(12) United States Patent
Louie et al.

(10) Patent No.: US 10,990,465 B2
(45) Date of Patent: *Apr. 27, 2021

(54) MRAM NOISE MITIGATION FOR BACKGROUND OPERATIONS BY DELAYING VERIFY TIMING

(71) Applicant: Spin Memory, Inc., Fremont, CA (US)

(72) Inventors: Benjamin Louie, Fremont, CA (US);
Neal Berger, Fremont, CA (US);
Lester Crudele, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/598,611

(22) Filed: Oct. 10, 2019

(65) Prior Publication Data
US 2020/0057687 A1 Feb. 20, 2020

Related U.S. Application Data

(63) Continuation-in-part of application No. 16/275,088, filed on Feb. 13, 2019, now Pat. No. 10,818,331, (Continued)

(51) Int. Cl.
*G06F 11/07* (2006.01)
*G11C 7/22* (2006.01)
(Continued)

(52) U.S. Cl.
CPC .......... *G06F 11/076* (2013.01); *G06F 11/002* (2013.01); *G06F 11/1679* (2013.01);
(Continued)

(58) Field of Classification Search
CPC .. G06F 11/076; G06F 11/002; G06F 11/1679; G06F 11/1048; G11C 7/222;
(Continued)

(56) References Cited

U.S. PATENT DOCUMENTS 5,487,036 A * 1/1996 Akaogi ................. G11C 29/04
365/189.09
9,432,298 B1 8/2016 Smith
(Continued)

FOREIGN PATENT DOCUMENTS

KR 1020120053953 5/2012

*Primary Examiner* — Sultana Begum

(57) ABSTRACT

A method of writing data into a memory device discloses utilizing a pipeline to process write operations of a first plurality of data words addressed to a memory bank. The method further comprises writing a second plurality of data words into an error buffer, wherein the second plurality of data words comprises data words that are awaiting write verification associated with the memory bank. The method further comprises searching for a data word that is awaiting write verification in the error buffer, wherein the verify operation occurs in a same row as the write operation. The method also comprises determining if an address of the data word is proximal to an address for the write operation and responsive to a positive determination, delaying a start of the verify operation so that a rising edge of the verify operation occurs a predetermined delay after a rising edge of the write operation.

20 Claims, 45 Drawing Sheets

Related U.S. Application Data which is a continuation-in-part of application No. 16/118,137, filed on Aug. 30, 2018, now Pat. No. 10,546,625, which is a continuation-in-part of application No. 15/855,855, filed on Dec. 27, 2017, now Pat. No. 10,192,602, which is a continuation-in-part of application No. 15/277,799, filed on Sep. 27, 2016, now Pat. No. 10,366,774.

(51) Int. Cl.
*G06F 11/00* (2006.01)
*G06F 11/16* (2006.01)
*G11C 11/16* (2006.01)

(52) U.S. Cl.
CPC .......... *G11C 7/222* (2013.01); *G11C 11/1657* (2013.01); *G11C 11/1673* (2013.01); *G11C 11/1675* (2013.01)

(58) Field of Classification Search
CPC .............. G11C 7/1039; G11C 11/1673; G11C 11/1657; G11C 11/1675; G11C 11/1693; G11C 11/1653; G11C 11/1677; G11C 29/52; G11C 29/70; G11C 2207/2245
See application file for complete search history.

(56) References Cited

U.S. PATENT DOCUMENTS

| | | |
|---|---|---|
| 2014/0237159 A9 | 8/2014 | Flynn et al. |
| 2018/0114590 A1 | 4/2018 | El-Baraji et al. |
| 2019/0018782 A1 | 1/2019 | Murphy |
| 2020/0050545 A1* | 2/2020 | Louie .................. G06F 12/0804 |

* cited by examiner

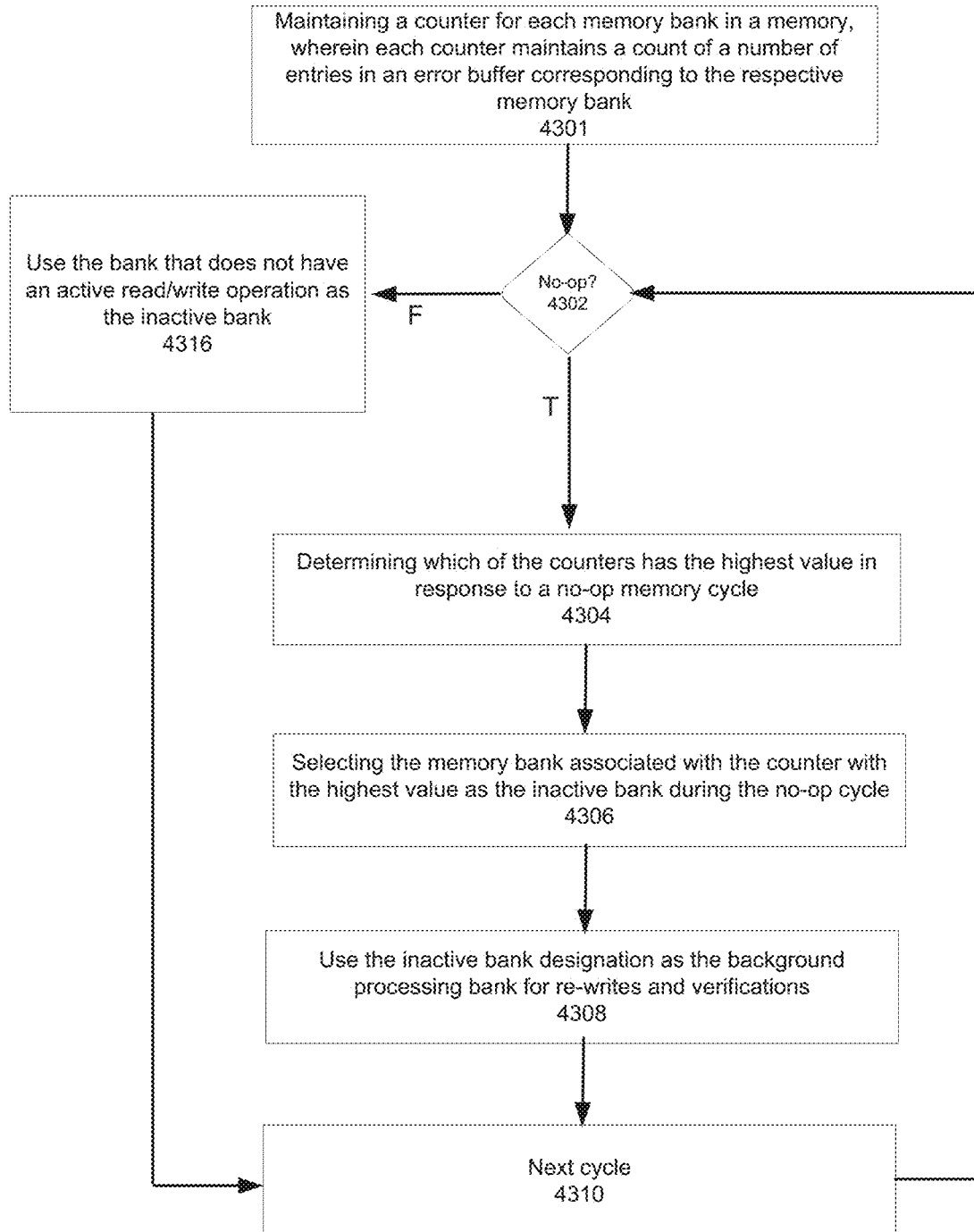

MRAM NOISE MITIGATION FOR BACKGROUND OPERATIONS BY DELAYING VERIFY TIMING

CROSS-REFERENCE TO RELATED APPLICATION

The present application is a Continuation-in-part of, claims the benefit and priority to U.S. application Ser. No. 16/275,088, filed Feb. 13, 2019, entitled "A MULTI-CHIP MODULE FOR MRAM DEVICES," which is a Continuation-in-part of, claims the benefit and priority to U.S. application Ser. No. 16/118,137, Attorney Docket No. SPIN-0002-15P07US, filed Aug. 30, 2018, entitled "A METHOD OF OPTIMIZING WRITE VOLTAGE BASED ON ERROR BUFFER OCCUPANCY," which is a Continuation-in-part of, claims the benefit and priority to U.S. application Ser. No. 15/855,855, filed Dec. 27, 2017, entitled "SMART CACHE DESIGN TO PREVENT OVERFLOW FOR A MEMORY DEVICE WITH A DYNAMIC REDUNDANCY REGISTER," and hereby incorporated by reference in its entirety, which is a continuation-in-part of, claims the benefit of and priority to U.S. application Ser. No. 15/277,799, filed Sep. 27, 2016, entitled "DEVICE WITH DYNAMIC REDUNDANCY REGISTERS" and hereby incorporated by reference in its entirety.

FIELD

The present patent document relates to registers that are added to devices, and more particularly registers added to random access memory (RAM). The methods and devices described herein are particularly useful in spin-transfer torque magnetic memory (STT-MRAM) devices.

BACKGROUND

Magnetoresistive random-access memory ("MRAM") is a non-volatile memory technology that stores data through magnetic storage elements. These magnetic storage elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetization of the two layers. The cell's resistance will be different for the parallel and anti-parallel states and thus the cell's resistance can be used to distinguish between a "1" and a "0." MRAM devices are generally considered as non-volatile memory devices since they maintain the information even when the power is off. The two plates can be sub-micron in lateral size and the magnetization direction can still be stable with respect to thermal fluctuations.

MRAM devices are considered as the next generation structures for a wide range of memory applications. MRAM products based on spin torque transfer switching are already making its way into large data storage devices. Spin transfer torque magnetic random access memory ("STT-MRAM") has an inherently stochastic write mechanism, wherein bits have certain probability of write failure on any given write cycle. The write failures are most generally random, and have a characteristic failure rate. A high write error rate (WER) may make the memory unreliable. Because STT-MRAM devices may have higher failure rates, the failures need to be recorded so that they may be fixed by, for example, using re-write attempts.

Conventional STT-MRAM memories lack any structures (e.g., registers, cache memories) used to keep track of the errors. Furthermore, in conventional STT-MRAM devices any mechanism used to keep track of errors would not have any safeguards against overflow. In other words, conventional STT-MRAM devices are typically not designed to prevent overflow in structures that may be used to keep track of the errors or even to prevent such structures from filling up too rapidly. Also, conventional STT-MRAM devices would not have any way of managing power consumption by memory modules used to keep track of such errors.

In memory devices, and especially STT-MRAM, methods and systems for verifying and re-writing data words are beneficial. Conventional STT-MRAM memories, however, are not configured to prevent verify (or read) operations from occurring too close in proximity to write operations.

SUMMARY AND CLAIMABLE SUBJECT MATTER

In an embodiment, a device with dynamic redundancy registers is disclosed. In one aspect, a memory device comprising random access memory (RAM) device, and specifically an STT-MRAM device, is provided. The present disclosure provides backup dynamic redundancy registers that allow the device to operate with high write error rate (WER). The dynamic redundancy registers allow verifies, re-writes, and relocation of data words that fail to write correctly to a memory bank, generally, without loss of throughput, speed, or restriction on random access addressing.

In one aspect, the present disclosure teaches a memory bank that is coupled to an e1 register. The e1 register is coupled to the e2 register. The e1 register stores data words that are to be verified or re-written to the memory bank. The e1 register also stores an associated address for data words within the memory bank. Data words in the e1 register may be verified against data words in the memory bank at the associated address within the memory bank. If a system write operation fails on the memory bank, a re-write operation may be tried by writing a data word from the e1 register to the memory bank. The fact that the system write operation failed may be determined through a verify operation. Re-write operation from e1 register to memory bank may be tried as many times as necessary to successfully complete write operation or may not be tried at all. In one example, the number of re-write operations may be configurable based on control bit(s) associated with re-write attempts. In one aspect, the number of re-write operations may be configurable on a per-bank basis or per-segment of bank basis. These control bits may be stored in the e1 register and associated with a particular data word and communicated and updated as appropriate.

In one aspect, the re-write operation may be tried only when memory bank is idle (that is there are no write or read operations for that memory bank). In this way, re-write operations may be transparent to and with no delay of incoming system read and system write operations. After the desired number of re-write attempts (0 to n) from the e1 register, the memory device moves (relocates) data word from the e1 register to the e2 register. The memory device may also move associated address within memory bank for data word from the e1 register to the e2 register. In one aspect, the memory device does not comprise an e2 register. Instead, after a desired number of re-write attempts, the memory device relocates the data word and associated address from the e1 register to a secure area in memory reserved for storing data words associated with pending re-write and verify operations in the e1 register.

In one embodiment, a re-write operation may occur only once from the e1 register to the memory bank. The memory device then relocates the data word and associated address from the e1 register to the e2 register if the re-write operation failed. Alternatively, if there is no e2 register, the memory device then relocates the data word and associated address from the e1 register to the secure storage area in memory. Although explained with reference to one memory bank and two dynamic redundancy registers, one or more memory banks and two or more dynamic redundancy registers may also be used. Alternatively, in certain embodiments only one dynamic redundancy register may be used, e.g., embodiments without an e2 register.

Typically, the first level dynamic redundancy register (e1 register) may operate at clock cycle speed of memory bank (some operations may operate at clock cycle speed of memory bank while other operations may occur independent or multiples of memory bank clock cycle speed). The e1 register may be either non-volatile or volatile, and may typically comprise SRAM. The e1 register may also comprise a content addressable memory (CAM) array which allows reduced size of e1 register. In one embodiment, e1 register may be high-speed, smaller register than a last level register.

Typically, the last level dynamic redundancy register (e2 register) may operate at clock cycle speed of main memory bank (some operations may operate at clock cycle speed of memory bank while other operations may occur independent or multiples of memory bank clock cycle speed). The last level may be either non-volatile or volatile, and may typically comprise MRAM. The e2 register may also comprise a CAM. The last level dynamic register may beneficially comprise non-volatile memory which allows data to be backed up on power down. The e2 register typically prioritizes reliability over size as compared to memory bank. In one embodiment, the last level register may comprise more entries than the e1 register. In one embodiment, e2 register entries may be invalidated when a write operation occurs for a data word having associated address common with data word in e2 register. Alternatively, in an embodiment without an e2 register, entries in the secure memory storage area may be invalidated when a write operation occurs for a data word having an associated address common with data word in the secure memory storage.

In one aspect, the e1 register stores a data word and an associated address for data words in a pipeline structure that have not had an opportunity to verify. For example, a data word may not have an opportunity to verify because of row address change. That is, a write operation may occur on a different row address than a verify operation. Thus, the data word for a verify operation would be stored within e1 register and verify would be performed, if possible, on another data word from e1 register having common row address with the data word for write operation. This feature is especially beneficial in pseudo-dual port memory banks. A dual port memory bank allows read and write operations to be performed simultaneously. A pseudo-dual port allows read and write operations to be simultaneously (e.g., substantially within the same memory device clock cycle) performed on less than all ports. In one example, a pseudo-dual port MRAM may allow verify and write operations to be simultaneously performed as long as the operations share a common row address and different column addresses. In one aspect, a data word may be read from the e1 register rather than main memory bank if the data word failed to write or verify to memory bank.

In another aspect, the e1 or e2 register data word, associated address, and control bits can be deleted, overwritten, invalidated such that the data is not used, or otherwise considered garbage when another write operation for the same associated address occurs on the memory bank. In one aspect, a data word may be read from the e2 register rather than the main memory bank if such read operation is beneficial. For example, if e1 register relocated a data word to e2 register. In another aspect, data stored in the e2 SRAM and CAM is backed up onto the e2 non-volatile RAM for storage during power down. In another embodiment, data stored in e2 non-volatile RAM may be transferred to e2 volatile RAM during power up. In another aspect, the memory device may move data from the e1 register to the e2 register in order to free room in the e1 register. In another aspect, e2 register may not store data words and associated addresses but instead remap data words and associated addresses received from e1 register into a different area of memory bank. In another aspect e2 register may move data words to memory bank upon power down.

Typically, e2 register should be more reliable than memory bank because data may not be recoverable in case of e2 register failure. Thus, schemes can be implemented to increase reliability of e2 register. For example, e2 register may comprise status bits that allow data manipulation of a particular data word or other entry within e2 only if all or a predetermined number of status bits are set to one. In another scheme, multiple copies of data word may be maintained in e2 register and selected based on a voting scheme. In another scheme, a more stringent error correction code (ECC) scheme may be performed within e2 register than in memory bank. In another scheme, e2 register points to particular addresses within main memory for storing data words rather than storing the data word within e2 itself.

In one embodiment of the present invention, only one dynamic redundancy register, e.g., the e1 register may be used in a memory device. In other words, the memory device will have no e2 register. In one embodiment, upon receiving the power down signal, the e1 register may attempt to perform all the pending operations, e.g., verify and re-write operations associated with the data words stored in the e1 register prior to shutting down. In other words, upon receiving the power down signal, the e1 register may attempt to perform all the pending verify operations and move all the data words associated with pending re-write operations (e.g. operations that have failed verification) stored within it to the appropriate corresponding locations in the memory bank. In one embodiment, if the verify operations and re-write operations succeed, the corresponding entries for the data words in the e1 register may be deleted prior to shutting down (if the e1 register comprises non-volatile memory). Any data words in the e1 register that could not be successfully re-written or verified prior to shutting down will be stored in a secure memory storage area. In one embodiment, the memory device ensures that data is written securely to the secure memory storage area by using one or multiple schemes including voting, error-correcting code (ECC), or storing multiple copies.

In one embodiment where only the e1 register is used, upon power up of the memory device and receipt of power up signal, another attempt can be made to perform all the pending re-write or verify operations using the associated addresses for the data words. As stated above, subsequent to powering down, the secure memory storage area will comprise data words (with their associated addresses) that have not yet been verified or that have failed verification. The verify and re-write operations can be directly attempted from the secure memory storage area or they can be recalled to the e1 register prior to processing the pending operations to the pipeline. In one embodiment, if the attempt to verify or write the data words back to memory on power up succeeds, the corresponding entries for the data words in the secure memory storage area or the e1 register may be deleted. Any data words that could not be successfully re-written or verified subsequent to powering up will be stored in the e1 register.

In one aspect, the present disclosure teaches an access method and system into memory banks. Pseudo-dual ports allow using the disclosed Y-mux structure to simultaneously perform verify and write operations on two data words sharing a common row address (e.g., sharing a common word line). In other embodiments, dual port memory bank could allow simultaneous read and write operations. The Y-mux structure of the present disclosure operates using two column decoders for the column address. One column decoder allows decoding for write column addresses. The other column decoder allows decoding for read and verify column addresses. The disclosed pseudo-dual port memory bank with Y-mux structure requires only a single-port memory cell. As explained, a dual port memory bank may allow read and write operations to be simultaneously performed, but requires a dual port memory cell. A single port memory cells, for example an STT MRAM memory cell, may be more area efficient than a dual port memory cell, for example a dual port STT MRAM memory cell. Thus, the present disclosure teaches, in one embodiment, a Y-mux structure to create a pseudo dual port memory bank with single port memory cells. Thus, e1 register operates with the disclosed pseudo dual port memory bank to permit write and verify operations sharing common row address to occur simultaneously.

In another aspect, the memory device includes control bits and signals that are used for the control logic of this disclosure. The memory device may thus know whether data is located in a memory bank, memory pipeline, e1 register, or e2 register for read operations. In another aspect, data for operations may be invalidated based on control bits and signals to maintain consistency of operations. Such control bits and signals may include valid bit, active bank signal, fail count bits, e2 entry inactive bit. A valid bit indicates that particular data within a register is valid for data manipulation operations. An active bank signal indicates whether the memory bank for operation is active (i.e., that a system write or system read is being performed in that bank). Fail count bits indicate the number of re-write operations have occurred for the data word. The e2 entry inactive bit indicates that the associated entry in e2 should not be used for data manipulation operations.

In another aspect, the present disclosure teaches a memory device having pipeline structure for write and verify, among other data manipulation operations. This pipeline structure may be used to control system write, verify, and re-write operations, among other data manipulation operations. Using the pipeline structure of the present disclosure, data integrity is maintained and data flow is structured. In one embodiment, a delay register implements a delay cycle allowing memory to reach stable state before performing a verify operation on a data word. This delay cycle allows a write operation to be performed for a data word, followed by a delay cycle, followed by a verify operation for the data word.

In one embodiment, a method of writing data into a memory device is disclosed. The method comprises utilizing a pipeline to process write operations of a first plurality of data words addressed to a memory bank. The method further comprises writing a second plurality of data words and associated memory addresses into a cache memory, e.g., an e1 register, wherein the cache memory is associated with the memory bank and wherein further each data word of the second plurality of data words is either awaiting write verification associated with the memory bank or is to be re-written into the memory bank. Further, the method comprises detecting a power down signal and responsive to the power down signal, transferring the second plurality of data words and associated memory addresses from the cache memory, e.g., the e1 register, into a secure memory storage area reserved in the memory bank. Finally, the method comprises powering down the memory device. It should be noted that in this embodiment only one dynamic redundancy register, e.g., the e1 register may be used in the memory device. In other words, the memory device will have no e2 register.

In one aspect of this embodiment, the memory bank comprises a plurality of spin-transfer torque magnetic random access memory (STT-MRAM) cells. In another aspect, the method further comprises responsive to the power down signal, transferring any partially completed write operations of the pipeline to the secure memory storage area. In a different aspect, the method further comprises responsive to the power down signal, and before the transferring, copying any partially completed write operations of the pipeline to the cache memory.

In one aspect of the embodiment, the transferring comprises utilizing a secure communication process that is substantially compliant with one of: voting; ECC encoding; use of multiple copies; comparing multiple copies; and voting from multiple copies. In another aspect, the power down signal originates from a system level software stack and represents a system wide orderly power down event. In a different aspect, the power down sequence is initiated when an analog detector detects that the operating power of the chip has decreased by a predetermined threshold level. In one aspect, the method further comprises removing a data word and its associated address from the cache memory responsive to an indication that the data word has been verified as properly written to the memory bank. In another, the method further comprises receiving a power up signal and responsive to the power up signal, transferring the second plurality of data words and associated memory addresses from the secure memory storage area to the cache memory and processing the second plurality of data words from the cache memory, through the pipeline for writing into the memory bank.

In one embodiment, a method of writing data into a memory device is disclosed. The method comprises utilizing a pipeline to process write operations of a first plurality of data words addressed to a memory bank. The method further comprises writing a second plurality of data words and associated memory addresses into a cache memory, wherein the cache memory is associated with the memory bank and wherein further each data word of the second plurality of data words is either awaiting write verification associated with the memory bank or is to be re-written into the memory bank. The method also comprises detecting a power down signal and responsive to the power down signal, and before the memory device is powered down, processing data words of the second plurality of data words and associated memory addresses through the pipeline to write data into the memory bank. The method finally comprises powering down the memory device.

In one aspect, the memory bank comprises a plurality of spin-transfer torque magnetic random access memory (STT-MRAM) cells. In another aspect, the power down signal originates from a system level software stack and represents a system wide orderly power down event. In a different aspect, the power down sequence is initiated when an analog detector detects that the operating power of the chip has decreased by a threshold level. In one aspect, the method further comprises removing a data word and its associated address from the cache memory responsive to an indication that the data word has been verified as properly written to the memory bank. In yet another aspect, the method further comprises subsequent to the processing the data words and before the power down, transferring any unprocessed data words of the second plurality of data words from the cache memory to a secure memory storage area of the memory bank. In one aspect, the transferring comprises utilizing a secure communication process substantially compliant with one of: voting; ECC encoding; use of multiple copies; comparing multiple copies; and voting from multiple copies.

In one aspect, the method also comprises receiving a power up signal and responsive to the power up signal, transferring any data words and associated memory addresses from the secure memory storage area to the cache memory and processing the data words, from the cache memory, through the pipeline for writing into the memory bank.

In one embodiment, a method of writing data into a memory device is disclosed. The method comprises utilizing a pipeline to process write operations of a first plurality of data words addressed to a memory bank. The method further comprises writing a second plurality of data words and associated memory addresses into a cache memory, wherein the cache memory is associated with the memory bank and wherein further each data word of the second plurality of data words is either awaiting write verification associated with the memory bank or is to be re-written into the memory bank. The method also comprises detecting a power down signal and responsive to the power down signal, transferring the second plurality of data words and associated memory addresses from the cache memory into a secure memory storage area in the memory bank. Additionally, the method comprises detecting a power up signal and responsive to the power up signal, and before the memory device is powered up, transferring the second plurality of data words and associated memory addresses from the secure memory storage area to the cache memory. Further, the method comprises responsive to the transferring, and before the memory device is powered up, processing the second plurality of data words and associated memory addresses from the cache memory to the pipeline for writing data to the memory bank during power up.

In one aspect, the memory bank comprises a plurality of spin-transfer torque magnetic random access memory (STT-MRAM) cells. Further, in one aspect, the method further comprises responsive to the power down signal, transferring any partially completed write operations of the pipeline to the secure memory storage area. In another aspect, the method further comprises responsive to the power down signal, copying any partially completed write operations of the pipeline to the cache memory. In one aspect, the transferring comprises utilizing a secure communication process substantially compliant with one of: voting; ECC encoding; use of multiple copies; comparing multiple copies; and voting from multiple copies.

In one embodiment, the power down signal originates from a system level software stack and represents a system wide orderly power down event. In a different aspect, the power down sequence is initiated when an analog detector detects that the operating power of the chip has decreased by a threshold level. In another aspect, the method further comprises removing a data word and its associated address from the cache memory responsive to an indication that the data word has been verified as properly written to the memory bank.

In one embodiment, a memory pipeline for performing a write operation in a memory device is disclosed. The memory pipeline comprises an initial pipe-stage comprising an input register operable to receive a first data word and an associated address to be written into a memory bank. The memory pipeline also comprises a pre-read register of the first pipe-stage coupled to the input register and operable to receive the first data word and the associated address from the input register and further operable to pre-read a second data word stored in the memory bank at the associated address, and wherein the pre-read register is further operable to store mask bits associated with pre-reading the second data word, wherein the mask bits comprise information regarding a bit-wise comparison between the first data word and the second data word. Further, the memory pipeline comprises a write register of the second pipe-stage operable to receive the first data word, the associated address and the mask bits from the pre-read register, wherein the write register is further operable to use information from the mask bits to write the first data word into the memory bank by changing those bits in the first data word that differ from the second data word, and wherein the second pipe-stage follows the first pipe-stage.

In one aspect the memory bank comprises memory cells that are spin-transfer torque magnetic random access memory (STT-MRAM) cells. In another aspect, the pre-read register further comprises ECC bits for correcting bit errors in data words read from the memory bank. In one aspect, the pre-read is performed as part of a bit redundancy remapping operation. In another aspect the pre-read register stores the mask bits in a first level dynamic redundancy register. In a further aspect, the memory pipeline further comprises a delay register of the third pipe-stage operable to provide delay cycles between the write register and a verify register, wherein the delay cycles are used to find a verify operation in a first level dynamic redundancy register with a row address in common with the first data word wherein the third pipe-stage follows the second pipe-stage. In one aspect the delay register is further operable to receive the first data word and associated address from the write register. In another aspect, the delay register is further operable to transmit the first data word and associated address to the first level dynamic redundancy register responsive to receipt of a row address change signal. In one aspect, the memory pipeline further comprises a verify register of the fourth pipe-stage operable to receive the first data word and associated address from the delay register, and further operable to read a third data word at the associated address from the memory bank, wherein the fourth pipe-stage follows the third pipe-stage. Further, the memory pipeline comprises compare logic operable to compare contents of the first data word and the third data word to determine if the first data word wrote correctly to the memory bank.

In one embodiment, a memory pipeline for performing a write operation in a memory device is disclosed. The memory pipeline comprises an initial pipe-stage comprising an input register operable to receive a first data word and an associated address to be written into a memory bank. Further, the pipeline comprises a first write register of a first pipe-stage coupled to the input register and operable to receive the first data word and the associated address from the input register in a first clock cycle, wherein the first write register is further operable to perform a first attempt at writing the data word into the memory bank at a location corresponding to the associated address. The pipeline also comprises a second write register of the second pipe-stage coupled to the first write register and operable to receive the first data word and the associated address from the first write register in a second clock cycle, wherein the second write register is further operable to perform a second attempt at writing the first data word into the memory bank at the location corresponding to the associated address, and further wherein a second data word is input into the first write register in the second clock cycle subsequent to writing the first data word into the second write register from the first write register, wherein the second pipe-stage follows the first pipe-stage.

In one aspect, the pipeline further comprises a delay register of the third pipe-stage operable to receive the first data word and the associated address from the second write register on a third cycle, wherein a third data word is input into the first write register and the second data word is transferred from the first write register into the second write register for a second attempt at writing the second data word on the third cycle into the memory bank, wherein the third pipe-stage follows the second pipe-stage. In one aspect, the delay register is further operable to provide a delay cycle between the write register and a verify register, wherein the delay cycle is used to find a verify operation in a first level dynamic redundancy register with a row address in common with the first data word. In one aspect, the delay register is further operable to transmit the first data word and the associated address to the first level dynamic redundancy register responsive to receipt of a row address change signal. In another aspect, the memory pipeline further comprises a verify register of the fourth pipe-stage coupled to the delay register wherein the verify register is operable to receive the first data word from the delay register on a fourth clock cycle, and wherein the verify register performs a read operation on the memory bank at the associated address to determine whether the first data word wrote correctly to the memory bank, wherein the fourth pipe-stage follows the third pipe-stage. In yet another aspect, the memory pipeline also comprises compare logic operable to perform a compare operation between the first data word in the verify register and a data word read from the memory bank at the associated address in the verify register.

In one aspect, the memory pipeline additionally comprises a verify results register of the fifth pipe-stage operable to receive the first data word and the associated address from the verify register, wherein responsive to a determination that a verify operation associated with the compare operation failed, the verify results register is further operable to transfer the first data word and the associated address to a first level dynamic redundancy register, wherein the fifth pipe-stage follows the fourth pipe-stage. In one aspect, the memory cells of the memory bank comprise spin-transfer torque magnetic random access memory (STT-MRAM) cells. In another aspect responsive to receiving a read operation, write operations associated with the memory pipeline are stalled until the read operation is completed.

In one embodiment of the present invention, a memory device for storing data is disclosed. The memory device comprises a memory bank comprising a plurality of addressable memory cells configured in a plurality of segments wherein each segment contains N rows per segment, wherein the memory bank comprises a total of B entries, and wherein the memory cells are characterized by having a prescribed write error rate, E. The memory device also comprises a pipeline comprising M pipestages and configured to process write operations of a first plurality of data words addressed to a given segment of the memory bank. Further, the memory comprises a cache memory, e.g., the e1 register comprising Y number of entries, the cache memory associated with the given segment of the memory bank wherein the cache memory is operable for storing a second plurality of data words and associated memory addresses, and wherein further each data word of the second plurality of data words is either awaiting write verification associated with the given segment of the memory bank or is to be re-written into the given segment of the memory bank, and wherein the Y number of entries is based on the M, the N and the prescribed word error rate, E, to prevent overflow of the cache memory.

In one aspect, the Y number of entries is at least (N*M)+(B*E) entries. In one aspect, the memory cells of the memory bank comprise spin-transfer torque magnetic random access memory (STT-MRAM) cells. In one aspect, the memory device further comprises a plurality of pipelines and a plurality of cache memories, and wherein further each segment of the plurality of segments has associated therewith a respective pipeline of the plurality of pipelines and a respective cache memory of the plurality of cache memories. In one aspect, the cache memory comprises one or more status indicators for indicating a partial occupancy level of the cache memory. In one aspect, the pipeline supports multiple write attempts for a given write operation. In another aspect, the pipeline supports a pre-read operation for a given write operation. In one aspect, the pipeline is operable to flush a currently processing first memory operation to the cache memory if a second memory operation enters the pipeline has a different row address as the first memory operation.

In one embodiment, a memory device for storing data is disclosed. The memory device comprises a plurality of memory banks, wherein each memory bank comprises a plurality of addressable memory cells and a plurality of pipelines each comprising a plurality of pipe-stages, wherein each pipeline is associated with a respective one of the plurality of memory banks, and wherein each pipeline is configured to process write operations of a first plurality of data words addressed to its associated memory bank. The memory device further comprises a plurality of cache memories, wherein each cache memory is associated with a respective one of the plurality of memory banks and a respective one of the plurality of pipelines, and wherein each cache memory is operable for storing a second plurality of data words and associated memory addresses, and wherein further each data word of the second plurality of data words is either awaiting write verification associated with the given segment of an associated memory bank or is to be re-written into the given segment of the associated memory bank.

In one aspect, the addressable memory cells of the associated memory bank comprise spin-transfer torque magnetic random access memory (STT-MRAM) cells. In one aspect, each pipeline is operable to flush a currently processing first memory operation to an associated cache memory if a second memory operation that enters the pipeline has a different row address as the first memory operation. In another aspect, each cache memory comprises one or more status indicators for indicating a partial occupancy level of the cache memory. In one aspect, each pipeline supports multiple write attempts for a given write operation. In another aspect, each pipeline supports a pre-read operation for a given write operation.

In one embodiment, a memory device for storing data is disclosed. The memory device comprises a memory bank comprising a memory array of addressable memory cells and a pipeline configured to process read and write operations addressed to the memory bank. Further, the memory comprises an x decoder circuit coupled to the memory array for decoding an x portion of a memory address for the memory array and a y multiplexer circuit coupled to the memory array and operable to simultaneously multiplex across the memory array based on two y portions of memory addresses and, based thereon with the x portion, for simultaneously writing a value and reading a value associated with two separate memory cells of the memory array, wherein the x decoder and the y multiplexer comprise a read port and a write port which are operable to simultaneously operate with respect to the memory array.

In one aspect, the x decoder is operable to assert a row line of the memory array and wherein the two separate memory cells share the row line in common. In another aspect, the read port and the write port allow a write operation and a read-verify operation, that share a common row, to simultaneously access the memory array. In one aspect, the read port and the write port allow a write operation and a read-verify operation, that share a common row and that have different y portions, to simultaneously access the memory array. In another aspect, the addressable memory cells comprise spin-transfer torque magnetic random access memory (STT-MRAM) cells. In one aspect of the invention, the x portion of the memory address decodes to a common row line shared by the two separate memory cells of the memory array and wherein further the two y portions of memory addresses respectively select first and second sets of bit lines associated with the two separate memory cells of the memory array. In one aspect, the memory device further comprises a plurality of input/output channels, the plurality of input/output channels coupled to the y multiplexer circuit.

In one embodiment, a method of writing data into a memory device is disclosed. The method comprises utilizing a pipeline to process write operations of a first plurality of data words addressed to a memory bank. The method further comprises writing a second plurality of data words and associated memory addresses into an error buffer, wherein the second plurality of data words are a subset of the first plurality of data words, wherein the error buffer is associated with the memory bank and wherein further each data word of the second plurality of data words is either awaiting write verification associated with the memory bank or is to be re-written into the memory bank. Further, the method comprises monitoring an occupancy level of the error buffer and determining if the occupancy level of the error buffer is larger than a predetermined threshold. Responsive to a determination that the occupancy level of the error buffer is larger than the predetermined threshold, the method comprises increasing a write voltage of the memory bank, wherein subsequent write operations are performed at a higher write voltage.

In another embodiment, a memory device for storing data is disclosed. The memory device comprises a memory bank comprising a plurality of addressable memory cells and a pipeline configured to process write operations of a first plurality of data words addressed to the memory bank. The method also comprises a cache memory operable for storing a second plurality of data words and associated memory addresses, wherein the cache memory is associated with the memory bank and wherein further each data word of the second plurality of data words is either awaiting write verification associated with the memory bank or is to be re-written into the memory bank. Further, the method comprises a logic module operable to: (a) monitor an occupancy level of the error buffer; (b) determine if the occupancy level of the error buffer exceeds a predetermined threshold; and (c) responsive to a determination that the occupancy level of the error buffer exceeds the predetermined threshold, increase a write voltage of the memory bank, wherein subsequent write operations are performed at a higher write voltage.

In a different embodiment, a method of writing data into a memory device is disclosed. The method comprises utilizing a pipeline to process write operations of a first plurality of data words addressed to a memory bank and writing a second plurality of data words and associated memory addresses into an error buffer wherein the error buffer is associated with the memory bank and wherein further each data word of the second plurality of data words is either awaiting write verification associated with the memory bank or is to be re-written into the memory bank. Further, the method comprises monitoring an occupancy level of the error buffer and determining if the occupancy level of the error buffer has increased beyond a predetermined threshold. Responsive to a determination that the occupancy level of the error buffer has increased beyond the predetermined threshold, the method comprises increasing a length of a pulse width for write cycles of the memory bank, wherein subsequent write operations are performed using the pulse width.

In one embodiment, a method of writing data into a memory device is disclosed. The method comprises utilizing a pipeline to process write operations of a first plurality of data words addressed to a memory bank. The method also comprises writing a second plurality of data words and associated memory addresses into an error buffer, wherein the second plurality of data words are a subset of the first plurality of data words, wherein the error buffer is associated with the memory bank and wherein further each data word of the second plurality of data words is either awaiting write verification associated with the memory bank or is to be re-written into the memory bank. Further, the method comprises monitoring a first counter value which tracks a number of write 1 errors and a second counter value which tracks a number of write 0 errors. The method also comprises determining if the first counter value has exceeded a predetermined threshold and determining if the second counter value has exceeded the predetermined threshold. Responsive to a determination that the first counter value has exceeded the predetermined threshold, the method comprises increasing a write 1 voltage of the memory bank, wherein subsequent write 1 operations are performed at a higher write 1 voltage and, further, responsive to a determination that the second counter value has exceeded the predetermined threshold increasing a write 0 voltage of the memory bank, wherein subsequent write 0 operations are performed at a higher write 0 voltage.

In another embodiment, a method of writing data into a memory device is disclosed. The method comprises utilizing a pipeline to process write operations of a first plurality of data words addressed to a memory bank, wherein the processing of write operations comprises writing '1's to the memory bank using a write 1 voltage and writing '0's to the memory bank using a write 0 voltage. The method further comprises writing a second plurality of data words and associated memory addresses into an error buffer, wherein the second plurality of data words are a subset of the first plurality of data words, wherein the error buffer is associated with the memory bank and wherein further each data word of the second plurality of data words is either awaiting write verification associated with the memory bank or is to be re-written into the memory bank. Further, the method comprises monitoring a first counter value that tracks a number of write 1 errors and a second counter value that tracks a number of write 0 errors. Subsequently, the method comprises determining if the first counter value has exceeded a first predetermined threshold and determining if the second counter value has exceeded a second predetermined threshold. Responsive to a determination that the first counter value has exceeded the first predetermined threshold, the method comprises increasing the write 1 voltage of the memory bank, wherein subsequent write 1 operations are performed at a higher write 1 voltage and, further, responsive to a determination that the second counter value has exceeded the second predetermined threshold increasing the write 0 voltage of the memory bank, wherein subsequent write 0 operations are performed at a higher write 0 voltage.

In a different embodiment, a memory device for storing data is disclosed. The memory device comprises a memory bank comprising a plurality of addressable memory cells and a pipeline configured to process write operations of a first plurality of data words addressed to the memory bank. The method further comprises a cache memory operable for storing a second plurality of data words and associated memory addresses, wherein the second plurality of data words is a subset of the first plurality of data words, wherein the cache memory is associated with the memory bank and wherein further each data word of the second plurality of data words is either awaiting write verification associated with the memory bank or is to be re-written into the memory bank. The memory device also comprises a logic module operable to: a) monitor a first counter value that tracks a number of write 1 errors and a second counter value that tracks a number of write 0 errors; b) determine if the first counter value has exceeded a first predetermined threshold; c) determine if the second counter value has exceeded a second predetermined threshold; and d) responsive to a determination that the first counter value has exceeded a first predetermined threshold increase a write 1 voltage of the memory bank, wherein subsequent write 1 operations are performed at a higher write 1 voltage and, further, responsive to a determination that the second counter value has exceeded a second predetermined threshold increase a write 0 voltage of the memory bank, wherein subsequent write 0 operations are performed at a higher write 0 voltage.

In one embodiment, a method of writing data into a memory device is disclosed. The method comprises utilizing a pipeline to process write operations of a first plurality of data words addressed to a memory bank. The method also comprises writing a second plurality of data words and associated memory addresses into an error buffer, wherein the second plurality of data words are a subset of the first plurality of data words, wherein the error buffer is associated with the memory bank and wherein further the second plurality of data words comprises data words that are awaiting write verification associated with the memory bank. Further, the method comprises searching for at least one data word that is awaiting write verification in the error buffer, wherein verify operations associated with the at least one data word are operable to be performed in a same cycle as a write operation, and wherein the verify operations associated with the at least one data word occur in a same row as the write operation. The method also comprises determining if an address associated with any of the at least one data word is proximal to an address for the write operation and preventing a verify operation associated with the at least one data word from occurring in a same cycle as the write operation if a corresponding address for the verify operation is proximal to the write operation.

In another embodiment, a method of writing data into a memory device is disclosed. The method comprises utilizing a pipeline to process write operations of a first plurality of data words addressed to a memory bank and writing a second plurality of data words and associated memory addresses into an error buffer, wherein the second plurality of data words are a subset of the first plurality of data words, wherein the error buffer is associated with the memory bank and wherein further the second plurality of data words comprises data words that are awaiting write verification associated with the memory bank. Further, the method comprises searching for two data words that are awaiting write verification in the error buffer, wherein verify operations associated with the two data words are operable to be performed in a same cycle as a write operation, and wherein the verify operations associated with the two data words occur in a same row as the write operation. The method also comprises determining if an address associated with any of the two data words is adjacent to an address for the write operation and de-prioritizing a verify operation associated with any of the two data words if a corresponding address for the verify operation is adjacent to the write operation, wherein the verify operation is scheduled to occur in a different cycle than the write operation.

In one embodiment, a memory device for storing data is disclosed. The memory device comprises a memory bank comprising a plurality of addressable memory cells and a pipeline configured to process write operations of a first plurality of data words addressed to the memory bank. The memory device also comprises a cache memory operable for storing a second plurality of data words and associated memory addresses, wherein the cache memory is associated with the memory bank and wherein further the second plurality of data words comprises data words that are awaiting write verification associated with the memory bank. Further, the memory device comprises a logic module operable to: a) search for three data words that are awaiting write verification in the error buffer, wherein verify operations associated with the three data words are operable to be performed in a same cycle as a write operation, and wherein the verify operations associated with the three data words occur in a same row as the write operation; b) determining if an address associated with any of the three data words is adjacent to an address for the write operation; and c) de-prioritizing a verify operation associated with any of the three data words if a corresponding address for the verify operation is adjacent to an address of the write operation.

In one embodiment, a method of writing data into a memory device is disclosed. The method comprises utilizing a pipeline to process write operations of a first plurality of data words addressed to a memory bank and writing a second plurality of data words and associated memory addresses into an error buffer, wherein the second plurality of data words are a subset of the first plurality of data words, wherein the error buffer is associated with the memory bank and wherein further the second plurality of data words comprises data words that are awaiting write verification associated with the memory bank. Further, the method comprises searching for a data word that is awaiting write verification in the error buffer, wherein a verify operation associated with the data word is operable to be performed in a same cycle as a write operation, and wherein the verify operation associated with the data word occurs in a same row as the write operation. The method also comprises determining if an address of the data word is proximal to an address for the write operation. Finally, responsive to a determination that the address of the data word is proximal to the address for the write operation, the method comprises delaying a start of the verify operation, wherein a rising edge of the verify operation occurs a predetermined delay after a rising edge of the write operation.

In another embodiment, a method of writing data into a memory device is disclosed. The method comprises utilizing a pipeline to process write operations of a first plurality of data words addressed to a memory bank and writing a second plurality of data words and associated memory addresses into an buffer, wherein the second plurality of data words are a subset of the first plurality of data words, wherein the buffer is associated with the memory bank and wherein further the second plurality of data words comprises data words associated with pending verify operations in connection with the memory bank. Further, the method comprises searching for a pending verify operation in the buffer, wherein the pending verify operation is operable to be performed in a background operation and operable to be performed in a same cycle as a write operation, and wherein a data word associated with the verify operation occurs in a same row as the write operation. Subsequently, the method comprises determining if an address of the data word is adjacent to an address for the write operation. Responsive to a determination that the address of the data word is adjacent to the address for the write operation, the method comprises delaying a start of the verify operation, wherein a rising edge of the verify operation occurs a predetermined delay after a rising edge of the write operation, and wherein the verify operation and the write operation occur in a same clock cycle.

In another embodiment, a memory device for storing data is disclosed. The memory device comprises a memory bank comprising a plurality of addressable memory cells and a pipeline configured to process write operations of a first plurality of data words addressed to the memory bank. The memory device further comprises a cache memory operable for storing a second plurality of data words and associated memory addresses, wherein the cache memory is associated with the memory bank and wherein further the second plurality of data words comprises data words that are awaiting write verification associated with the memory bank. Further, the memory device comprises a logic module operable to: a) search for a data word that is awaiting write verification in the cache memory, wherein a verify operation associated with the data word is operable to be performed in a same cycle as a write operation, and wherein the verify operation associated with the data word occurs in a same row as the write operation; b) determine if an address of the data word is proximal to an address for the write operation; and c) responsive to a determination that the address of the data word is proximal to the address for the write operation, delay a start of the verify operation, wherein a rising edge of the verify operation occurs a predetermined delay after a rising edge of the write operation.

In one embodiment, a memory device for storing data is disclosed. The memory device comprises a memory bank comprising a plurality of addressable memory cells, wherein the memory bank is divided into a plurality of segments and a pipeline configured to process write operations of a first plurality of data words addressed to the memory bank. The memory device also comprises a cache memory operable for storing a second plurality of data words and associated memory addresses, wherein the second plurality of data words are a subset of the first plurality of data words, wherein the cache memory is associated with the memory bank and wherein further each data word of the second plurality of data words is either awaiting write verification associated with the memory bank or is to be re-written into the memory bank, wherein the cache memory is divided into a plurality of segments, wherein each segment of the cache memory is direct mapped to a corresponding segment of the memory bank, wherein an address of each of the second plurality of data words is mapped to a corresponding segment in the cache memory, and wherein data words from a particular segment of the memory bank only get stored in a corresponding direct mapped segment of the cache memory.

In another embodiment, a memory device for storing data is disclosed. The memory device comprises a plurality of memory banks, each comprising a plurality of addressable memory cells, wherein each of the plurality of memory banks is divided into a plurality of segments and a pipeline configured to process write operations of a first plurality of data words addressed to the plurality of memory banks. The memory device also comprises a cache memory operable for storing a second plurality of data words and associated memory addresses, wherein the second plurality of data words are a subset of the first plurality of data words, wherein the cache memory is associated with the plurality of memory banks and wherein further each data word of the second plurality of data words is either awaiting write verification associated with a bank from the plurality of memory banks or is to be re-written into a bank from the plurality of memory banks, wherein the cache memory is divided into a plurality of segments, wherein each segment of the cache memory is direct mapped to a corresponding segment of a memory bank of the plurality of memory banks, and wherein an address of each of the second plurality of data words is mapped to a corresponding segment in the cache memory.

In a different embodiment, a memory device is disclosed. The memory device comprises a memory bank comprising a plurality of magnetic random access memory (MRAM) cells, wherein each memory cell is configured to store a data word at a respective one of a plurality of memory addresses, and wherein the memory bank is divided into a plurality of segments. The memory device also comprises a dynamic redundancy register comprising data storage elements, wherein the dynamic redundancy register is divided into a plurality of segments, wherein each segment of the dynamic redundancy register is direct mapped to a corresponding segment of the memory bank. Also, the memory device comprises a pipeline bank coupled to the memory bank and the dynamic redundancy register, wherein the pipeline bank is configured to: a) write a data word into a segment of the memory bank that corresponds to a selected address of the plurality of memory addresses; b) verify the data word written into the memory bank to determine whether the data word was successfully written; and c) responsive to a determination that the data word was not successfully written, writing the data word and the selected address into a segment of the dynamic redundancy register that directly maps to the segment of the memory bank associated with the write, wherein data words from a particular segment of the memory bank only get stored in a corresponding direct mapped segment of the dynamic redundancy register.

In one embodiment, a memory device for storing data is disclosed. The memory device comprises a memory bank comprising a plurality of addressable memory cells, wherein the memory bank is divided into a plurality of segments. Further, the memory device comprises a pipeline configured to process write operations of a first plurality of data words addressed to the memory bank. The memory device also comprises a cache memory operable for storing a second plurality of data words and associated memory addresses, wherein the second plurality of data words are a subset of the first plurality of data words, wherein the cache memory is associated with the memory bank and wherein further each data word of the second plurality of data words is either awaiting write verification associated with the memory bank or is to be re-written into the memory bank, wherein the cache memory is divided into a plurality of primary segments, wherein each primary segment of the cache memory is direct mapped to a corresponding segment of the plurality of segments of the memory bank, wherein each primary segment of the plurality of primary segments of the cache memory is sub-divided into a plurality of secondary segments, and each of the plurality of secondary segments comprises at least one counter for tracking a number of valid entries stored therein, and wherein a secondary segment for storing a data word from the second plurality of data words is selected based on a selection criterion.

In another embodiment, a memory device for storing data is disclosed. The memory device comprises a plurality of memory banks, each comprising a plurality of addressable memory cells, wherein each of the plurality of memory banks is divided into a plurality of segments and a pipeline configured to process write operations of a first plurality of data words addressed to the plurality of memory banks. The memory device further comprises a cache memory operable for storing a second plurality of data words and associated memory addresses, wherein the second plurality of data words are a subset of the first plurality of data words, wherein the cache memory is associated with the plurality of memory banks and wherein further each data word of the second plurality of data words is either awaiting write verification associated with a bank from the plurality of memory banks or is to be re-written into a bank from the plurality of memory banks, wherein the cache memory is divided into a plurality of primary segments, wherein each primary segment of the cache memory is direct mapped to a corresponding segment of the plurality of segments of the plurality of memory banks, wherein each primary segment of the plurality of primary segments of the cache memory is sub-divided into a plurality of secondary segments, wherein each of the plurality of secondary segments comprises at least one counter for tracking a number of valid entries stored therein, and wherein a secondary segment from the plurality of secondary segments is selected for performing an access operation based on a selection criterion.

In a different embodiment, a memory device comprises a memory bank comprising a plurality of magnetic random access memory (MRAM) cells, wherein each memory cell is configured to store a data word at a respective one of a plurality of memory addresses, and wherein the memory bank is divided into a plurality of segments. The memory device also comprises a dynamic redundancy register comprising data storage elements, wherein the dynamic redundancy register is divided into a plurality of primary segments, wherein each primary segment of the dynamic redundancy register is direct mapped to a corresponding segment of the plurality of segments of the memory bank, wherein each primary segment of the plurality of primary segments of the dynamic redundancy register is sub-divided into a plurality of secondary segments, and wherein each of the plurality of secondary segments comprises at least one counter for tracking a number of entries in a respective secondary segment. Further, the memory device comprises a pipeline bank coupled to the memory bank and the dynamic redundancy register, wherein the pipeline bank is configured to: a) write a data word into a segment of the memory bank that corresponds to a selected address of the plurality of memory addresses; b) verify the data word written into the memory bank to determine whether the data word was successfully written; and c) responsive to a determination that the data word was not successfully written, writing the data word and the selected address into a selected secondary segment of a selected primary segment of the dynamic redundancy register, wherein the selected primary segment directly maps to the segment of the memory bank associated with the selected address of the data word, and wherein the selected secondary segment is selected based on a selection criteria.

In one embodiment, a memory device comprises a memory bank comprising a plurality of addressable memory cells, wherein the memory bank is divided into a plurality of segments, and a pipeline configured to process write operations of a first plurality of data words addressed to the memory bank. The memory device also comprises a cache memory operable for storing a second plurality of data words and associated memory addresses, wherein the second plurality of data words are a subset of the first plurality of data words, wherein the cache memory is associated with the memory bank and wherein further each data word of the second plurality of data words is either awaiting write verification associated with the memory bank or is to be re-written into the memory bank, wherein the cache memory is divided into a plurality of primary segments, wherein each primary segment of the cache memory is direct mapped to a corresponding segment of the plurality of segments of the memory bank, wherein each primary segment of the plurality of primary segments of the cache memory is sub-divided into a plurality of secondary segments, and wherein each of the plurality of secondary segments comprises at least one counter for tracking a number of entries stored therein. Further, the memory device comprises a logic module operable to: a) determine a first primary segment of the plurality of primary segments of the cache memory for performing an access operation; and b) select a first secondary segment from the plurality of secondary segments within the first primary segment for performing the access operation, wherein the first secondary segment is selected based on a value of a counter of the selected secondary segment.

In another embodiment, a memory device comprises a plurality of memory banks comprising a plurality of addressable memory cells, wherein each of the plurality of memory banks is divided into a plurality of segments, and a pipeline configured to process write operations of a first plurality of data words addressed to the plurality of memory banks. The memory device further comprises a cache memory operable for storing a second plurality of data words and associated memory addresses, wherein the second plurality of data words are a subset of the first plurality of data words, wherein the cache memory is associated with the plurality of memory banks and wherein further each data word of the second plurality of data words is either awaiting write verification associated with a memory bank from the plurality of memory banks or is to be re-written into a memory bank from the plurality of memory banks, wherein the cache memory is divided into a plurality of primary segments, wherein each primary segment of the cache memory is direct mapped to a corresponding segment of the plurality of segments of the memory bank, wherein each primary segment of the plurality of primary segments of the cache memory is sub-divided into a plurality of secondary segments, and wherein each of the plurality of secondary segments comprises at least one counter for tracking a number of entries in stored therein. Finally, the memory device comprises a logic module operable to: a) determine a first primary segment of the plurality of primary segments of the cache memory for performing an access operation; and b) select a first secondary segment from the plurality of secondary segments within the first primary segment for performing the access operation, wherein the first secondary segment is selected based on a value of a counter of the selected secondary segment.

In a different embodiment, a memory device comprises a memory bank comprising a plurality of addressable memory cells, wherein the memory bank is divided into a plurality of segments, and a pipeline configured to process write operations of a first plurality of data words addressed to the memory bank. The memory device also comprises a cache memory operable for storing a second plurality of data words and associated memory addresses, wherein the second plurality of data words are a subset of the first plurality of data words, wherein the cache memory is associated with the memory bank and wherein further each data word of the second plurality of data words is either awaiting write verification associated with the memory bank or is to be re-written into the memory bank, wherein the cache memory is divided into a plurality of primary segments, wherein each primary segment of the cache memory is direct mapped to a corresponding segment of the plurality of segments of the memory bank, wherein each primary segment of the plurality of primary segments of the cache memory is sub-divided into a plurality of secondary segments, and wherein each of the plurality of secondary segments comprises at least one counter for tracking a number of entries stored therein. Finally, the memory device comprises a logic module operable to: a) determine a first primary segment of the plurality of primary segments of the cache memory for performing an access operation; and b) select a first secondary segment from the plurality of secondary segments within the first primary segment for performing the access operation based on an address space that the first secondary segment maps to in the memory bank.

In one embodiment, a method of writing data into a memory device is disclosed. The method comprises utilizing a pipeline to process write operations of a first plurality of data words addressed to a plurality of memory banks, wherein each of the plurality of memory banks is associated with a counter. The method also comprises writing a second plurality of data words and associated memory addresses into an error buffer, wherein the second plurality of data words are a subset of the first plurality of data words, wherein the error buffer is associated with the plurality of memory banks and wherein further each data word of the second plurality of data words is either awaiting write verification associated with a bank from the plurality of memory banks or is to be re-written into a bank from the plurality of memory banks. Finally the method comprises maintaining a count in each of the plurality of counters for a respective number of entries in the error buffer corresponding to a respective memory bank.

In one embodiment, a memory device for storing data is disclosed. The memory device comprises a first and a second memory bank, each comprising a plurality of addressable memory cells, and a pipeline configured to process write operations of a first plurality of data words addressed to the first and second memory bank. The memory device also comprises a cache memory operable for storing a second plurality of data words and associated memory addresses, wherein the second plurality of data words are a subset of the first plurality of data words, wherein the cache memory is associated with the first and the second memory bank and wherein further each data word of the second plurality of data words is either awaiting write verification or is to be re-written into either the first or the second memory bank. Further, the memory device comprises a first counter associated with the first memory bank, wherein the first counter maintains a count for a number of entries in the cache memory corresponding to the first memory bank and a second counter associated with the second memory bank, wherein the second counter maintains a count for a number of entries in the cache memory corresponding to the second memory bank. The memory device also comprises a logic module operable to: a) determine if the pipeline is in a no-op cycle; b) responsive to a determination of the no-op cycle, determine which of the first counter or the second counter has a higher value; c) responsive to a determination that the first counter has a higher value, select a first memory bank as an inactive memory bank; and d) responsive to a determination that the second counter has a higher value, select a second memory bank as an inactive memory bank.

In a different embodiment, a memory device for storing data comprises a first and a second memory bank, each comprising a plurality of addressable memory cells, wherein the first and the second memory banks is each divided into a plurality of segments, and a pipeline configured to process write operations of a first plurality of data words addressed to the first and second memory bank and the process no-op cycles. The memory device also comprises a cache memory operable for storing a second plurality of data words and associated memory addresses, wherein the second plurality of data words are a subset of the first plurality of data words, wherein the cache memory is associated with the first and the second memory bank and wherein further each data word of the second plurality of data words is either awaiting write verification or is to be re-written into either the first or the second memory bank, wherein the cache memory is divided into a plurality of primary segments, wherein each primary segment of the cache memory is direct mapped to a corresponding segment of the plurality of segments of the first and the second memory banks, wherein each primary segment of the plurality of primary segments of the cache memory is sub-divided into a plurality of secondary segments, and wherein each of the plurality of secondary segments comprises a counter for keeping track of a number of entries in a respective secondary segment. Further, the memory device comprises a logic module operable to: a) determine if the pipeline is processing a no-op cycle; b) responsive to a determination of the no-op cycle, determine a sum of counter values of a respective plurality of secondary segments for each primary segment of the cache memory; c) selecting a first memory bank as the inactive memory bank if a highest summed counter value is associated with a primary segment that is associated with the first memory bank; and d) selecting a second memory bank as the inactive memory bank if a highest summed counter value is associated with a primary segment that is associated with the second memory bank.

These and other objects, features, aspects, and advantages of the embodiments will become better understood with reference to the following description and accompanying drawings. Moreover, the object, features, aspect, and advantages of the embodiments can be modified and combined without departing from the teachings of the present disclosure.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 43 depicts an exemplary embodiment for a process flow showing the manner in which an inactive memory bank is chosen for a no-op cycle in a memory with two or more memory banks in accordance with an embodiment of the present invention.

Figure 1:
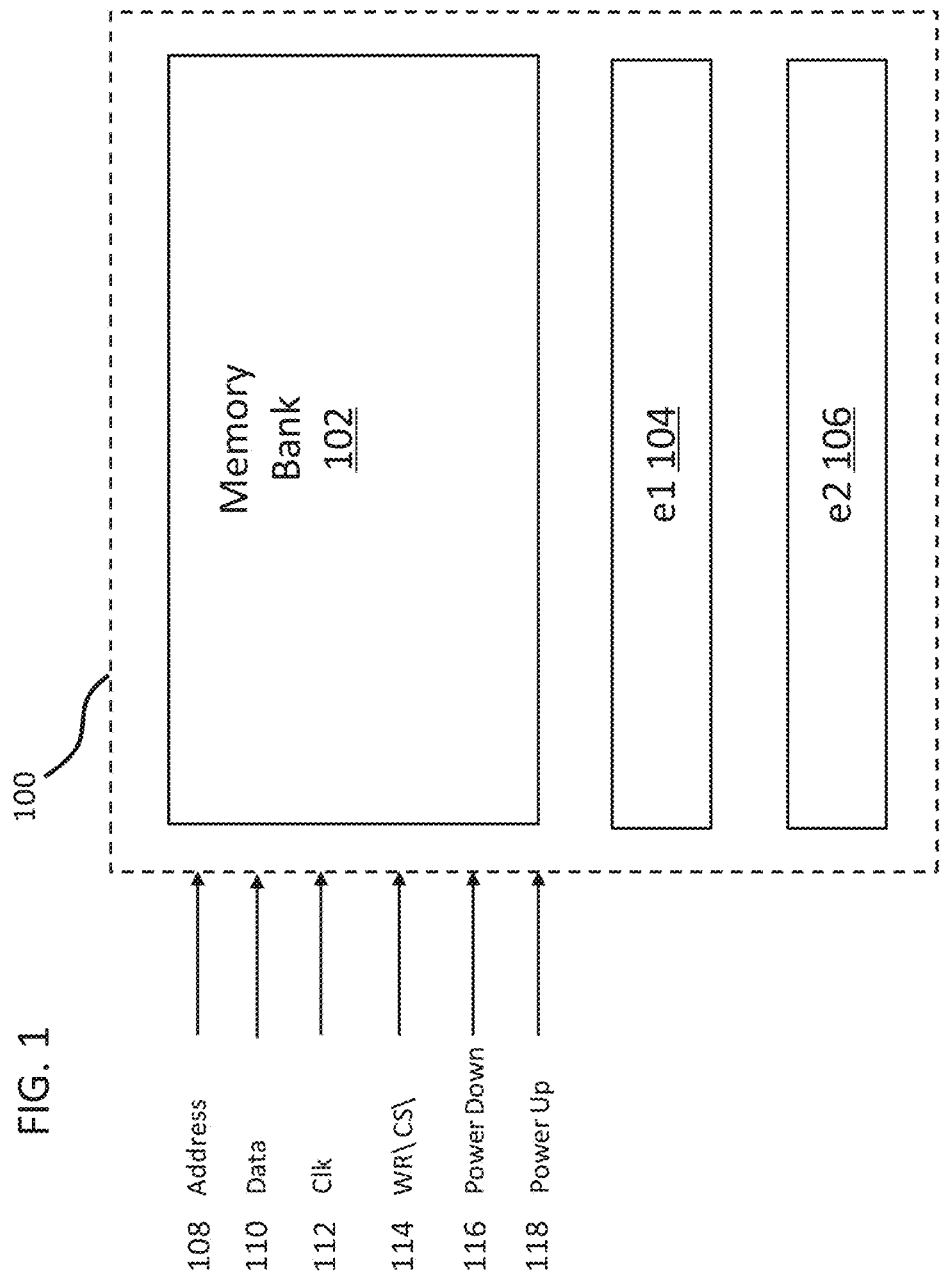
FIG. 1 is a block diagram of exemplary memory device of the present disclosure having redundancy registers.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use dynamic redundancy registers that allow devices, and especially magnetic semiconductor device such as an MRAM, to operate with high write error rate (WER). Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

FIG. 1 is a block diagram of exemplary memory device of the present disclosure having dynamic redundancy registers (e1 register 104 and e2 register 106, in this case). FIG. 1 shows memory devices 100 described herein that includes memory bank 102, e1 register 104, and e2 register 106. Moreover, memory device 100 communicates with data signals, for example, address signal 108, data word signal 110, clock signal 112, write and chip select signals 114, power down signal 116, power up signal 118. Note that FIG. 1 illustrates certain teachings of the present disclosure. However, it should be understood that the specific signals 108-118 illustrated may be modified by those with ordinary skill in the art without departing from the teachings of the present disclosure. Moreover, other communication interfaces, for example a double data rate (DDR) interface, to the memory device may be used. Although shown with only two dynamic redundancy registers here (e1 register 104 and e2 register 106) and one memory bank (memory bank 102), memory device 100 may comprise two or more dynamic redundancy registers and one or more memory banks. The two or more dynamic redundancy registers could be implemented using some combination e1 register 104 and e2 register 106. The two or more dynamic redundancy registers may also operate hierarchically or in parallel.

Memory bank 102 comprises an array of data storage elements comprising data bits and may be implemented by volatile or non-volatile RAM technologies such as static random-access memory (SRAM), dynamic random-access memory (DRAM), resistive random-access memory (RRAM), phase-change memory (PCM), MRAM, STT-MRAM, or other RAM technologies. In an exemplary embodiment, memory bank 102 may include an error correcting code block (not pictured). The teachings of the present disclosure are especially beneficial when memory bank 102 comprises STT-MRAM which suffers from an inherently stochastic write mechanism, wherein bits have certain probability of write failure on any given write cycle. The teachings of the present disclosure allow memory bank 102 to be operated with high WER. However, many such errors can be corrected using the teachings of the present disclosure. Operating with high WER may allow memory bank 102 to operate under other beneficial conditions. For example, memory bank 102 could operate under high write speed, low write voltage (which may enable higher bitcell endurance), reducing ECC bits, or increased ECC decode speed, among other beneficial conditions.

In one embodiment, memory bank 102 may comprise 65,536×50 addressable bits. Further, the 50 bits comprise a 32-bit data word and 18 parity bits for error correction. Operations may be performed on memory bank 102 including system read, system write, re-write and verify operations, among other data manipulations. A particular operation, for example a write operation, may occur at a particular address within memory bank 102. The operation may have a row address, indicating a word line, and a column address. The address for write operations may be communicated through a write port of memory bank 102. The address for read or verify operations may be communicated through a read port of memory bank 102.

In one embodiment, memory bank 102 comprises a pseudo-dual port memory bank allowing memory device 100 to simultaneously (e.g., substantially within a memory device clock cycle) perform a write operation and a verify operation sharing a common row (word line) address. System read operations to memory bank 102 generally supersede write and verify operations. Thus, system read operation would be performed before the scheduled write and verify operations. Write and verify operation could then happen on a subsequent clock cycle.

It should be noted that if a dual-port memory bank 102 is used, read and write operations may be simultaneously performed. In other words, a dual-port memory bank would also permit two write operations (or two read operations) to be performed simultaneously. By contrast, a pseudo-dual port memory bank can comprise two ports, however, both ports may not be designed to service the same operations. For example, typically a write operation requires a write driver with corresponding sense amplifiers that can support the higher current requirements of a write operation. In other words, a write driver tends to occupy more surface area on the chip as compared to a read driver because of the high current requirements for a write operation. A dual port memory bank optimizes both ports to support write operations, which, in turn, means that both ports can also support read operations because the requirements for read drivers are less stringent than for write drivers. A pseudo dual port memory bank, on the other hand, optimizes one of the ports to support a write operation and one of the ports to support a read operation. In the current case, because memory device 100 will be receiving a write and a verify operation sharing a common row (word line) address in the same clock cycle, a pseudo-dual port memory bank can be used to process the write and verify operation simultaneously.

The e1 register 104 is coupled to memory bank 102 and e2 register 106. The e1 register 104 comprises an array of data storage elements comprising data bits and may be implemented by volatile and non-volatile RAM technologies. The e1 register 104 may also comprise control bits and communicate using control signals that maintain consistency of operations within memory device 100. Typically, data is more reliably written to e1 register 104 than within memory bank 102. Thus, if memory bank 102 comprises STT-MRAM, then e1 register 104 might comprise SRAM. In other embodiments, e1 register may comprise non-volatile RAM such as STT-RAM. The e1 register may also comprise a dual-port STT-RAM to allow simultaneous read and write operations. In this case, e1 register 104 can run at the same cycle throughput speed as a memory bank. The e1 register 104 may also comprise content addressable memory (CAM). In one embodiment, the e1 register may be located off the memory chip and on a system card or even on the CPU. In other words, the e1 register can be located on a different chip besides the memory chip.

Generally, e1 register 104 stores data words and associated addresses for data in memory bank 102 that has not been verified or has failed verification. In one embodiment, e1 register 104 may store data words that have not been verified. For example, e1 register 104 receives a Row-Change signal that indicates row address change within a pipeline structure of the present disclosure. The RowChange signal indicates that the data word and the associated address from the pipeline structure should be stored within e1 register 104. The RowChange signal may also indicate that that another data word and associated address should be transmitted from e1 register 104 to the pipeline structure for a verify operation. If a pseudo-dual port memory bank is used, e1 register 104 may choose a data word and an associated address such that they share a common row address with a data word in the write register of the pipeline structure. In this way, a write operation and a verify operation can be simultaneously performed since the data words share a common row address.

In another embodiment, e1 register 104 may store data words that have failed verification. For example, the pipeline structure may transmit a signal to e1 register 104 indicating that a data word has failed to write (i.e., failed verification) to memory bank 102. The pipeline structure may also transmit data word and associated address (in the case that e1 register 104 does not already contain the data word and associated address) to e1 register 104 in order to later try to re-write the data word to memory bank 102. In another example, a read operation may occur and pipeline structure may determine that the read operation did not occur within a predetermined error budget. The pipeline structure may then transmit a signal indicating that the read operation failed and transmit the data word and associated address to e1 register 104 for storage.

From the preceding, one of ordinary skill in the art will understand that e1 register 104 may store data words and associated addresses for future verification. For example, a data word may not have had an opportunity to verify due to a row address change. Thus, e1 register 104 may transmit the data word and associated address to the pipeline structure of the present disclosure during some subsequent clock cycle to verify the data word. Typically, a control signal may indicate to e1 register 104 that a row address change will occur or that memory bank 102 will become inactive during subsequent clock cycles. The e1 register 104 may then determine the appropriate data word sharing a common row address with the data word to be written (in case of row address change) during the subsequent clock cycle. The e1 register 104 then transmits the data word and associated address to verify register of the pipeline structure. In one embodiment, e1 register 104 may also transmit the physical address within e1 register 104 if the data word is already stored within e1 register 104. In this way, control bits associated with the data word may be updated.

From the preceding, a person skilled in the art will understand that e1 register 104 may also store data words for future re-write attempts. The e1 register 104 may receive data words that have failed verification from the pipeline structure of the present disclosure. Memory device 100 may have attempted a write operation and the data word failed a verify operation. Memory device 100 may also have attempted a read operation and the data word may have failed to read within a specified error budget. In both cases, the pipeline structure of the present disclosure may transmit the data word to e1 register 104. Memory bank 102 may become inactive during a subsequent cycle. The e1 register 104 may then determine an appropriate data word to attempt to re-write to memory bank 102. In this case, e1 register 104 may transmit a data word and associated address to the pipeline structure. The e1 register 104 transmits the data word such that a write register could re-write the data word during the clock cycle that memory bank 102 would otherwise be inactive.

Generally, e1 register 102 may also relocate data words, associated addresses, and control bits to e2 register 106. If no more re-write attempts are desired, e1 register 104 may relocate data word and associated address to e2 register 106. The e1 register may also relocate data to memory bank 102 or e2 register 106 on power down so that data is stored in non-volatile memory in the case that e1 register 104 comprises volatile memory. The e1 register 104 may also relocate data to e2 register 106 in the case that e1 register 104 lacks space for data words.

The e1 register comprises control bits and communicates using control signals. In one embodiment, e1 register comprises valid bits indicating whether the associated data word is a valid entry within e1 register. In another embodiment, e1 register comprises fail count bits indicating the number of re-write attempts associated with a data word. In this way, memory device 100 may try only a specified number of re-write attempts. In another embodiment, e1 register comprises bits indicating that the associated data word has not been verified due to row address change and should be verified.

The e2 register 106 is coupled to e1 register 104 and may also be coupled to memory bank 102. The e2 register 106 comprises an array of data storage elements comprising data bits and may be implemented by volatile and non-volatile RAM technologies. The e2 register 106 may also comprise an ECC block and CAM. The e2 register 106 may comprise data words, associated addresses, and control bits. Typically, e2 register 106 will comprise a non-volatile memory technology, for example STT-MRAM. In one embodiment, the e2 register may be located off the memory chip and on a system card or even on the CPU. In other words, the e2 register can be located on a different chip besides the memory chip.

The e2 register 106 stores data words and associated addresses relocated from e1 register 104. In another embodiment, rather than storing data words and associated data words from e1 register 104, e2 register 106 remaps those data words to addresses within memory bank 102. For example, e2 register 106 may store remap addresses in memory bank 102. The e2 register 106 then temporarily stores a data word from e1 register and then writes it to an appropriate remap address in memory bank 102. When a data word should be read, e2 register contains the appropriate remap address for reading the data word from memory bank 102.

Data words and associated addresses may be relocated to e2 register 106 or remapped based on different conditions. In one embodiment, e1 register 104 relocates data words and associated addresses to e2 register 106 because the data words failed to write to memory bank 102 after the specified number of re-write attempts.

In another embodiment, e1 register 104 relocates data words and associated addresses to e2 register 106 because power down signal 116 indicates that data word and associated address should be moved to non-volatile memory, such as e2 register 106 comprising STT-MRAM. In one embodiment, e1 register 104 may attempt to process any pending verifies or re-write attempts associated with data words stored in e1 prior to relocating the contents of the e1 register to the e2 register upon receipt of the power down signal. In other words, when a power down signal is received, but before the chip powers down, the e1 register can, in one embodiment, attempt to process all the entries within the e1 register prior to storing the entries in the e2 register. For example, the e1 register may attempt sending data words associated with any pending re-write operations or verify operations to the pipeline structure to process them prior to moving them to the e2 register. Any operations that are successfully processed may then be deleted, overwritten or invalidated from the e1 register and would not need to be stored in the e2 register. Any operations that are not successfully processed on power down, will be stored in the e2 register.

In another embodiment, e1 register 104 relocates data words and associated addresses to e2 register 106 because e1 register 104 lacks space. One of ordinary skill in the art will understand that desired control bits may also be relocated with associated data word. In another embodiment, if data word fails to write to a physical address within e2 register 106 after a predetermined number of write attempts a different physical address may be chosen for data word.

The e2 register 106 may also be coupled to an input register of a pipeline structure. In this way, e2 register 106 may receive control signals indicating that a write operation for a data word sharing a common associated address with a data word within e2 register 106 may be occurring. Thus, control bits within e2 register 106 may indicate that a data word within e2 register 106 is invalid because of a system write operation.

Memory device 100 also communicates using exemplary signals 108-118. Address signal 108 comprises address within memory bank 102 of data to be written to or read from (or otherwise manipulated). Data word signal 110 comprises a data word to be written to (or otherwise manipulated) memory bank 102. Clock signal 112 comprises a memory device 100 clock signal or other clock signal (such as for specific components within memory device 100). Write and chip select signals 114 comprise signals used to determine the operation to be performed within memory bank 102. For example, if write signal is high and chip select signal is low a read operation might be performed on memory bank 102.

Power down signal 116 indicates whether power will be removed from memory device 100 or specific components within memory device 100. Thus, power down signal 116 may be used to determine that contents of e1 register 104 should be written to memory or e2 register 106. As mentioned above, the e1 register 104 may attempt to process any pending verifies or re-write attempts associated with data words stored in e1 prior to relocating the contents of the e1 register to the e2 register upon receipt of the power down signal but before the device powers down.

Power up signal 118 indicates that power is provided to memory device 100. Power up signal may indicate that e2 non-volatile memory contents should be loaded to e2 volatile memory. One of ordinary skill in the art will recognize that the specific signals 108-118 may be modified without departing from the present disclosure. In one embodiment, upon receipt of the power up signal and before loading the memory contents to e2 volatile memory, another attempt is made to process any pending verifies or re-write attempts associated with data words stored in the e2 register. If the e2 register is connected to the pipeline structure, the attempts to process the data words in the e2 register may occur directly from the e2 register. In a different embodiment, the e2 register may need to move its contents to the e1 register prior to attempting the verify and re-write operations through the pipeline.

Power down signal 116 may indicate that e2 register 106 volatile memory contents should be moved to e2 register 106 non-volatile memory. For example, e2 register 106 volatile memory contents not already stored in e2 non-volatile memory may be moved to e2 register 106 non-volatile memory. Again, in one embodiment, if the e2 register is connected to the pipeline structure, upon receipt of the power down signal, the e2 register may attempt to process any pending verify or re-write operations prior to moving the contents into non-volatile memory.

In another embodiment, power down signal 116 may indicate that e2 register 106 contents should be moved to non-volatile memory bank 102.

In another embodiment, power down signal 116 may indicate that certain data words within e1 register 104 should be verified to memory bank 102. In another embodiment, power down signal 116 indicates that certain data words within e1 register 104 should be re-written to memory bank 102. If the verify or re-write operations are unsuccessful, as mentioned above, the data words associated with those operations would then be moved to the e2 register upon power down.

Figure 9:
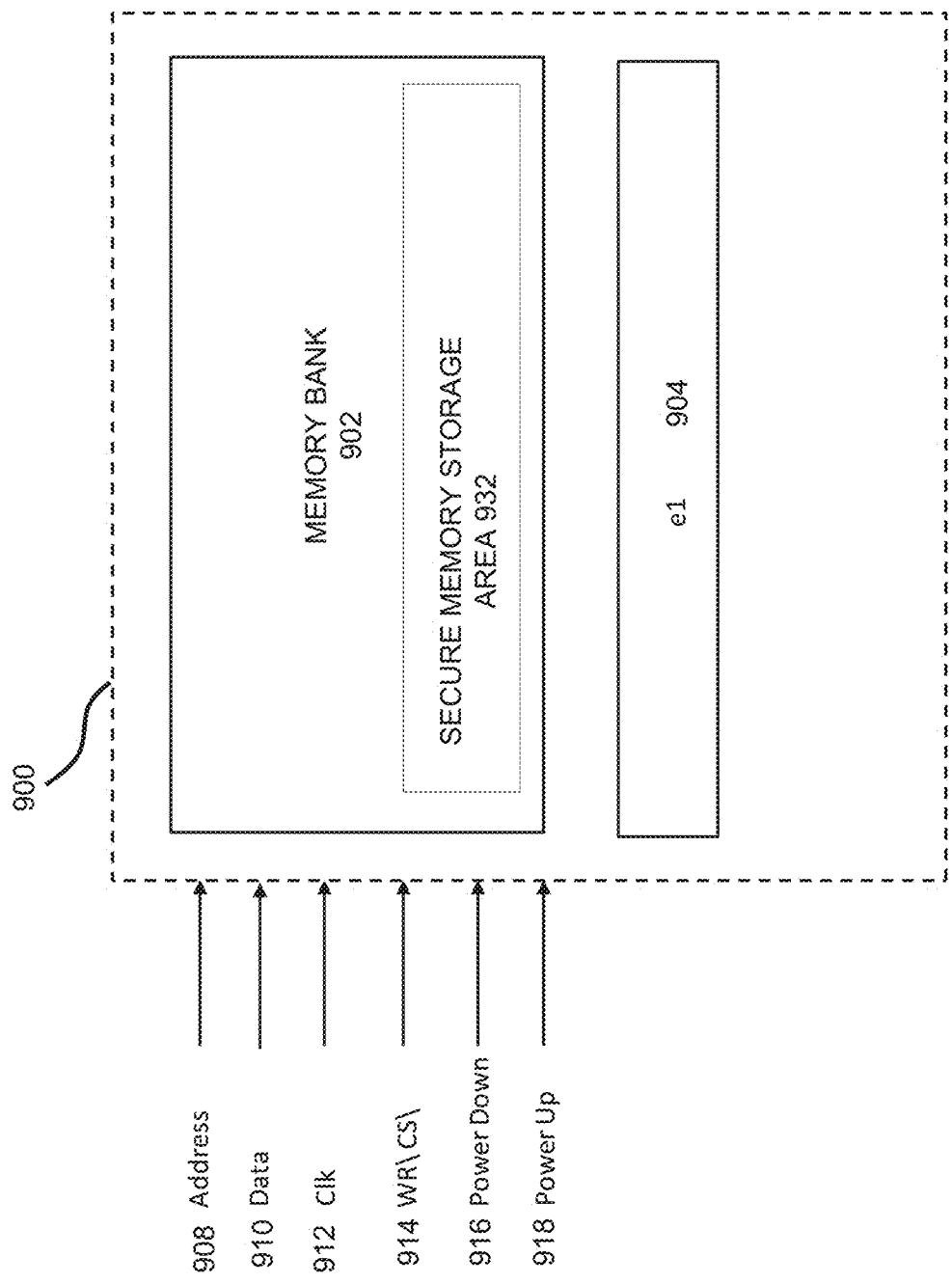
FIG. 9 is a block diagram of exemplary memory device of the present disclosure having a single redundancy register.

FIG. 9 is a block diagram of exemplary memory device of the present disclosure having a single dynamic redundancy register (e1 register 904 in this case). FIG. 9 shows memory devices 900 described herein that includes memory bank 902 and e1 register 904. As compared to the embodiment shown in FIG. 1, the embodiment of FIG. 9 does not comprise an e2 register. Instead memory bank 902 comprises a secure memory storage area 932 that may be reserved for the e1 register to relocate data words, associated addresses, and control bits. In one embodiment, the reserved secured memory storage area 932 performs substantially the same function as the e2 register described in FIG. 1. However, instead of dedicating a separate dedicated register, the e1 register is able to relocate its contents to a secured location in memory as will be further described below.

Additionally, memory device 900 communicates with data signals, for example, address signal 908, data word signal 910, clock signal 912, write and chip select signals 914, power down signal 916, and power up signal 918. Note that FIG. 9 illustrates certain teachings of the present disclosure. However, it should be understood that the specific signals 908-918 illustrated may be modified by those with ordinary skill in the art without departing from the teachings of the present disclosure. Moreover, other communication interfaces, for example a double data rate (DDR) interface, to the memory device may be used. Although shown with only one memory bank (memory bank 102), memory device 900 may comprise one or more memory banks. Note further that while write and chip select signals have been lumped into one signal 914 in FIG. 9, write, chip select and read may all comprise separate signals to memory device 900.

Memory bank 902 comprises an array of data storage elements comprising data bits and may be implemented by volatile or non-volatile RAM technologies such as static random-access memory (SRAM), dynamic random-access memory (DRAM), resistive random-access memory (RRAM), phase-change memory (PCM), MRAM, STT-MRAM, or other RAM technologies. In an exemplary embodiment, memory bank 902 may include an error correcting code block (not pictured). As noted above, the teachings of the present disclosure are especially beneficial when memory bank 902 comprises STT-MRAM which suffers from an inherently stochastic write mechanism, wherein bits have certain probability of write failure on any given write cycle. The teachings of the present disclosure allow memory bank 902 to be operated with high WER. However, many such errors can be corrected using the teachings of the present disclosure. Operating with high WER may allow memory bank 902 to operate under other beneficial conditions. For example, memory bank 902 could operate under high write speed, low write voltage (which may enable higher bitcell endurance), reducing ECC bits, or increased ECC decode speed, among other beneficial conditions.

In one embodiment, memory bank 902 may comprise 65,536×50 addressable bits for instance. Further, the 50 bits comprise a 32-bit data word and 18 parity bits for error correction. Operations may be performed on memory bank 902 including system read, system write, re-write and verify operations, among other data manipulations. A particular operation, for example a write operation, may occur at a particular address within memory bank 902. The operation may have a row address, indicating a word line, and a column address. The address for write operations may be communicated through a write port of memory bank 902. The address for read or verify operations may be communicated through a read port of memory bank 902.

In one embodiment, memory bank 902 comprises a pseudo-dual port memory bank allowing memory device 900 to simultaneously (e.g., substantially within a memory device clock cycle) perform a write operation and a verify operation sharing a common row (word line) address. System read operations to memory bank 902 generally supersede write and verify operations. Thus, system read operation would be performed before the scheduled write and verify operations. Write and verify operation could then happen on a subsequent clock cycle. As explained above, a pseudo-dual port memory bank can used to implement the write and verify operation on the same clock cycle.

The e1 register 904 is coupled to memory bank 902. The e1 register 904 comprises an array of data storage elements comprising data bits and may be implemented by volatile and non-volatile RAM technologies. The e1 register 904 may also comprise control bits and communicate using control signals that maintain consistency of operations within memory device 900. Typically, data is more reliably written to e1 register 904 than within memory bank 902. Thus, if memory bank 902 comprises STT-MRAM, then e1 register 904 might comprise SRAM. In other embodiments, e1 register may comprise non-volatile RAM such as STT-RAM. The e1 register may also comprise a dual-port STT- RAM to allow simultaneous read and write operations. In this case, e1 register 904 can run at the same cycle throughput speed as a memory bank. The e1 register 904 may also comprise content addressable memory (CAM).

Generally, e1 register 904 stores data words and associated addresses for data in memory bank 902 that have not been verified or have failed verification. In one embodiment, e1 register 904 may store data words that have not been verified. For example, e1 register 904 receives a RowChange signal that indicates row address change within a pipeline structure of the present disclosure. The RowChange signal indicates that the data word and the associated address from the pipeline structure should be stored within e1 register 904. The RowChange signal may also indicate that that another data word and associated address should be transmitted from e1 register 904 to the pipeline structure for a verify operation. If a pseudo-dual port memory bank is used, e1 register 904 may choose a data word and an associated address such that they share a common row address with a data word in the write register of the pipeline structure. In this way, a write operation and a verify operation can be simultaneously performed since the data words share a common row address.

In another embodiment, e1 register 904 may store data words that have failed verification. For example, the pipeline structure may transmit a signal to e1 register 904 indicating that a data word has failed to write (e.g., failed verification) to memory bank 902. The pipeline structure may also transmit data word and associated address (in the case that e1 register 904 does not already contain the data word and associated address) to e1 register 904 in order to later try to re-write the data word to memory bank 902. In another example, a read operation may occur and pipeline structure may determine that the read operation did not occur within a predetermined error budget. The pipeline structure may then transmit a signal indicating that the read operation failed to occur within the error budget and transmit the data word and associated address to e1 register 904 for storage.

From the preceding, one of ordinary skill in the art will understand that e1 register 904 may store data words and associated addresses for future verification. For example, a data word may not have had an opportunity to verify due to a row address change. Thus, e1 register 904 may transmit the data word and associated address to the pipeline structure of the present disclosure during some subsequent clock cycle to verify the data word. Typically, a control signal may indicate to e1 register 904 that a row address change will occur or that memory bank 902 will become inactive during subsequent clock cycles. The e1 register 904 may then determine the appropriate data word sharing a common row address with the data word to be written (in case of row address change) during the subsequent clock cycle. The e1 register 904 then transmits the data word and associated address to verify register of the pipeline structure. In one embodiment, e1 register 904 may also transmit the physical address within e1 register 904 if the data word is already stored within e1 register 904. In this way, control bits associated with the data word may be updated.

From the preceding, a person skilled in the art will understand that e1 register 904 may also store data words for future re-write attempts. The e1 register 904 may receive data words that have failed verification from the pipeline structure of the present disclosure. Memory device 900 may have attempted a write operation and the data word failed a verify operation. Memory device 900 may also have attempted a read operation and the data word may have failed to read within a specified error budget. In both cases, the pipeline structure of the present disclosure may transmit the data word to e1 register 904. Memory bank 902 may become inactive during a subsequent cycle. The e1 register 904 may then determine an appropriate data word to attempt to re-write to memory bank 902. In this case, e1 register 904 may transmit a data word and associated address to the pipeline structure. The e1 register 904 transmits the data word such that a write register could re-write the data word during the clock cycle that memory bank 902 would otherwise be inactive.

In the embodiment of FIG. 9, the e1 register 902 may relocate data words, associated addresses, and control bits to secure memory storage 932 in memory bank 902. If no more re-write attempts are desired, e1 register 904 may relocate data word and associated address to secure memory storage 332. The e1 register may also relocate data to secure memory storage 932 on power down so that data is stored in non-volatile memory in the case that e1 register 104 comprises volatile memory. As mentioned above, generally, e1 register 904 stores data words and associated addresses for data in memory bank 902 that have not been verified or have failed verification.

Processing Operations Pending in a Dynamic Redundancy Register Prior to Powering Down In one embodiment, upon receiving the power down signal, the e1 register 904 may attempt to perform all the pending operations associated with the data words stored in the e1 register prior to the device shutting down. For example, the e1 register may attempt to store all the data words to be re-written back into memory to the targeted locations in the memory bank 102 using the associated addresses for the data words (also stored within e1). It should be noted, however, that prior to attempting pending operations stored in the e1 register, the memory device will first flush out the pipeline and finish up any pending operations in the pipeline from before the power down signal was received.

Note that, in one embodiment, the power down signal originates from a system level software stack and represents a system wide orderly power down event. However, in a different embodiment, the power down signal may not be part of a system wide orderly power down event. In other words, an analog detector may be configured to monitor the power level of the chip (e.g., a VCC power supply pin) and initiate a power down sequence if the power level of the chip falls below a certain threshold level, e.g., falls 10% or more. Further, one or more capacitors may be configured to hold charge in order to sustain the power level above a threshold level, which allows the entire power down sequence to finish to completion.

In one embodiment, a status pin(s) or register may be configured that allows the system to determine whether a power down sequence is complete. This status pin(s) or register may be used whether the shut down sequence is a result of an orderly shut down process or not. The status pin(s) or register may, for example, be associated with a timer that is set to allow the system enough time to run the entire power down sequence to completion.

As mentioned above, the e1 register may comprise data words that have not yet been verified or that have failed verification. Upon receiving the power down signal, but before powering down, the e1 register may attempt to perform all the pending verify operations and move all the data words associated with pending re-write operations (e.g. operations that have failed verification) stored within it to the appropriate corresponding locations in the memory bank. In this embodiment, the power down sequence will typically take longer because it may take a few cycles for the e1 register to attempt to perform all the pending verify or re-write operations. In one embodiment, the power down signal 916 from the user or system warns the e1 register 904 to expect a shut down sequence. Upon notification of the power down signal, the e1 register can then attempt to perform the pending verify and re-write operations. In one embodiment, an option bit (or bits) or pin(s) (not shown) is provided to the user to disable the processing of the contents of the e1 register prior to shutting down. For example, if a user wants to avoid a long power down sequence, an option may be provided to disable this scheme. By way of further example, the option bit(s) may be used to disable the scheme during a test mode.

In one embodiment, the e1 register may simply transmit the data words to the appropriate registers in the pipeline structure. For example, a data word to be re-written into the memory bank may be transmitted to the write register in the pipeline from the e1 register. From the pipeline, the data can be directed to the targeted locations within the memory bank 902.

Another data word to be verified may be transferred to the verify register in the pipeline. Further details regarding the pipeline are provided in connection with FIG. 5.

In one embodiment, if the verify operations or the attempt to re-write the data words back to memory succeed, the corresponding entries for the data words in the e1 register may be deleted prior to shutting down. In other words, any data words that were successfully re-written or verified can be deleted from the e1 register prior to shutting down. Any data words in the e1 register that could not be successfully re-written or verified prior to shutting down will be stored in secure memory storage area 932. In one embodiment, where e1 comprises volatile memory, the data words that were successfully re-written or verified do not need to be pro-actively deleted, instead they will be deleted automatically once the power down sequence completes.

Memory bank 902 can comprise a secure area reserved for e1 register to transfer its contents into upon shutting down. In one embodiment, the memory device 900 ensures that data is written securely to the secure memory storage area 932 by using one or multiple schemes including voting, error-correcting code (ECC), or storing multiple copies. For example, in one embodiment, multiple copies of each of the data words can be written into secure memory storage area 932. When one of the data words needs to be read, each of the copies of the data word are read from the secure memory storage area and compared to determine if the data between all the copies is consistent. In case of inconsistency, a voting scheme is used to determine the correct data word. In other words, the most frequently occurring version of the data word between the various copies is selected as the data word. In another embodiment, ECC is used to ensure that the data words are error corrected to ensure that they are written accurately into the secure memory storage area 932.

Processing Operations Pending in Secured Memory Location Upon Powering Up Using a Dynamic Redundancy Register In one embodiment, upon power up of the memory device and receipt of power up signal 918, but before the device enters mission mode (or starts accepting commands), another attempt can be made to perform all the pending re-write or verify using the associated addresses for the data words. As mentioned previously, subsequent to powering down, the secure memory storage area will comprise data words (with their associated addresses) that have not yet been verified or that have failed verification. The pending re-write or verify operations will now be stored in non-volatile memory in secure memory storage area 932 where they were re-located to following power down. The verify and re-write operations can be directly attempted from the secure memory storage area 932 or they can be recalled to the e1 register prior to processing the pending operations.

If the contents of secure storage area 932 are moved to the e1 register prior to re-attempting the pending operations, subsequent to the receipt of the power up signal 918, the e1 register may attempt to perform all the pending verify operations and move all the data words associated with pending re-write operations (e.g. operations that have failed verification) to the appropriate corresponding locations in the memory bank.

Alternatively, secure memory storage area 932 may be connected to the pipeline structure and the data words for the pending operations can be directed directly from secure memory storage area 932 to the pipeline structure. For example, a re-write operation can be sent directly from the secure memory storage area to a write register in the pipeline structure. Similarly, a pending verify operation may be sent to a verify register in the pipeline structure directly from the secure memory storage area. The verify and re-write operations that do not complete successfully can be transferred to the e1 register. In other words, the verify and re-write operations that cannot complete in the specified amount of time are transferred to the e1 register.

It should be noted that power up sequence in this scheme will typically take longer because it may take a few cycles to attempt to perform all the pending verify or re-write operations.

In one embodiment, an option bit(s) or pin(s) (not shown) can be set to determine whether to enable or disable this feature. Some users, for example, may not want a long power up sequence. In such cases, an option bit may be provided to users to disable this feature.

In one embodiment, the data words associated with pending operations may be simply transmitted to the appropriate registers in the pipeline structure (from either the e1 register or the secured memory storage). From the pipeline, the data can be directed to their targeted locations within the memory bank 902.

In one embodiment, if the attempt to verify or write the data words back to memory on power up succeeds, the corresponding entries for the data words in the secure memory storage area 932 or the e1 register may be deleted prior to shutting down. In other words, any data words that were successfully re-written or verified can be deleted from both the secure memory storage area 932 and the e1 register 904. Any data words that could not be successfully re-written or verified subsequent to powering up will be stored in the e1 register.

Performing a Blind Save into a Dynamic Redundancy Register on Power Down and a Blind Recall into a Dynamic Redundancy Register on Power Up In one embodiment, instead of attempting to process entries in the e1 register on power down, the memory device blindly transfers all the contents of the e1 register into secure memory storage area 932 on power down. As mentioned previously, the power down signal 916 can be used to indicate that a power down sequence is expected. In response to the power down signal, e1 register 904 can dump the entirely of its contents into secure memory storage area 932. The blind save on power down will typically require more time than a regular power down sequence, but will not consume as many cycles as trying to execute pending operations in the e1 register prior to shut down.

In one embodiment, the memory device 900 ensures that data is written securely to the secure memory storage area 932 by using one or multiple schemes including voting, error-correcting code (ECC), or storing multiple copies. For example, in one embodiment, multiple copies of each of the data words can be written into secure memory storage area 932. When one of the data words needs to be read, each of the copies of the data word are read from the secure memory storage area and compared to determine if the data between all the copies is consistent. In case of inconsistency, a voting scheme can be used to determine the correct data word. In other words, the most frequently occurring version of the data word between the various copies is selected as the data word. In another embodiment, ECC is used to ensure that the data words are error corrected to ensure that they are written accurately into the secure memory storage area 932.

In one embodiment, instead of attempting to process pending verify and re-write entries from the secure memory storage area 932 on power up, the memory device blindly transfers all the contents from the secure area of the memory array into the e1 register. In other words, no attempt is made to process the operations associated with the data words stored in the secure memory storage area 932 on power up. The data words are simply saved to the e1 register.

It should be noted that the design for memory device 900 does not necessitate attempting pending verify and re-write operations on both shut down and power up. In other words, memory device may attempt to process pending re-write and verify operations only on power up, but not on power down. Alternatively, in one embodiment, memory device may attempt pending operations only on power down, but not during the power up sequence (e.g., not before the device enters mission mode). In a different embodiment, memory device may attempt pending operations both on power down and power up. In cases where the pending verify and re-write operations are not processed, the corresponding data words are either transferred directly from the e1 register to the secure memory storage area 932 (on power down) or from the secure memory storage area to the e1 register (on power up).

The e1 register 904 may also relocate data to secure memory storage 932 in the case that e1 register 904 lacks space for data words. The e1 register comprises control bits and communicates using control signals. In one embodiment, e1 register comprises valid bits indicating whether the associated data word is a valid entry within e1 register. In another embodiment, e1 register comprises fail count bits indicating the number of re-write attempts associated with a data word. In this way, memory device 900 may try only a specified number of re-write attempts. In another embodiment, e1 register comprises bits indicating that the associated data word has not been verified due to row address change and should be verified.

Memory device 900 also communicates using exemplary signals 908-918. Address signal 908 comprises address within memory bank 902 of data to be written to or read from (or otherwise manipulated). Data word signal 910 comprises a data word to be written to (or otherwise manipulated) memory bank 902. Clock signal 912 comprises a memory device 900 clock signal or other clock signal (such as for specific components within memory device 900). Write and chip select signals 914 comprise signals used to determine the operation to be performed within memory bank 902. For example, if write signal is high and chip select signal is low a read operation might be performed on memory bank 902. Note that in such case write and chip select signals can be separate signals.

Power down signal 916 indicates whether power will be removed from memory device 900 or specific components within memory device 900 in accordance with an orderly shut down. Thus, power down signal 916 may be used to determine that contents of e1 register 904 should be written to secure memory storage area 932 as detailed above. Further, as detailed above, in one embodiment, power down signal 916 may indicate that certain data words within e1 register 904 should be verified to memory bank 902. In another embodiment, power down signal 916 indicates that certain data words within e1 register 904 should be re-written to memory bank 902.

Power up signal 918 indicates that power is provided to memory device 900. Power up signal may indicate that contents of the non-volatile secure memory storage area 932 should be loaded to the e1 volatile memory. Further, as detailed above, in one embodiment, power up signal 918 may indicate that certain data words within secure memory storage 932 should be verified to memory bank 902. In another embodiment, power up signal 918 indicates that certain data words within secure memory storage 932 should be re-written to memory bank 902.

One of ordinary skill in the art will recognize that the specific signals 908-918 may be modified without departing from the present disclosure.

Figure 10:
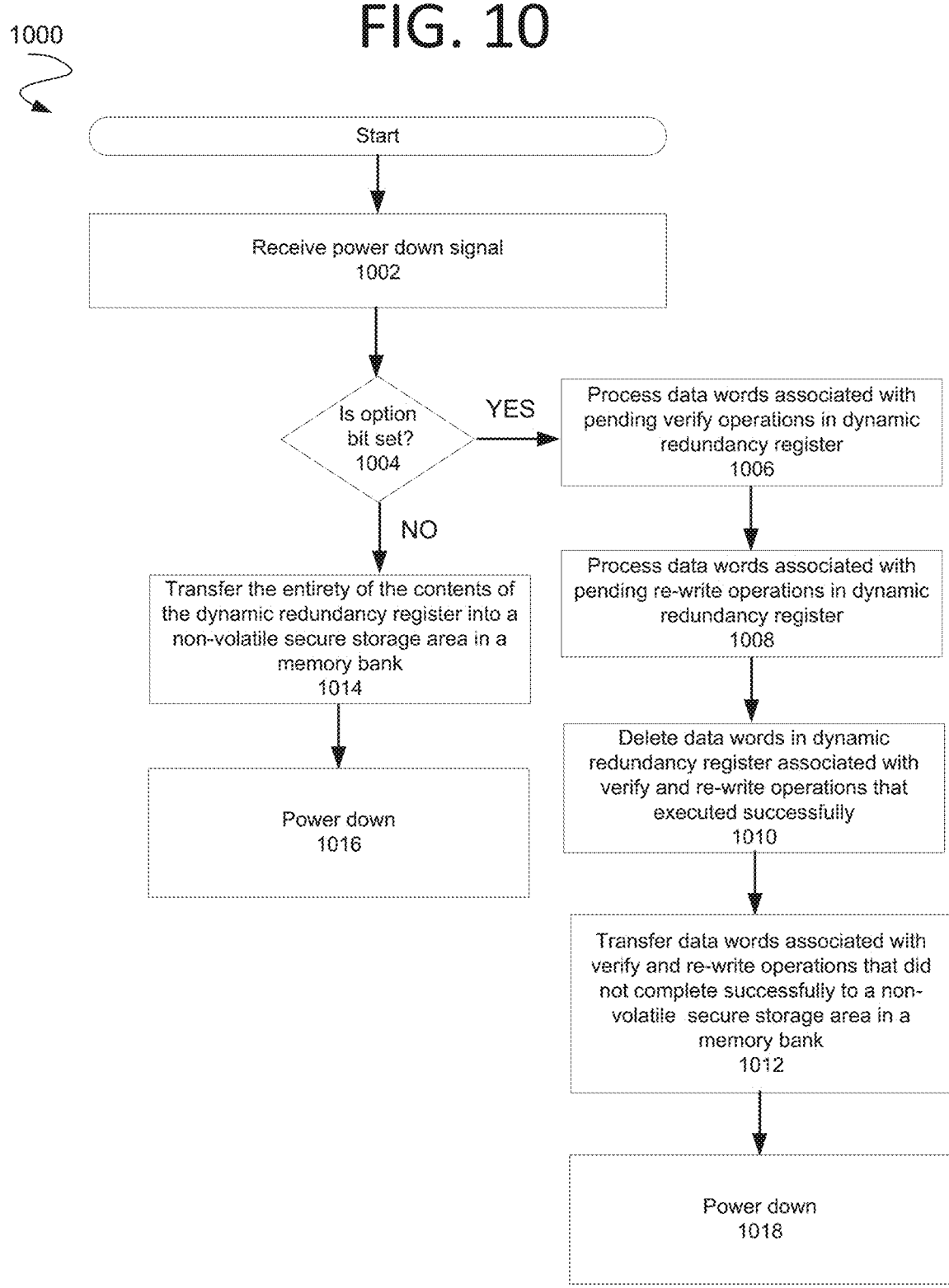
FIG. 10 depicts an exemplary embodiment for a process flow showing the processing of pending memory related operations in a dynamic redundancy register on power down in an exemplary memory device of the present disclosure.

FIG. 10 depicts an exemplary embodiment for a process flow 1000 showing the processing of pending memory related operations in a dynamic redundancy register on power down in an exemplary memory device of the present disclosure.

At step 1002, a power down signal 916 is received. As stated above, the power down signal originates from a system level software stack and represents a system wide orderly power down event. In a different embodiment, the power down sequence is initiated when an analog detector detects that the operating power of the chip has fallen below a threshold level as noted above. At step 1004, the memory device 900 determines if an option bit or pin is set for enabling the processing of pending operations in a dynamic redundancy register prior to shutting down.

If the option bit or pin is set, then at step 1006 the memory device processes data words associated with pending verify operations in the e1 register 904. In other words, any verifies for which corresponding data words and addresses are stored in the e1 register 904 are attempted prior to powering down. Similarly, at step 1008, the memory device processes any pending re-write operations in the e1 register. Data words corresponding to any verifies or re-writes that are successful are deleted from the dynamic redundancy register at step 1010. As noted above, if the dynamic redundancy register comprises volatile memory then a pro-active deletion step is not necessary. At step 1012, the remaining data words, if any, corresponding to operations that did not complete successfully are transferred to non-volatile secure memory storage area 932. As noted previously, operations may not complete successfully because of certain specification mandated time limits on the power down sequence. At step 1018, the memory device is ready for power down and/or powers down.

Alternatively, if at step 1004, the option bit is not set, then at step 1014 all the contents of the e1 register are re-located directly to the non-volatile secure memory storage area 932 without attempting any of the verify and re-write operations associated with data words stored in the e1 register. At step 1016, the memory device powers down.

Figure 11:
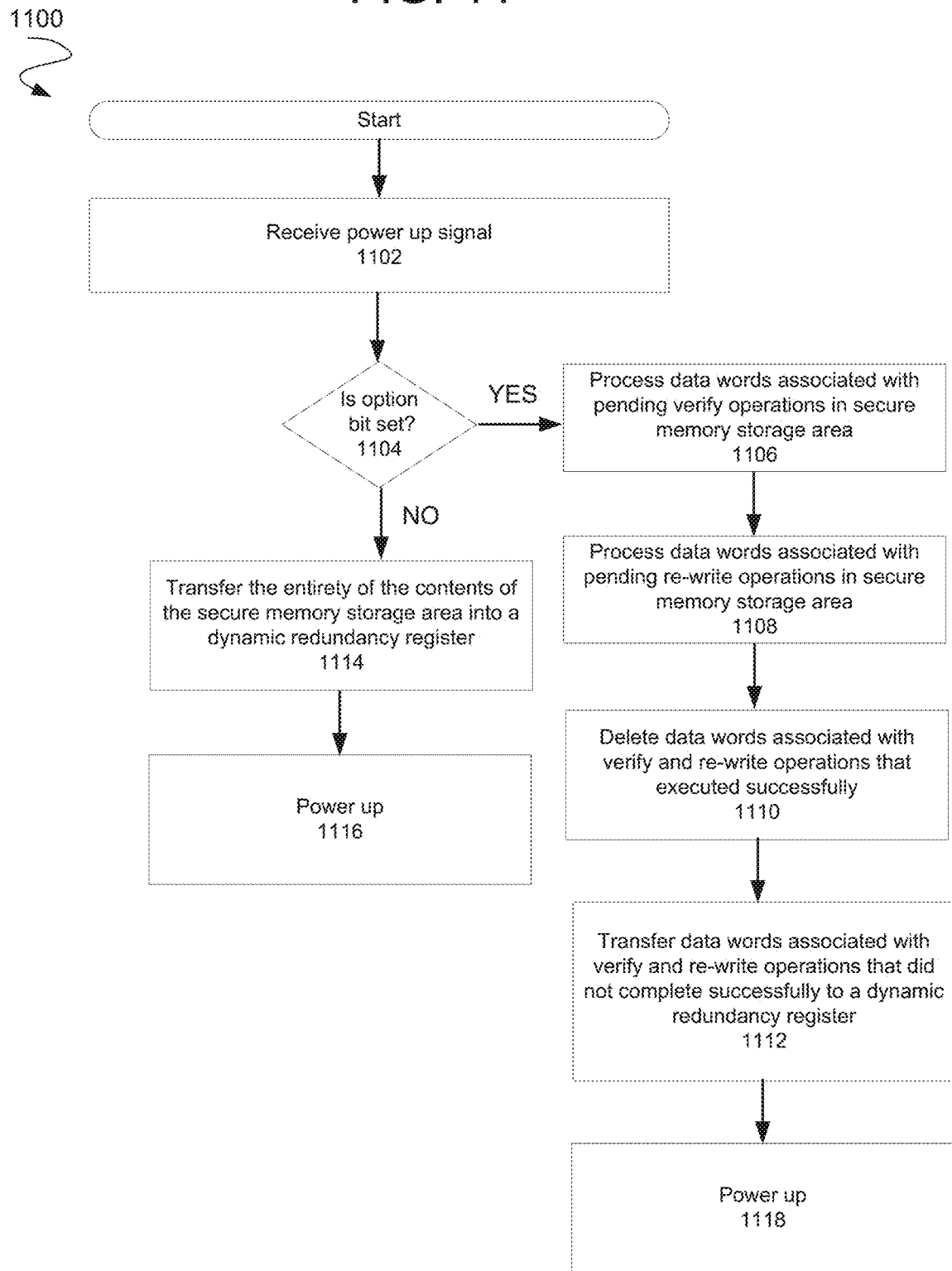
FIG. 11 depicts an exemplary embodiment for a process flow showing the processing of pending memory related operations in a secure memory storage area on power up using a dynamic redundancy register in an exemplary memory device of the present disclosure.

FIG. 11 depicts an exemplary embodiment for a process flow 1100 showing the processing of pending memory related operations in a secure memory storage area on power up using a dynamic redundancy register in an exemplary memory device of the present disclosure.

At step 1102, a power up signal 918 is received from system level resources. At step 1104, the memory device 900 determines if an option bit is set for enabling the processing of pending operations in a secure memory storage area using a dynamic redundancy register prior to powering up.

If the option bit is set, then at step 1106 the memory device processes data words associated with pending verify operations in the secure memory storage area 932. In other words, any verifies for which corresponding data words and addresses are stored in the secure memory are attempted prior to powering up. Similarly, at step 1008, the memory device processes any pending re-write operations in the secure memory area 932. As noted above, the data words and addresses associated with the pending verify and re-write operations can be injected directly into the pipeline structure from the secure memory storage area. Alternatively, in a different embodiment, the verify and re-write operations can be attempted by first transferring the corresponding data words and addresses to a dynamic redundancy register, e.g. the e1 register, then to the pipeline.

Data words corresponding to any verifies or re-writes that are successful are deleted from the secure memory storage area 932 (or the e1 register if transferred there prior to attempting the operations) at step 1110. If the verifies and re-writes are attempted directly from the secure memory storage, then at step 1112, the remaining data words corresponding to operations that did not complete successfully are transferred to the e1 register. As noted previously, operations may not complete successfully because of certain specification mandated time limits on the power up sequence. At step 1112, the memory device is ready to power up and/or powers up.

Alternatively, if at step 1104, the option bit is not set, then at step 1114 all the contents of the secure memory storage area 932 are re-located directly to the dynamic redundancy register without attempting any of the verify and re-write operations associated with data words stored in the secure memory storage. At step 1116, the memory device powers down.

Figure 12:
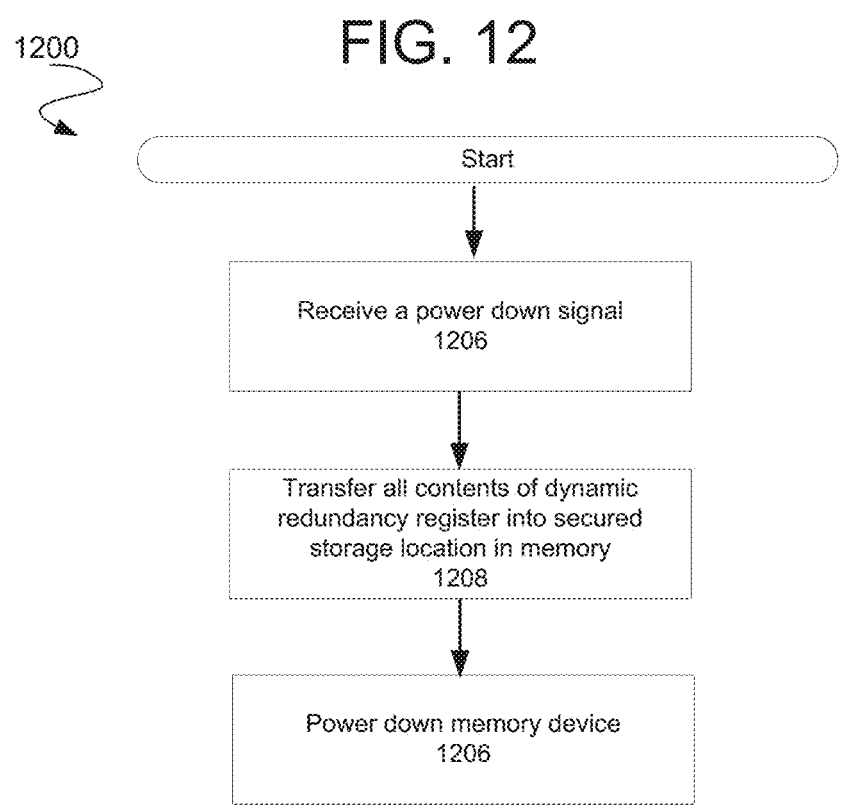
FIG. 12 depicts an exemplary embodiment for a process flow showing the processing of performing a blind save of the contents of a dynamic redundancy register on power down in an exemplary memory device of the present disclosure.

FIG. 12 depicts an exemplary embodiment for a process flow 1200 showing the processing of performing a blind save of the contents of a dynamic redundancy register on power down in an exemplary memory device of the present disclosure. Upon receipt of a power down signal 916 at step 1206, all the contents of the dynamic redundancy register (e.g. the e1 register) are transferred to secure storage location 932 without attempting to perform any of the operations associated with the data words stored in the e1 register. At step 1206, the memory device is then powered off.

Figure 13:
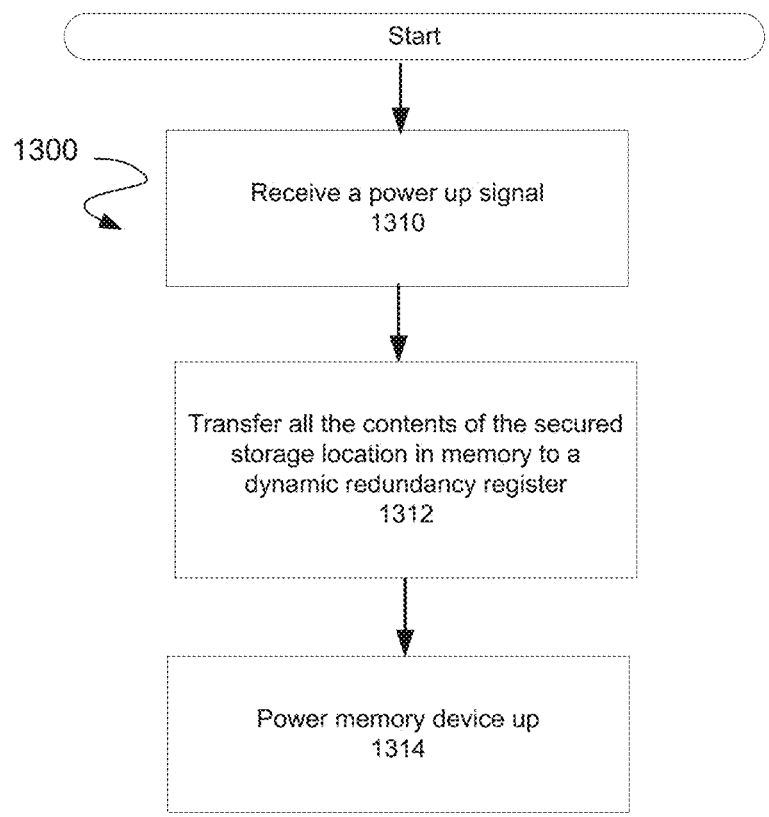
FIG. 13 depicts an exemplary embodiment for a process flow showing the processing of performing a blind recall of the contents of the memory bank into a dynamic redundancy register on power up in an exemplary memory device of the present disclosure.

FIG. 13 depicts an exemplary embodiment for a process flow 1300 showing the processing of performing a blind recall of the contents of the memory bank into a dynamic redundancy register on power up in an exemplary memory device of the present disclosure. Upon receipt of a power up signal 918 at step 1310, at step 1312, all the contents of the secure memory storage area 932 are transferred to the dynamic redundancy register (e.g. the e1 register) without attempting to perform any of the operations associated with the data words stored in the secure memory storage area. At step 1314, the memory device is then powered off.

Figure 2:
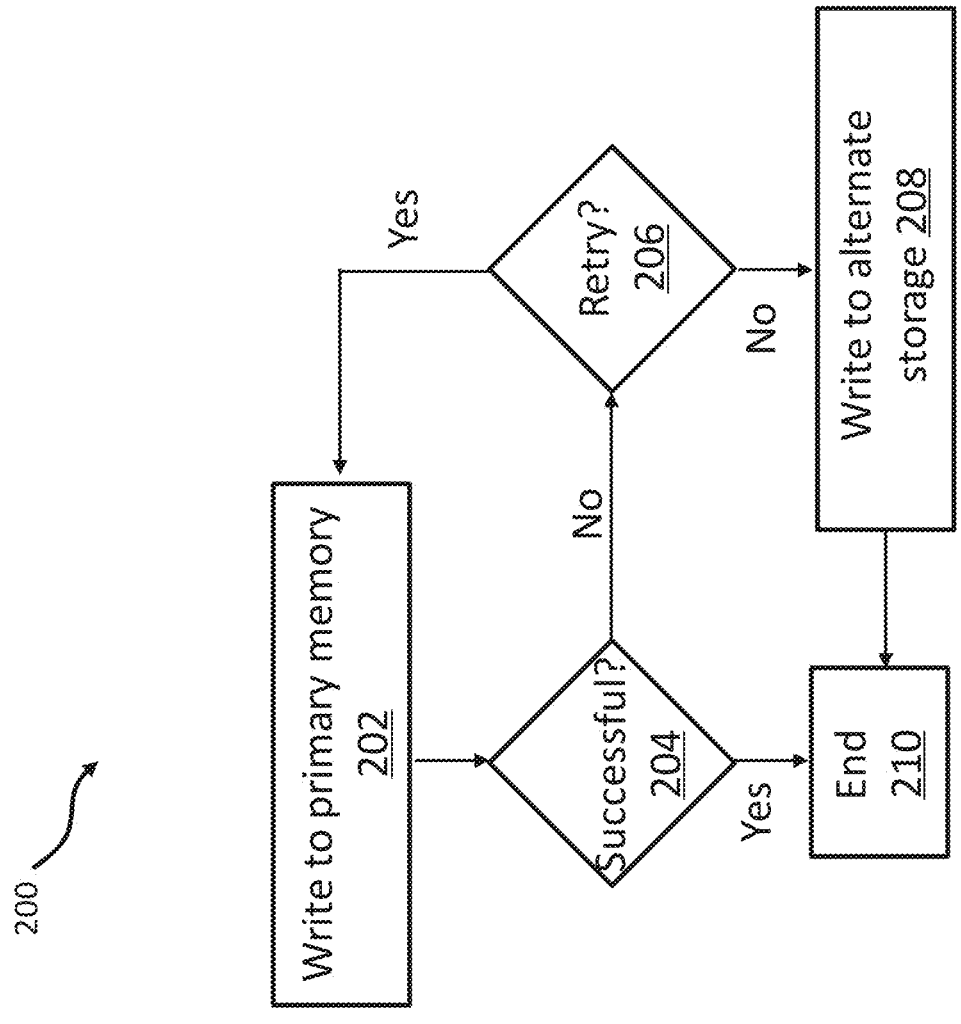
FIG. 2 is an exemplary embodiment for a process flow showing a write operation using exemplary memory device of the present disclosure and illustrates the high-level write operation performed on a memory device.

FIG. 2 depicts an exemplary embodiment for a process flow showing a write operation using an exemplary memory device of the present disclosure and illustrates the high-level write operation performed on a memory device. In step 202, a write operation to be performed on primary memory (e.g., input register to memory bank 102) exists within a memory device. In step 202, the system write operation may be performed on primary memory. In step 204, it is determined whether system write operation was successful. For example, a verify operation could determine whether the write operation successfully occurred (for example, whether the data word was written with an acceptable error budget or perfectly) within primary memory. If the write operation was successful, process flow 200 proceeds to end step 210. On the other hand, if the write operation was unsuccessful, a determination is made whether write operation should be retried in step 206. One retry is illustrated during process flow 200 of FIG. 2, but as many tries to write data into memory bank may be tried as desired (0 to n retries). If a retry should be tried, the data will be written from e1 register to primary memory when process flow 200 returns to step 202. From this description a person having ordinary skill in the art will understand the operation of steps 202-206 and 210. However, in some instances, a write operation from e1 register to primary memory may be unsuccessful despite the total desired number of retries. In that case, if a determination is made at step 206 that no more tries should be made to write data from e1 register to primary memory, process flow 200 will proceed to step 208. In step 208, data is written to alternate storage (e.g., from e1 register to e2 register).

Figure 3:
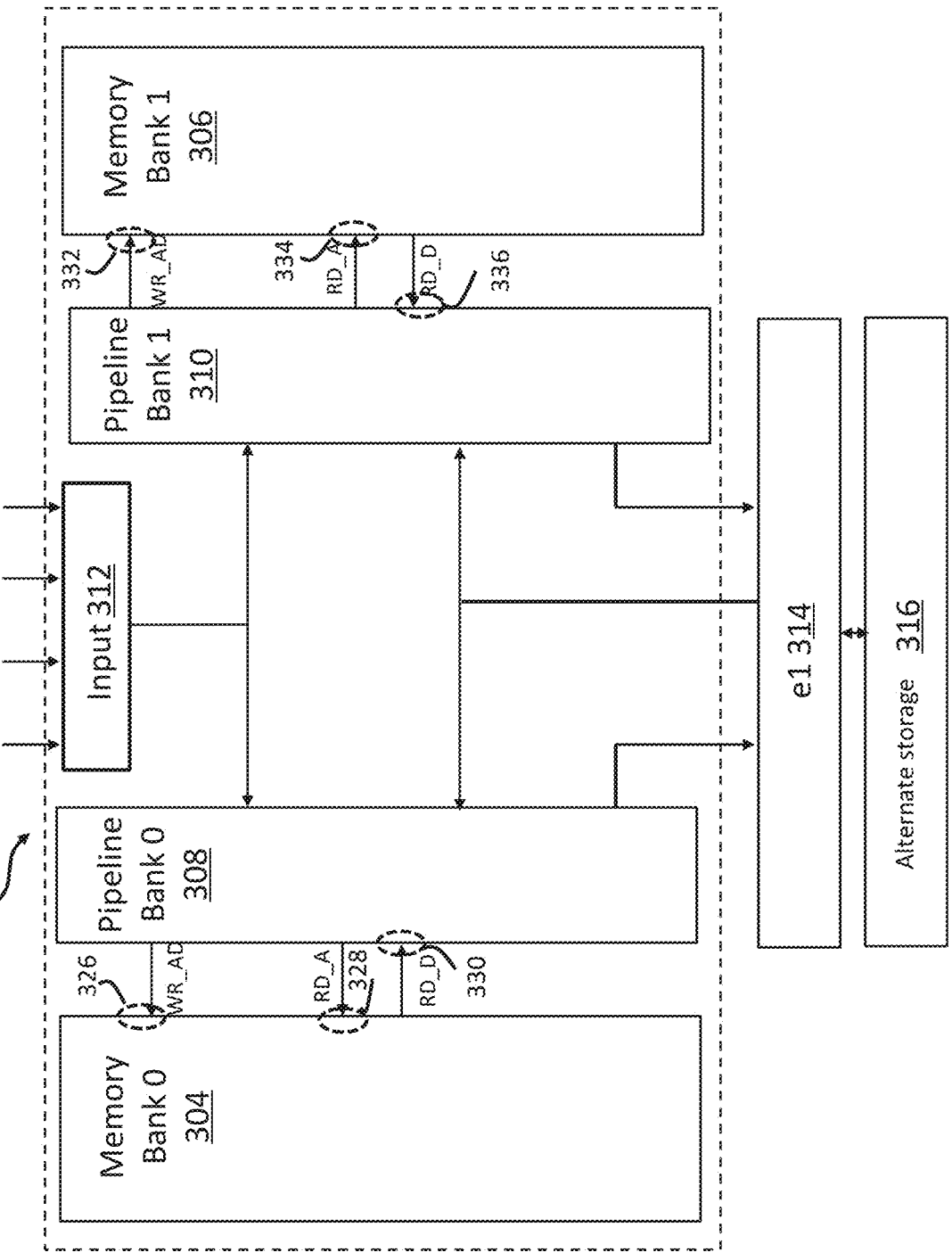
FIG. 3 is a block diagram of exemplary embodiment of a memory device of the present disclosure having dynamic redundancy registers.

FIG. 3 is a block diagram of exemplary embodiment of a memory device 300 of the present disclosure having dynamic redundancy registers. FIG. 3 is a block diagram of memory device 300 described herein that include memory banks 304 and 306, pipeline banks 308 and 310, input register 312, e1 register 314, and e2 register 316. Memory device 300 communicates using signals 318-324. Memory device 300 includes ports 326-336 for performing read, write, and verify (or other data manipulation) operations on memory banks 304 and 306. Memory device 300 is described herein to describe aspects of the present disclosure. One of ordinary skill would understand how to modify memory device 300 without departing from the teachings of the present disclosure. Thus, for example, the specific signals 318-324 may be modified by those with ordinary skill in the art without departing from the teachings of the present disclosure. Although shown with only two dynamic redundancy registers here (e1 register 314 and e2 register 316) and two memory banks (memory banks 304 and 306), memory device 300 may comprise two or more dynamic redundancy registers and one or more memory banks. In one embodiment, memory device may only comprise a single dynamic redundancy register as discussed above.

Memory banks 304 and 306 have previously been described with respect to FIG. 1. Memory banks 304 and 306 also include two ports (326 and 328; 332 and 334, respectively) for performing read, write, and verify (or other data manipulation) operations. Memory bank 304 could, for example, comprise data words having even addresses while memory bank 306 comprises data words having odd addresses. Two ports 326 and 328 of memory bank 304 are coupled to bit lines of memory bank 304. Likewise, two ports 332 and 334 of memory bank 306 are coupled to bit lines of memory bank 306. Although shown with one read and one write port per memory bank, memory device 300 may comprise any desired number of read and write ports. For example, in one embodiment, memory device can comprise two write ports and a single read port. In one embodiment, a dual port memory bank is used. Thus, each port 326-336 could perform simultaneous read and write operations. However, one of ordinary skill in the art will understand that the discussion proceeds with pseudo-dual port memory banks 304-306 in mind to highlight specific teachings of the present disclosure. The Y-mux structure of the present disclosure allows pseudo-dual port memory banks 304-308 to perform simultaneous write and verify operations sharing common row address and different column address. As explained above, a pseudo-dual port memory bank may have one port optimized to perform write operations and another port optimized to perform read operations.

As shown in FIG. 3, the memory device may comprise two memory banks. Alternatively, the memory device may comprise several memory banks, e.g., 2, 4, 8, 16 etc. In one embodiment, each memory bank will be associated its own respective pipeline. In another embodiment, each memory bank will be associated with a dedicated pipeline and a dedicate device redundancy register. In other words, the memory device will contain an e1 register for each of the memory banks. If each memory bank has a dedicated e1 register, the size of each of the e1 registers will likely be smaller than an e1 register that services all memory banks. This will likely increase re-write and verify efficiency.

With respect to memory bank 304, write port 326 allows transmission of signals comprising write address and write data to memory bank 304 from pipeline bank 308. Port 328 allows transmission of data signals comprising read address or verify address to memory bank 304 from pipeline bank 308. Port 330 allows transmission of data signals comprising read data word from memory bank 304 to pipeline bank 308.

Pipeline banks 308 and 310 comprise data registers for implementing the write, read, and verify (and other data manipulation) operations of the present disclosure. Pipeline banks 308 and 310 are coupled to memory banks 304 and 306, respectively, using pseudo-dual port structures, as explained above, for providing simultaneous write and verify operations. Moreover, pipeline banks 308 and 310 are coupled to input register 312. As explained in connection with FIG. 5, pipeline banks 308 and 310 implement a pipeline structure that allows verify and write operations to be simultaneously performed on memory banks 304 and 306. Moreover, pipeline banks communicate with e1 register 314 to implement a pipeline structure of the present disclosure.

Input register 312 comprises data storage elements comprising data bits. Input register comprises a data word, an associated addresses within memory banks, and control bits indicating a system operation such as system read or system write. For example, input register 312 may comprise a data word to be written to memory banks (received from data signal 322), the address of the data (received from address signal 324), and control bits. Input register 312 may be coupled to pipeline bank 308 and pipeline bank 310 to communicate a data word, its associated address, and control bits. One of ordinary skill in the art will recognize that other connections are possible and consistent with the teachings of the present disclosure and the specific connections are shown for ease of understanding. For example, input register 312 may be coupled to e1 register 314 for transferring the associated address of data word to e1 register 312 and control signals.

The e1 register 314 has been described in connection with FIG. 1, and will also be further described in connection with FIG. 7. The e1 register 314 is coupled to pipeline banks 308 and 310 and e2 register 316. The e1 register 314 comprises data storage elements comprising data bits. For example, e1 register 314 may comprise data word and associated addresses for data words that have failed to verify correctly within memory banks 304 and 306. The e1 register 314 may comprise data words and associated addresses for data words that have not yet been verified within memory banks 304 and 306. The e1 register 314 may also comprise data words and associated addresses for data words that have failed to read from memory banks 304 and 306 within an associated error budget.

The e2 register 316 has been described in connection with FIG. 1, and will also further be described in connection with FIG. 8. The e2 register 316 may be coupled to e1 register 314. As noted above, the e2 register 316 can, in one embodiment, be optional. The e2 register 316 comprises data storage elements comprising data bits. The e2 register 316 comprises data words, associated addresses, and control bits. These data words have typically failed to write to memory banks 304 and 306. These words may have also been written from e1 register 314 to e2 register 316 because of power down of memory device 300 or lack of space within e1 register. In one embodiment, e2 register 316 may optionally be coupled to pipeline banks 308 and 310 or memory banks 304 and 306 in order to write data words (or other signals). For example, rather than storing data words and associated address from e1 register 316, e2 register may store remap addresses within memory banks 304 and 306 for writing directly to memory banks through a remap process. In another embodiment, e2 register 316 writes data to memory banks 304 and 306 during power down.

Figure 4:
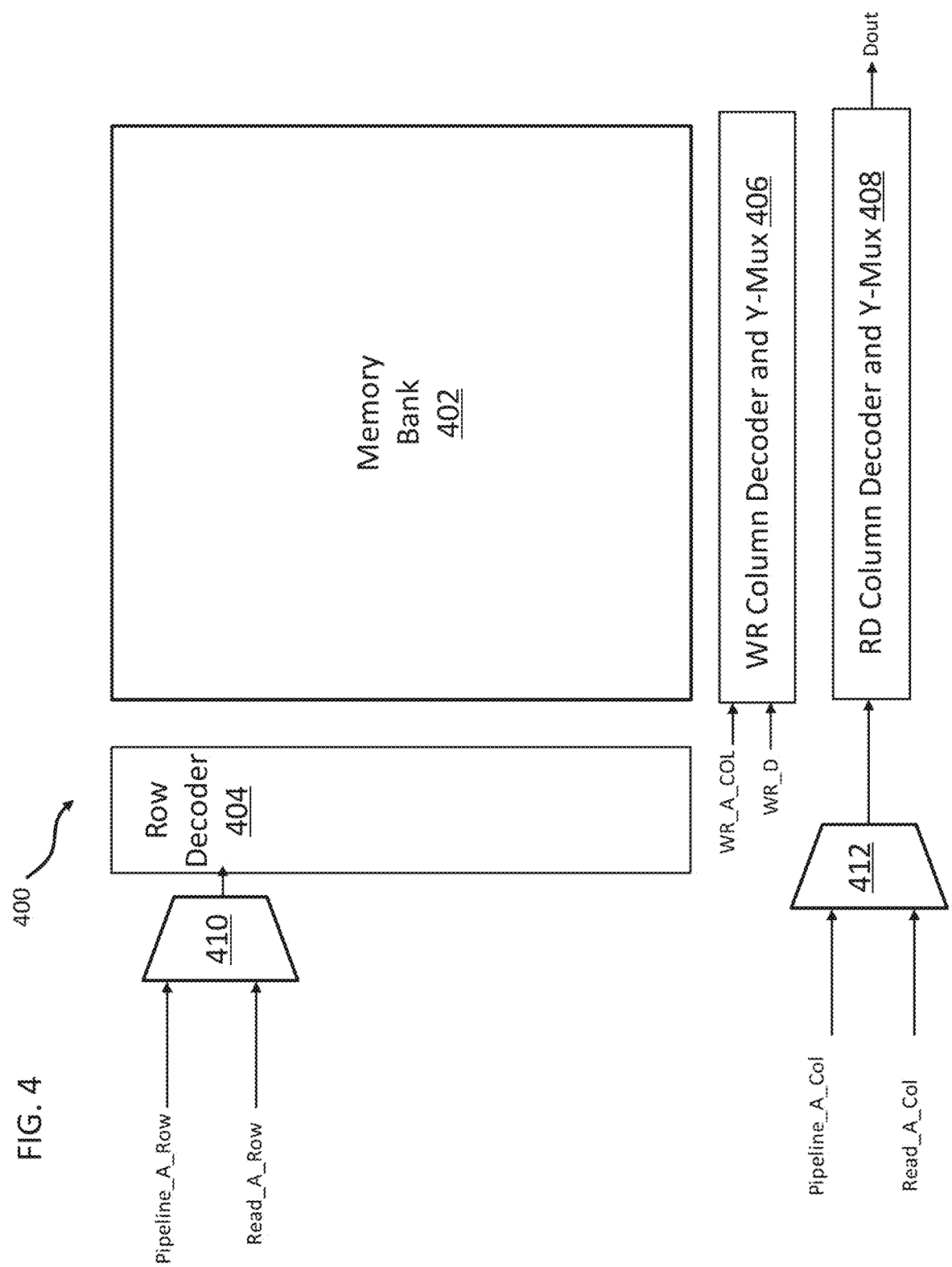
FIG. 4 is a block diagram of exemplary embodiment of a memory device of the present disclosure showing Y-mux structure.

FIG. 4 is a block diagram of exemplary embodiment of a memory device of the present disclosure showing a Y-mux structure. The Y-mux structure of the present disclosure allows pseudo-dual port memory banks to perform simultaneous write and verify operations sharing common row address and different column address. Accordingly, the Y-mux structure prevents the e1 register from overflowing by allowing both a write and verify operation to take place in the same cycle (provided they share a common row address). FIG. 4 shows portion of memory device 400 comprising memory bank 402, row decoder 404, write column decoder and y-mux 406, read column decoder and y-mux 408, and muxes 410-412.

FIG. 4 shows a Y-mux structure for decoders 406-408. As mentioned above, the Y-mux structure allows simultaneous verify and write operations for data words sharing a common row address (word line) in the memory bank but different column address. In one embodiment, one set of x addresses (common row address) and two sets of y addresses (one for the write and another for the verify operation) are inputted into the Y-mux structure. The row address (x address) for both the verify and the write operation need to be the same. Further, the addresses for verify and write operations need to address different columns. In other words, the verify and write operation cannot be performed at the same column address. In one embodiment, instead of a pseudo-dual port memory bank utilizing the Y-mux structure, a dual ported memory bank can be used that allows two writes or two reads to be performed simultaneously.

Memory bank 402 is coupled to decoders 404-408. Row decoder 404 takes as an input the row of address for data word that is to be written to or read or verified from memory bank 402. Row decoder then determines appropriate row for the data word. In various embodiments, a data word is a pre-defined number of bits for a piece of information handled by a memory device. For example, a data word may comprise 8, 16, 24, etc. bits. The size of a data word is dependent on the memory device and may be varied as necessary.

Mux 410 is coupled to row decoder 404. Mux 410 takes as inputs the pipeline row address (Pipeline_A_Row) and read row address (Read_A_Row). Pipeline row address indicates the row address for data words received from the pipeline for either a write or verify operation. Typically, the pipeline row address indicates a shared row address between a data word to be written to memory bank 402 and another data word to be simultaneously verified in memory bank 402. Read row address indicates a row address for a data word to be read from memory bank 402. Read row address generally takes precedence over pipeline row address when pseudo-dual port memory bank 402 is used. Mux 410 then outputs appropriate row address to row decoder 404. Row address decoder 404 then activates the appropriate row in memory bank 402. Appropriate activation schemes will be known to those with ordinary skill in the art.

Write column decoder and y-mux 406 is coupled to memory bank 402. Write column decoder and y-mux 406 takes as inputs write address column WR_A_Col and write data WR_D, such as data word. Write address column indicates a column address for a system write or re-write operation received from the pipeline structure of the present disclosure. Write column decoder and y-mux 406 then determines appropriate column address for write operation. Write column decoder and y-mux 406 then activates the appropriate column in memory bank 402. Appropriate activation schemes will be known to those with ordinary skill in the art.

Read column decoder and y-mux 408 is coupled to memory bank 402. Read column decoder and y-mux 408 takes as its input the column address output from mux 412. Read column decoder and y-mux 408 then determines the appropriate column for read operation. Read column decoder and y-mux 408 then activates the appropriate column in memory bank 402. Appropriate activation schemes will be known to those with ordinary skill in the art.

Mux 412 is coupled to read column decoder and y-mux 408. Mux 412 takes as inputs pipeline column address (Pipeline_A_Col) and read column address (Read_A_Col). Pipeline column address indicates column address of data word that should be verified in memory bank 402. Pipeline column address is received from the pipeline structure. Read column address indicates a column address for a data word that should be read from memory bank 402. Typically, read column address takes precedence when a pseudo-dual port memory bank 402 is used. Mux 412 outputs signal comprising column address for read operation or verify operation to read column decoder and y-mux 408. Thus, operating together, row and column decoders 404-408 perform operation on specific addresses within memory bank 402 (for example, read, write, or verify).

One of ordinary skill in the art will understand that the Y-mux structure of column decoders and y-mux 406-408 allows memory bank 402 to be operated as a pseudo-dual port memory bank. A single port memory cell may thus be used, but memory bank 402 may simultaneously perform verify and write operations when those operations share a common row address but different column addresses. If a dual port memory bank 402 was used, read and write or verify and write operations could be performed simultaneously (and not necessarily on a common row address). Further, with a dual port memory bank, two writes or two reads could be performed simultaneously as well. As mentioned above, in one embodiment, the pseudo-dual port of the memory bank is designed so that one port is optimized for a read operation and the other port is optimized for a write operation. The port that is optimized for a write operation can also perform reads because write ports typically require a strong driver. However the read port typically cannot perform writes because the driver does not support write operations with higher current requirements.

Figure 17:
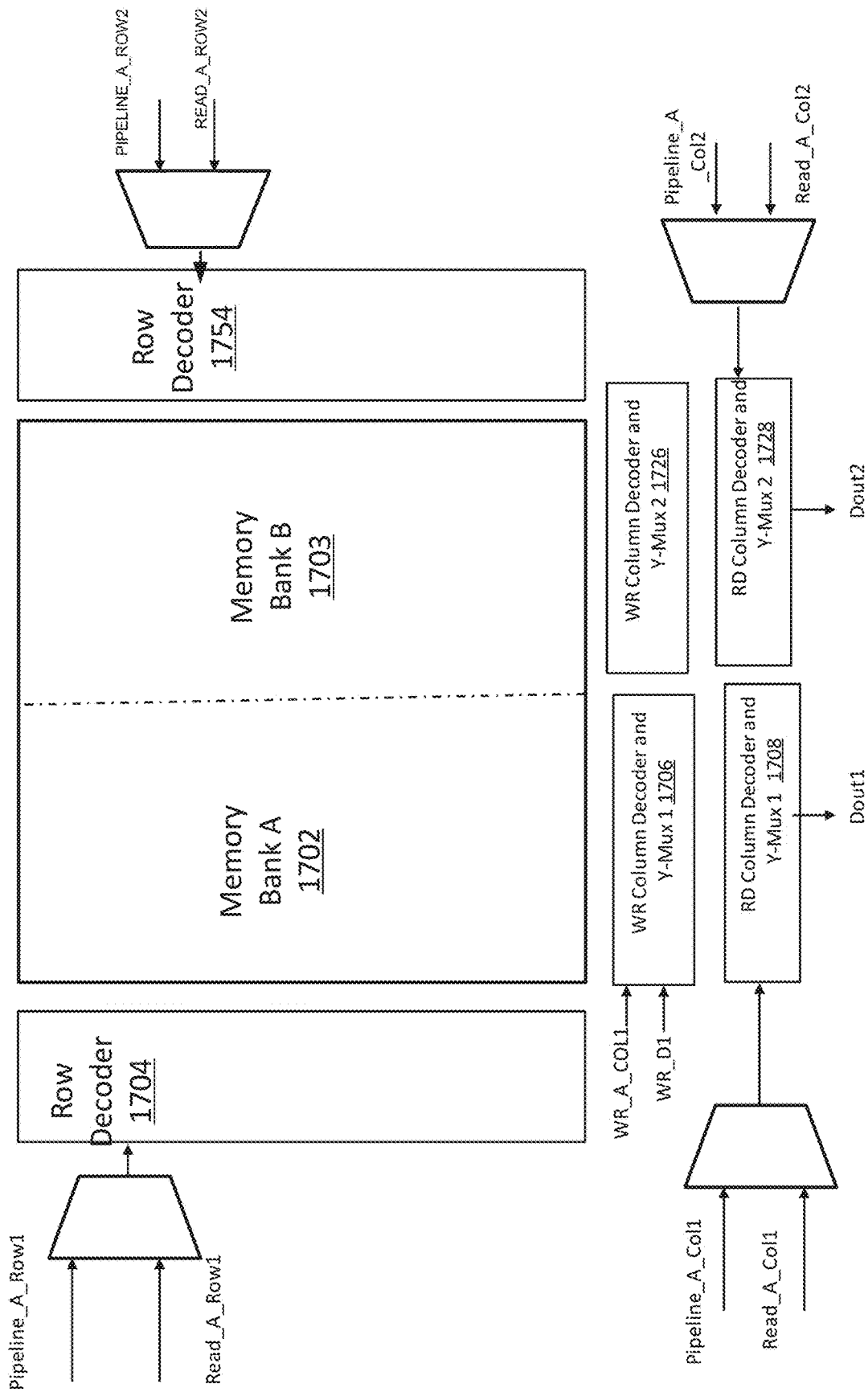
FIG. 17 illustrates the manner in which a memory bank can be segmented in accordance with an embodiment of the present invention.

A Memory Device with a Plurality of Memory Banks where Each Memory Bank is Associated with a Corresponding Memory Instruction Pipeline and a Dynamic Redundancy Register FIG. 17 illustrates the manner in which a memory bank can be segmented in accordance with an embodiment of the present invention. As shown in FIG. 17, a memory bank can be split into segments, memory bank A 1702 and memory bank B 1703. Instead of being driven by one set of row and column decoders, the memory bank is now split into two and driven from both sides with two sets or row and column decoders. The row decoders 1704 and 1754 perform substantially the same function as the row decoder 404 in FIG. 4. Similarly, the two segments can each be driven by a Write column decoder and Y-mux (e.g., 1706 and 1726) and a Read column decoder and Y-mux (e.g., 1708 and 1728). The write column decoder and Y-mux and the Read column decoder and Y-mux structures perform substantially the same function as the Write column decoder and Y-mux 406 and the Read column decoder and Y-mux 408 shown in FIG. 4.

Each of the segments may be considered a separate memory bank. As mentioned above, in an alternate embodiment, the memory device may comprise several memory banks or segments, e.g., 2, 4, 8, 16 etc. In one embodiment, each memory bank or segment will be associated its own pipeline. In another embodiment, each memory segment will be associated with a dedicated pipeline and a dedicated device redundancy register. In other words, the memory device will contain an e1 register for each of the memory banks or segments.

Figure 18:
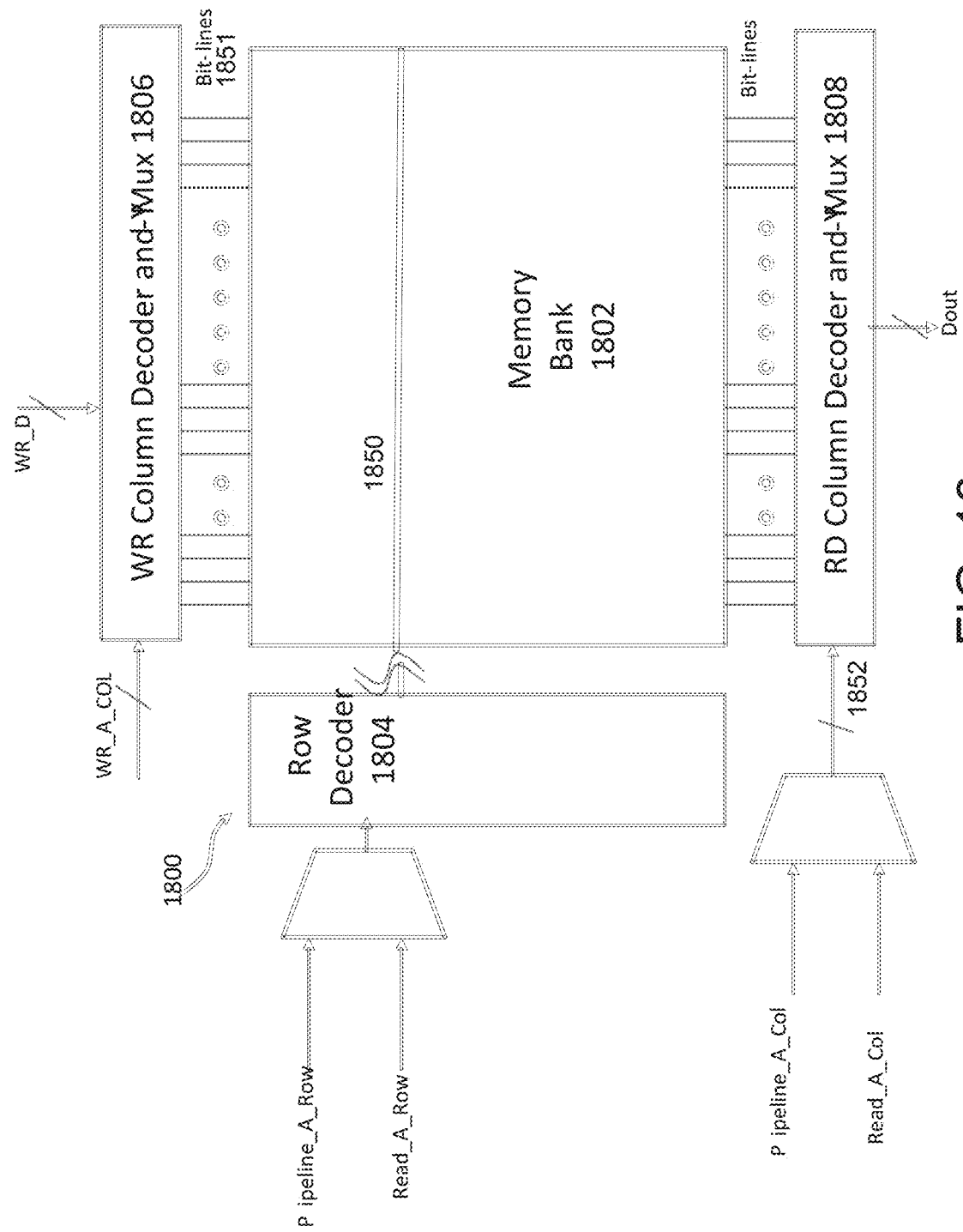
FIG. 18 is a block diagram of exemplary embodiment of a memory device of the present disclosure showing the operation of a row and column decoder in conjunction with a Y-mux structure in accordance with an embodiment of the present invention.

A Memory Device with a Dual Y-Multiplexer Structure for Performing Two Simultaneous Operations on the Same Row of a Memory Bank FIG. 18 is a block diagram of exemplary embodiment of a memory device of the present disclosure showing the operation of a row and column decoder in conjunction with a Y-mux structure in accordance with an embodiment of the present invention. As mentioned above, the Y-mux structure of the present disclosure allows pseudo-dual port memory banks to perform simultaneous write and verify operations sharing common row address and different column address. FIG. 18 shows portion of memory device 1800 comprising memory bank 1802, row decoder 1804, write column decoder and y-mux 1806, and read column decoder and y-mux 1808. Note that memory bank 1802, row decoder 1804, write column decoder and y-mux 1806, and read column decoder and y-mux 1808 perform substantially similar functions as the corresponding components in FIG. 4. Further note that write column decoder and y-mux 1806, row decoder 1804 and read column decoder and y-mux 1808 together comprise a read/write port for the pseudo dual port memory bank.

FIG. 18 shows a Y-mux structure for decoders 1806 and 1808. Memory bank 1850 will typically comprise a plurality of rows and column bit-lines. The Y-mux structure allows simultaneous verify and write operations for data words sharing a common row address (word line) in the memory bank but different column address. For example, the row decoder 1804 may activate a row address 1850 (an x address). At the same time, column decoder and Y-mux 1806 multiplexes the column bit-lines 1851 based on a column address (WR_A_COL) to arrive at the column lines associated with the addressed data word in the Y-mux. In other words, the WR_A_COL signal is used to select the appropriate column bit-lines 1851 to write the data inputted through the WR_D signal. In the same cycle as column decoder and Y-mux 1806 are writing a data word to the memory bank 1802, the read column decoder and Y-mux is used to perform the verify operation that shares the common row address (on row 1850) as the write operation. For example, the read address 1852 is used to select the appropriate bit-lines for the verify (or read) operation and the result is outputted through the D-out signal. Accordingly, the column decoder and Y-mux 1806 is used to write a data word into the memory bank 1802 at a row address 1850 in the same cycle as the read column decoder and Y-mux 1808 is used to verify (or read) a data word from row address 1850.

Figure 5:
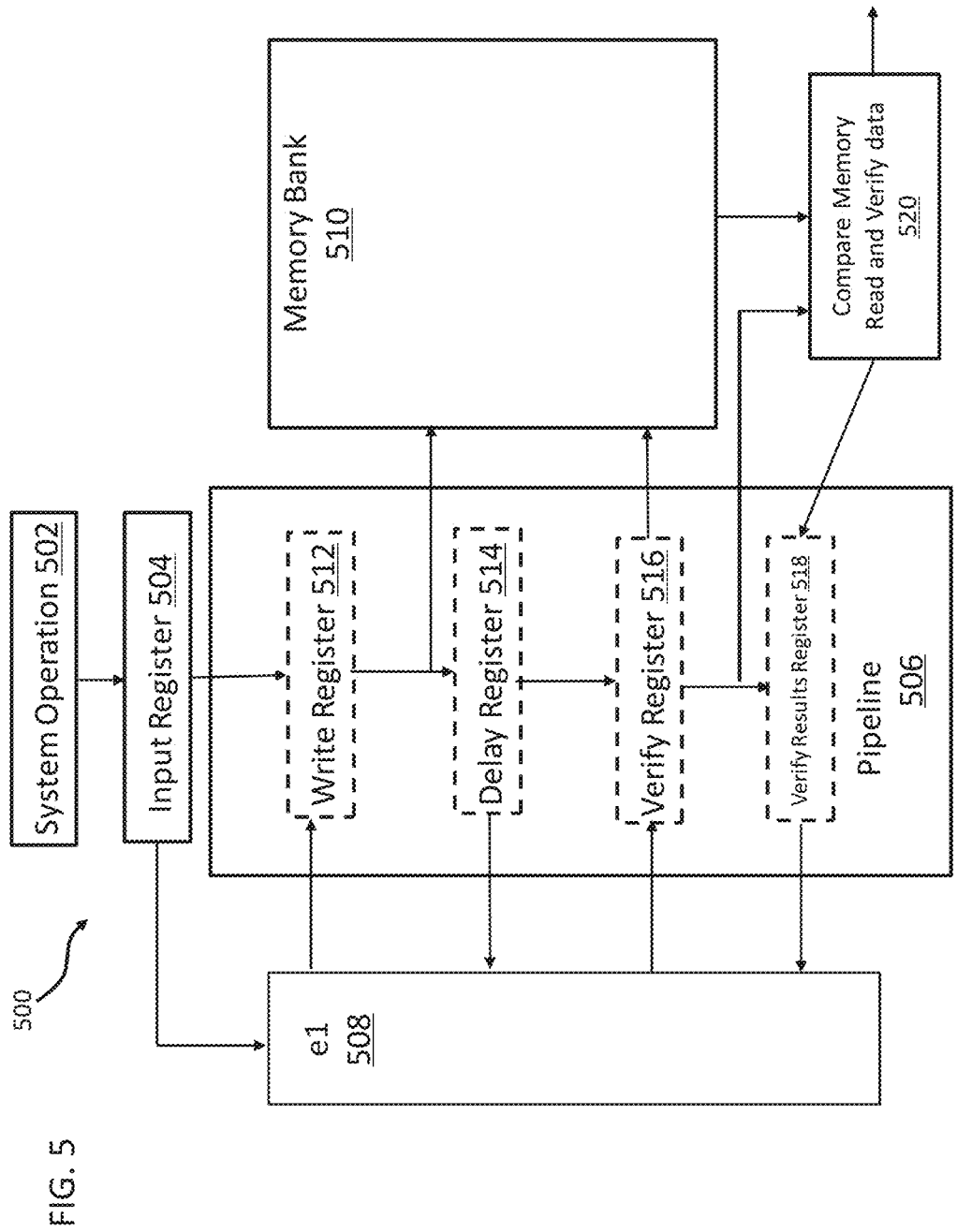
FIG. 5 is a block diagram of exemplary embodiment of a memory device of the present disclosure showing pipeline structure that allows verification and re-write operations.

FIG. 5 is a block diagram of exemplary embodiment of a memory device of the present disclosure showing pipeline structure that allows verification and re-write operations. FIG. 5 shows exemplary pipeline 500 for implementing the pipeline flow for system write, re-write, and verify operations, among other data manipulation operations. Pipeline 500 is implemented using system operations 502, input register 504, memory pipeline 506, e1 register 508, and memory bank 510. Memory pipeline 506 comprises write register 512, delay register 514, verify register 516, and verify results register 518. Moreover pipeline 500 comprises compare memory logic 520.

System operation 502 comprises signals for performing a desired operation such as system write and system read, among other data manipulation operations. As such, system operation 502 typically includes signals indicating a data word, the associated data address within memory bank 510, and control signals indicating the operation to be performed on memory bank 510 (such as write or chip select signal), among other signals for performing data manipulation operations and maintaining appropriate states. Typically, the signals from system operation 502 are stored in input register 504. Other configurations for signals from system operation 502 may be used without departing from the scope of the present disclosure. Moreover, other embodiments of pipeline 500 are possible without departing from the teachings of this disclosure. For example, delay register 514 allows delay between write and verify operation on a data word. STT-MRAM may require a delay between write operations at a particular address and verify operation at the common address. The delay cycle allows data storage elements within memory bank 510 to return to a stable state before performing verify operation. Other RAM technologies, and in some instances STT-MRAM itself, may not require such delay and delay register 514 is not necessary.

Input register 504 is coupled to write register 512. Input register 504 comprises data storage elements comprising data bits. In certain embodiments, input register 504 can include data bits for a data word, associated address, a valid bit, and other desired control bits. The input register 504 comprises the initial stage of the pipeline.

In one embodiment, for example, where a pseudo-dual bank memory bank is used, the input register 504 adds a delay in the pipeline that allows the memory device time to search for a data word and an associated address in the e1 register 508 that shares a common row address with a data word (associated with a write operation) in the input register. For example, a write operation may be received into the input register 504 from system operations 502 along with the data word to be written and its corresponding address. The input register provides the requisite delay to be able to search in the e1 register for a verify operation that shares a common row address with the data word associated with the write operation. As discussed above, e1 register 904 can receive a RowChange signal that indicates row address change within a pipeline structure of the present disclosure. The RowChange signal may indicate that another data word and associated address should be transmitted from e1 register 904 to the pipeline structure for a verify operation. If a pseudo-dual port memory bank is used, e1 register 904 may choose a data word and an associated address such that they share a common row address with a data word to be written into the write register of the pipeline structure. In this way, a write operation and a verify operation can be simultaneously performed since the data words share a common row address. The input register 504 provides the necessary delay in the pipeline to be able to look for the matching verify operation in the e1 register before the data word to be written is inserted into the write register 512. In other words, the delay of input register 504 allows enough time to search for the matching verify operation in the e1 register prior to inserting the data words to be written and verified into the write register 512 and the verify register 516 respectively.

The valid bit indicates whether data manipulation operations such as system write operation should be performed or the register should not be used to perform such operations. For example, valid bits based on a write signal and chip select signal provided by system operation 502 may indicate whether data word in input register is used for write. Input register 504 may also be coupled to e1 register 508, for example, to transmit associated address and control bits to e1 register 508. This associated address and control bits may be used in case of row address change in the pipeline or to invalidate an e1 register 500 entry with the same associated address, for example. For example, the address and control bits may be used to look for a pending verify operation in the e1 register that shares a common row address with a data word to be written into the memory bank.

An active memory bank of an embodiment of the present disclosure denotes a memory bank in which a system write or system read is taking place. Thus, an active bank signal (or an active bank bit) prevents re-writes during that clock cycle, and instead indicates that a system write or read will occur during that clock cycle. For example, an active bank signal indicates that write register 512 will write a data word previously received from input register 504 to memory bank 510 during that clock cycle. Thus, e1 register knows that data word for re-write operation should not be transmitted to write register 512 during that clock cycle. Input register 504 transmits data word, associated address, and desired control bits to write register 512.

The e1 register 508 has previously been described with respect to FIG. 1 and will be described in conjunction with FIG. 7. The e1 register 508 is coupled to input register 504, write register 512, delay register 514, verify register 516, and verify results register 520. The e1 register 508 may supply data word, associated address of a data word within memory bank 510, and control signals to write register 512, and verify register 516. The e1 register 508 may receive a data word, its associated address, and control signals from delay register 514 and verify results register 518. The e1 register 508 may also transmit a physical address within e1 register 508 in case the data word is already stored within e1 register 508. Although not shown, if delay register 514 were not used, e1 register 508 may receive data word, associated address, and control signals from write register 512. Moreover, e1 register 508 may communicate with input register to receive signals such as data word signal and control signal such as inactive bank signal.

Write register 512 is coupled to delay register 514 and memory bank 510. In other embodiments, write register 512 may be coupled to verify register 516. Write register 512 comprises data storage elements comprising data bits. Typically, write register 512 comprises data bits for a data word, its associated address, valid bit, and other desired control bits. The valid bit is a valid register bit and may be set to one when write register 512 contents are valid such that write operation may occur. Write register 504 receives data word, associated address, and desired control bits from input register 504 for system write operations. For memory bank clock cycles that write register 504 would not otherwise be writing system data words to that memory bank, e1 register 508 transmits data words, associated address, and desired control bits to write register 512. This allows write register 512 to attempt re-write operations when write register 512 would not otherwise be writing system data words to memory bank 510. As previously explained, when pseudo-dual port memory bank 510 is used, read operations generally take precedence over write operations from write register 512. Moreover, when pseudo-dual port memory bank 510 is used, write register 512 may perform write operation simultaneously with verify operation performed by verify register 516 if the operations share a common row address. Write register 512 also transmits data word, associated address, and desired control bits to delay register 514 (or verify register 516 if no delay register is used).

Delay register 514 is coupled to verify register 516 and e1 register 508. Delay register 514 comprises data storage elements comprising data bits. Typically, delay register 514 comprises a data word, associated address bits, a valid bit, and other desired control bits. Valid bit indicates if delay register 514 contents are valid. The delay register or multiple delay register could provide more clock cycle delay between write and verify. As previously explained, the delay register 514 is optional for RAM technologies that require delay between write and verify operations for a particular address within memory bank 510. If row address change occurs within memory pipeline 504, delay register 514 transmits data word, associated address, and desired control bits to e1 register 508. Thus, data word may be verified on a later clock cycle when write register will write a data word sharing a common row address. In another embodiment, data word may be verified on a later clock cycle when no verify operation will otherwise occur to the memory bank. If no row address change occurs within memory pipeline 504, after desired delay clock cycles, delay register 514 transmits the data word, associated address, and desired control bits to verify register 516.

Verify register 516 is coupled to memory bank 510 and verify results register 520. Verify register 516 comprises data storage elements comprising data bits. Typically, verify register 516 comprises a data word, its associated address, valid bit, and other desired control bits. Verify register 156 may comprise internal e1 address if data word was received as a result of re-write operation or verify operation from e1 register. Valid bit indicates whether verify register 516 contents are valid for verify operation. Verify register 516 contents, such as data word, can be sourced from either delay register 514 (or write register 512 in case delay register 512 is not used) or e1 register 508. Verify register 516 would receive contents from delay register 514 if no row address change has occurred. Verify register 516 would receive contents from e1 register 508 if row address change occurred. In one embodiment, verify register 516 receives the data word, its associated address, address within e1 register, fail count bits, and other desired control bits from e1 register 508. Verify register 516 transmits the associated address to memory bank 510 for the data word to be verified. Verify register 516 transmits the data word, fail count bits, and other desired status bits to compare data logic 520. Verify register 516 transmits the data word and its associated address to verify results register 518 in case of a system write. Verify register 516 transmits internal e1 address in case of re-write operation or verify from e1 register 508. Thus, if the data word and the associated address already exist e1 register 508, verify register 516 need not transmit the data word and the associated address to verify results register 518.

Compare memory logic 520 is coupled to verify register 516. Compare memory logic 520 comprises data storage elements comprising data bits. Compare memory logic 520 may comprise read or sense amplifiers to read a data word from memory bank 510. Hardware logic for implementing compare memory logic 520 can be used by those with ordinary skill in the art.

In the case of verify operation, compare memory logic 520 receives input from verify register 516 and memory bank 510. Memory bank 510 outputs a data word to compare memory logic 520 based on the associated address transmitted from verify register 516. Compare memory logic 520 also receives the data word from verify register 516. Thus, compare memory logic 520 determines whether the write operation passed or failed. Compare memory logic 520 makes the pass/fail determination based on methods desired by those with ordinary skill in the art. In one embodiment, compare memory logic 520 determines whether the data word from verify register 516 matches the data word from memory bank 510. In other embodiments, compare memory logic 520 deems that the operation passed if a predetermined number of bits match. If verify operation passed, compare memory logic 520 passes appropriate control bits to verify results register 518, for example fail count bits may be set to 0. Verify results register 518 may then invalidate the entry within e1 register if needed. If verify operation failed, verify results register 518 updates fail count bits within e1 register (in case of re-write or verify from e1) or transmits the data word, the associated address, and control bits to e1 register (in case of system write).

In the case of read operation, memory bank 510 outputs a data word, the associated address, and desired control bits to compare memory logic 520. Compare memory logic 520 determines whether the read operation passed or whether re-write operation should be performed on memory bank 510 because too many errors occurred while reading the data word. In one embodiment, compare memory logic 520 corrects data words using ECC and parity bits associated with data words. If ECC determines that too many errors occurred (e.g., errors above a predetermined threshold), compare memory logic 520 also transmits the data word and control bits to verify results register 518.

Verify results register 518 is coupled to compare memory logic 520 and e1 register 508. Verify results register 518 comprises data storage elements comprising data bits. Typically, verify results register 518 comprises data bits for a data word, associated address, valid bit, and desired control bits. Valid bit indicates that contents of verify results stage register 518 are valid to be written to e1 register 508. Verify results register 518 may also comprise internal e1 address. Verify results register 518 transmits data to e1 register as previously explained.

One of ordinary skill in the art will understand that pipeline structure 500 is exemplary and may include more write, delay, verify, verify results registers, and compare logic blocks to allow more re-write attempts before writing failed data words to e1 register. Moreover, more registers and memory banks may be added without departing from the scope of the present disclosure.

Increased Pipeline Depth to Support Pre-Read Operations in a Memory Device

Figure 14:
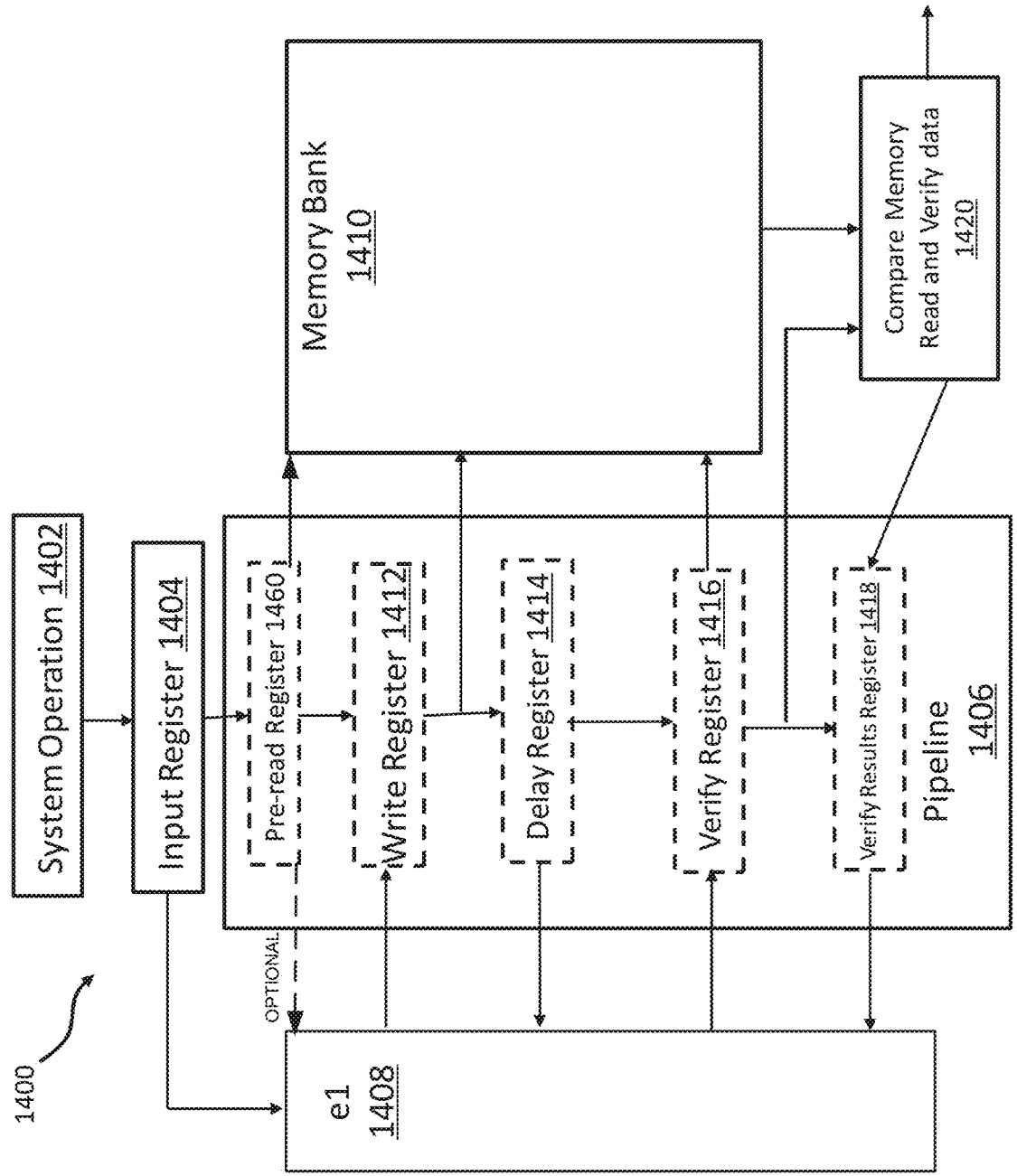
FIG. 14 is a block diagram of exemplary embodiment of a memory device of the present disclosure showing pipeline structure that allows pipestages for performing a pre-read operation for a write operation.

FIG. 14 is a block diagram of exemplary embodiment of a memory device of the present disclosure showing pipeline structure that allows pipestages for performing a pre-read operation for a write operation. FIG. 14 shows exemplary pipeline 1400 for implementing the pipeline flow for system pre-read, write, re-write, and verify operations, among other data manipulation operations. Pipeline 1400 is implemented using system operations 1402, input register 1404, memory pipeline 1406, e1 register 1408, and memory bank 1410. Memory pipeline 1406 comprises pre-read register 1460, write register 1412, delay register 1414, verify register 1416, and verify results register 1418. Moreover pipeline 1400 comprises compare memory logic 1420.

It should be noted that pipeline 1400 can be distinguished from pipeline 500 in that the memory pipeline 1406 comprises a pre-read register and pipe-stage 1460 prior to the write register 1412 and pipe-stage.

System operation 1402 performs substantially the same function as system operations 502 in FIG. 5. For example, system operation 1402 comprises signals for performing a desired operation such as system write and system read, among other data manipulation operations. As such, system operation 1402 typically includes signals indicating a data word, the associated data address within memory bank 1410, and control signals indicating the operation to be performed on memory bank 1410 (such as write or chip select signal), among other signals for performing data manipulation operations and maintaining appropriate states. Typically, the signals from system operation 1402 are stored in input register 1404. Other configurations for signals from system operation 1402 may be used without departing from the scope of the present disclosure. Moreover, other embodiments of pipeline 1400 are possible without departing from the teachings of this disclosure. For example, delay register 1414 allows delay between write and verify operation on a data word. STT-MRAM may require a delay between write operations at a particular address and verify operation at the common address. The delay cycle allows data storage elements within memory bank 1410 to return to a stable state before performing verify operation. Other RAM technologies, and in some instances STT-MRAM itself, may not require such delay and delay register 1414 is not necessary.

Input register 1404 is coupled to pre-read register 1460. Input register 1404 comprises data storage elements comprising data bits. In certain embodiments, input register 1404 can include data bits for a data word, associated address, a valid bit, and other desired control bits. The input register 1404 comprises the initial stage of the pipeline.

As mentioned above, in one embodiment, for example, where a pseudo-dual bank memory bank is used, the input register 1404 adds a delay in the pipeline that allows the memory device time to search for a data word and an associated address in the e1 register 1408 that shares a common row address with a data word (associated with a write operation) in the input register. For example, a write operation may be received into the input register 1404 from system operations 1402 along with the data word to be written and its corresponding address. The input register provides the requisite delay to be able to search in the e1 register for a verify operation that shares a common row address with the data word associated with the write operation. In this way, a write operation and a verify operation can be simultaneously performed since the data words share a common row address.

The valid bit, as discussed above, indicates whether data manipulation operations such as system write operation should be performed or the register should not be used to perform such operations. For example, valid bits based on a write signal and chip select signal provided by system operation 1402 may indicate whether data word in input register is used for write. Input register 1404 may also be coupled to e1 register 1408, for example, to transmit associated address and control bits to e1 register 1408. This associated address and control bits may be used in case of row address change in the pipeline or to invalidate an e1 register 1400 entry with the same associated address, for example. For example, the address and control bits may be used to look for a pending verify operation in the e1 register that shares a common row address with a data word to be written into the memory bank.

An active memory bank of an embodiment of the present disclosure denotes a memory bank in which a system write or system read is taking place. Thus, an active bank signal (or an active bank bit) prevents re-writes during that clock cycle, and instead indicates that a system write or read will occur during that clock cycle. For example, an active bank signal indicates that write register 1412 will write a data word previously received from input register 1404 to memory bank 1410 during that clock cycle. Thus, e1 register knows that data word for re-write operation should not be transmitted to write register 1412 during that clock cycle.

Input register 1404 transmits data word, associated address, and desired control bits to pre-read register 1460. A pre-read register 1460 can be used in the pipeline for several purposes. For example, the data word, associated address and control bits received from the input register 1404 could be associated with a write operation. If the information transmitted from input register 1404 into the pre-read register is associated with a write operation, a pre-read register 1460 can be used to reduce power consumption by pre-reading the data word to be written from memory bank 1410. Power consumption is reduced as a result of performing a pre-read because instead of writing the data word received from the input register 1404 directly into the memory bank at the associated address, the current data word stored at the associated address in the memory bank 1410 is pre-read to determine how many bits in the current data word need to be flipped in order to conform it to the newly received data word. For example, if the newly received data word to be written into the memory bank comprises all 1's, but the pre-read operation determines that the data word already written into memory bank at the associated address also comprises all 1's, then power is saved because the newly received data word would not need to be re-written into the memory. Accordingly, the pre-read operation reduces power consumption by reducing the number of bits that need to be written for each write operation. In other words, the pre-read operation takes into account that some of the bits in a given word may already be in the correct orientation so a write operation does not need to typically write all the bits in the word.

In another embodiment, a pre-read operation is performed as part of a bit-redundancy remapping protocol. Examples of on-the-fly bit failure detection and bit redundancy remapping techniques are described in U.S. patent application Ser. No. 15/792,672, entitled "ON-THE-FLY BIT FAILURE DETECTION AND BIT REDUNDANCY REMAPPING TECHNIQUES TO CORRECT FOR FIXED BIT DEFECTS" and hereby incorporated by reference in its entirety.

In one embodiment, the pre-read register 1460 may require extra bits to carry the information acquired as a result of the pre-read operation. In other words, the pre-read register 1460 not only needs to store the data word, associated address, and desired control bits received from the input register 1404, but it also needs to store information acquired as a result of the pre-read operation, e.g., the bits read from memory bank 1410. For example, the pre-read register 1460 may need to store mask bits comprising information regarding the bits in the data word received from the input register that need to be flipped in order to correctly perform the write operation. Further, the mask bits also need to store information regarding the direction in which the bits get flipped. In one embodiment of the present invention, pre-read register may also need to store ECC bits in order to perform error correction on the bits that are read from and written to memory bank 1410.

In one embodiment, instead of carrying the additional bits of storage within the pre-read register itself, the memory device can store the additional bits within e1 register 1408. However, as shown in FIG. 14, the connection between the pre-read register 1460 and the e1 register 1408 is optional. In a more typical embodiment, the additional bits will be stored within the pre-read register 1460, because storing the additional data in the e1 register may not be desirable in certain circumstances because of size considerations.

The e1 register 1408 performs substantially the same function as the e1 register described in conjunction with FIG. 5. The e1 register 1408 is coupled to input register 1404, write register 1412, delay register 1414, verify register 1416, and verify results register 1420. The e1 register may, in one embodiment, be also coupled to pre-read register 1460. The e1 register 1408 may supply data word, associated address of a data word within memory bank 1410, and control signals to write register 1412, and verify register 1416. The e1 register 1408 may receive a data word, its associated address, and control signals from delay register 1414 and verify results register 1418. The e1 register 1408 may also transmit a physical address within e1 register 1408 in case the data word is already stored within e1 register 1408. Although not shown, if delay register 1414 were not used, e1 register 1408 may receive data word, associated address, and control signals from write register 1412. Moreover, e1 register 1408 may communicate with input register to receive signals such as data word signal and control signal such as inactive bank signal.

Write register 1412 is coupled to delay register 1414 and memory bank 1410. Write register 1412 performs substantially the same function as write register 512 in FIG. 5.

Delay register 1414 is coupled to verify register 1416 and e1 register 1408. Delay register 1414 performs substantially the same function as delay register 514 in FIG. 5.

Verify register 1416 is coupled to memory bank 1410 and verify results register 1420. Verify register 1416 performs substantially the same function as verify register 516 in FIG. 5.

Compare memory logic 1420 is coupled to verify register 1416. Compare memory logic 1420 performs substantially the same function as compare logic 520 in FIG. 5. Verify results register 1418 is coupled to compare memory logic 1420 and e1 register 1408. Verify results register 1418 performs substantially the same function as verify result register 518 in FIG. 5.

One of ordinary skill in the art will understand that pipeline structure 1400 is exemplary and may include more write, delay, verify, verify results registers, and compare logic blocks to allow more re-write attempts before writing failed data words to e1 register. Moreover, more registers and memory banks may be added without departing from the scope of the present disclosure.

Figure 19:
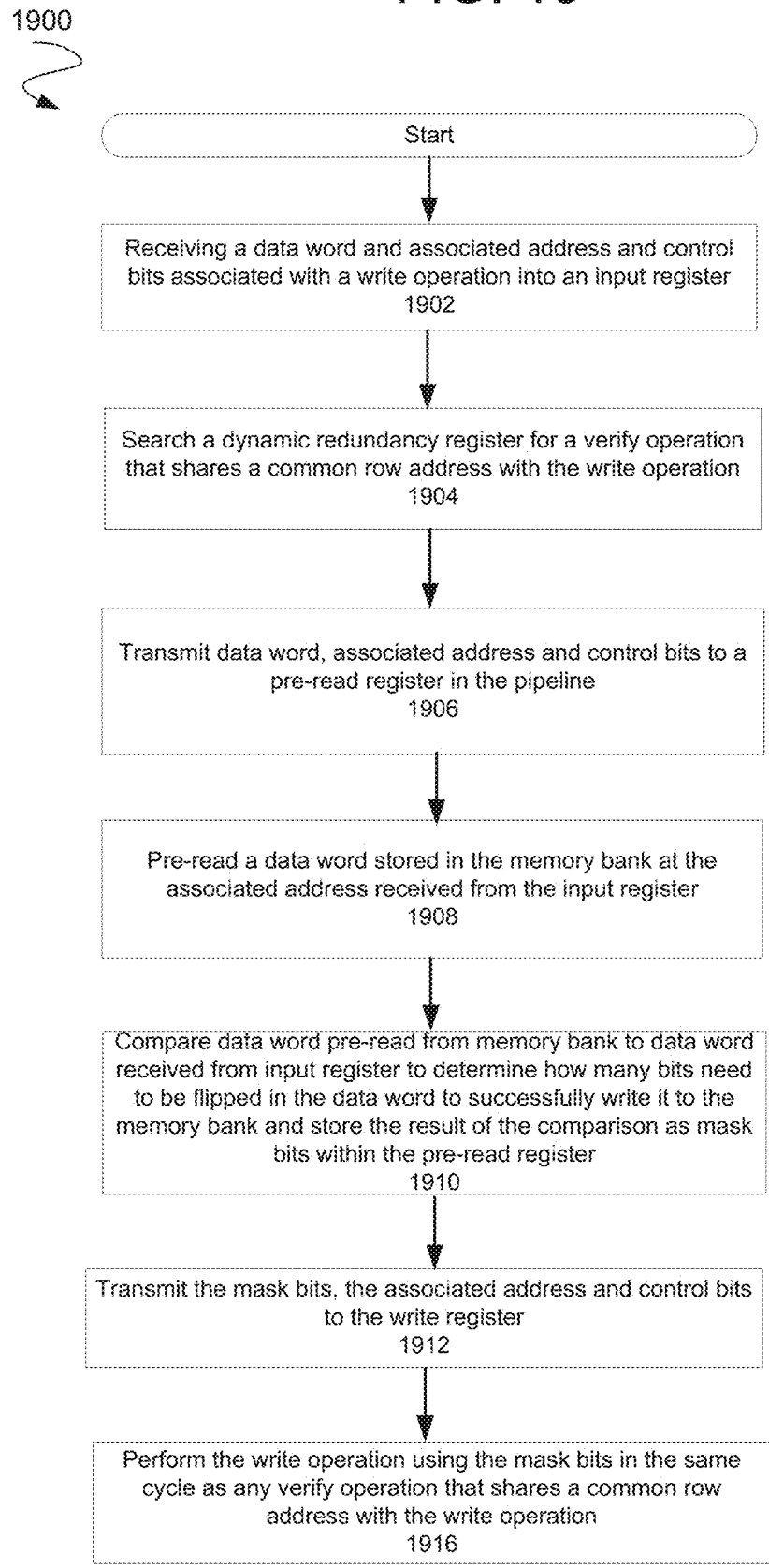
FIG. 19 depicts an exemplary embodiment for a process flow showing the manner in which a pre-read register is used to perform a write operation in an exemplary memory device of the present disclosure.

FIG. 19 depicts an exemplary embodiment for a process flow showing the manner in which a pre-read register is used to perform a write operation in an exemplary memory device of the present disclosure.

At step 1902, a data word, an associated address and control bits are received into the input register 1404 from system operations 1402.

At step 1904, as mentioned above, in one embodiment, the input register 1404 adds a delay in the pipeline that allows the memory device time to search for a data word and an associated address in the e1 register 1408 that shares a common row address with a data word (associated with a write operation) in the input register.

At step 1906, the input register 1404 transmits data word, associated address, and desired control bits to pre-read register 1460. As indicated above, the pre-read register 1460 can be used in the pipeline for several purposes. For example, the data word, associated address and control bits received from the input register 1404 could be associated with a write operation. If the information transmitted from input register 1404 into the pre-read register is associated with a write operation, a pre-read register 1460 can be used to reduce power consumption by pre-reading the data word to be written from memory bank 1410.

Accordingly, at step 1908, the data word stored in the memory bank at the associated address received from the input register is pre-read.

At step 1910, the data word pre-read from the memory bank is compared to the data word received from the input register to determine which bits need to be flipped in the data word stored in the memory bank in order to successfully write the new data word received from the input register into the memory bank. The results of the comparison can, in one embodiment, be stored as mask bits in the pre-read register. In one embodiment, compare logic may be built into the pipeline to perform this comparison. As mentioned above, in one embodiment, the pre-read register 1460 may require extra bits to carry the information acquired as a result of the pre-read operation. In other words, the pre-read register 1460 not only needs to store the data word, associated address, and desired control bits received from the input register 1404, but it also needs to store information acquired as a result of the pre-read operation, e.g., the bits related to the results of the compare operation.

At step 1912, at least the mask bits, the associated address and control bits may be transmitted to the write register. In a different embodiment, the data word to be written to the memory bank (received from the input register) may also be transmitted along with the mask bits.

At step 1916, the write operation is performed using the mask bits. Further, if a data word and an associated address is received from the e1 register at step 1904, the verify operation that shares a common row address with the write operation is also performed in the same cycle as the write operation.

Figure 20:
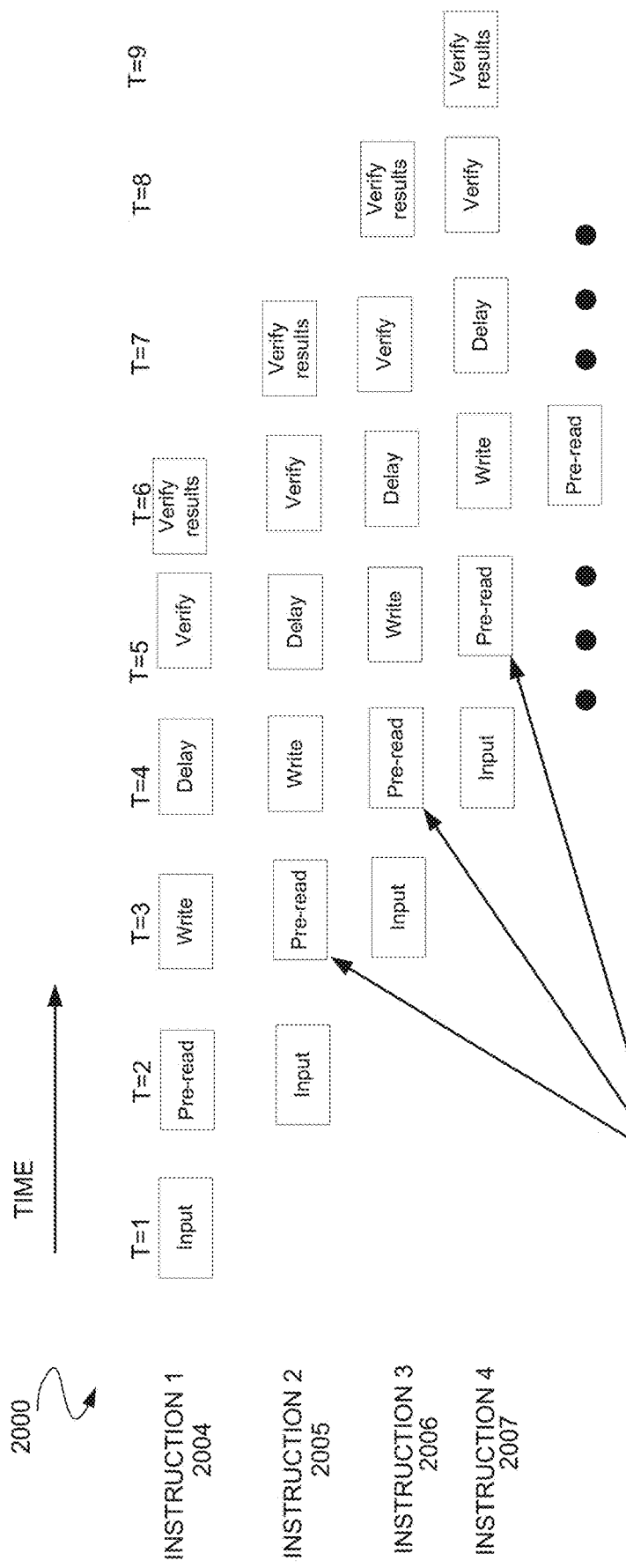
FIG. 20 is a block diagram of an exemplary pipeline structure for a memory device that comprises a pre-read pipe-stage for a write operation in accordance with an embodiment of the present invention.

FIG. 20 is a block diagram of an exemplary pipeline structure for a memory device that comprises a pre-read pipe-stage for a write operation in accordance with an embodiment of the present invention. As shown in pipeline structure 2000, at any given slice of time, e.g., T=3, T=4 and T=5, there will be a pre-read operation and a write operation being performed simultaneously. As each write is being performed in the write register, at any given slice of time, another write operation is coming into the pre-read register from the input register. For example, Instruction 1 2004 enters the pre-read pipestage at time T=2. At time, T=3, when Instruction 1 2004 enters the write register, Instruction 2 2005 enters the pre-read register. Similarly, at time T=4, Instruction 1 2004 enters the delay cycle, Instruction 2 enters the write register and new Instruction 3 2006 enters the pre-read register.

Accordingly, a read and a write operation will need to be performed to the memory bank 1410 at any given period of time. The memory device will, therefore, need an extra port into memory bank 1410. As mentioned earlier, a pseudo-dual port memory bank works in cases where in a single cycle at most a write operation is performed concurrently with a verify operation. The pipeline structure of FIG. 14 would require that a read and a write operation be performed concurrently with a verify operation. Accordingly, two read ports (one for a verify operation and one for a read operation) and one write port will be needed.

Figure 15:
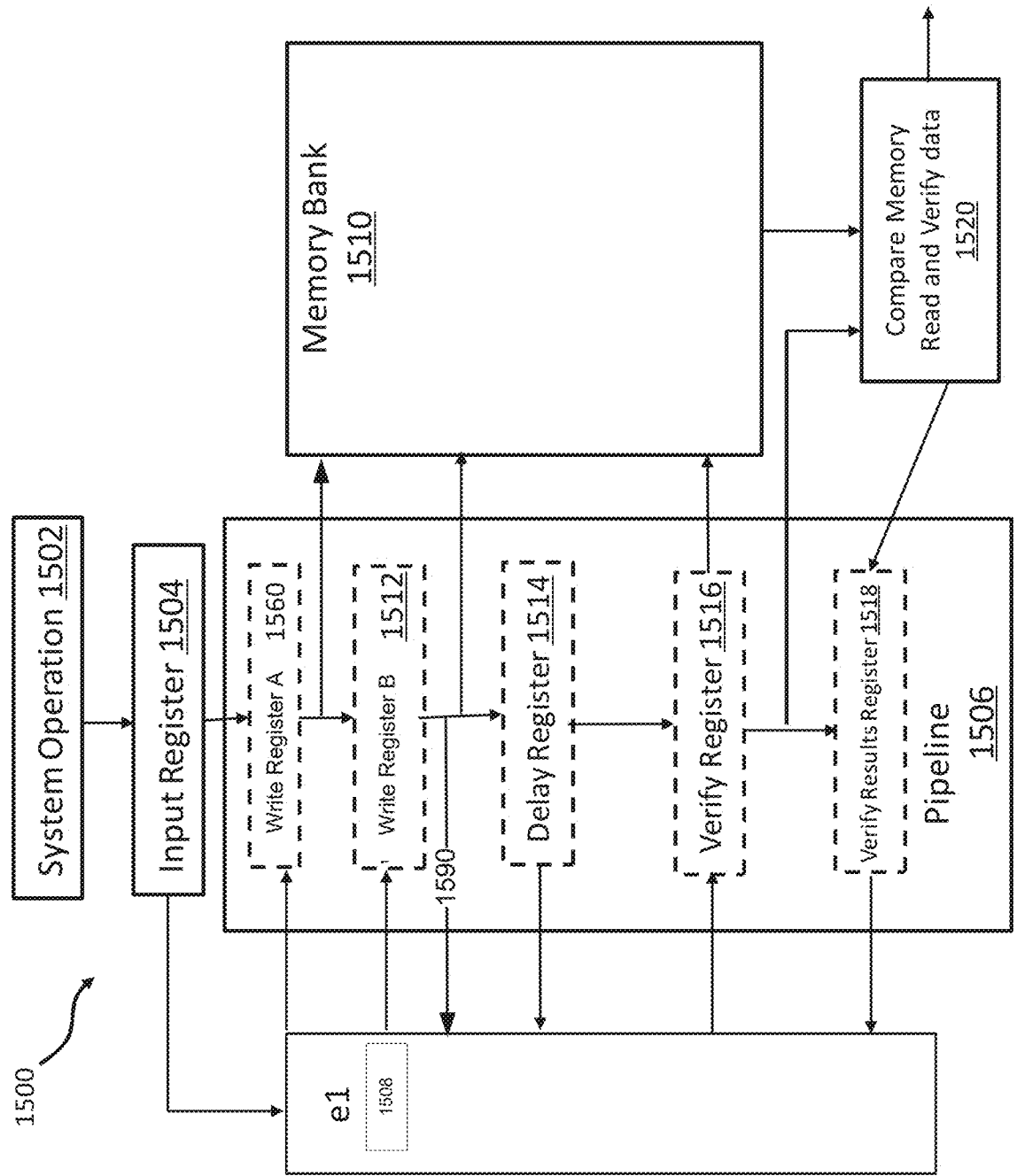
FIG. 15 is a block diagram of exemplary embodiment of a memory device of the present disclosure showing pipeline structure that allows an additional cycle for write operation for storing a data word.

Increased Pipeline Depth to Support Additional Write Operations in a Memory Device FIG. 15 is a block diagram of exemplary embodiment of a memory device of the present disclosure showing pipeline structure that allows an additional cycle for a write operation for storing a data word. The additional write cycle in FIG. 15 allows incoming data words to be written an additional window to be written accurately into the memory bank. FIG. 15 shows exemplary pipeline 1500 for implementing the pipeline flow for system write, re-write, and verify operations, among other data manipulation operations. Pipeline 1500 is implemented using system operations 1502, input register 1504, memory pipeline 1506, e1 register 1508, and memory bank 1510. Memory pipeline 1506 comprises write register A 1560, write register B 1512, delay register 1514, verify register 1516, and verify results register 1518. Moreover pipeline 1500 comprises compare memory logic 1520.

System operation 1502 comprises signals for performing a desired operation such as system write and system read, among other data manipulation operations. As such, system operation 1502 typically includes signals indicating a data word, the associated data address within memory bank 1510, and control signals indicating the operation to be performed on memory bank 1510 (such as write or chip select signal), among other signals for performing data manipulation operations and maintaining appropriate states. Typically, the signals from system operation 1502 are stored in input register 1504. Other configurations for signals from system operation 1502 may be used without departing from the scope of the present disclosure.

Moreover, other embodiments of pipeline 1500 are possible without departing from the teachings of this disclosure. For example, delay register 1514 allows delay between write and verify operation on a data word. STT-MRAM may require a delay between write operations at a particular address and verify operation at the common address. The delay cycle allows data storage elements within memory bank 1510 to return to a stable state before performing verify operation. Other RAM technologies, and in some instances STT-MRAM itself, may not require such delay and delay register 1514 is not necessary.

Input register 1504 is coupled to write register 1512. Input register 1504 comprises data storage elements comprising data bits. In certain embodiments, input register 1504 can include data bits for a data word, associated address, a valid bit, and other desired control bits. The input register 1504 comprises the initial stage of the pipeline.

In one embodiment, for example, where a pseudo-dual bank memory bank is used, the input register 1504 adds a delay in the pipeline that allows the memory device time to search for a data word and an associated address in the e1 register 1508 corresponding to a verify operation that shares a common row address with a data word in the input register. The data word in the input register would be associated with a write operation that shares a common row address with the data word for the verify operation in the e1 register. For example, a write operation may be received into the input register 1504 from system operations 1502 along with the data word to be written and its corresponding address. The input register provides the requisite delay to be able to search in the e1 register for a verify operation that shares a common row address with the data word associated with the write operation. The input register 1504 provides the necessary delay in the pipeline to be able to look for the matching verify operation in the e1 register before the data word to be written is inserted into the write register 1512. In other words, the delay of input register 1504 allows enough time to search for the matching verify operation in the e1 register prior to inserting the data words to be written and verified into the write register 1512 and the verify register 1516 respectively.

The valid bit indicates whether data manipulation operations such as system write operation should be performed or the register should not be used to perform such operations. For example, valid bits based on a write signal and chip select signal provided by system operation 1502 may indicate whether data word in input register is used for write. Input register 1504 may also be coupled to e1 register 1508, for example, to transmit associated address and control bits to e1 register 1508. This associated address and control bits may be used in case of row address change in the pipeline or to invalidate an e1 register entry with the same associated address, for example. For example, the address and control bits may be used to look for a pending verify operation in the e1 register that shares a common row address with a data word to be written into the memory bank.

An active memory bank of an embodiment of the present disclosure denotes a memory bank in which a system write or system read is taking place. Thus, an active bank signal (or an active bank bit) prevents re-writes during that clock cycle, and instead indicates that a system write or read will occur during that clock cycle. For example, an active bank signal indicates that write register 1560 will write a data word previously received from input register 1504 to memory bank 1510 during that clock cycle. Thus, e1 register knows that data word for re-write operation should not be transmitted to write register 1512 during that clock cycle. Input register 1504 transmits data word, associated address, and desired control bits to write register A 1560.

The e1 register 1508 performs substantially the same functions as the e1 register discussed in conjunction with FIGS. 5 and 14. The e1 register 1508 is coupled to input register 1504, write register A 1560, write register B 1512, delay register 1514, verify register 1516, and verify results register 1520. The e1 register 1508 may supply data word, associated address of a data word within memory bank 1510, and control signals to write register A 1560, write register B 1512, and verify register 1516. The e1 register 508 may receive a data word, its associated address, and control signals from delay register 1514 and verify results register 1518. The e1 register 1508 may also transmit a physical address within e1 register 1508 in case the data word is already stored within e1 register 1508. Although not shown, if delay register 1514 were not used, e1 register 1508 may receive data word, associated address, and control signals from one of the write registers. Moreover, e1 register 1508 may communicate with input register to receive signals such as data word signal and control signal such as inactive bank signal.

Write register A 1560 is coupled to write register B 1512 and to memory bank 1510. Write register 512 comprises data storage elements comprising data bits. Typically, write register A 1560 comprises data bits for a data word, its associated address, valid bit, and other desired control bits. The valid bit is a valid register bit and may be set to one when write register A contents are valid such that write operation may occur. Write register A 1560 receives data word, associated address, and desired control bits from input register 1504 for system write operations. For memory bank clock cycles that write register A 1560 would not otherwise be writing system data words to that memory bank, e1 register 1508 transmits data words, associated address, and desired control bits to write register 1560. This allows write register 1560 to attempt re-write operations when write register 1560 would not otherwise be writing system data words to memory bank 1510.

In one embodiment, write register A 1560 is coupled to another write register B 1512. Accordingly, pipeline 1500 comprises two write stages. The purpose of two write stages in the pipeline is to attempt each write operation at least twice prior to the verification stage. As mentioned earlier, STT-MRAM may suffer from a high write error rate (WER) and, accordingly, attempting to write each word at least twice prior to verification may reduce the WER associated with the memory.

Figure 16:
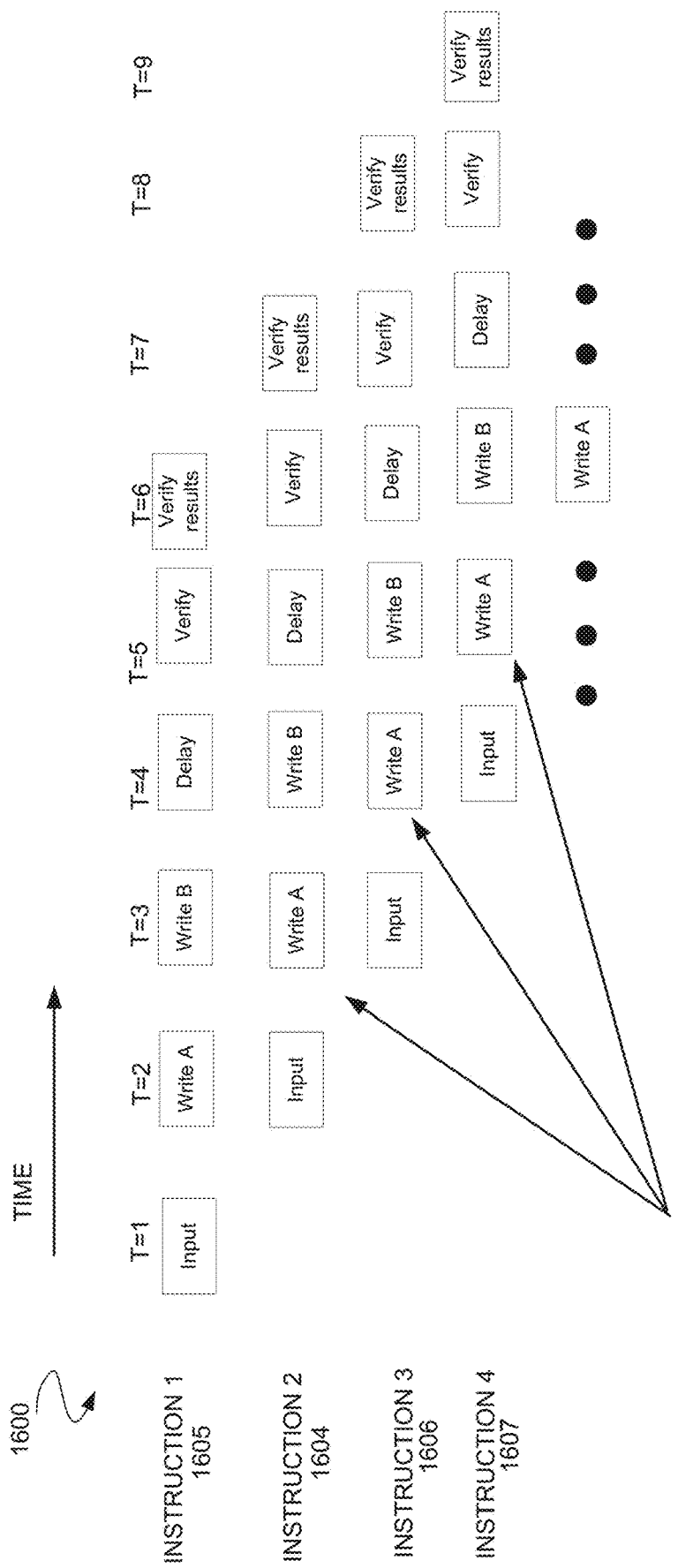
FIG. 16 is a block diagram of an exemplary pipeline structure for a memory device that comprises an additional write stage in accordance with an embodiment of the present invention.

In one embodiment, an extra port in the memory bank will be required to support an additional write operation. FIG. 16 is a block diagram of an exemplary pipeline structure for a memory device that comprises an additional write stage in accordance with an embodiment of the present invention. As shown in pipeline structure 1600, at any given slice of time, e.g., T=3, T=4 and T=5, there will be two write operations being performed simultaneously. Each write will be performed twice, however, at any given slice of time, as one write is going through its second cycle in write register B 1512, a new write will be incoming into write register A 1560. For example, Instruction 1 1605 enters write register A at time T=2. At time T=3, when Instruction 1 1605 enters write register B, Instruction 2 1604 enters write register A. Similarly, at time T=4, Instruction 1 1605 enters the delay cycle, Instruction 2 enters write register B and new Instruction 3 1606 enters write register A.

Accordingly, two write operations will need to be performed to the memory bank 1510 at any given period of time. The memory device will, therefore, need an extra port into memory bank 1510. As mentioned earlier, a pseudo-dual port memory bank works in cases where in a single cycle at most a write operation is performed concurrently with a verify operation. The pipeline structure of FIG. 15 would require that two write operations be performed concurrently with a verify operation. Accordingly, two write ports and a single read (or verify) port into memory bank 1510 will be needed. Two write ports are necessary because simply performing one write in a given cycle and inserting the other write into the e1 register would increase the size of the e1 register beyond practical limits.

In one embodiment, a tri-ported memory bank structure can be obtained by adding an extra write port to the pseudo-dual port memory bank structure using the Y-mux structure as explained in conjunction with FIG. 4. In a different embodiment, three separate ports are implemented into the memory bank 1510, wherein two ports are optimized for write operations and one port is optimized for read operations. As explained earlier, ports that are optimized for write operations will have higher current requirements and occupy more physical space than ports that are optimized for read operations. In one embodiment, the three ports are all implemented using the Y-mux structure discussed in conjunction with FIG. 4. In one embodiment, a true dual port memory bank is implemented for the two write operations and an extra port is added using the Y-mux structure for the read port.

In one embodiment, instead of two separate write stages in the pipeline 1500, a single write pulse that is double the width of a traditional write pulse can also be used. Within the time period of the single write pulse, there can be two attempts at writing the data word into memory bank 1510.

Write register A 1560 transmits data word, associated address, and desired control bits to write register B 1512. This way the same data word can be written twice to the memory bank 1510 in two separate cycles.

It should be noted that read operations generally take precedence over write operations from either of write registers. If a read operation occurs, then the pipeline is typically stalled to allow the read operation to terminate.

As discussed above, e1 register 1908 can receive a RowChange signal that indicates row address change within a pipeline structure of the present disclosure. When a ROWchng signal is received in the embodiment of FIG. 15, there will be an unfinished write in write register A 1560 and a write that has not been verified yet in write register B 1512. Accordingly, in the embodiment of FIG. 15, the e1 register will typically be larger than other embodiments because upon receiving a RowChange signal, two entries from the pipeline will be inserted into the e1 register while the memory operation causing the row change signal to assert is allowed to enter the pipeline. The entry from write register A 1560 will need to be re-written and the entry from write register B 1512 will need to be verified. In one embodiment, if a RowChange signal is received, the data word that has only passed through one write stage can be transferred to the e1 register through connection 1590 while the other data word that has passed through both write stages can be transferred to the e1 register through the delay register 1514. The data word sent to the e1 register through connection 1590 would need to be re-written while the data word transmitted from the delay register 1514 would need to be verified during a later cycle.

Further, similar to the embodiments discussed in connection with FIGS. 5 and 14, the RowChange signal may also be used to indicate that another data word and associated address should be transmitted from e1 register 1508 to the pipeline structure for a verify operation. If a pseudo-dual port memory bank is used, e1 register 1508 may choose a data word and an associated address such that they share a common row address with a data word to be written into the write register of the pipeline structure. In this way, a write operation and a verify operation can be simultaneously performed since the data words share a common row address. The input register 504 provides the necessary delay in the pipeline to be able to look for the matching verify operation in the e1 register before the data word to be written is inserted into the write register 512. In other words, the delay of input register 1504 allows enough time to search for the matching verify operation in the e1 register prior to inserting the data words to be written and verified into the write registers and the verify register 516 respectively. In the embodiment of FIG. 15, since the write operation passes through two stages of the pipeline, the e1 register has another cycle to be able to look for the matching verify operation. Accordingly, the delay in the input register 1504 may not be necessary to provide sufficient time to find a matching verify operation.

Write register B 1512 is coupled to delay register 1514 and memory bank 1510. In other embodiments, write register 1512 may be coupled to verify register 1516. Write register 1512 comprises data storage elements comprising data bits. Typically, write register 1512 comprises data bits for a data word, its associated address, valid bit, and other desired control bits. The valid bit is a valid register bit and may be set to one when write register 1512 contents are valid such that write operation may occur. Write register 1504 receives data word, associated address, and desired control bits from write register A 1560 so that the data word can be written into memory bank 1510 a second time.

For memory bank clock cycles that write register 1504 would not otherwise be writing system data words to that memory bank, e1 register 1508 transmits data words, associated address, and desired control bits to write register 1512. This allows write register 1512 to attempt re-write operations when write register 1512 would not otherwise be writing system data words to memory bank 1510. In one embodiment, the e1 register 1508 can also transmit data words associated with re-write operations to write register A 1560 so that the re-write operations may also be attempted at least twice in the pipeline.

Delay register 1514 is coupled to verify register 1516 and e1 register 1508. Delay register 1514 comprises data storage elements comprising data bits. Typically, delay register 1514 comprises a data word, associated address bits, a valid bit, and other desired control bits. Valid bit indicates if delay register 1514 contents are valid. The delay register or multiple delay register could provide more clock cycle delay between write and verify.

As previously explained, the delay register 1514 is optional for RAM technologies that require delay between write and verify operations for a particular address within memory bank 1510. If row address change occurs within memory pipeline 1504, delay register 1514 transmits data word, associated address, and desired control bits to e1 register 1508. Thus, data word may be verified on a later clock cycle when write register will write a data word sharing a common row address. In another embodiment, data word may be verified on a later clock cycle when no verify operation will otherwise occur to the memory bank. If no row address change occurs within memory pipeline 1504, after desired delay clock cycles, delay register 1514 transmits the data word, associated address, and desired control bits to verify register 1516. The addition of a delay between the write register 1560 and the verify register 1516 also allows the data transferred from the write register 1512 to stabilize before transferring the information to the verify register 1516. This prevents noise from being injected into the verify cycle.

Verify register 1516 is coupled to memory bank 1510 and verify results register 1520. Verify register 1516 performs substantially the same function as verify register 516 in FIG. 5.

It should be noted that in one embodiment the second write register B 1512 may be placed subsequent to the verify register 1516. In other words, instead of having two write registers back to back in the pipeline, one of the write registers may follow the verify register 1516. This way a write operation can be attempted in the first write cycle and verified thereafter to ensure that the operation completed successfully. If the write operation did not complete successfully, then another write cycle subsequent to the verify operation can be used to attempt a re-write. This may be more efficient in certain cases than performing two write operations consecutively on the same data word. Similarly, other combinations are possible that attempt one or more re-write operations at different stages of the pipeline.

In one embodiment, the pipeline illustrated in FIG. 15 could also have a pre-read register that performs substantially the same function as pre-read register 1460 in FIG. 14.

Compare memory logic 1520 is coupled to verify register 1516. Compare memory logic 1520 performs substantially the same function as compare logic 520 in FIG. 5. Verify results register 1518 is coupled to compare memory logic 1520 and e1 register 1508. Verify results register 1518 performs substantially the same function as verify result register 518 in FIG. 5.

One of ordinary skill in the art will understand that pipeline structure 1500 is exemplary and may include more write, delay, verify, verify results registers, and compare logic blocks to allow more re-write attempts before writing failed data words to e1 register. Moreover, more registers and memory banks may be added without departing from the scope of the present disclosure.

One of ordinary skill in the art will understand that pipeline structure 1500 is exemplary and may include more write, delay, verify, verify results registers, and compare logic blocks to allow more re-write attempts before writing failed data words to e1 register. Moreover, more registers and memory banks may be added without departing from the scope of the present disclosure.

Figure 6:
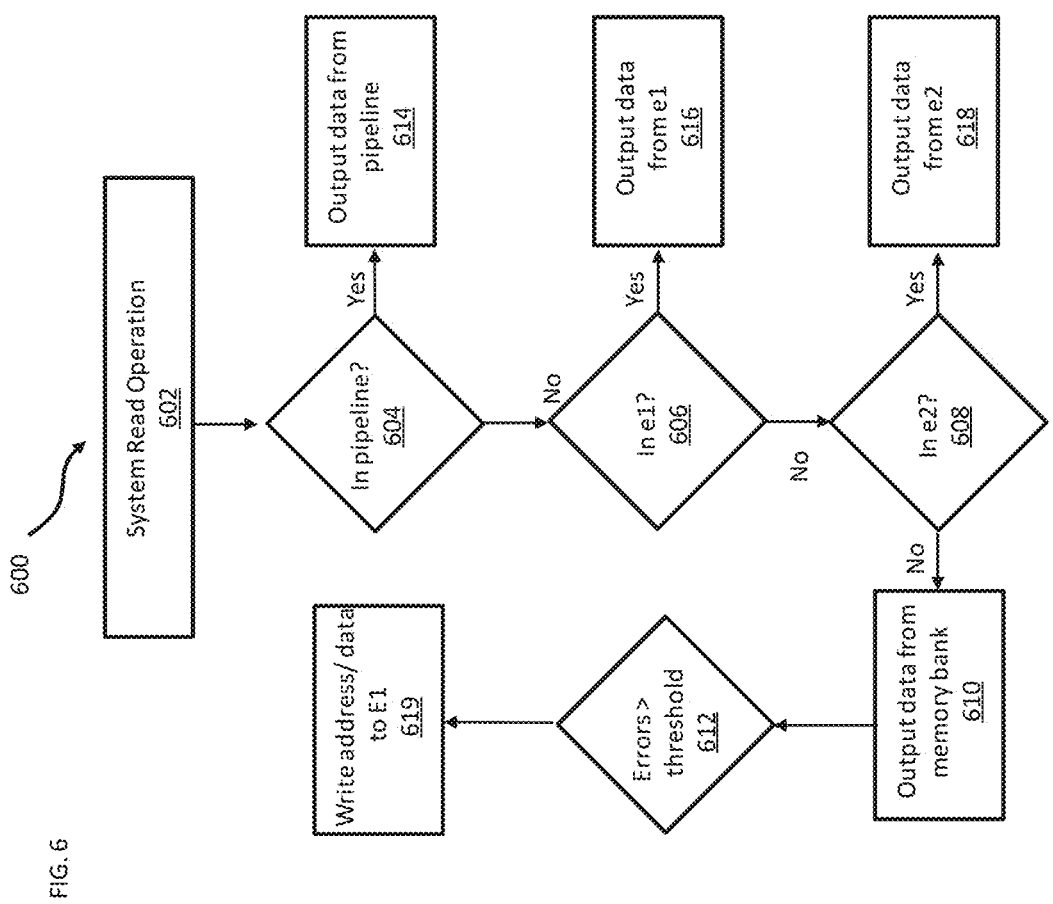
FIG. 6 is an exemplary process flow showing an embodiment of a system read operation using an embodiment of memory device of the present disclosure.

FIG. 6 is an exemplary process flow showing an embodiment of a system read operation using an embodiment of memory device of the present disclosure. FIG. 6 shows process flow 600 for system read operation of the present disclosure. Process flow 600 illustrates the high-level read operation performed on a memory device. In step 602, a system read operation to be performed on memory bank exists within a memory device. In step 604, the valid address stored in both pipeline banks are checked to determine whether the data word associated with system read operation exists there. If no, e1 register checks address to determine whether the data word associated with system read operation exists there in step 606. If no, e2 register checks the address to determine whether the data word associated with system read operation exists there in step 608. If no, the data word is read from memory bank at the associated address of system read operation in step 610. If the result of step 608 is yes, the data word is read from e2 register in step 618. If the answer to step 604 returned yes, then data word is read from pipeline 614. If the answer to step 606 is yes, then the data word is read from e1 register in step 616. One of ordinary skill in the art may recognize other process flows for system read operations without departing from the teachings of the present disclosure.

System read process flow 600 may include additional steps. After step 610, compare logic may determine whether system data word from memory bank was read within a predetermined error budget in step 612. If the data word output from memory bank contains errors, such errors may be corrected though ECC. If the data word output from memory bank contained more errors than allowed by a predetermined error budget, the data word may also be corrected and stored in e1 register in step 619. In this way, e1 register may attempt to re-write data word back to memory bank so that the data word may be read within a predetermined error budget on future read operations. The corrected data word and associated address would be stored within e1 register.

It should be noted that as discussed above, in one embodiment, the e2 register is optional. For memory devices without the additional dynamic redundancy register, the process flows from step 606 directly to step 610. In other words, at step 606, e1 register checks address to determine whether the data word associated with system read operation exists there. If no, then at step 610, the data word is read from memory bank at the associated address of system read operation in step 610.

Figure 7:
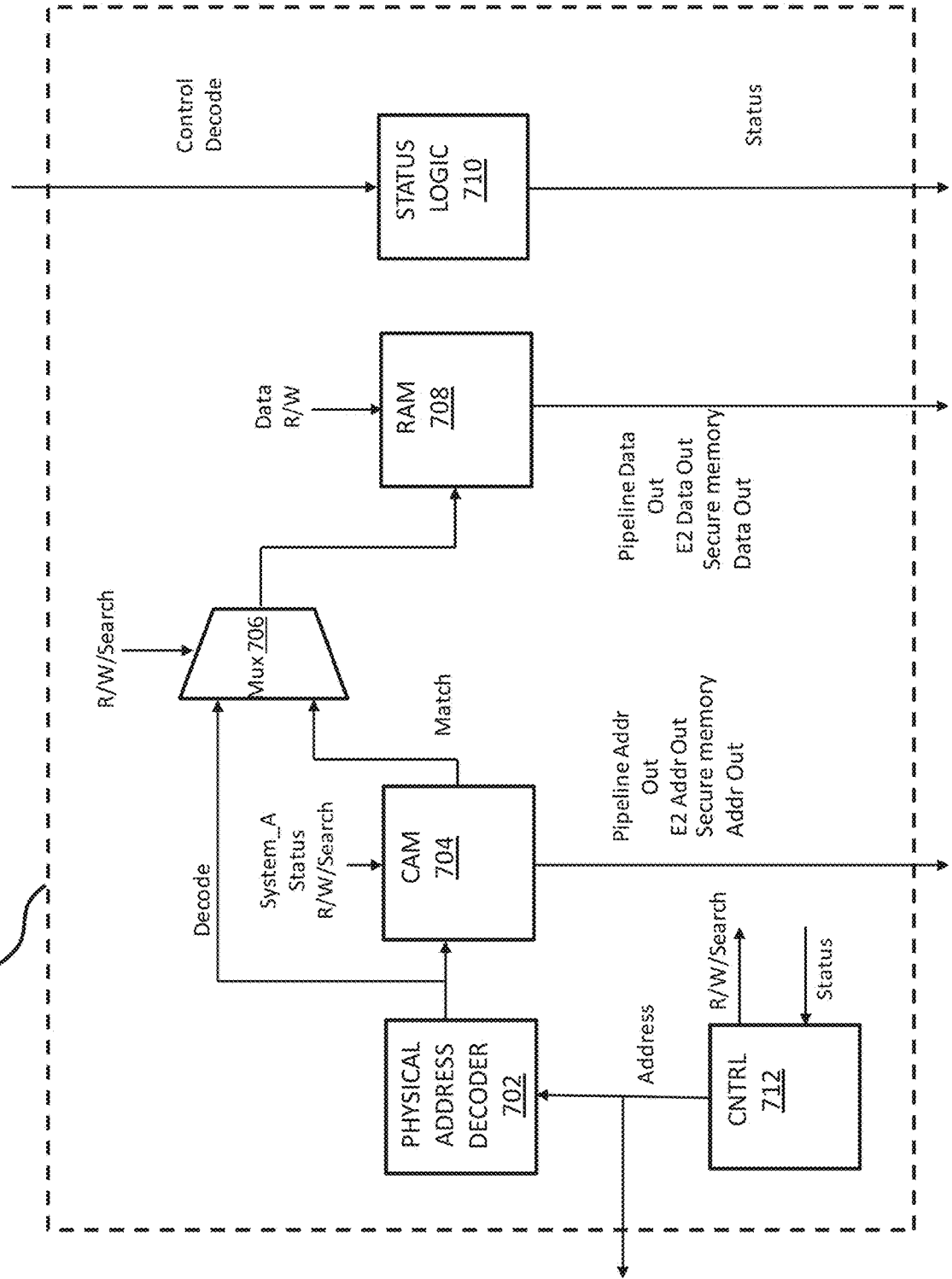
FIG. 7 is a block diagram of an embodiment of a memory device showing a first level dynamic redundancy register.

FIG. 7 is a block diagram of an embodiment of a memory device showing a first level dynamic redundancy register. FIG. 7 shows exemplary e1 register 700 described herein that comprises physical address decoder 702, CAM 704, mux 706, RAM 708, status logic 710, and control logic 712. One of ordinary skill in the art will recognize that e1 register 700 is exemplary, and includes features such as CAM 704 which are not required for achieving the teachings of the present disclosure. Moreover, e1 register 700 communicates control signals for maintaining consistency of operations both internally and to communicate with components of memory device such as pipeline banks, e2 register and secure memory storage, e.g., 932. Such control signals may be modified without departing from the teachings of the present disclosure.

Physical address decoder 702 is coupled to CAM 704, mux 706, and control logic 712. Physical address decoder 702 receives an address input from control logic 712. Physical address decoder 702 uses the address input to determine the appropriate physical addresses within CAM 704 and RAM 708 for performing data manipulation operation, such as read and write. Physical address decoder 702 selects an entry within CAM 704 using decode signal. Physical address decoder 702 may also select an entry within RAM 708 using decode signal to mux 706.

In one embodiment, physical address decoder 702 may take pointers as input from control logic 712. Different pointers from control logic 712 indicate available addresses for writing data to CAM 704 and RAM 708 or reading data from CAM 704 and RAM 708, or other pointers may be used. For example, pointers from control logic 712 may keep track of lowest open addresses within CAM 704 and RAM 704. Thus, e1 register 700 keeps track of addresses for storing new data. Pointers from control logic 712 may also keep track of oldest stored data within CAM 704 and RAM 708. Thus, re-write operations may be tried on a First-In-First-Out (FIFO) basis. Other schemes for addressing data within e1 register 700 and selecting data for data manipulation operations may be used by those with ordinary skill in the art without departing from the scope of this disclosure.

CAM 704 is coupled to mux 706. CAM 704 takes as input decode signal from physical address decoder 702. CAM 704 also takes as input an associated address which may be received from input register, delay register, or verify results register of a pipeline structure. CAM 704 also takes as input control bits such as read, write, or search signal received from control logic 712. CAM 704 also takes as input other control bits from status logic 710.

The associated address signals indicate addresses within a memory bank. Associated address signal is typically received from input register, delay register, or verify results register. Thus, e1 register 700 receives an address within a memory bank where data word should be verified or written. The e1 register 700 may also receive associated address from input register to be searched for words with matching row addresses which may be verified. As mentioned above, the input register allows a delay period for searching words associated with pending verify operations in the e1 register that have matching row addresses. CAM 704 will typically write associated address from delay register or verify results registers to itself, so that associated address may be used later for re-write or verify operation.

Status signal, such as valid bit, indicates whether physical address within CAM 704 contains valid data for data manipulation operation. CAM 704 may receive status signal from status logic 710.

Read signal indicates that CAM 704 should output an associated address, and RAM 708 should output the corresponding data word. CAM 704 may use decode and read signal to output an associated address of the data word stored in RAM 708. For example CAM 704 may output an associated address of the data word to write register. In this way, write register may write data from e1 register in a clock cycle during which it would otherwise be inactive.

Write signal indicates that the associated address should be stored within CAM 704 and the corresponding data word should be stored within RAM 708. For example, CAM 704 may use the associated address signal, decode signal, and write signal to write the associated address to a physical address within CAM 704. In one embodiment, this may occur because row address change occurred within pipeline structure and delay register sent a data word, an associated address, and control bits to e1 register 700 for storage. In another embodiment, verify results register may send a data word, an associated address, and control bits to e1 register 700 for storage because verify operation failed or data was not read within a predetermined error budget.

Search signal indicates that CAM 704 should search itself for an appropriate address. For example, CAM 704 uses search signal received from control logic 712 to search itself for an associated address to output to verify register. Thus, if row change has occurred in pipeline structure, CAM 704 may output the associated address of a data word sharing a common row address with the data word to be written from the pipeline. In addition, e1 RAM 708 outputs a data word matching the associated address within CAM 704 to the pipeline.

CAM 704 outputs associated addresses to the pipeline structure, such as to write register and verify register. CAM 704 also outputs associated addresses to e2 register or to secure memory storage area 932 (as discussed in connection with FIG. 9). CAM 704 may only output a portion of associated address. For example, if row address change occurred and CAM 704 searched itself for an appropriate address for verify operation, CAM 704 may output only the column address since the row address may be known. CAM 704 also outputs match signal to mux 706. Match signal indicates the physical address within RAM 708 of a data word that corresponds to the associated address within CAM 704. Match signal may be used when reading a data word from RAM 708.

Mux 706 takes as input read, write, search signal from control logic 712. Mux 706 also takes as input decode signal received from physical address decoder. Mux 706 also takes as input match signal from CAM 704. Mux then transmits select signal to RAM 708 for data manipulation operation. If mux 706 receives read signal, mux 706 typically transmits decode signal to RAM 708 because decode signal indicates the physical address within RAM 708 for read operation. If mux 706 receives write signal, mux 706 typically transmits decode signal to RAM 708 because decode signal indicates the physical address within RAM 708 for write operation. If mux 706 receives search signal, mux 706 typically transmits match signal to RAM 708 because match signal indicates the physical address within RAM 708 for outputting data word.

RAM 708 takes as input select signal from mux 706. RAM 708 also takes as input a data word received from pipeline structure, such as from delay register or verify results register. RAM 708 also takes as input read and write signals received from control logic 712. Select signal from mux 706 indicates the physical address within RAM 708 for performing data manipulation operation such as read or write operation. Data word signal indicates the data word for storage within RAM 708. Read signal indicates whether the physical address signal should be used for read operation such that data should be read from RAM 708 and output to pipeline structure or e2 register or secure memory storage. Write signal indicates whether select signal should be used for write operation such that data word signal should be written to RAM 708. RAM 708 typically comprises volatile memory such as SRAM, but may comprise non-volatile memory such as STT-MRAM.

Status logic 710 comprises hardware logic that drives the selection of addresses within control logic 710. Status logic 710 takes as input control signals from pipeline structure and e2 register. Control signals may include RowChange flag previously discussed. Control signals may also indicate whether data words associated with verify and re-write operations in the e1 register should be processed prior to re-locating them to secure memory storage or if the contents of the e1 register should be dumped in their entirety into the secure memory storage area 932. Pipeline structure may also transmit fail count bits to status logic 710. In one embodiment, status logic 710 updates a valid bit associated with a data word to invalid in the case that status logic 710 receives fail count bits set to 0. That is, because control signals received from verify results register indicated that verify operation passed, e1 register 700 invalidates the entry associated with data word (associated addresses, data word, any associated control bits). Status logic may also take as input inactive signal indicating that memory bank may become inactive during a subsequent clock cycle. Thus, e1 register should output a data word to write register for a re-write operation. Status logic 710 may also receive control signals from e2 register. For example, status logic 710 may receive signal indicating that e2 register is ready for a new data word. Status logic 710 may also receive a signal from the secure memory storage indicating that it is ready for a new data word in embodiments where there is no e2 register. Status logic 710 may also receive decode signal from physical decoder 702. Decode signal will indicate the entry or entries within e1 register 700 which are being updated.

Status logic 710 transmits status signals. Status logic 710 transmits status signals both internally and externally. Status logic 710 transmits status signals to control logic 710. Status logic 710 may also transmit status signals, such as fail count bit, to pipeline structure and e2 register. Thus, control signals from status logic 710 may be used to maintain consistency of operations both within e1 register 700 and within pipeline structure.

Control logic 712 comprises hardware logic for determining operations to be performed on CAM 704 and RAM 708. Control logic 712 also comprises hardware logic for outputting address signal to physical address decoder 702. Control logic 712 takes as input status signals from status logic 710. Status signals drive the selection of addresses by control logic 712. For example, status signals may indicate that write operation should be performed on CAM 704 and RAM 708. Control logic may then increment a pointer to next address, indicating empty addresses within CAM 704 and RAM 708 for writing associated addresses and data words. The address signal output from control logic 712 may comprise pointers that are decoded by physical address decoder 702 to select appropriate physical addresses within CAM 704 or RAM 708 for performing data manipulation operation. The address signal output from control logic 712 may also be output to the pipeline to indicate physical addresses within e1 register 700.

In this way, e1 register 700 may transmit a data word, its associated address, and its physical address within e1 register 700 to pipeline structure. The physical address within e1 register 700 may be used to update e1 register 700 control bits after verify or re-write operation occurs. If the re-write operation failed, for example, fail count bits within e1 register 700 may be updated using the physical address within e1 register 700.

One of ordinary skill in the art will understand that the specific control signals, logic and structures disclosed with respect to FIG. 7 are merely exemplary, and illustrate one of many possible implementations of e1 register 700. Other implementations of e1 register 700 may be used in conjunction with the teachings of the present disclosure.

Smart Dynamic Redundancy Register Design to Prevent E1 Overflow

In one embodiment of the present invention, a memory device may comprise multiple banks or segments. As noted above, the memory bank may comprise STT-MRAM which suffers from an inherently stochastic write mechanism, wherein bits have certain probability of write failure on any given write cycle. In other words, the memory cells are characterized by having a high write error rate. The dynamic redundancy registers of the present disclosure allow the memory bank to be operated with high WER (write error rate). However, designers of the memory device need to ensure that the size of a dynamic redundancy register or cache memory, e.g., an e1 register used to store data words associated with pending verify and re-write operations does not exceed practical limitations.

Accordingly, the e1 register needs to be designed with a sufficient fixed size so that overflow is avoided in all cases. One of the factors that need to be taken into consideration in determining an optimal size for the e1 register is the WER. For example, for a higher error rate, the e1 register will need to be larger than for a lower error rate. In one embodiment, the number of entries in the e1 register will be at least the WER*the size of the memory bank.

Further, in one embodiment, the e1 register will contain at least one entry per row segment. In one embodiment, the e1 register can contain 2 entries per row segment. For example, if each row segment in a memory bank has a 100 rows, then the size of the e1 register would be at least 200 entries.

In one embodiment, the number of entries the e1 register needs to contain per row segment is related to the depth of the pipeline. In other words, the number of entries the e1 register contains is directly proportional to the number of pipeline stages (or pipe-stages). This is because with a longer pipeline, there will be more data words that need to be stored in the e1 register in case of a row change, e.g., when a RowChange signal is received. For example, as seen in FIGS. 5, 14 and 15, the pipeline can have several stages. The more stages the pipeline has, the higher the number of entries that e1 needs to be designed to contain. If the pipeline has an additional write stage, as shown in FIG. 15, receiving a RowChange signal would mean that the entries in both a write register and a verify register would need to be saved to be verified at a later time. Accordingly, additional storage space will be needed in the e1 register as compared to a case where there's only a single write stage in the pipeline.

In one embodiment, if the memory bank 2100 comprises N rows per segment and the pipeline has M number of stages, then, the e1 register will comprise at least N*M entries.

As mentioned above, the number of entries in the e1 register can also be a function of the WER. In one embodiment, the size of the e1 register can be at least (N*M)+(WER*number of entries in the memory bank).

In one embodiment, the memory device can comprise a plurality of memory banks as discussed above, wherein each of the memory banks (or segments) can have its own pipeline and a dedicated e1 register. Or alternatively, the memory device can comprise a plurality of memory banks, wherein each of the memory banks (or segments) can have its own pipeline, but a single e1 register serves all the segments (instead of a dedicated e1 register per segment).

In one embodiment, a warning pin or status bit can be used to indicated to the user the occupancy level of the e1 register. For example, status bits may indicate to a user that the e1 register is 25%, 50%, 75% or completely full.

Figure 21:
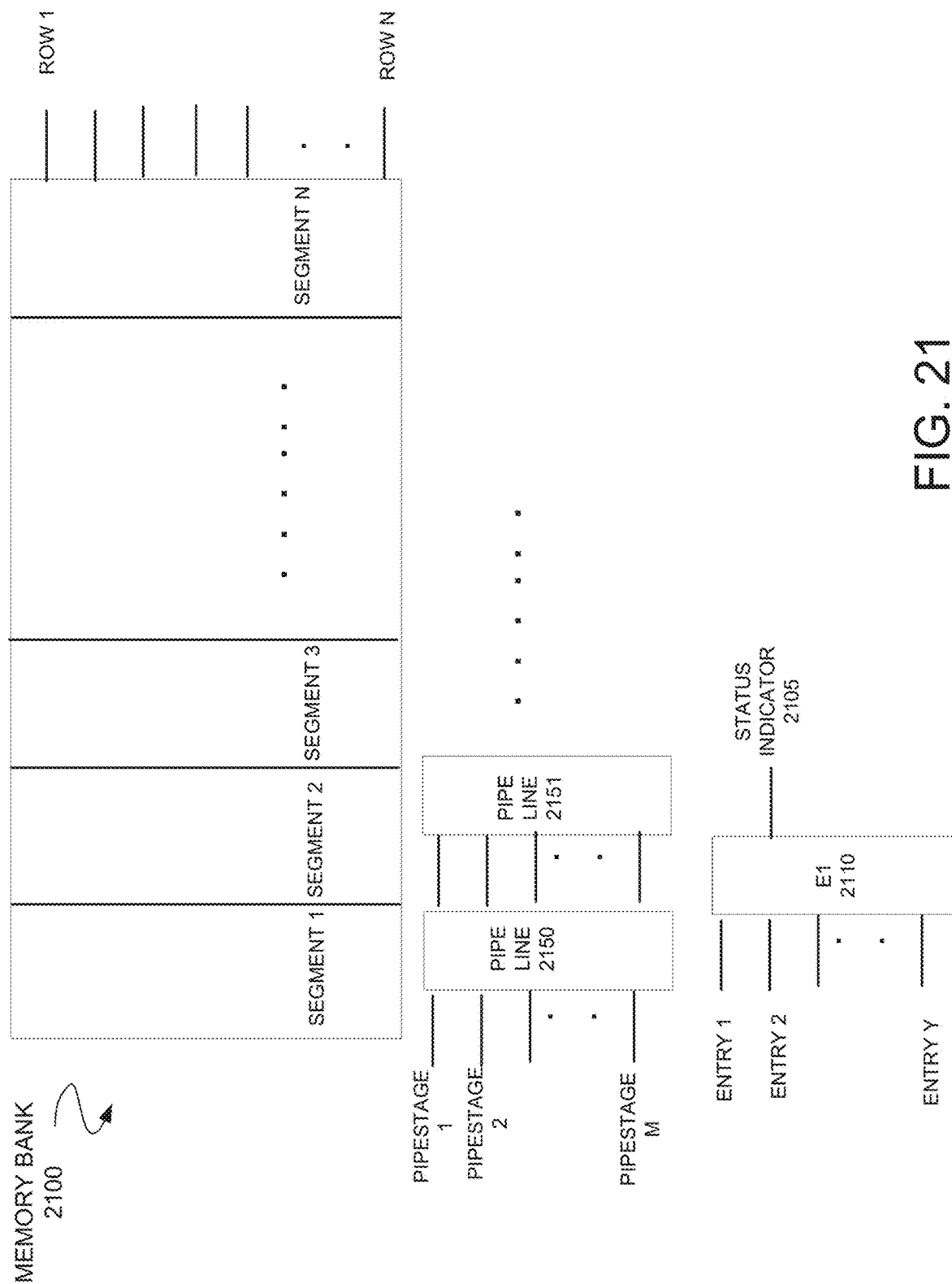
FIG. 21 illustrates a smart design for a dynamic redundancy register in accordance with an embodiment of the present invention.

FIG. 21 illustrates a smart design for a dynamic redundancy register in accordance with an embodiment of the present invention. The memory bank 2100 comprises multiple addressable memory cells configured in multiple segments, wherein each segment contains N rows per segment. Each of the segments can be associated with its own pipeline. As shown in FIG. 21, segment 1 of memory bank 2100 can be associated with pipeline 2150 while segment 2 can be associated with pipeline 2151. Each pipeline comprises M pipestages and are configured to process write operations for data words addressed to a given segment of a of the memory bank. Alternatively, in one embodiment, a single pipeline can service all the segments in the memory bank. In other words, the entire memory bank comprises a single pipeline.

The memory device can also comprise a dynamic redundancy register or cache memory E1 2110. The number of entries, Y, in e1 is based on M, N and a prescribed word error rate (WER) so as to prevent overflow of the cache memory. In a different embodiment, each of the segments of memory bank 2100 can have its own associated e1 register. However, in a typical embodiment, a single e1 register services all the segments of the memory bank.

In one embodiment, the number of entries Y in e1 can be calculated using the formula: (N*M+B*E), wherein B indicates the number of rows in the memory bank.

In one embodiment, a warning pin(s) or status bit(s) 2105 can be used to indicate to the user the occupancy level of the e1 register. For example, status bits may indicate to a user that the e1 register is 25%, 50%, 75% or completely full.

A Method of Optimizing Write Voltage Based on Error Buffer Occupancy

As noted above, memory bank 2100 may comprise STT-MRAM which suffers from an inherently stochastic write mechanism, wherein bits have certain probability of write failure on any given write cycle. In other words, the memory cells are characterized by having a high write error rate. The dynamic redundancy registers (e.g., e1 2110) of the present disclosure allow the memory bank to be operated with high WER (write error rate). As also noted previously, designers of the memory device need to ensure that the size of a dynamic redundancy register or cache memory, e.g., an e1 register used to store data words associated with pending verify and re-write operations does not exceed practical limitations. Furthermore, designers need to provide for a way to relieve the pressure off of the dynamic redundancy register, e.g., e1 2110 if it is approaching close to its capacity. In other words, designers need to provide a mechanism to prevent the dynamic redundancy register from overflowing if it is filling up too rapidly. The e1 register needs to be designed to avoid overflow in all cases.

Figure 22:
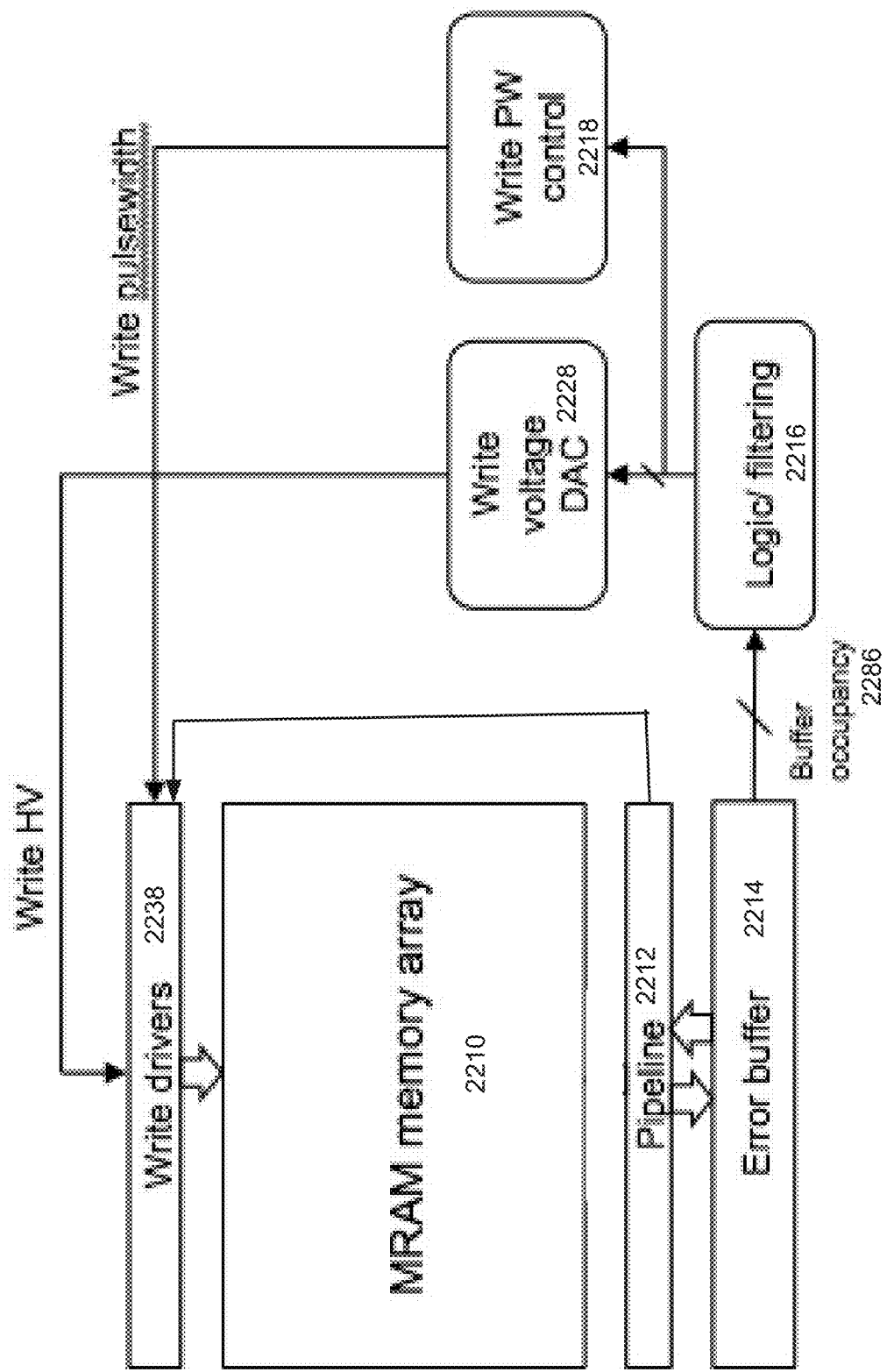
FIG. 22 is a block diagram of an exemplary embodiment of a memory device that optimizes write voltage based on error buffer occupancy in accordance with an embodiment of the present invention.

FIG. 22 is a block diagram of an exemplary embodiment of a memory device that optimizes write voltage based on error buffer occupancy in accordance with an embodiment of the present invention. As shown in FIG. 22, the e1 register (also known as an 'error buffer') 2214 stores data words that are to be verified or re-written to a memory bank 2210. The error buffer 2214 is coupled to the memory array 2210 through pipeline 2212 as discussed in detail, for example, in FIGS. 5, 14 and 15. The memory bank may be an MRAM array. In one embodiment, the MRAM may comprise STT-MRAM.

In one embodiment of the present invention, as entries in the e1 register (also known as an 'error buffer') 2214 increase, the write voltage on the write cycles to the memory bank can be increased in order to reduce the error rate. In one embodiment, the write voltage on both the bit and source lines of the memory cell are increased. Increasing the write voltage on write cycles to the memory bank of an MRAM array decreases the WER. Because the memory cells are written to with a higher voltage, there is a lesser likelihood of a memory cell being written to incorrectly. Under typical operating conditions, increasing write voltage will consume more energy and reduce the reliability of the memory because the oxide in the memory cells wears down faster at higher voltage rates. Nevertheless, in order to prevent the e1 register from overflowing, embodiments of the present invention have built-in logic circuitry 2216 to recognize when the error buffer is filling up and to increase the voltage temporarily to reduce the error rate. Reducing the error rate advantageously reduces the number of entries placed into the e1 register because data words tend to be written correctly on a first attempt without requiring re-writes. Further, read operations are also less likely to add more entries to the e1 register.

It should be noted, however, operating the memory at higher write voltages for longer periods of time may cause the memory cells to wear down faster. In one embodiment, if a data word in the memory bank has one or more memory cells that have failed or completely worn down, that data word is transferred or moved over to the e1 register. Subsequently, all accesses to that data word are from the e1 register as opposed to the memory bank.

As mentioned previously, in one embodiment, a warning pin(s) or status bit(s) 2105 can be used to indicate to the user the occupancy level of the e1 register. For example, status bits may indicate to a user that the e1 register is 25%, 50%, 75% or completely full. Similarly, in one embodiment, status bits 2286 indicating buffer occupancy can be relayed to a logic module 2216 that determines how close to full the e1 register is getting. The status bits may, for example, indicate the level of occupancy of the e1 register or error buffer. The higher the number of status bits available, the higher the precision with which the logic module 2216 can determine the occupancy levels of the error buffer.

Responsive to a determination that the occupancy level of the e1 register is increasing, or has crossed a predetermined threshold, the logic module 2216 communicates with the write voltage digital-to-analog converter (DAC) 2228, which in turn increases the write voltage on the write drivers 2238.

In one embodiment, logic circuitry 2216 is configured to monitor cache occupancy to modulate the write voltage for error buffer and endurance optimizations. Using a higher write voltage at higher error buffer occupancy levels optimizes the error buffer by reducing the WER and, thereby, ensures that there is less likelihood of the error buffer exceeding capacity. Similarly, logic circuitry 2216 also enables endurance optimization because it lowers the write voltage in response to lower cache occupancy levels, thereby, reducing write stress and promoting higher endurance.

In one embodiment, logic circuitry 2216, over a period of time, stabilizes the write voltage at an optimal level, which allows the occupancy level of the error buffer to not exceed a predetermined threshold while at the same time maintaining an acceptable level of endurance. In other words, logic circuitry 2216 can be programmed to select an optimal write voltage level that achieves a balance between error buffer occupancy levels and memory endurance levels. Accordingly, the self-trimming of the write voltage on the memory chips by logic circuitry 2216 can result in higher endurance levels for memory chips because the write voltage can be dynamically adjusted to operate at lower levels in response to low error buffer occupancy levels.

In one embodiment, the logic module 2216 can be programmed so that the increase in write voltage is proportional to the occupancy level of the error buffer 2214. For example, if the error buffer is 25% full, the write voltage is increased by 25%. Alternatively if the error buffer is close to 75% full, the write voltage would be increased by 75%. In one embodiment, the write voltage is not increased until the occupancy level of the e1 register surpasses a threshold level, e.g., 25%. For example, the write voltage is increased after the error buffer is more than 25% full.

The logic circuitry 2216 monitors the buffer occupancy signals 2286 to keep track of the occupancy level of the error buffer. Once the error buffer starts falling below a certain threshold level, for example, the write voltage can be decreased accordingly. For example, if the error buffer is less than 25%, the write voltage can be dialed down to normal operating conditions.

In this way, embodiments of the present invention advantageously allow dynamic control over the occupancy levels of the error buffer. By optimizing the write voltage based on error buffer occupancy, the error buffer is prevented from ever getting overfull or exceeding capacity. Similarly, as mentioned above, endurance levels are optimized because embodiments of the present invention are able to reduce the write voltage in response to lower error buffer occupancy levels.

In one embodiment of the present invention, instead of adjusting the write voltage, the pulse width of the write cycle can be modified based on the error buffer fill rate. Similar to increasing the write voltage, increasing the pulse width can reduce the WER. Accordingly, as the error buffer becomes more full, the pulse width of the write cycle can be increased to reduce the write error rate. Conversely, as the error buffer empties out, the pulse width can be reduced in order to optimize for endurance. The logic circuitry 2216 can alter the pulse width using the write pulse width control module 2218. The pulse width control module 2218 communicates with the write drivers 2238 to effectuate the pulse width change on the write cycle. Controlling the pulse width allows an extra level of control over the WER, which is useful especially in cases where the write voltage cannot be increased any further. Therefore, to avoid chip breakdown, the pulse width can be increased instead of increasing the write voltage.

It should be noted that increasing the pulse width allows the same voltage to be applied for a longer duration and, therefore, it also causes oxide related stress in the memory cells. Accordingly, the logic circuitry module 2216 should be programmed to reduce the pulse width in response to lower error buffer occupancy levels.

In one embodiment, logic circuitry 2216 can be configured to control both the write voltage level (through write voltage DAC 2228) and the write pulse width (through write pulse width control module 2218) in order to achieve an optimal operating write voltage level for the chip. In such an embodiment, both write voltage and the write pulse width may be increased and decreased together to attain an optimal operating write voltage level for the chip. Alternatively, in a different embodiment, the write voltage and write pulse width may be adjusted in phases. For example, in response to an error buffer that is getting full, the write voltage may be increased at first. Subsequently, if the error buffer continues to get full, the write pulse width may be increased before attempting to increase the write voltage to a higher voltage step. Also, in the scenario that the write voltage has been increased beyond an acceptable threshold, it is important to give the test and/or product engineers the flexibility to adjust the write pulse width. Once the write voltage level has been increased beyond an acceptable threshold, only the write pulse width may be increased to control the occupancy level of the error buffer.

Embodiments of the present invention advantageously allow for dynamic self-trimming in the field. Instead of the needing to select an optimal voltage level at test, the logic circuitry 2216 can be programmed to pick the optimal voltage level based on the error rates. For example, as the life of the chip gets older, the error rate may increase and, accordingly, the logic circuitry may need to apply a higher write voltage in order to prevent the occupancy levels of the error buffer from increasing. The logic circuitry 2216 self-trims by adjusting the write voltage higher in response to higher occupancy levels of the error buffer without requiring human intervention.

Embodiments of the present invention also advantageously reduce test time because the test and/or product engineers do not have to manually find an optimal operational voltage for each memory chip, which can vary between chips. In other words, embodiments of the present invention can be used to self-trim the write voltage on memory chips. Typically, test time is used up by engineers to determine the appropriate voltage level for each die. Further, the engineers will typically need to select a different operational voltage for each life cycle of the die, e.g., early life, mid-life and end-of-life voltages. It is appreciated that instead of using up valuable test time in determining appropriate voltage levels for each life cycle of a chip, embodiments of the present invention dynamically adjust the voltage levels based on the error rate and the concomitant error buffer occupancy levels.

Temperature conditions may also affect the optimal operating voltage levels of a memory chip. Embodiments of the present invention allow the memory chip to dynamically adjust the write voltage levels to the changing temperature levels simply by monitoring the error buffer occupancy levels. This conserves engineer time in determining optimal voltage levels for various temperature ranges. Instead, a test technician or engineer may simply select an acceptable starting voltage for each chip and allow the logic circuitry module 2216 to converge the write voltage to an optimal level based on the error buffer occupancy levels. As a result, the product lifecycle is increased because the logic circuitry module can dynamically select the optimal write voltage for higher endurance levels.

Figure 23:
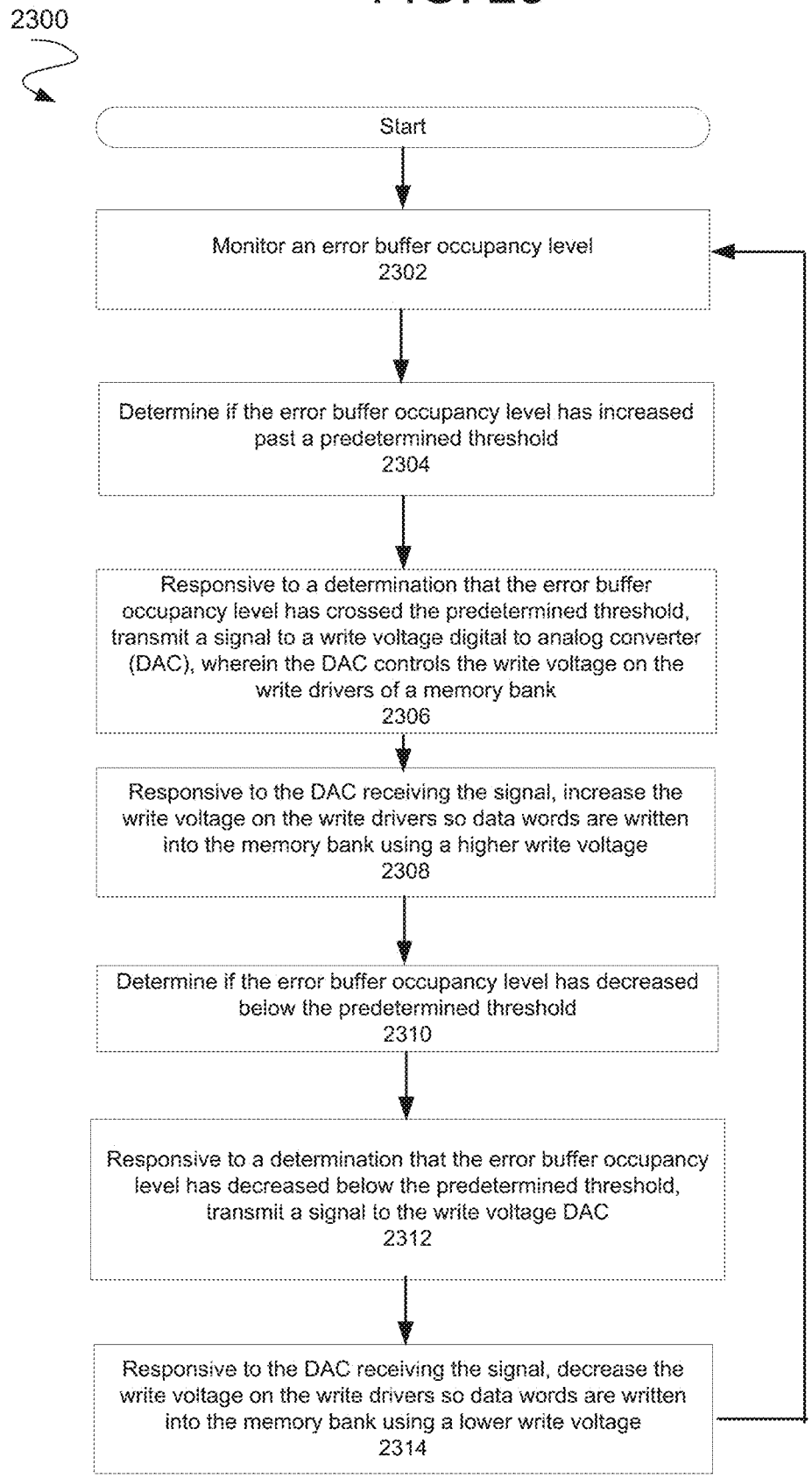
FIG. 23 depicts an exemplary embodiment for a process flow showing the manner in which the write voltage for a memory bank is optimized based on error buffer occupancy levels in accordance with an embodiment of the present invention.

FIG. 23 depicts an exemplary embodiment for a process flow showing the manner in which the write voltage for a memory bank is optimized based on error buffer occupancy levels in accordance with an embodiment of the present invention.

At step 2302, the error buffer (or e1 register) 2214 is monitored by the logic circuitry 2216 to determine the occupancy level of the error buffer. At step 2304, the logic circuitry determines if the error buffer occupancy level has increased past a predetermined threshold. The threshold information may be programmed or configured into the logic circuitry.

At step 2306, responsive to a determination that the error buffer occupancy level has crossed the predetermined threshold, a signal is transmitted from the logic circuitry 2216 to the write voltage digital-to-analog converter (DAC) 2228, where the write voltage DAC controls the write voltage on the write drivers 2238 of the memory bank 2210.

At step 2308, the write voltage on the write drivers 2238 is increased so subsequent data words written into the memory bank 2210 are written using a higher write voltage.

At step 2310, logic circuitry 2216 further determines if the error buffer occupancy levels have decreased below the predetermined threshold. At step 2312, responsive to a determination that the error buffer occupancy level has decreased below the predetermined threshold, log circuitry transmits a signal to the write voltage DAC. At step 2314, in response to the signal transmitted to the write voltage DAC, the write voltage on the write drivers 2238 is decreased so that incoming data words are written into the memory bank at a lower write voltage. Thereafter, the process continues until the voltage level converges to an optimal level. Alternatively, if the voltage level does not converge to an optimal level, the process continues to increase or decrease the write voltage as necessary depending on the occupancy level of the error buffer.

Figure 24:
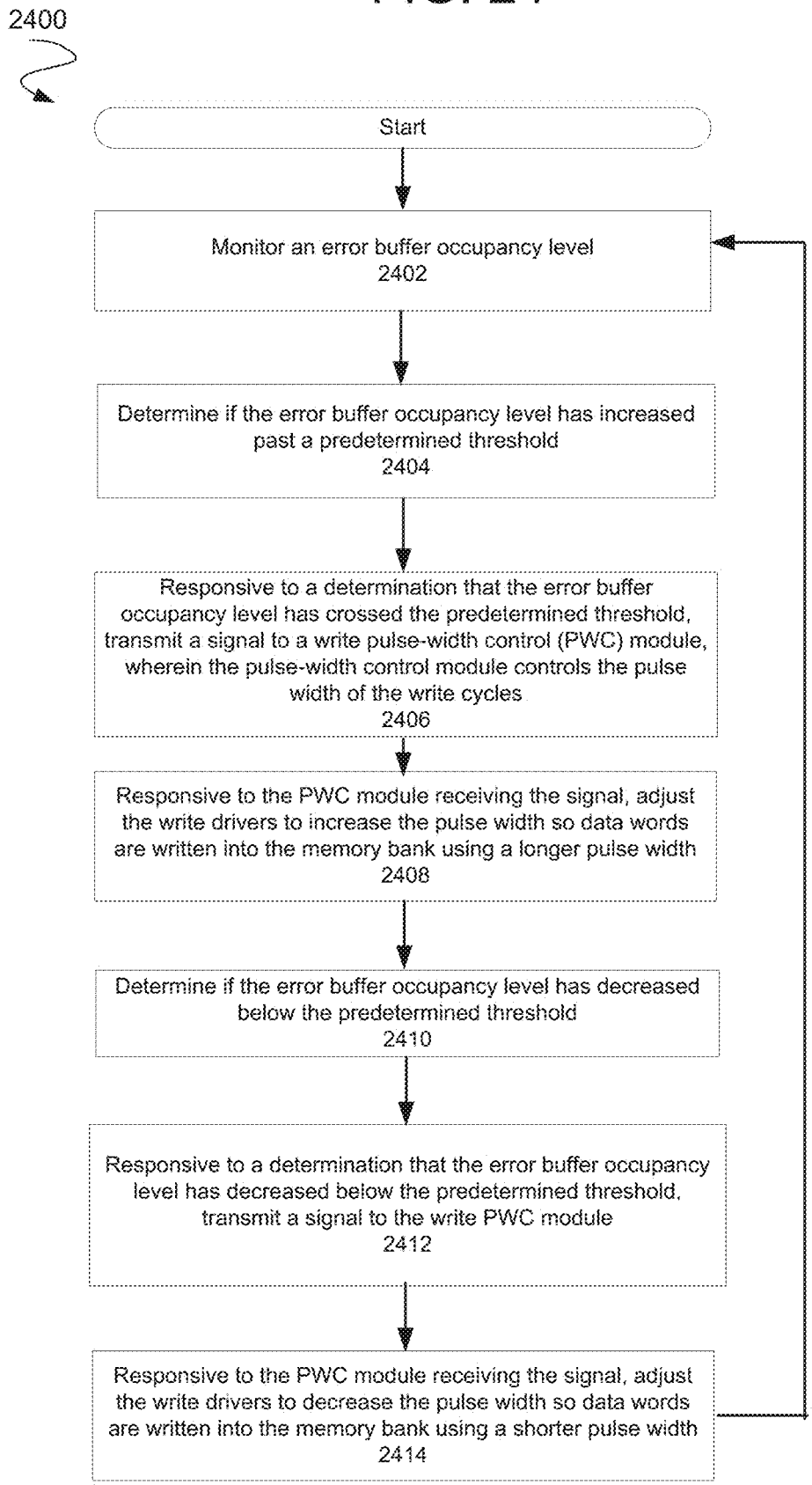
FIG. 24 depicts an exemplary embodiment for a process flow showing the manner in which the pulse width for write cycles of a memory bank is optimized based on error buffer occupancy levels in accordance with an embodiment of the present invention.

FIG. 24 depicts an exemplary embodiment for a process flow showing the manner in which the pulse width for write cycles of a memory bank is optimized based on error buffer occupancy levels in accordance with an embodiment of the present invention.

At step 2402, the error buffer (or e1 register) 2214 is monitored by the logic circuitry 2216 to determine the occupancy level of the error buffer. At step 2404, the logic circuitry determines if the error buffer occupancy level has increased past a predetermined threshold. The threshold information may be programmed or configured into the logic circuitry.

At step 2406, responsive to a determination that the error buffer occupancy level has crossed the predetermined threshold, a signal is transmitted from the logic circuitry 2216 to the write pulse width control module 2218, where the write pulse width control module controls the write voltage on the write drivers 2238 of the memory bank 2210.

At step 2408, the write drivers 2238 are adjusted to increase the pulse width so subsequent data words written into the memory bank 2210 are written using a longer write pulse width.

At step 2410, logic circuitry 2216 further determines if the error buffer occupancy levels have decreased below the predetermined threshold. At step 2412, responsive to a determination that the error buffer occupancy level has decreased below the predetermined threshold, transmit a signal to the pulse width control module 2218. At step 2414, in response to the signal transmitted to the pulse width control module, the pulse width on the write drivers 2238 is adjusted so that incoming data words are written into the memory bank using a shorter pulse width. Thereafter, the process continues until the voltage level converges to an optimal level. Alternatively, if the voltage level does not converge to an optimal level, the process continues to increase or decrease the pulse width as necessary depending on the occupancy level of the error buffer.

A Multi-Chip Module for MRAM Devices

As noted previously, memory bank, e.g., memory bank 2100 may comprise STT-MRAM which suffers from an inherently stochastic write mechanism, wherein bits have certain probability of write failure on any given write cycle. In other words, the memory cells are characterized by having a high write error rate. The dynamic redundancy registers (e.g., e1 104 or e2 106) of the present disclosure allow the memory bank to be operated with high WER (write error rate). The dynamic redundancy registers perform error management for the MRAM memory bank by storing data words (and associated addresses) for pending verify and re-write operations.

As also noted above, in one embodiment, the e1 register may be located off the memory chip and on a system card or even on the CPU. In other words, the e1 register can be located on a different chip besides the memory chip. Similarly, the e2 register may also be located off the memory chip. Neither, the e1 register nor the e2 register need to be located on the same chip as the memory chip.

In one embodiment, in order to increase density and optimize the use of the MRAM engine, MRAM engine is separated out from the memory banks onto a different die. The MRAM engine is the control engine of the memory and may comprise the e1 register, the e2 register, one or more pipelines, control registers and any other control logic used to control the memory and the dynamic redundancy registers (e.g., e1 and e2). The MRAM memory arrays comprising the one or more memory banks are separated out on separate dies. In other words, the MRAM engine would be fabricated on a single die while the dies comprising the memory arrays may be fabricated on separate dies. In one embodiment, the dies comprising the memory arrays may be stacked on top of the MRAM engine die. It should be noted that in different embodiments the MRAM engine die may be located at any position within the stack and is not necessarily at the bottom.

For example, referring to FIG. 21, each of the memory bank segments can be on a separate die that is stacked on top of a MRAM engine die, wherein the MRAM engine die comprises the pipelines (e.g., 2150 and 2151) and one or more dynamic redundancy registers (e.g., 2110). It was noted earlier in connection with FIG. 21 that in a different embodiment, each of the segments of memory bank 2100 can have its own associated e1 register. In such an embodiment, all the e1 registers associated with the respective memory bank segments would be located on the MRAM engine die while each of the respective memory bank segments may be located on a separate die. Alternatively, all the memory bank segments may be placed on a single die.

By way of further example, referring to FIG. 17, each of the memory banks, A 1702 and B 1703 may be located on a separate die. The dies comprising the memory banks may be stacked on top of an MRAM engine die comprising the dynamic redundancy registers, control logic, and the various multiplexers and decoders illustrated in FIG. 17.

Figure 25:
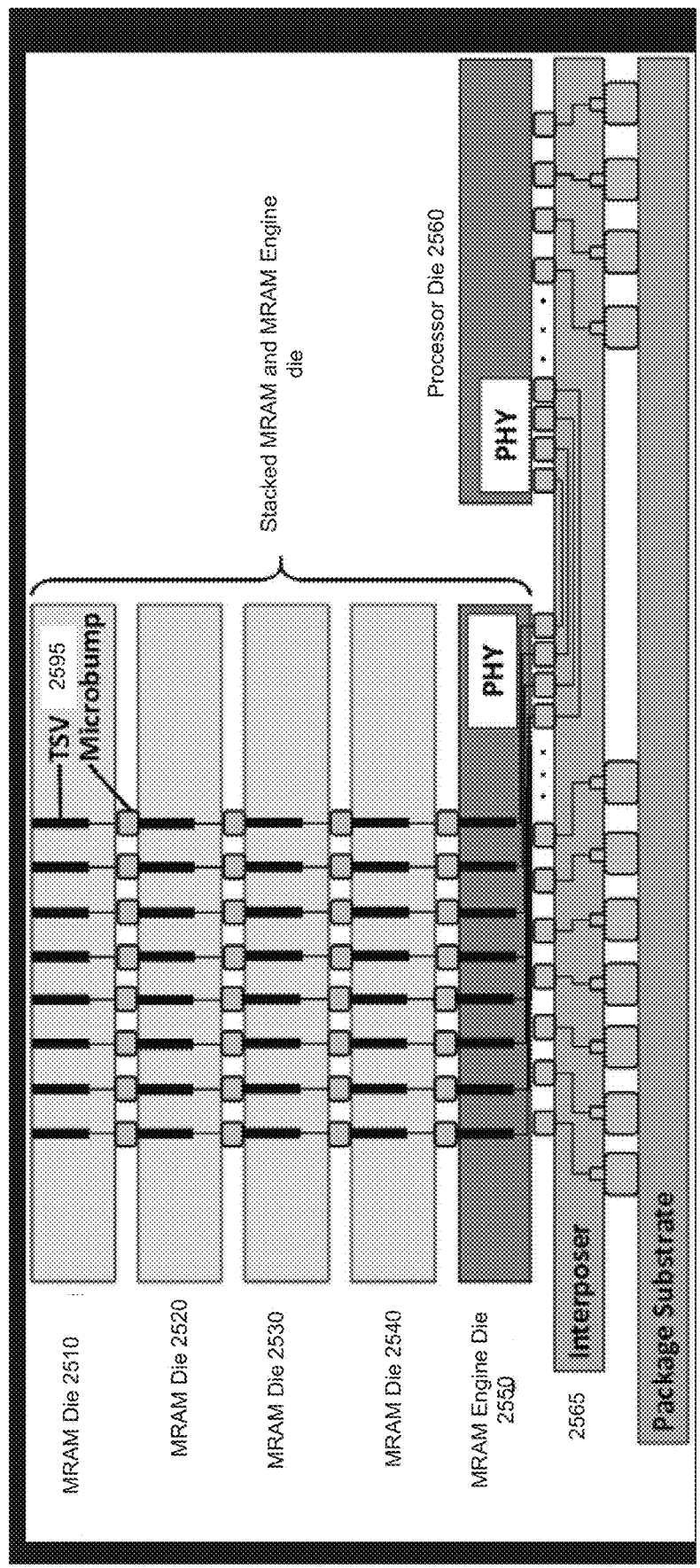
FIG. 25 illustrates the manner in which stacking dies by using through-silicon vias can be used to increase memory density and optimize the use of the MRAM engine in accordance with an embodiment of the present invention.

FIG. 25 illustrates the manner in which stacking dies by using through-silicon vias can be used to increase memory density and optimize the use of the MRAM engine in accordance with an embodiment of the present invention. As one having ordinary skill in the art would appreciate, a through-silicon via (TSV) is a vertical electrical connection (via) that passes completely through a silicon wafer or die. TSVs are high performance interconnect techniques used as an alternative to wire-bond and flip chips to create 3D packages and 3D integrated circuits. Compared to alternatives such as package-on-package, the interconnect and device density is substantially higher, and the length of the connections becomes shorter.

Embodiments of the present invention use TSVs to stack dies in a way such that the MRAM memory bank dies are separated out and stacked atop the MRAM engine die (or dies). Stacking dies using TSVs allows embodiments of the present invention to achieve a higher memory density and optimize the use of the MRAM engine. For example, the control logic along with the dynamic redundancy registers may comprise a large number of I/O signals—using TSVs helps facilitate inter-board routing of the signals without needing to create long traces or routes on any given die or board.

It should be noted that using TSVs is not the only way to implement embodiments of the present invention. For example, multi-die packages can be implemented in other ways that allow the memory banks to be stacked separately from the MRAM engine.

As shown in FIG. 25, four MRAM dies 2510, 2520, 2530 and 2540 are stacked on top of an MRAM engine die 2550. This configuration achieves a much higher internal bandwidth than conventional MRAM memory designs. The close integration of the MRAM engine control die with the memory banks using the TSV interconnects leads to higher density. TSVs are vertical interconnects that can pass through the silicon wafers of a 3D stack of dies. A TSV has a much smaller feature size than a traditional PCB interconnect, which enables a 3D-stacked MRAM to integrate hundreds to thousands of these wired connections between stacked layers. Using this large number of wired connections, 3D-stacked MRAM can transfer bulk data simultaneously, enabling much higher bandwidth compared to conventional MRAM.

FIG. 25 shows a 3D-stacked MRAM based system that comprises the four layers of MRAM dies and an MRAM engine control die stacked together and connected using TSVs, a processor die 2560, and a silicon interposer 2565 that connects the stacked MRAM and the processor 2560. The vertical connections in the stacked MRAM are considerably wide and short, which results in high bandwidth and low power consumption, respectively. It should be noted that embodiments of the present invention are not limited to only 4 layers of MRAM dies. There can be several layers of MRAM memory dies, for example, stacked on top of the MRAM engine module 2550, wherein the communication between the layers takes place using TSVs. Similarly, the MRAM engine may be spread across multiple dies as well. Accordingly, in one embodiment of the present invention, the MRAM architecture can comprise M layers of memory dies stacked atop N layers of MRAM engine dies.

In one embodiment, instead of having a separate processing die 2560, computational or processing units are placed inside the memory system where the data resides. This improves performance from both a bandwidth and latency standpoint and reduces energy consumption in the memory. For example, processing capability may be added to the MRAM engine die 2250. The computation inside or near the MRAM memory dies significantly reduces the need to transfer data to/from the processor 2560 over the memory bus. Thus, the processing in the memory results in a considerable performance improvement and energy reduction compared to conventional MRAM architectures which must transfer all data to/from the processor since the processor is the only unit that performs all the computational tasks.

In one embodiment, the stacked MRAM configuration of FIG. 25 along with processing capabilities added to the MRAM engine enables high-performance and low-power systems. The multiple stacked MRAM dies are controlled by the tightly-integrated MRAM engine layer 2550.

In one embodiment, the MRAM engine layer 2550 will comprise additional memory management and control logic to control the MRAM memory banks. In this embodiment, the MRAM engine layer may be able to use the control logic and memory management to manage bad addresses and locations prior to using the dynamic redundancy registers of the MRAM engine in order to store data words (and associated addresses) for pending verify and re-write operations.

In one embodiment, the MRAM engine module, in addition to processing capabilities, may also include certain memory modules as well. In other words, it is not essential for the MRAM engine module to exclusively comprise control logic—the MRAM engine module may also comprise one or more memory banks. The MRAM engine die 2550 may in certain cases comprise memory banks that did not fit onto the memory dies 2510, 2520, 2530 and 2540. In such an embodiment, the MRAM engine die 2550 may be a larger die than the other memory dies. However, in an alternative embodiment, where the MRAM engine die does not comprise any memory, the MRAM engine die may be the same size as the other die in the stack.

Similarly, in one embodiment, the dies comprising memory banks may also contain parts of the control logic. In other words, it is not essential for the control logic, pipelines and other registers to reside exclusively on the MRAM engine die. For example, the pipeline banks (e.g., 308 and 310) associated with the memory banks (e.g., 304 and 306) may be located on the same die as the memory banks.

Memory dies 2510, 2520, 2530 and 2540 typically will not comprise any control logic.

Embodiments of the present invention allow for higher density MRAM within a single package. The MRAM engine can be implemented on a separate die from the memory die, which increases MRAM die density and optimizes the usage of the MRAM engine to multiple die.

In one embodiment, the MRAM engine (comprising the dynamic redundancy registers, pipelines and control logic) allows a reduced cell size or cell current for the memory bank cells. The dynamic redundancy registers, as explained above, allow the memory banks to be operated with high WER (write error rate). Reducing the cell size or cell current of the memory bank may be advantageous in certain cases because reducing the memory cell size allows for higher density memories while reducing the cell current allows for power savings. However, reducing the cell size or cell current may, in certain cases, lead to higher WER. The MRAM engine advantageously enables the memory banks to operate with a higher WER, particularly where the dynamic redundancy registers are sized to accommodate a higher number of entries.

Accordingly, the MRAM memory banks can be designed with smaller transistor sizes—the memory banks can rely on the MRAM engine to absorb the ramifications of the associated higher WER.

Furthermore, by separating out the MRAM engine from the memory banks, embodiments of the present invention advantageously allow different fabrication and process technologies to be used for the memory bank dies as compared with the MRAM engine die. For example, the MRAM memory only dies may be fabricated with a technology used for cheap and low-cost memory cells of reduced size. By comparison, the MRAM engine may need transistors that are faster. Accordingly, the MRAM engine die may be fabricated with a high speed CMOS process. In one embodiment, the memory dies may use specialized transistors—embodiments of the present invention would allow the memory bank dies to be fabricated using specialized processing technology, e.g., specialized technology associated with the transistors that optimizes MRAM performance or density. Meanwhile, the MRAM engine die may be fabricated using CMOS technology required for high-speed logic.

Figure 8:
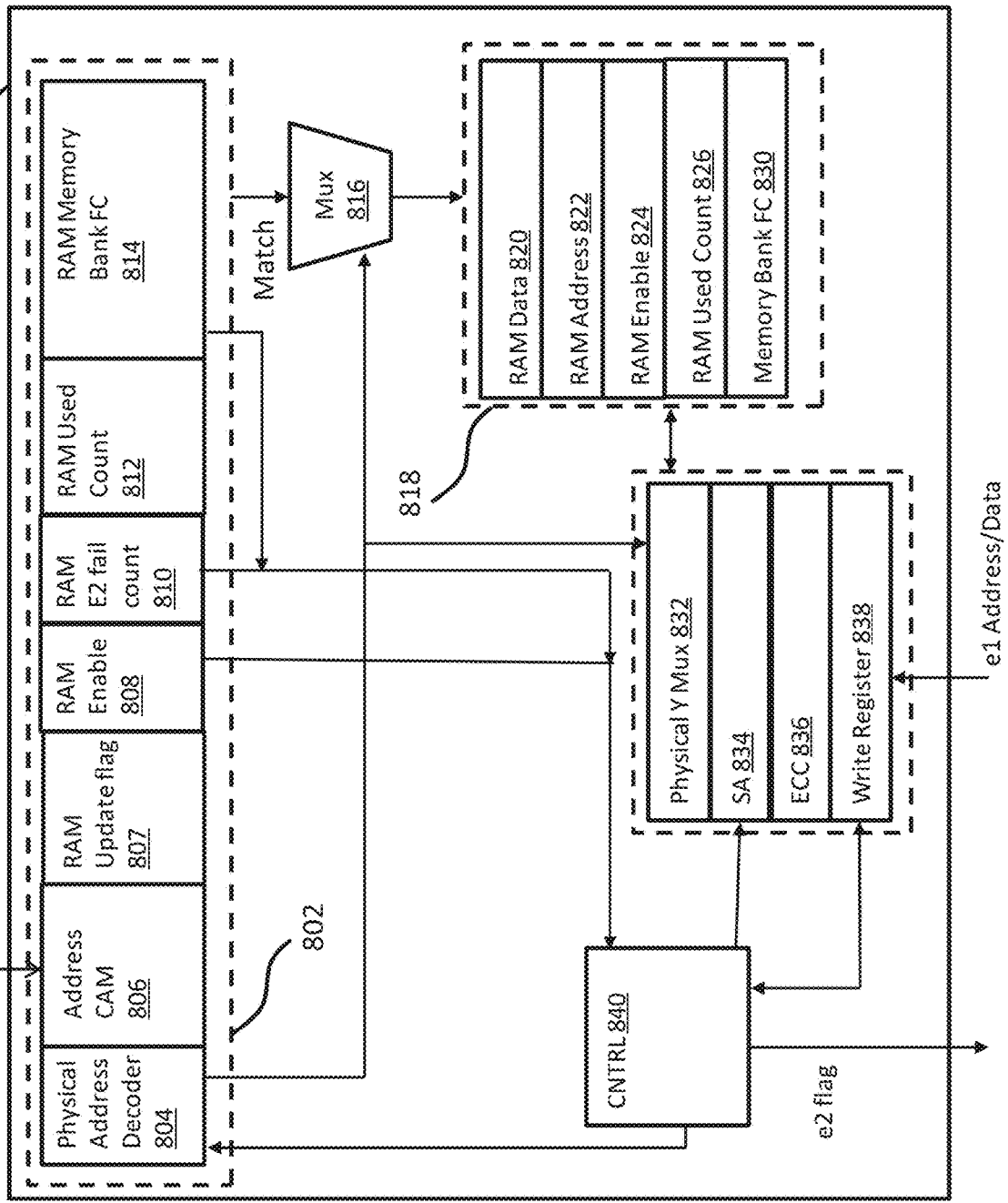
FIG. 8 is a block diagram of an embodiment of a memory device of the present disclosure showing a last level dynamic redundancy register.

FIG. 8 is a block diagram of an embodiment of a memory device of the present disclosure showing a last level dynamic redundancy register. FIG. 8 shows exemplary e2 register 800 described herein that comprises CAM/RAM/Enbl/Pointers block 802, mux 816, e2 RAM 818, and physical y-mux 832, sense amplifier 834, error correction code bits 836, write register 838, and control logic 840. One of ordinary skill in the art will recognize that e2 register 800 is exemplary, and includes features such as RAM Memory bank FC 814 which are not necessary for achieving the teachings of the present disclosure. Moreover, e2 register 800 communicates control signals for maintaining consistency of operations both internally and to communicate with components of memory device such as pipeline banks, memory banks, and e1 register. Such control signals may be modified without departing from the teachings of the present disclosure.

CAM/RAM/Enbl/Pointers block 802 comprises physical address decoder 804, address CAM 806, RAM update flag 807, RAM enable 808, RAM e2 fail count 810, RAM used count 812, and RAM memory bank FC 814. Thus, block 802 comprises data storage elements comprising data bits. Block 802 is used for storing control bits and associated addresses of data words.

Physical address decoder 804 receives an address inputs from control logic 840. As explained in relation to e1 register and FIG. 7, physical address decoder 804 uses address inputs to determine physical addresses for writing associated addresses and data words to CAM 806 and RAM 818, respectively. Physical address decoder 804 outputs decode signal to CAM 806 and mux 816. Moreover, physical address decoder 804 may output decode signal to physical y-mux 832.

CAM 806 stores associated addresses for data words. As explained in relation to e1 register and FIG. 7, CAM 806 may take as inputs various control signals and associated addresses. CAM 806 can then write associated addresses to itself or determine appropriate physical address within RAM 818 for matching data word. Typically, such data word would be output, for example, to pipeline banks or memory banks.

RAM update flag 807 comprises control bits for determining whether associated data should be updated within RAM 818. For example, control signals received from control logic 840 may indicate that RAM 818 entry should be updated based on a new data word. RAM update flag 807 thus provides a mechanism to track data words that should be updated in case it is not possible to update the data word immediately.

RAM enable 808 comprises control bits indicating whether e2 RAM 818 contains a valid data word. RAM enable 808 may thus require that all bits be set to one, for example, to provide a stringent mechanism to ensure that RAM 818 includes valid data. RAM enable 808 may be output to control logic 840 so that control logic may keep track of valid data within block 802 and RAM 818. One of ordinary skill in the art will recognize that other schemes may be used to ensure reliability of data words. For example, multiple copies of data word may be maintained in RAM 818 and selected based on a voting scheme. In another scheme, a more stringent error correction code (ECC) scheme may be performed within e2 register 800 than in memory bank. In another scheme, RAM 818 points to particular addresses within main memory for storing data words rather than storing the data words within e2 register 800 itself.

RAM e2 fail count 810 indicates the number of times a data word has failed to write to e2 RAM 818. For example, RAM 818 may comprise non-volatile STT-MRAM in an embodiment. In that case, e2 register 800 may write to RAM 818 until write operation is successful in order to maintain reliability within e2 register 800. Thus, e2 fail count indicates the number of times a data word has failed to write to RAM 818. RAM e2 fail count 810 may be output to control logic 840, so that control logic 840 may output appropriate addresses for writing to RAM 818.

RAM used count 812 indicates the number of times that a physical address within e2 RAM 818 has been used. The e2 register 800 may desire to keep track of the number of times that a particular physical address within RAM 818 has been used. For example, the number of times that a read operation has occurred, write operation has occurred, or both to a specific physical address within RAM 818.

RAM memory bank FC 814 indicates the number of times that a data word has failed to write to a memory bank. For example, e2 register 800 may desire to keep track of the number of times that a write operation from e2 register 800 has failed to the memory bank. This may be useful so that only a desired number of re-write operations are tried. The specific components of block 802 are exemplary and may be modified without departing from the teachings of the present disclosure. For example, one of ordinary skill in the art will recognize that RAM memory bank FC 814 is optional and provides a mechanism for controlling the number of re-write attempts to memory bank.

Mux 816 is coupled to CAM/RAM/Enbl/Pointers block 802 and e2 RAM 818. Mux 816 takes as input decode signal from physical address decoder 804 indicating physical address within e2 RAM 818 and match signal from CAM 806 indicating that match exists within e2 RAM 818. Thus, as explained with respect to e1 register 700 of FIG. 7, e2 RAM 818 can perform read or write operation. If e2 RAM 818 comprises MRAM, write operations may be tried a number of times based on RAM e2 fail count 810. In another embodiment, after a predetermined number of write attempts to physical address within e2 RAM 818, RAM used count 812 may operate to indicate that another location within e2 RAM 818 should be chosen for write operation.

The e2 RAM 818 comprises RAM data 820, RAM address 822, RAM enable 824, RAM used count 826, and Memory Bank FC 830. The e2 RAM 818 may comprise volatile or non-volatile memory. In one embodiment, The e2

RAM 818 comprises non-volatile memory such as MRAM so that contents may be saved on during power down.

RAM data 820 comprises data storage elements comprising data bits storing a data word received from e1 register. RAM address 822 stores an associated address within a memory bank for the data word stored within RAM data 820. For example, CAM 806 may store an associated address to RAM address 822. RAM enable 824 stores the same enable bits as RAM enable 808. RAM used count 826 stores the same used count as in RAM used count 812. Memory Bank FC 830 stores the same fail count as RAM Memory Bank FC 814. Thus, block 802 comprising volatile storage (e.g., SRAM) may be backed up to non-volatile storage (e.g., MRAM).

Similar to the explanation given with respect to FIG. 4, y-mux 832 allows read and write operations to be performed on RAM 818. Sense amplifiers 824 are used to read RAM 818. ECC block 836 allows error correcting on RAM 818. Write Register 938 may comprise CAM for searching write register contents. Write register 838 receives data word and address from e1 register. Write register 838 also communicates with e2 control logic 840 to, for example, send ready e2 ready signal when write register 838 is ready for new data word from e1 register.

Control logic 840 comprises hardware logic. Control logic 840 determines appropriate operations (such as read, write, and search) to be performed on e2 register 800. Control logic 840 also determines addresses. As previously explained in connection with FIG. 7, control logic 840 may use many different addressing schemes. In one embodiment, control logic 840 uses pointers to determine physical addresses within block 802 and RAM 818 for writing data words. Control logic 840 may also communicate with other components of memory device including pipeline banks, memory banks, and e1 register. For example control logic 840 transmits e2 flag to e1 register to indicate that e2 register 800 may receive a new data word to write register 838.

Bi-Polar Write Scheme

As noted above, a memory bank, e.g., memory bank 102 or 2100 may comprise STT-MRAM which suffers from an inherently stochastic write mechanism, wherein bits have certain probability of write failure on any given write cycle. In other words, the memory cells are characterized by having a high write error rate. The dynamic redundancy registers (e.g., e1 104, e1 2110 etc.) of the present disclosure allow the memory bank to be operated with high WER (write error rate). As also noted previously, designers of the memory device need to ensure that the size of a dynamic redundancy register or cache memory, e.g., an e1 register used to store data words associated with pending verify and re-write operations does not exceed practical limitations. Furthermore, designers need to provide for a way to relieve the pressure off of the dynamic redundancy register, e.g., e1 2110 if it is approaching close to its capacity. In other words, designers need to provide a mechanism to prevent the dynamic redundancy register from overflowing if it is filling up too rapidly. The e1 register needs to be designed to avoid overflow in all cases.

Figure 26:
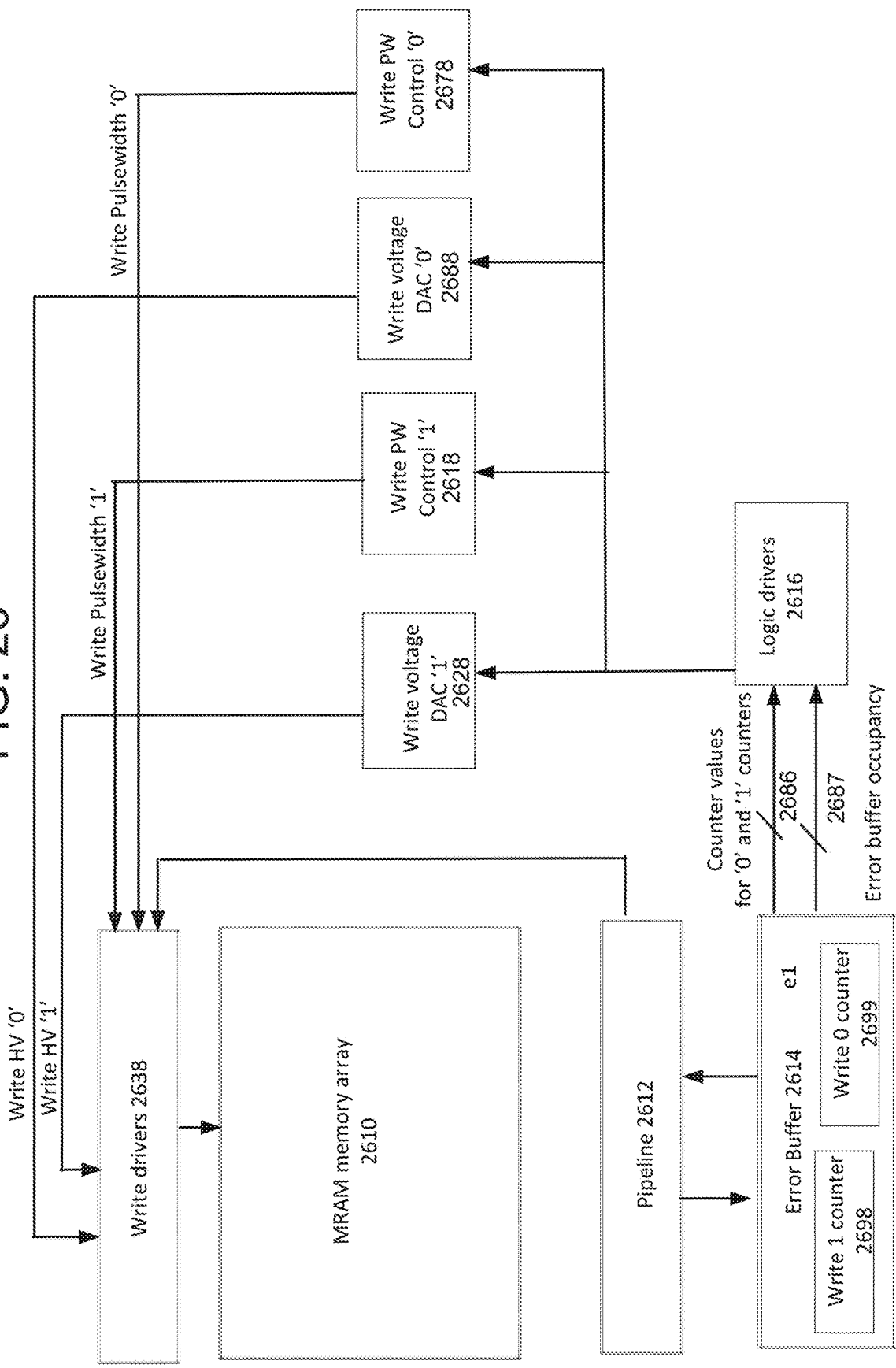
FIG. 26 is a block diagram of an exemplary embodiment of a memory device that optimizes write voltage for bit-line and source-line independently based on the number of errors resulting from write '1's and write '0's in accordance with an embodiment of the present invention.

FIG. 26 is a block diagram of an exemplary embodiment of a memory device that optimizes write voltage for bit-line and source-line independently based on the number of errors resulting from write '1's and write '0's in accordance with an embodiment of the present invention. As shown in FIG. 26, the e1 register (also known as an 'error buffer') 2614 stores data words that are to be verified or re-written to a memory bank 2610. The error buffer 2614 is coupled to the memory array 2610 through pipeline 2612 as discussed in detail, for example, in FIGS. 5, 14 and 15. The memory bank may be an MRAM array. In one embodiment, the MRAM may comprise STT-MRAM.

In the embodiment discussed in connection with FIG. 22, as entries in the e1 register (also known as an 'error buffer') 2214 increase, the write voltage on the write cycles to the memory bank can be increased in order to reduce the error rate. In the embodiment of FIG. 22, the write voltage on both the bit and source lines of the memory cell are increased. Increasing the write voltage on write cycles to the memory bank of an MRAM array decreases the WER. Because the memory cells are written to with a higher voltage, there is a lesser likelihood of a memory cell being written to incorrectly. Under typical operating conditions, increasing write voltage will consume more energy and reduce the reliability of the memory because the oxide in the memory cells wears down faster at higher voltage rates. Nevertheless, in order to prevent the e1 register from overflowing, the embodiment of FIG. 22 comprises a built-in logic circuitry 2216 to recognize when the error buffer is filling up and to increase the voltage temporarily to reduce the error rate.

The embodiment of FIG. 22, however, does not discriminate between the types of write errors that cause the error buffer 2214 to fill up. In other words, the embodiment of FIG. 22 increases the write voltage on both the bit and source lines of the memory cell. In a typical memory, however, there may be circumstances as a result of which the number of write '1' fails exceeds the number of write '0' fails, or vice versa. Accordingly, increasing the write voltage on both the bit and source lines indiscriminately may lead to memory cells wearing down faster than necessary.

A write '1' operation on an MRAM cell has properties that are distinct from a write '0' operation. As noted above, MRAM is a non-volatile memory technology that stores data through magnetic storage elements. These elements are two ferromagnetic plates or electrodes that can hold a magnetic field and are separated by a non-magnetic material, such as a non-magnetic metal or insulator. This structure is known as a magnetic tunnel junction ("MTJ"). In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "0" or a "1" can be stored in each MRAM cell. Due to the spin-polarized electron tunneling effect, the electrical resistance of the cell changes due to the orientation of the magnetic fields of the two layers. The cell's resistance will be different for the parallel and anti-parallel states and thus the cell's resistance can be used to distinguish between a "1" and a "0".

Figure 27A:
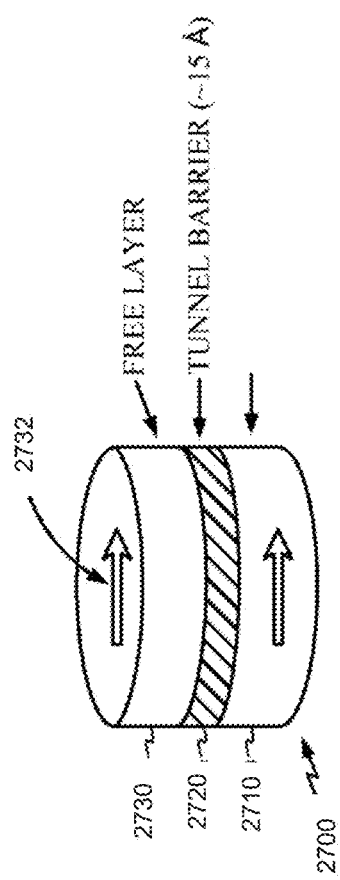
FIGS. 27A and 27B illustrate the manner in which either a "0" or a "1" can be stored in an MRAM cell.
Figure 27B:
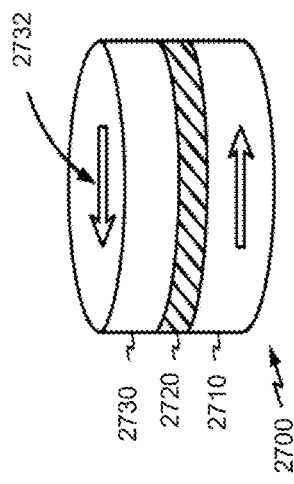

FIGS. 27A and 27B illustrate the manner in which either a "0" or a "1" can be stored in an MRAM cell. As illustrated in FIG. 27A and FIG. 27B, a magnetic tunnel junction (MTJ) storage element 2700 can be formed from two magnetic layers 2710 and 2730, each of which can hold a magnetic field, separated by an insulating layer 2720, which can be, for example a tunnel barrier layer, or the like. One of the two layers such as fixed layer 2710, is set to a particular polarity. The polarity 2732 of the other layer, such as free layer 2730, is free to change to match that of an external field that can be applied. A change in the polarity 2732 of the free layer 2730 will change the resistance of the MTJ storage element 2700. For example, as shown in FIG. 27A, when the polarities are aligned, a low resistance state exists (corresponding to a "0" state). When the polarities are not aligned, as shown in FIG. 27B, a high resistance state exists (corresponding to a "1" state). The illustration of MTJ 2700 has been simplified and it will be appreciate that each layer illustrated may include one or more layers of materials, as is known in the art.

MRAM devices are considered as the next generation structures for a wide range of memory applications. MRAM products may be based on spin torque transfer switching, which is already making its way into large data storage devices. Spin transfer torque magnetic random access memory ("STT-MRAM") or spin transfer switching, uses spin-aligned ("polarized") electrons to change the magnetization orientation of the free layer in the magnetic tunnel junction. In general, electrons possess a spin, a quantized number of angular momentum intrinsic to the electron. An electrical current is generally unpolarized, which means it consists of 50% spin up and 50% spin down electrons. Passing a current though a magnetic layer polarizes electrons with the spin orientation corresponding to the magnetization direction of the magnetic layer (e.g., polarizer), thus produces a spin-polarized current. If a spin-polarized current is passed to the magnetic region of a free layer in the magnetic tunnel junction device, the electrons will transfer a portion of their spin-angular momentum to the magnetization layer to produce a torque on the magnetization of the free layer. Thus, this spin transfer torque can switch the magnetization of the free layer, which, in effect, writes either a "1" or a "0" based on whether the free layer is in the parallel or anti-parallel states relative to the reference layer, as noted previously.

STT-MRAM devices belong to a class of devices relying on bipolar memory elements. Bipolar memory elements use currents to "write" data to a memory element. Depending on the direction of current flow, a logic high "1" or logic low "0" bit may be written to the memory element. Such bipolar memory devices may include MRAM, resistive random-access memory (RRAM), phase-change memory (PCM), among others. For example, RRAM devices may utilize memristors as a memory element. Current flowing in one direction may be used to write a logic "1" to the memristor. Current flowing in the opposite direction may be used to write a logic "0" to the memristor.

In MRAM devices, data is stored in program latches during both write and verify operations. Data stored in the latches (write buffer) determines the voltage condition on bit lines during write operations. In write operations, bit line and source line bias are dependent on the data stored. For example, if the data to be written is logic zero "0", the bit line can be driven high while the source line is driven low. If the data to be written is logic one "1", the opposite bias condition would need to exist in order to reverse the polarity of current flow across the MTJ. In this case for writing logic one "1", the source line would be driven high while the bit line would be driven low.

Figures 28A, 28B:
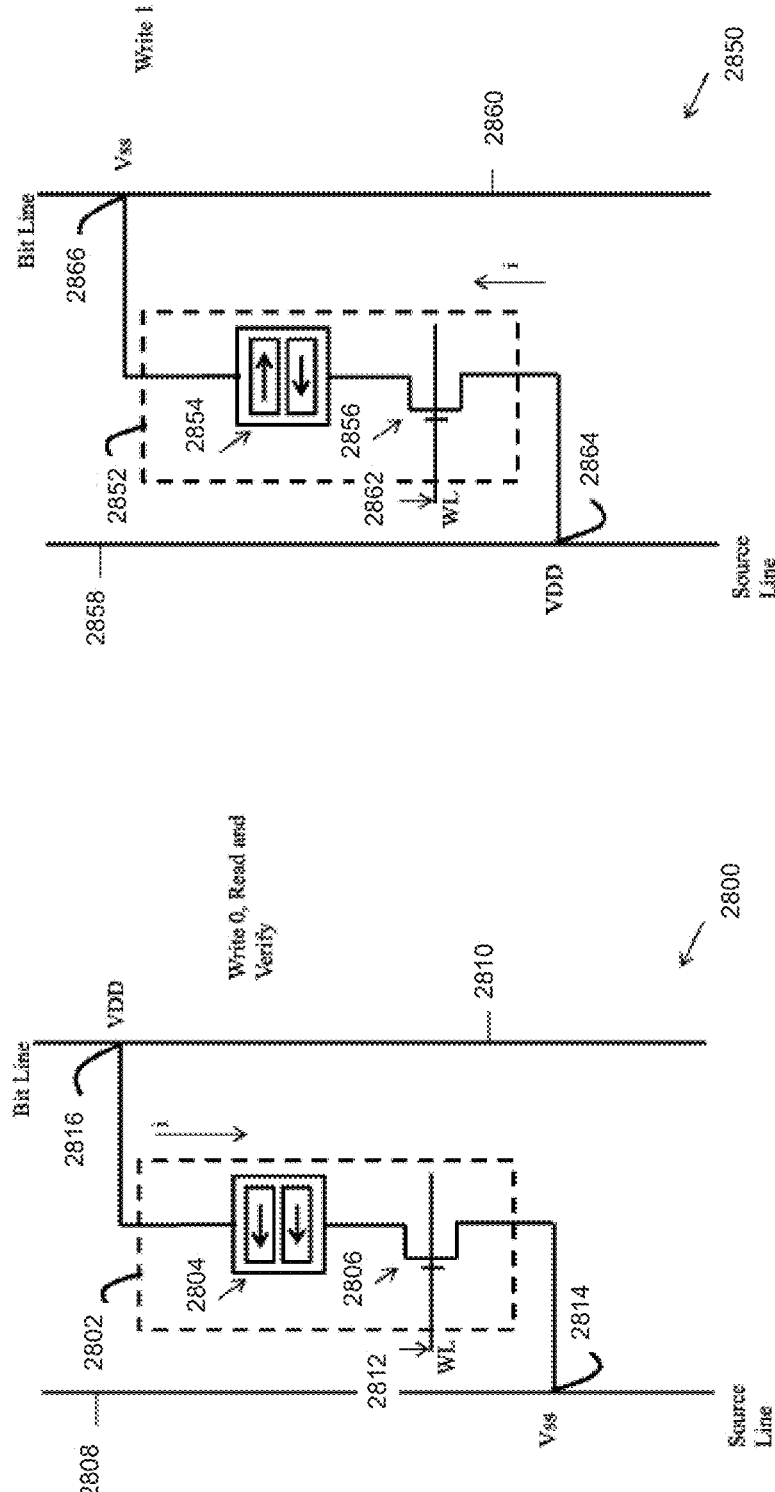
FIGS. 28A and 28B illustrate exemplary circuitry that may be used to implement write operations.

FIGS. 28A and 28B illustrate exemplary circuitry that may be used to implement write operations.

FIG. 28A shows operation of exemplary bipolar memory device 2800, in this case, an MRAM device, during write "0" operations. Bipolar memory device 2800 includes memory cell 2802 coupled to source line 2808 and bit line 2810. Memory cell 2802 comprises MTJ 2804 and select transistor 2806. Select transistor is further coupled to word line 2812. MTJ 2804 is coupled to bit line 2810 and select transistor 2806 is coupled to source line 2808. During write "0" operations, voltage node 2814 on source line is driven low while voltage node 2816 on bit line is driven high. It is appreciated that verify and read operations may also occur with the same bias conditions. Read and verify operations have similar characteristics because they both entail reading the contents of the memory cell, therefore, both operations may be carried out with the same bias conditions.

Voltage node 2814 may be driven to ground or otherwise held close to 0V. Voltage node 2816 may be driven to a positive voltage. Voltage node 2816 is driven to for example, 1.0 V for verify operations; 1.2 V for read operations; and a higher voltage for write operations. Voltage is applied to word line 2812 to activate select transistor 2806 to allow current i to flow between bit line and source line.

During write "0" operation, the voltage differential across memory cell 2802 causes current i to flow. Current i causes the magnetization of free layer of MTJ 2804 to align, or become parallel, with the reference layer of MTJ 2804. During verify and read operation, the current i is not sufficient to alter the state of free layer and the bit stored in MTJ 2804 may be ascertained.

FIG. 28B shows operation of exemplary bipolar memory device 2850, in this example, an MRAM device, during write "1" operation. Bipolar memory device 2850 includes memory cell 2852 coupled to source line 2858 and bit line 2860. Memory cell 2852 comprises MTJ 2854 and select transistor 2856. Select transistor is further coupled to word line 2862. MTJ 2854 is coupled to bit line 2860 and select transistor 2856 is coupled to source line 2858. Bipolar memory device 2850 of FIG. 28B is identical to bipolar memory device 2800 of FIG. 28A except that polarity of voltages on source and bit lines are flipped. Thus, voltage node 2864 on source line 2858 is driven high and voltage node 2866 bit line 2860 is driven low. Voltage node 2864 may also be at a slightly higher voltage for write "1" operation than corresponding voltage on the bit line during write "0" operation. This is because the voltage drop across select transistor 2856 is higher in this configuration. Moreover, voltage on word line 2862 is chosen to enable current flow. This opposite bias conditions causes current i to flow in the opposite direction from bipolar memory device 2800 of FIG. 28A. This results in write "1" operation.

Because voltage node 2864 may need to be at a slightly higher voltage for write "1" operation than corresponding voltage on the bit line during write "0" operation and because a write "1" results in the magnetization of free layer of MTJ 2854 to become anti-parallel (which is a higher resistance state than the parallel configuration), write "1" operations exhibit different characteristics from write "0" operations. Accordingly embodiments of the present invention optimize the write voltage for bit-line and source-line independently based on the number of errors resulting from write '1's and write '0's.

The embodiment of the present invention illustrated in FIG. 26 adjusts the write voltages for bit line and source line independently based on the number of errors that are caused by write '0' failures as compared to write '1' failures. In other words, write '1' failures are tracked independently from write '0' failures. If the number of errors caused by write '1' failures exceeds a predetermined threshold, then the source line voltage (e.g., voltage 2864) would be increased during a write operation. On the other hand, if the number of errors caused by write '0' failures exceeds a predetermined threshold, then the bit line voltage (e.g., voltage 2816) would be increased during a write operation. The embodiment of FIG. 26 is advantageous because it does not increase the write voltage on both the bit and source lines indiscriminately thereby causing the memory cells to wear down faster. This is especially advantageous in circumstances where there is significant differences in the number of errors generated by write '1' versus write '0' operations.

Further, the embodiment of FIG. 26 allows the ability to limit the maximum voltage separately on the bit lines versus the source lines. For example, in certain instances the maximum allowed voltage on the bit lines of the memory array may be different from the maximum allowed voltage on the source lines. In such cases, the ability to limit the maximum voltage separately on the bit lines versus the source lines may be necessary for preserving the longevity of the memory chip.

As mentioned previously, in one embodiment, a warning pin(s) or status bit(s), e.g., bits 2105 (as shown in FIG. 21) can be used to indicate to the user the occupancy level of the e1 register 2214. For example, status bits may indicate to a user that the e1 register is 25%, 50%, 75% or completely full. Similarly, in one embodiment, status bits 2687 indicating buffer occupancy can be relayed to a logic module 2616 that determines how close to full the e1 register is getting. The status bits may, for example, indicate the level of occupancy of the e1 register or error buffer. The higher the number of status bits available, the higher the precision with which the logic module 2616 can determine the occupancy levels of the error buffer.

Further, in the embodiment of FIG. 26, additional logic circuitry (not shown) may be added to the verify circuits of the memory engine in order to separately track the number of write '1' fails versus write '0' fails. Alternatively, a dual-pass verify scheme may also be used, where during each pass either the write '1's or write '0's are verified so as to be able to track them separately. However, the dual-pass verify scheme would typically increase verify time.

In one embodiment, the number of write '1' fails and write '0' fails can be tracked separately using at least two non-volatile counters. In one embodiment, the counter values may be stored in the error buffer 2614. In one embodiment, the number of write '1' fails may be tracked using a counter 2698 in error buffer 2614 while the number of write '0' fails may be tracked using a counter 2699 in error buffer 2614. In one embodiment, if e1 2614 comprises volatile memory, the values of counters 2698 and 2699 may need to be saved in the memory array 2610 (or in another non-volatile location on the memory chip) upon power down and restored back upon power up.

The logic driver circuitry 2616 may receive the counter values 2686 from the e1 buffer 2614 to determine whether to increase the source line voltage (for write '1' errors) or the bit line voltage (for write '0' errors). Alternatively, the counters may be maintained elsewhere on the memory chip. It should be noted that the counter values will preferably be maintained in non-volatile memory so that the values can be preserved in case of power shut-down.

Responsive to a determination that the counter value for write '1' errors has crossed a predetermined threshold, logic driver 2616 may be configured to communicate with the write voltage digital-to-analog converter (DAC) 2628, which in turn increases the write voltage on the write drivers 2638. More specifically DAC 2628 is configured to increase the write voltage on the write drivers for the source lines of memory array 2610. In one embodiment, logic driver 2616 uses only the counter value for write '1' errors (obtained using signal 2686) to determine whether to increase the write voltage for the source lines.

Responsive to a determination that the counter value for write '0' errors has crossed a predetermined threshold, logic driver 2616 may be configured to communicate with the write voltage digital-to-analog converter (DAC) 2688, which in turn increases the write voltage on the write drivers 2638. More specifically DAC 2688 is configured to increase the write voltage on the write drivers for the bit lines of memory array 2610. In one embodiment, logic driver 2616 uses only the counter value for write '0' errors (obtained using signal 2686) to determine whether to increase the write voltage for the bit lines. In another embodiment, logic driver 2616 uses the error occupancy level 2687 of the error buffer 2614 in conjunction with the counter value for write '0' errors (2686) to determine whether to increase the write voltage for the bit lines.

In one embodiment, the error buffer occupancy 2687 can be determined using the counter values 2686 for the write '1' and write '0' errors.

In one embodiment, logic circuitry 2616 is configured to monitor counter values 2686 (and/or error cache occupancy levels 2687) to modulate the write voltage (for bit line and source line) for error buffer and endurance optimizations. Using a higher write voltage for either the source lines or the bit lines (depending on whether there are more write '1' errors or write '0' errors) optimizes the error buffer by reducing the WER and, thereby, ensures that there is less likelihood of the error buffer exceeding capacity. Similarly, logic circuitry 2616 also enables endurance optimization because it lowers the write voltage for the bit lines or source lines in response to lower counter values (and/or lower cache occupancy levels), thereby, reducing write stress and promoting higher endurance. In other words, if the counter values for the write '1' or write '0' errors drops, logic circuitry 2616 is configured to lower the corresponding source line or bit line voltages respectively. In one embodiment, the counter values may, for example, be reduced or decreased as entries are removed from the error cache 2614. Accordingly, the counters will typically comprise logic circuitry to increase or decrease the corresponding values based on the number of entries in the e1 buffer 2614.

Embodiments of the present invention are therefore able to take advantage of the different maximum voltages for the bit lines and the source lines of the memory array 2610. The maximum voltages for bit lines and source lines of the memory array are determined by memory endurance or WER upturn limitations. WER upturn refers to the condition where over a threshold voltage level the number of resulting write errors in the memory will increase as opposed to decreasing.

Also, as noted above, voltage node 2864 on the source line may need to be at a slightly higher voltage for a write "1" operation than corresponding voltage on the bit line during a write "0" operation (because of the voltage drop across transistor 2856 and because a write "1" results in the magnetization of free layer of MTJ 2854 to become antiparallel as mentioned in relation to FIGS. 27 and 28). Accordingly, the embodiment illustrated in FIG. 26 provides the advantage of being able to adjust the bit line and source line voltages independently of each other. For example, if the maximum allowed voltage on the source lines is higher than the maximum allowed voltage on the bit line, the corresponding maximum voltage for write '1' operations will be higher than the maximum allowable voltage for write '0' operations. In this way, the write '1' operation may have a higher predetermined threshold (for increasing the write voltage) than the predetermined threshold for increasing the write voltage for write '0' operations.

Embodiments of the present invention also advantageously prevent voltages for all write operations from being incremented indiscriminately. For example, if most of the errors are resulting from write '1' operations, the source line voltages can be increased using write voltage DAC 2628 while leaving the bit line voltages unchanged. This preserves the overall life of the memory chip.

In one embodiment, the write voltage for the write '1' and write '0' operations are incremented at predetermined threshold levels of the counter. For example, when a memory chips is first powered up, the write voltages for both write '1' and write '0' operations may start at a default power level. If, for example, the number of write '1' errors begin to increment and the counter value for write '1' errors goes up by a predetermined threshold number, the write voltage for write '1' operations will be incremented (leaving the voltage for the write '0' operations unchanged). If incrementing the voltage for the write '1' operations subsequently decreases the number of write '1' errors, the counter for write '1' errors will eventually be decremented. Alternatively, if the number of errors continues to increase, at the next threshold level of the counter, the write voltage for write '1' operations will be increased again. The write voltages will continue to be adjusted until the voltage levels for both the write '1' and the write '0' operations reach an equilibrium.

In one embodiment, logic circuitry 2616, over a period of time, stabilizes the write voltage at an optimal level, which prevents the counter values 2686 from exceeding a predetermined threshold level. It also prevents the occupancy level of the error buffer from exceeding a predetermined threshold while at the same time maintaining an acceptable level of endurance. In other words, logic circuitry 2616 can be programmed to select an optimal write voltage level that achieves a balance between error buffer occupancy levels and memory endurance levels. Accordingly, the self-trimming of the write voltage on the memory chips by logic circuitry 2616 can result in higher endurance levels for memory chips because the write voltage can be dynamically adjusted to operate at lower levels in response to low counter values and/or error buffer occupancy levels. Further, the ability to adjust write voltages for write '1's and write '0's independently also results in increased endurance levels for memory chips.

In one embodiment of the present invention, if either the write '1' voltage or the write '0' voltage is approaching its maximum value, instead of adjusting the write voltage, the pulse width of the write cycle, for either the write '1' or the write '0' can be modified based on the error buffer fill rate. It should be noted that the embodiment of FIG. 26 enables the pulse width for the write '1' to be modified independently of write '0'. It should further be noted that there may be a circumstance in which the maximum voltage for only one of the two write voltage (the write '1' or the write '0') has been reached—in this case the pulse width can be increased for the write operation that has reached its maximum value while the voltage for the write operation that has not reached its maximum value may still be adjusted upwards. For example, if only the write '1' voltage has reached its maximum allowed value, any further adjustments to the write '1' operation can only be made using the pulse width. Meanwhile, because the write '0' voltage has not yet reached its maximum allowed value, the voltage for the write '0' can continue to be increased until it reaches its maximum value.

Similar to increasing the write voltage, increasing the pulse width can reduce the WER. Accordingly, if the counter values continues to increase and the error buffer becomes more full, the pulse width of the write cycle for either the write '1' or the write '0' operation can be increased to reduce the write error rate. Conversely, as the counter values decrease and the error buffer empties out, the pulse width for either write operation can be reduced in order to optimize for endurance. The counter values may be decreased, for example, as entries are removed from the e1 buffer 2614.

The logic circuitry 2616 can alter the pulse width using the write pulse width control modules 2618 and 2678. If the write '1' voltage has reached its maximum value, subsequent adjustments to the write '1' operation need to be in the form of increasing the write '1' pulse width using module 2618. Similarly, if the write '0' voltage has reached its maximum value, subsequent adjustments to the write '0' operation need to be in the form of increasing the write '0' pulse width using module 2678. As noted previously, embodiments of the present invention advantageously allow the pulse-widths for both the write '1' and the write '0' operations to be adjusted independently of each other. In a different embodiment, instead of adjusting the pulse-width for the write '1' and write '0' operations independently, the pulse-width for both operations is set to the worst case. For example, if write '1' operations need to be performed with a longer pulse-width than write '0' operations, both the pulse-widths for the write '1' and write '0' operations are set to the pulse-width required for the write '1' operation—in other words, the pulse width for both operations are set to the longer of the two cases. An advantage of having the same pulse-width for both write '1' and write '0' operations is that both write '1' and write '0' operations can be performed in a single pass. If write '1' and write '0' operations have different pulse widths, then a separate pass is required for each case, which is potentially slower.

The pulse width control modules 2618 and 2678 communicate with the write drivers 2638 to effectuate the pulse width change on the write cycle. Controlling the pulse width allows an extra level of control over the WER, which is useful especially in cases where the write voltages for either the write '1's or the write '0's cannot be increased any further. Therefore, to avoid chip breakdown, the pulse width can be increased instead of increasing the write voltage.

It should be noted that increasing the pulse width allows the same voltage to be applied for a longer duration and, therefore, it also causes oxide related stress in the memory cells. Accordingly, the logic circuitry module 2616 should be programmed to reduce the pulse width in response to lower error buffer occupancy levels.

In one embodiment, the counter values for tracking the write '1' and write '0' errors can be stored during power down and recalled during power up. Storing the counter values is important so that on power up, the memory chip can ascertain how to adjust the write voltages (for both the write '1' and write '0' operations) using logic circuitry 2616. In the embodiment where the counter values are stored in error buffer 2614 and received by the logic circuitry using signal 2687, during power up recall, the counter values are simply added back to the error buffer 2616. It should be noted that a separate field in the e1 register 2614 would be used for the number of write '1' fails and the number of write '0' fails.

In one embodiment, logic circuitry 2616 can be configured to control both the write voltage levels (through write voltage DACs 2628 and 2688) and the write pulse widths (through write pulse width control modules 2618 and 2678)

in order to achieve an optimal operating write voltage level for the chip. In such an embodiment, both write voltages and the write pulse widths may be increased and decreased together to attain an optimal operating write voltage level for the chip. Alternatively, in a different embodiment, the write voltages and write pulse widths may be adjusted in phases. For example, in response to counter values 2686 that are increasing (and/or an error buffer that is getting full), the write voltages may be increased at first. Subsequently, if the counter values continue to increase and/or the error buffer continues to get full, the write pulse widths may be increased before attempting to increase the write voltages to a higher voltage step. Once the write voltage levels have been increased beyond an acceptable threshold (e.g. the maximum voltages), only the write pulse widths may be increased to control the occupancy level of the error buffer.

Embodiments of the present invention advantageously allow for dynamic self-trimming in the field. Instead of the need to select an optimal voltage level at test, the logic circuitry 2616 can be programmed to pick the optimal voltage levels for the write '1's and the write '0's based on the error rates. For example, as the life of the chip gets older, the error rates for either the write '1's or the write '0's (or both) may increase and, accordingly, the logic circuitry may need to apply a higher write voltage to one or both of the write operations in order to prevent the occupancy levels of the error buffer from increasing. The logic circuitry 2616 self-trims by adjusting the write voltages for the write operations higher in response to higher counter values and/or occupancy levels of the error buffer without requiring human intervention. It should be noted that there may be instances in which the write voltage for either the write '1' or the write '0' may need to be increased but not both.

Embodiments of the present invention also advantageously reduce test time because the test and/or product engineers do not have to manually find an optimal operational voltage for each memory chip, which can vary between chips. In other words, embodiments of the present invention can be used to self-trim the write voltages on memory chips. Typically, test time is used up by engineers to determine the appropriate voltage level for each die. Further, the engineers will typically need to select a different operational voltage for each life cycle of the die, e.g., early life, mid-life and end-of-life voltages. It is appreciated that instead of using up valuable test time in determining appropriate voltage levels for each life cycle of a chip, embodiments of the present invention dynamically adjust the voltage levels based on the error rate and the concomitant error buffer occupancy levels. Furthermore, embodiments of the present invention allow the voltage levels for the write '1' and write '0' operations to be adjusted independently of each other allowing the engineers an extra degree of flexibility.

Temperature conditions may also affect the optimal operating voltage levels of a memory chip. Embodiments of the present invention allow the memory chip to dynamically adjust the write voltage levels to the changing temperature levels simply by monitoring the counter values 2686 and/or error buffer occupancy levels. This conserves engineer time in determining optimal voltage levels for various temperature ranges. Instead, a test technician or engineer may simply select an acceptable starting voltage for each chip and allow the logic circuitry module 2616 to converge the write voltages (for the write '1' and the write '0' operations) to optimal levels based on the counter values and/or error buffer occupancy levels. As a result, the product lifecycle is increased because the logic circuitry module can dynamically select the optimal write voltages for higher endurance levels.

In this way, embodiments of the present invention advantageously allow dynamic control over the occupancy levels of the error buffer. By optimizing the write voltages based on error buffer occupancy, the error buffer is prevented from ever getting overfull or exceeding capacity. Similarly, as mentioned above, endurance levels are optimized because embodiments of the present invention are able to reduce the write voltage in response to lower error buffer occupancy levels.

Figure 29:
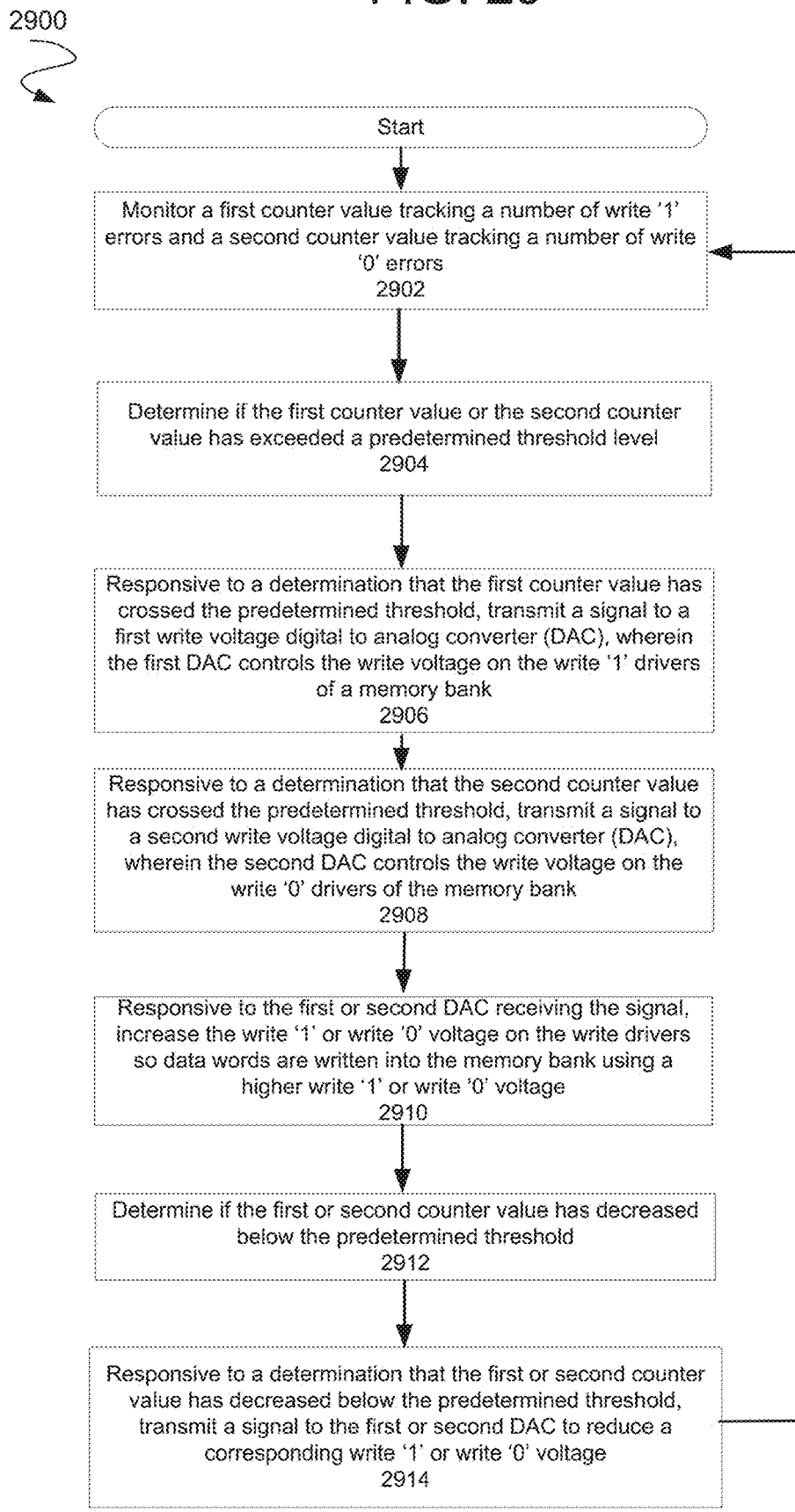
FIG. 29 depicts an exemplary embodiment for a process flow showing the manner in which the write '1' and write '0' voltage for a memory bank is optimized based on counter values in accordance with an embodiment of the present invention.

FIG. 29 depicts an exemplary embodiment for a process flow showing the manner in which the write '1' and write '0' voltage for a memory bank is optimized based on counter values in accordance with an embodiment of the present invention.

At step 2902, the counter values for write '1' and write '0' errors 2686 may be monitored by logic circuitry 2616 to track the number of write '1' and write '0' errors. In one embodiment, logic circuitry 2616 may also monitor error buffer occupancy levels 2687 in conjunction with the counter values.

At step 2904, logic circuitry 2616 determines if the first counter value or second counter value has increased past a predetermined threshold. The threshold information may be programmed or configured into the logic circuitry.

At step 2906, responsive to a determination that the first counter value has crossed the predetermined threshold, a signal is transmitted from the logic circuitry 2616 to the first write voltage digital-to-analog converter (DAC) 2628, where the first write voltage DAC controls the write voltage on the write '1' drivers (from the write drivers 2638) of the memory bank 2610.

At step 2908, responsive to a determination that the second counter value has crossed the predetermined threshold, a signal is transmitted from the logic circuitry 2616 to the second write voltage digital-to-analog converter (DAC) 2688, where the second write voltage DAC controls the write voltage on the write '0' drivers of the memory bank 2610.

At step 2910, the write voltage on either the write '1' or write '0' (or both) drivers is increased so subsequent data words written into the memory bank 2610 are written using a higher write '1' or write '0' (or both) voltage.

At step 2912, logic circuitry 2616 further determines if the first or second counter levels (and, optionally, the error buffer occupancy levels) have decreased below the predetermined threshold.

At step 2914, responsive to a determination that the first or second counter values have decreased below the predetermined threshold, transmitting a signal to the first or second DAC to reduce a corresponding write '1' or write '0' voltage (or both if both counter values have decreased).

Thereafter, the process continues until the voltage level converges to an optimal level. Alternatively, if the voltage level does not converge to an optimal level, the process continues to increase or decrease the write '1' or write '0' voltages as necessary depending on the counter values (and, optionally, occupancy level of the error buffer).

Figure 30:
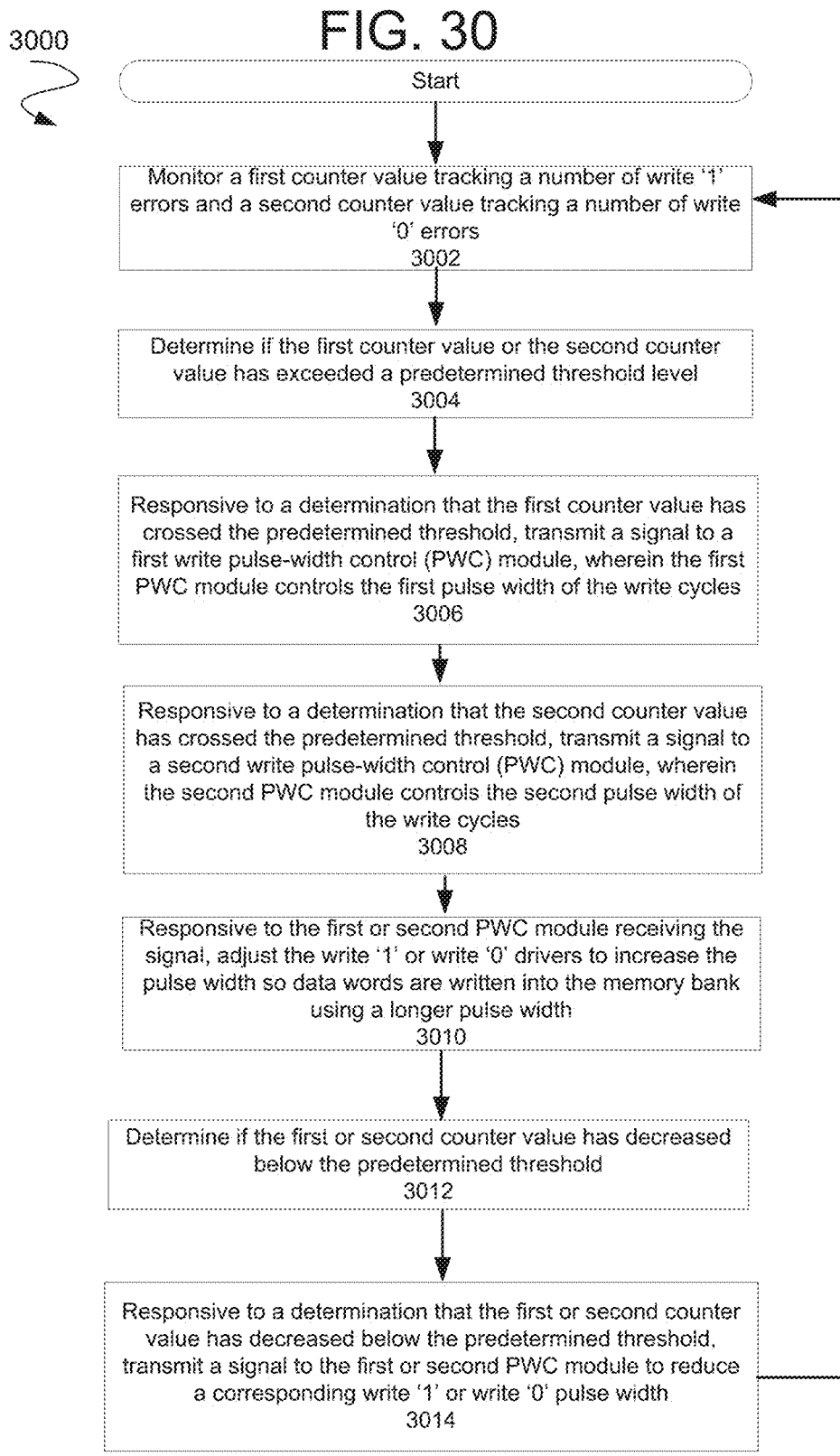
FIG. 30 depicts an exemplary embodiment for a process flow showing the manner in which the write '1' and write '0' pulse widths for write cycles for a memory bank is optimized based on counter values in accordance with an embodiment of the present invention.

FIG. 30 depicts an exemplary embodiment for a process flow showing the manner in which the write '1' and write '0' pulse widths for write cycles for a memory bank is optimized based on counter values in accordance with an embodiment of the present invention.

At step 3002, the counter values for write '1' and write '0' errors 2686 may be monitored by logic circuitry 2616 to track the number of write '1' and write '0' errors. In one embodiment, logic circuitry 2616 may also monitor error buffer occupancy levels 2687 in conjunction with the counter values.

At step 3004, logic circuitry 2616 determines if the first counter value or second counter value has increased past a predetermined threshold. The threshold information may be programmed or configured into the logic circuitry.

At step 3006, responsive to a determination that the first counter value has crossed the predetermined threshold, a signal is transmitted from the logic circuitry 2616 to the first write pulse-width control (PWC) module 2618, where the first PWC module controls the write pulse-width on the write '1' drivers (from the write drivers 2638) of the memory bank 2610.

At step 3008, responsive to a determination that the second counter value has crossed the predetermined threshold, a signal is transmitted from the logic circuitry 2616 to the second pulse-width control (PWC) module 2678, where the second PWC controls the write pulse-width on the write '0' drivers of the memory bank 2610.

At step 3010, the write pulse-width on either the write '1' or write '0' (or both) drivers is increased so subsequent data words written into the memory bank 2610 are written using a higher write '1' or write '0' (or both) pulse-width. As mentioned above, in one embodiment the write '1' pulse width can be set independently of the write '0' pulse width. In a different embodiment, however, the longer of the two pulse-widths is used as the pulse-width for both operations. In this way, the pulse widths for both operations are kept the same and both types of write operations can be performed at the same time.

At step 3012, logic circuitry 2616 further determines if the first or second counter levels (and, optionally, the error buffer occupancy levels) have decreased below the predetermined threshold.

At step 3014, responsive to a determination that the first or second counter values have decreased below the predetermined threshold, transmitting a signal to the first or second PWC to reduce a corresponding write '1' or write '0' pulse-width (or both if both counter values have decreased).

Thereafter, the process continues until the voltage level converges to an optimal level. Alternatively, if the voltage level does not converge to an optimal level, the process continues to increase or decrease the write '1' or write '0' pulse widths as necessary depending on the counter values (and, optionally, occupancy level of the error buffer).

MRAM Noise Mitigation for Write Operations with Simultaneous Background Operations As noted previously, in one embodiment, the memory bank, e.g., memory bank 102, 402 etc. comprises a pseudo-dual port memory bank allowing memory device 100 to simultaneously (e.g., substantially within a memory device clock cycle) perform a write operation and a background verify operation sharing a common row (word line) address. The Y-mux structure of the present disclosure allows pseudo-dual port memory banks, e.g., 304-308 to perform simultaneous write and verify operations sharing common row address and different column address. As explained above, a pseudo-dual port memory bank may have one port optimized to perform write operations and another port optimized to perform read (or verify) operations. As noted in connection with FIGS. 28A and 28B, read and verify operations have similar characteristics because they both require reading the contents of a memory cell, therefore, both operations may be carried out with the same bias conditions on the bit lines and source lines.

As discussed previously, generally, e1 register 104 stores data words and associated addresses for data in memory bank 102 that have not been verified or have failed verification. In one embodiment, e1 register 104 may store data words that have not been verified. For example, e1 register 104 receives a ROWchange signal that indicates row address change within a pipeline structure of the present disclosure. The ROWchange signal indicates that the data word and the associated address from the pipeline structure should be stored within e1 register 104. The ROWchange signal may also indicate that that another data word and associated address should be transmitted from e1 register 104 to the pipeline structure for a verify operation. If a pseudo-dual port memory bank is used, e1 register 104 may choose a data word and an associated address such that they share a common row address with a data word in the write register of the pipeline structure. In this way, a write operation and a verify operation can be simultaneously performed since the data words share a common row address. The simultaneous verify operation is typically performed in the background during the write cycle to prevent the e1 buffer 104 from overflowing. Accordingly, for every write, the engine searches for a verify within the error buffer 104 that matches the same row.

Figure 31:
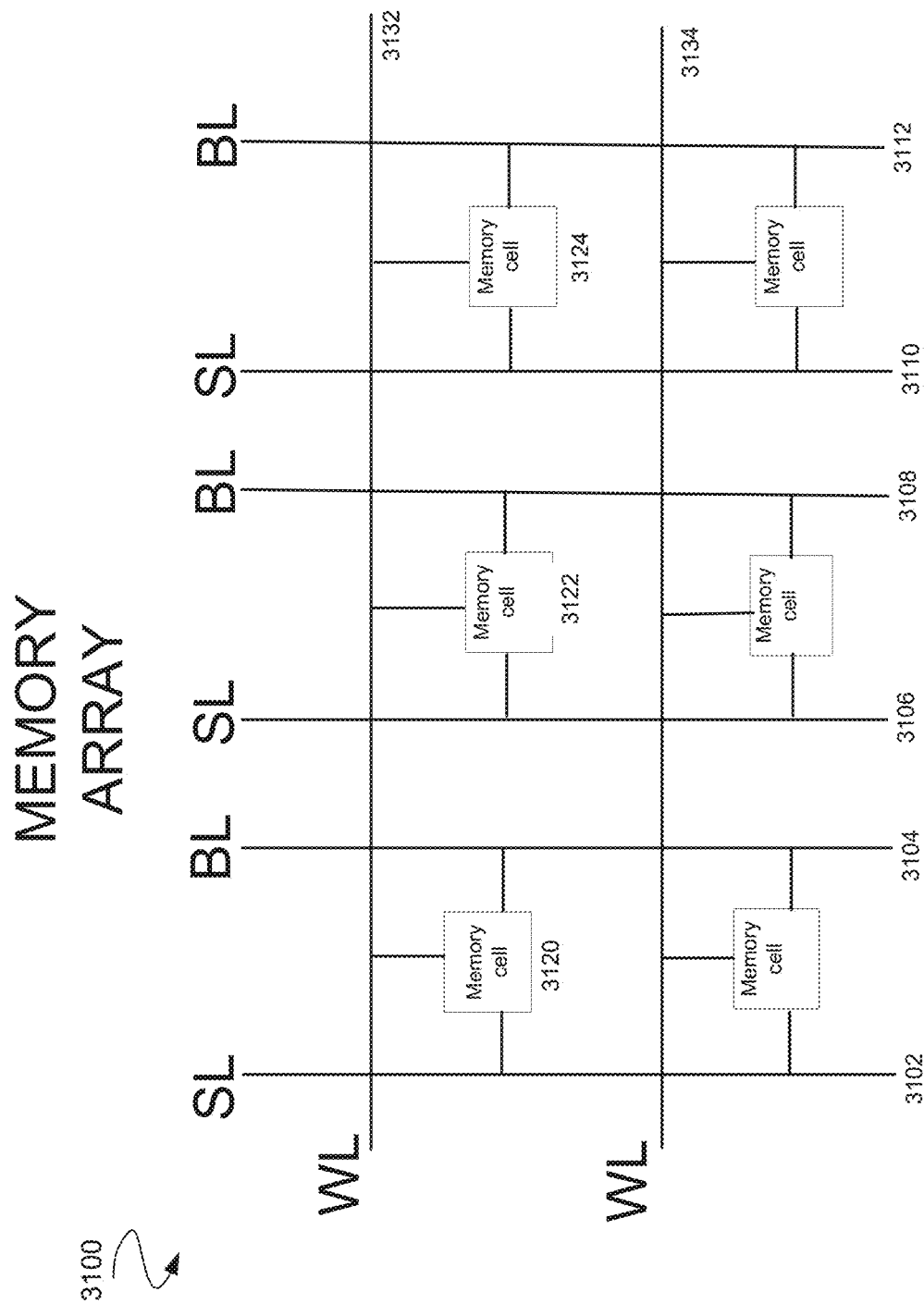
FIG. 31 illustrates the manner in which noise from bit-line coupling may impact a verify (or read) operation if it on the same word line or row as an adjacent write operation.

FIG. 31 illustrates the manner in which noise from bit-line coupling may impact a verify (or read) operation if it is on the same word line or row as a write operation on an adjacent memory cell (an adjacent write operation). One of the challenges that may occur with the pseudo-dual port scheme of implementing a write operation and a background verify operation sharing a common row (word line) address is that when implementing the write operation, noise from bit-line coupling can impact an adjacent verify (or read) operation that is on the same row. As noted in connection with FIGS. 28A and 28B, the voltage for write operations is higher than the voltage for verify (e.g. 1.0V) and read operations (e.g. 1.2V). Accordingly, the capacitive effects from bit-line coupling from an adjacent write operation may easily impact a verify or read operation that is on the same word line.

FIG. 31 comprises a memory array with source lines 3102, 3106 and 3110, bit-lines 3104, 3108 and 3112, and word lines 3182 and 3184. Further, memory array comprises memory cells 3120, 3122 and 3124. If a write operation is being performed on memory cell 3122, an adjacent background verify (or read) operation on memory cells 3120 or 3124 may be affected due to capacitive effects from bit-line coupling between the bit-lines of the neighboring cells.

Accordingly, in one embodiment of the present invention, additional circuitry is required in the memory design to prevent a verify (or read) operation that is adjacent to a write operation on the same row from simultaneously activating. In one embodiment, the additional circuitry may also be programmed to prevent a second write operation that is adjacent to a first write operation on the same row from simultaneously activating. In other words, in some cases two writes may be attempted on the same row that are adjacent to each other. Additional circuitry may be programmed, therefore, to filter out the additional write operation to avoid the effects of bit-line coupling.

Figure 32:
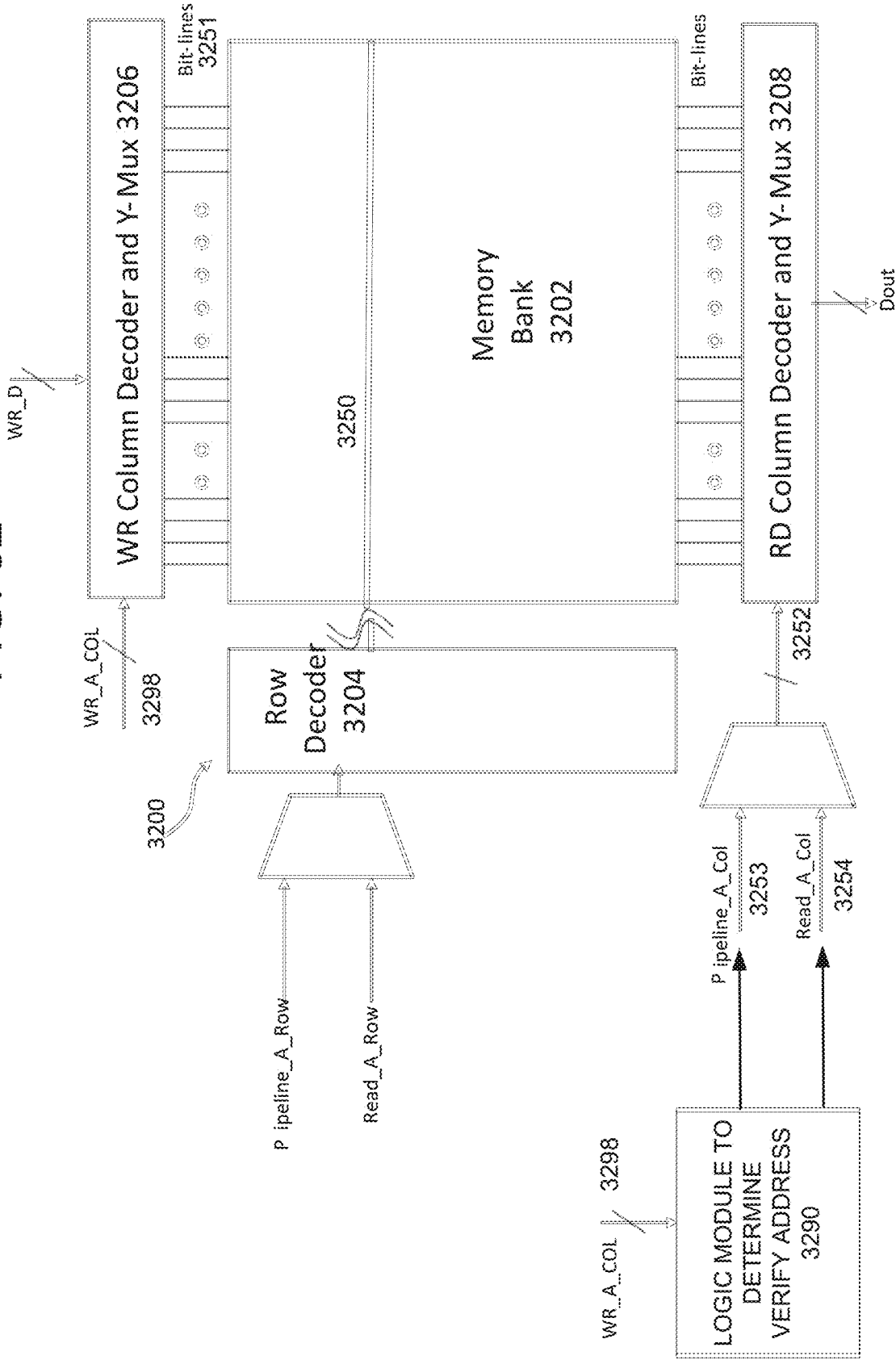
FIG. 32 is a block diagram of an exemplary embodiment of a memory device of the present disclosure showing the manner in which a verify operation adjacent to a simultaneously occurring write operation on the same row can be filtered out in accordance with an embodiment of the present invention.

FIG. 32 is a block diagram of an exemplary embodiment of a memory device of the present disclosure showing the manner in which a verify operation adjacent to a simultaneously occurring write operation on the same row can be filtered out in accordance with an embodiment of the present invention. FIG. 32 comprises similar elements to FIG. 18 discussed previously. As discussed in connection with FIG. 18, the Y-mux structure of the present disclosure allows pseudo-dual port memory banks to perform simultaneous write and verify operations sharing common row address and different column address. FIG. 32 shows a portion of memory device 3200 comprising memory bank 3202, row decoder 3204, write column decoder and y-mux 3206, and read column decoder and y-mux 3208. Note that memory bank 3202, row decoder 3204, write column decoder and y-mux 3206, and read column decoder and y-mux 3208 perform substantially similar functions as the corresponding components in FIG. 18. Further note that write column decoder and y-mux 3206, row decoder 3204 and read column decoder and y-mux 3208 together comprise a read/write port for the pseudo dual port memory bank.

FIG. 32 shows a Y-mux structure for decoders 3206 and 3208. Memory bank 3202 typically comprises a plurality of memory cells. As discussed previously, the Y-mux structure allows simultaneous verify and write operations for data words sharing a common row address (word line) in the memory bank but different column address. For example, the row decoder 3204 may activate a row address 3250 (an x address). At the same time, column decoder and Y-mux 3206 multiplexes the column bit-lines 3251 based on a column address (WR_A_COL) to arrive at the column lines associated with the addressed data word in the Y-mux. In other words, the WR_A_COL signal is used to select the appropriate column bit-lines 3251 to write the data inputted through the WR_D signal. In the same cycle as column decoder and Y-mux 3206 are writing a data word to the memory bank 3202, the read column decoder and Y-mux 3208 is used to perform the verify operation that shares the common row address (on row 3250) as the write operation. For example, the read address 3252 is used to select the appropriate bit-lines for the verify (or read) operation and the result is outputted through the D-out signal. Accordingly, the column decoder and Y-mux 3206 are used to write a data word into the memory bank 3202 at a row address 3250 in the same cycle as the read column decoder and Y-mux 3208 is used to verify (or read) a data word from row address 3250.

In one embodiment of the present invention, additional logic circuitry 3290 may be added (e.g., to the e1 buffer) in the selection of the read addresses presented to the read column decoder 3208 through signals Pipeline_A_Col 3253 and Read_A_Col 3254. In one embodiment, logic circuitry 3290 may be configured inside the e1 buffer. In a different embodiment, logic circuitry 3290 may be configured external to the e1 buffer, but would have access to signals and memory within the e1 cache.

As noted above, a ROWchange signal may indicate that that a data word and associated address should be transmitted from e1 register 104 to the pipeline structure for a verify operation. If a pseudo-dual port memory bank is used, e1 register 104 may choose a data word and an associated address such that they share a common row address with a data word in the write register of the pipeline structure. Accordingly, logic circuitry 3290 may, in one embodiment, be added to the e1 buffer to facilitate the selection of an appropriate read address. In one embodiment, logic circuitry 3290 is configured to prevent simultaneous selection of a column address that is adjacent to the column address selected by the write column decoder and Y-mux 3206. In other words, the additional circuitry (not shown) may be configured to filter out any addresses from being transmitted to the read decoder 3208 that are within a +1 or −1 range of the write column address currently selected by the write column decoder 3206. In one embodiment, logic module 3290 comprises address compare logic to check if the address from a queued verify is within a +1 or −1 column address away from the write operation.

In one embodiment, as stated above, logic module 3290 may also be programmed to filter out any subsequent write operations from being transmitted that are within a +1 or −1 range of a first write operation currently selected by a write column decoder.

In one embodiment, the logic module 3290 for filtering out adjacent verify or read addresses may further be configured to select an additional address for reading (or verification) that is on the same row (that is not adjacent to the write column address selected by the write column decoder 3206). The logic module prevents a simultaneous background verify operation when the verify (or read) address is a +1 or −1 column address from the on-going write operation and, instead, selects a different verify operation on the same row that is not adjacent to the write operation. In other words, any address within a +/−1 range of the write address selected by the write column decoder and Y-mux 3206 is filtered out or de-prioritized and, alternatively, a different address on the same row is selected for a verify operation. In one embodiment, de-prioritizing may entail performing the verify operation in a different cycle, or scheduling the verify operation to be performed in a different cycle. Timing constraints may require an additional row match solution to be output from the engine so that if one of the verify addresses is within +/−1 then the alternative verify address may be used.

In one embodiment, WR_A_COL 3298 (the write column address) may be inputted into the logic module 3290 and used to invalidate matches for anything with similar addresses, specifically +1 or −1 column address.

In one embodiment, if another verify operation is available in the e1 buffer (e.g., e1 104) on the same row as the write operation (that is not adjacent to the write operation) the logic circuitry 3290 would prioritize the non-adjacent address verify operation. In other words, the additional logic circuitry 3290 can be programmed to find a non-adjacent address on the same row that is awaiting verification from the error cache e1.

In one embodiment, the logic circuitry 3290 may be modified to search for multiple (e.g., two or three) different addresses on the same row for a verification operation in the same cycle. By searching for multiple possible verify operations at the same time or during the same cycle, an extra cycle is not required to search for an alternate verify operation on the same row in the event that a verify operation needs to be filtered out (e.g., because it is adjacent to an on-going write operation). The logic operations to determine if a verify address is adjacent to an on-going write operation is not a complex one (and, therefore, does not require complex circuitry) because the address is only a single bit (+1 or −1) removed from the write column address.

In one embodiment, the logic module 3290 is used to search for the multiple possible addresses (for verify operations) that share a common row address as the write operation in the same cycle that column decoder and Y-mux 3206 is writing a data word to the memory bank 1802.

In one embodiment, where multiple verify addresses are searched on the same row, instead of filtering out addresses that are adjacent to the write column addresses, the adjacent addresses are simply de-prioritized. In this embodiment, if another verify operation on the same row (that is not adjacent to the column write address) is not found, then an adjacent address may be used instead of being filtered out. However, if an alternate verify operation is found, any adjacent verify operation that may potentially cause bit-line coupling issues is de-prioritized.

In one embodiment, if bit-line coupling effects are high, then the logic module 3290 may be further configured to de-prioritize or filter out verify addresses that are not just adjacent but are proximal, e.g., within a +2/−2, +3/−3 or even +n/−n addresses of the write operation (where n is a value less than the number of columns in the memory array). As mentioned above, in one embodiment, de-prioritizing may mean performing the proximal operations in a different cycle. In one embodiment, the logic module 3290 may comprise a register or a programmable trim option. In other words, the proximity value is programmable and set by trim. In other words, the proximity value (e.g., +/−1, +/−2, +/−3 etc.) may be a programmable design option for the memory. Alternatively, the proximity value may be programmed into a register on the logic module 3290.

Figure 33:
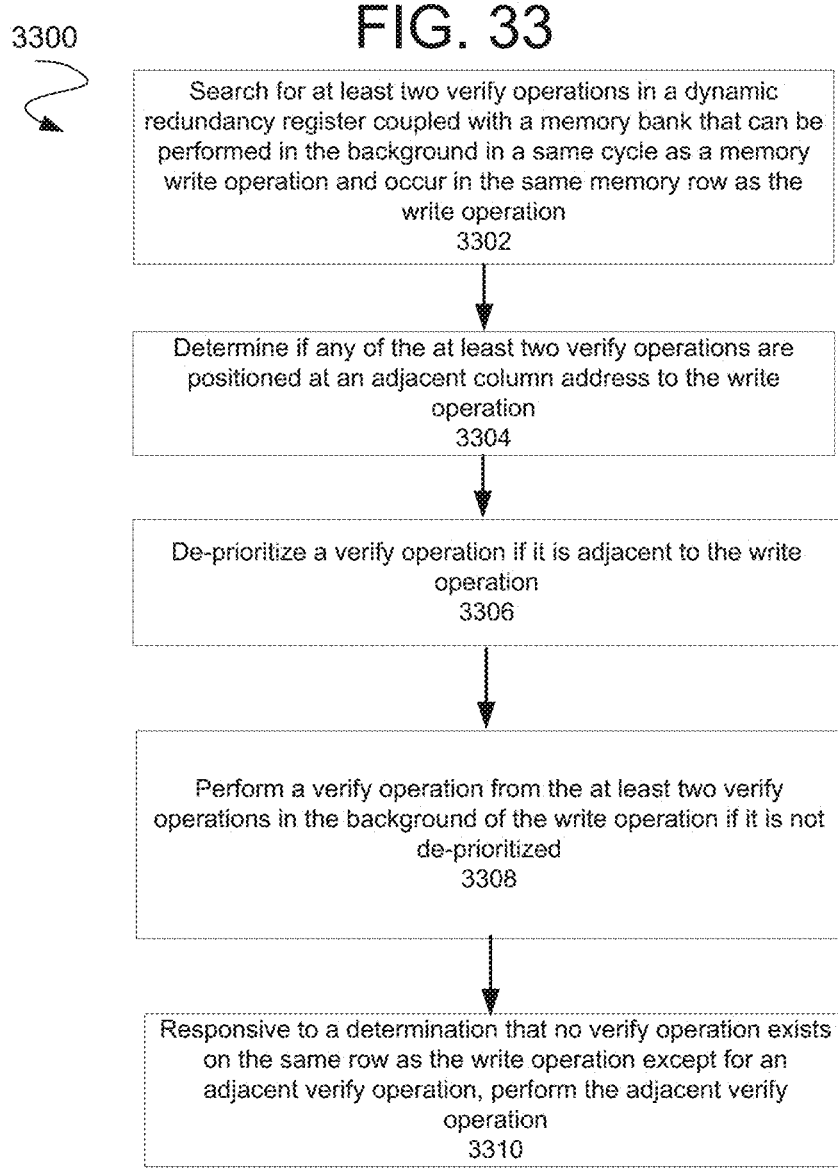
FIG. 33 depicts an exemplary embodiment for a process flow showing the manner in which a background verify or read can be performed in the same cycle as a write operation without distortion created by bit-line coupling effects in accordance with an embodiment of the present invention.

FIG. 33 depicts an exemplary embodiment for a process flow showing the manner in which a background verify or read can be performed in the same cycle as a write operation without distortion created by bit-line coupling effects in accordance with an embodiment of the present invention.

At step 3302, logic circuitry (e.g., module 3290) implemented, for example, in an e1 buffer, searches for at least two verify operations in a dynamic redundancy register that can be performed in the background in a same cycle as a memory write operation and that occur in the same memory row as the write operation.

At step 3304, module 3290 determines if any of the at least two verify operations are located adjacent to the write operation—in other words, if any of the verify operations are within a +1 or −1 column address of the write operation. In some embodiments, module 3290 may be also configured to determine if the at least two verify operations are within a +2/−2 or a +3/−3 column address of the write operation especially in circumstances where effects of bit-line coupling are pronounced. In these embodiments, verify operations within a +2/−2 or a +3/−3 column address of the write operation are considered to be "adjacent" verify operations.

At step 3306, module 3290 is configured to de-prioritize (or alternatively, filter out) any verify operations that are adjacent to the write operation.

At step 3308, verify operations that are not de-prioritized (or filtered out) are performed in the background of the write operation.

At step 3310, responsive to a determination that no other operations were found in the same row as the write operation besides the adjacent verify operations, perform the adjacent verify operation.

MRAM Noise Mitigation for Background Operations by Delaying Verify Timing

As mentioned previously, FIG. 31 illustrates the manner in which noise from bit-line coupling may impact a verify (or read) operation if it on the same word line or row as an adjacent write operation. One of the challenges that may occur with the pseudo-dual port scheme of implementing a write operation and a background verify operation sharing a common row (word line) address is that when implementing the write operation, noise from bit-line coupling can impact an adjacent verify (or read) operation that is on the same row. For example, if a write operation is being performed on memory cell 3122, an adjacent background verify (or read) operation on memory cells 3120 or 3124 may be affected due to capacitive effects from bit-line coupling between the bit-lines of the neighboring cells.

Figure 34:
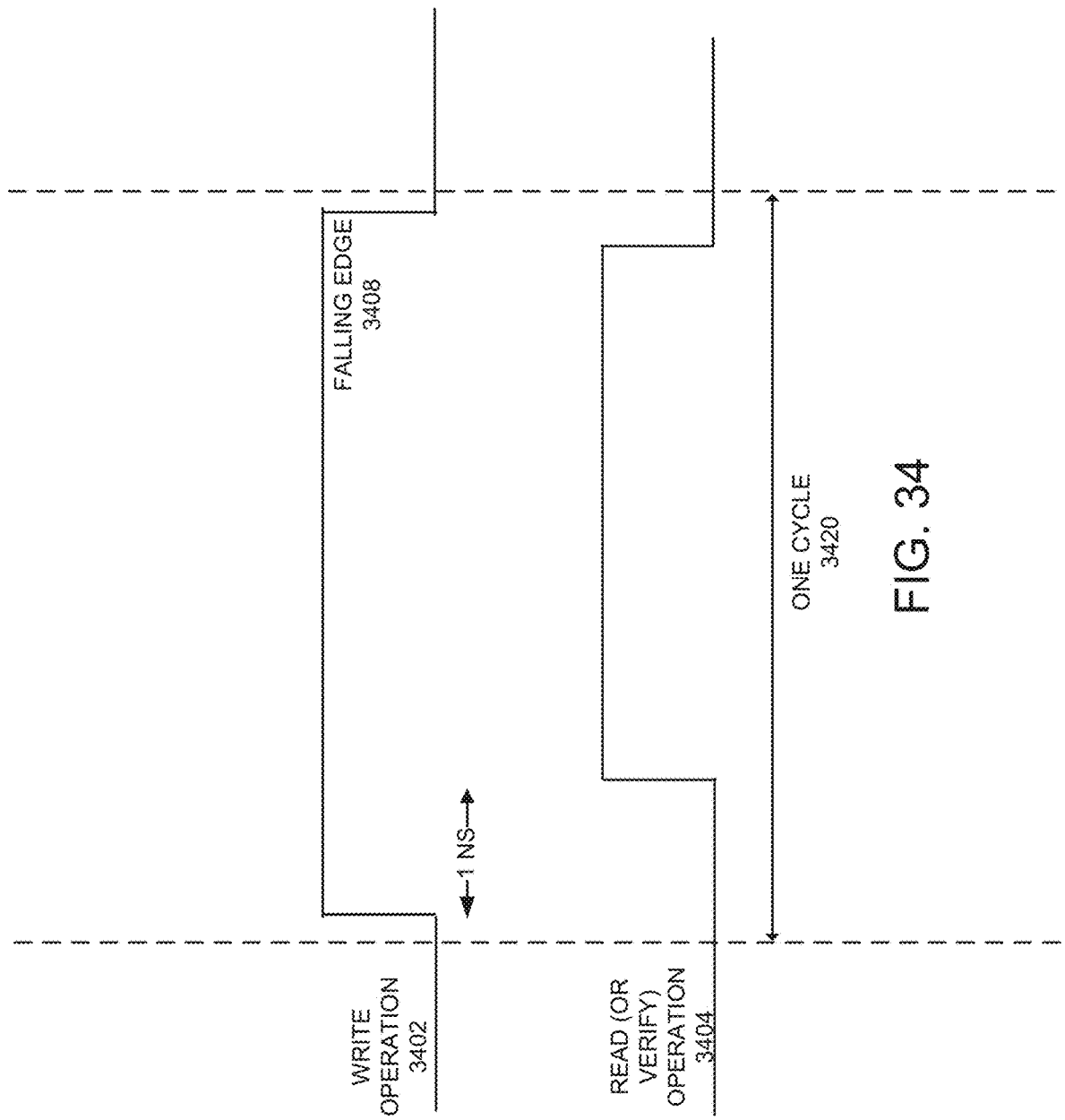
FIG. 34 illustrates an alternative method to addressing the problem of bit-line coupling in accordance with an embodiment of the present invention.

FIG. 34 illustrates an alternative method to addressing the problem of bit-line coupling in accordance with an embodiment of the present invention. In one embodiment, in order to prevent the voltage switching from the write operation 3402 from distorting the adjacent background verify (or read) operation 3404 performed simultaneously, the background verify (or read) operation 3404 is delayed by a threshold duration, but still within the same clock cycle 3520 as the write operation. For example, the start of the verify or read operation may be delayed by 1 ns from the start of the write operation. The delay has to be long enough to allow the source and bit-line from the write operation to settle. In other words, it is preferable to avoid the bit/source line voltage ramp time and any related ringing that can happen afterwards.

The delay prevents the write operation from aggressing the read or verify operation. It should be noted, however, that the delay cannot be too long, otherwise, it results in the memory slowing down. It is appreciated that both operations are executed within the same clock cycle even though the verify (or read) operation is delayed.

As noted above, in connection with FIGS. 28A and 28B, the voltage for write operations is higher than the voltage for verify (e.g. 1.0V) and read operations (e.g. 1.2V). Accordingly, the capacitive effects from bit-line coupling from an adjacent verify operation is unlikely to aggress on the write operation (because the voltage value for a verify operation is lower than a write operation). Therefore, delaying the verify or read operation a threshold duration from the start of the write operation prevents bit-line coupling from distorting the background verify (or read) operation. Furthermore, because a read or verify operation is typically shorter than a write operation, the read or verify will usually finish before the write operation is completed as shown in FIG. 34.

In one embodiment, the delay is programmable and set by trim. In other words, the delay value may be a programmable design option for the memory. The delay value may be programmed into a register on the memory chip. In an alternative embodiment, the instead of having a programmable delay value, a delay may be added by using gates or buffers in the circuitry. It is appreciated that both operations (the write and the verify or read operations) are executed within the same clock cycle even though the verify (or read) operation is delayed.

Typically read/verify operations are shorter than write operations. Accordingly, the read/verify operation 3404 will usually complete well before the write operation 3402 as shown in FIG. 34. In this case, background read/verify operations would complete before write operation has completed, and bit/source line cleanup will proceed as normal.

In the event that the read/verify operation 3404 is longer than a write operation, in one embodiment, the write operation may be programmed to end after the read or verify operation. In other words, the write pulse duration may be lengthened so that the falling edge of the write pulse 3408 occurs after the read pulse as shown in FIG. 34. This prevents the falling edge of the write pulse 3408 from aggressing on the read or verify operation. In this embodiment, the background read/verify operation is timed to occur within the write pulse.

In one embodiment, the solution of FIG. 34 may be used instead of the solution of FIG. 32 to avoid bit-line coupling effects.

In one embodiment, a logic module similar to module 3290 may be used in order to insert a delay to the background verify operation to be performed simultaneously with the write operation.

Figure 35:
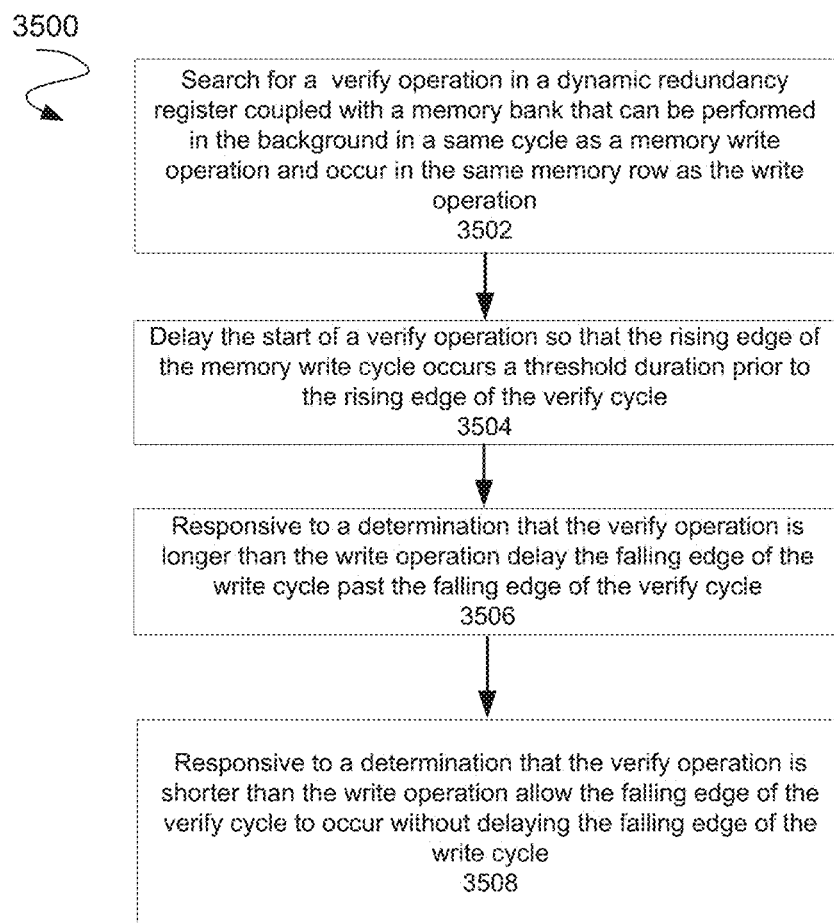
FIG. 35 depicts an exemplary embodiment for a process flow showing the manner in which a background verify or read can be delayed by a threshold amount from a write operation on the same row to prevent distortion created by bit-line coupling effects in accordance with an embodiment of the present invention.

FIG. 35 depicts an exemplary embodiment for a process flow showing the manner in which a background verify or read can be delayed by a threshold amount from a write operation on the same row to prevent distortion created by bit-line coupling effects in accordance with an embodiment of the present invention.

At step 3502, logic circuitry in the error buffer (or dynamic redundancy register coupled to the memory bank), as explained in detail above, searches for a pending verify operation that can be performed in the background in the same cycle as a current memory write operation, where the verify operation occurs in the same row as the write operation.

At step 3504, the start (or rising edge) of the background verify cycle is delayed by a threshold duration, so that the rising edge of the verify cycle occurs after the rising edge of the write cycle. This prevents the voltage switching from the bit-lines and source-lines from the write operation from corrupting the verify operation. It is appreciated that both operations are executed within the same clock cycle 3520 even though the verify (or read) operation is delayed.

The delay can be inserted by logic circuitry inside the error buffer, e.g., using a module similar to module 3290 in FIG. 32.

At step 3506, responsive to a determination that the verify operation is longer than the write operation, the falling edge of the write cycle is delayed so that it occurs after the falling edge of the verify operation (with enough delay so that the write operation does not create bit-line coupling effects in the verify operation).

At step 3508, responsive to a determination that the verify operation is shorter than the write operation, allow the falling edge of the verify cycle to occur without delaying the falling edge of the corresponding write cycle.

Error Cache Segmentation for Power Reduction

Memory designs, in which the size of the error cache or dynamic redundancy register is large, can consume significant power during active mode operation.

For example, the error buffer, e.g., error buffer 2614, 2110, etc., performs address matching operations, which have significant power requirements. By way of example, address matching may be performed in an error buffer to determine if a row-address of any occupied entries in the error buffer matches with the row-address of an active address. The entry chosen as a result of the CAM operation will be staged in the verify stage of the pipeline in the next memory cycle. The larger the error buffer, the more power is consumed to perform a CAM (Content Addressable Memory) search for the address matching.

Another source of power consumption in memory designs with larger error cache sizes is pointer data structures used to prevent data collision, and identify words to be verified or rewritten. Pointers in error caches are used, for example, among other things to keep track of empty locations in the error cache. When entries relating to pending re-write operations or verify operations are first added to the error buffer, pointers are used to keep track of locations that are empty and/or occupied. In this way, pointers may be used to prevent data collision. It should be noted that valid bits may also used to keep track of locations in the error buffer that are occupied. Entries are placed in or removed from the error buffer using both the valid bit scheme and the pointers.

Furthermore, pointers may also be used to search for background operations e.g. background verify operations in the same row as active write operations that can be performed in the same cycle. In some embodiments, multiple pointer structures may also be used. A separate pointer structure may be used for keeping track of empty slots in the error buffer, for keeping track of pending verify operations, and for keeping track of pending re-write operations.

For example, pointers that keep track of empty locations in the error buffer may be referred to as ENTRY_IN pointers, pointers that keep track of locations with data words to be re-written into the memory bank may be referred to as REWRITE pointers, and finally, pointers that keep track of locations with data words to be verified may be referred to as VERIFY pointers. ENTRY_IN pointers are used to find entries in the error cache that are available. Typically, the pointers are configured with a predetermined procedure they use to pick an entry, e.g., a simple top-down algorithm wherein entries towards the top of the memory are picked before entries towards the bottom of the memory. Also, it should be noted that pointer structures, e.g., REWRITE, VERIFY, etc. may need to be re-evaluated every clock cycle because as cache fills up and empties the pointer data structures become invalid. The pointer structures that keep track of the various entries in the error buffer consume significant levels of power.

Finally, with a larger error cache, power may also be depleted in an SRAM during read/write operations due to bit-line parasitics.

As discussed in connection with FIGS. 17 and 21, a memory bank can comprise multiple segments. In one embodiment of the present invention, dividing the error cache into several direct-mapped segments mitigates the power consumption especially in the case where the error cache is large. Each segment of the error cache is direct mapped to a given portion of memory address in a memory bank. Smaller segments reduce the power consumed for address matching utilizing CAM memory search techniques because the memory space (the error buffer segment) that needs to be searched is reduced in size.

Figure 36A:
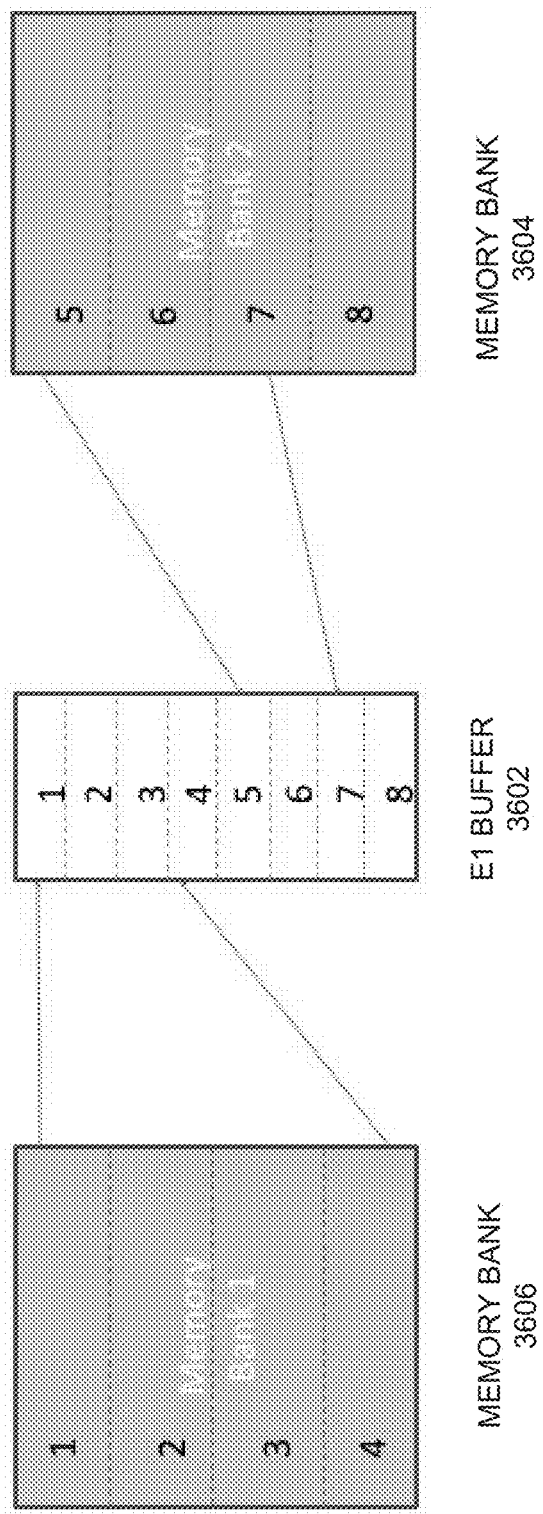
FIG. 36A illustrates the manner in which an error cache (e.g., a content-addressable memory or CAM) is divided into direct-mapped segments to mitigate high power in accordance with an embodiment of the present invention.

FIG. 36A illustrates the manner in which an error cache (e.g., a content-addressable memory or CAM) is divided into direct-mapped segments to mitigate high power in accordance with an embodiment of the present invention. As shown in FIG. 36A, each segment of the error cache 3602 is direct mapped to a portion of memory bank 3606 or memory bank 3604. In other words, each segment of the error cache is associated with a particular portion of the memory bank, wherein entries from the particular portion of the memory bank can only be inputted into the associated segment of the error cache. For example, entries associated with memory bank 3606 segment 1 can only be placed in error buffer 3602 segment 1. Similarly, entries associated with memory bank 3604 segment 7 can only be placed in error buffer 3602 segment 7. Although FIG. 36A illustrates only two memory banks, in one embodiment, segments of the error cache 3602 can be direct mapped to multiple memory banks.

Segmenting an error cache into direct-mapped segments, as shown in FIG. 36A, has several advantages over an unsegmented fully associative cache. In an unsegmented cache, there is no physical mapping between the memory logical or physical location of a memory word and the corresponding word stored in the error cache. In other words, the memory word can be stored at any available location in the error cache. For example, the words can be entered into the cache in the order in which it fills. Or, for example, a word from the bottom of the memory bank may be entered into the upper half of the error cache.

The unsegmented error cache is simplistic in principle and has certain advantages. For example, the fully associative error cache maximizes cache utilization because words from the memory can be entered into any unfilled space in the error cache. Further, only a single counter may be required to track cache utilization. In a segmented direct-mapped approach if a particular region of a memory bank has several localized errors, the segment of the error cache corresponding to this region would contain a higher proportion of entries (related to, for example, pending verifies and re-writes), thereby, risking possible overflow. A fully associative error cache avoids this problem because entries from the memory bank can be stored at any location in the error cache. Accordingly, a fully associative error cache minimizes effects of localized high error rate or bursts of random write errors.

However, a fully associative cache also suffers from several limitations. For example, a fully associative cache requires a search of the entire error cache to match a row address, using a CAM search, which can be a high power operation when CAM memory is used. As discussed above, address matching in a large error cache consumes significant power. A larger memory range to search through requires more power, whereas a smaller memory range requires lesser power to do the address search. Similarly, a search for pointers requires searching the entire cache, and this too is a high power operation. Furthermore, the fully associative error buffer has high power consumption due to the bit-lines during read and write operations that drive the entire cache depth. Fully associative caches are also slower for memories with higher densities.

Figure 36B:
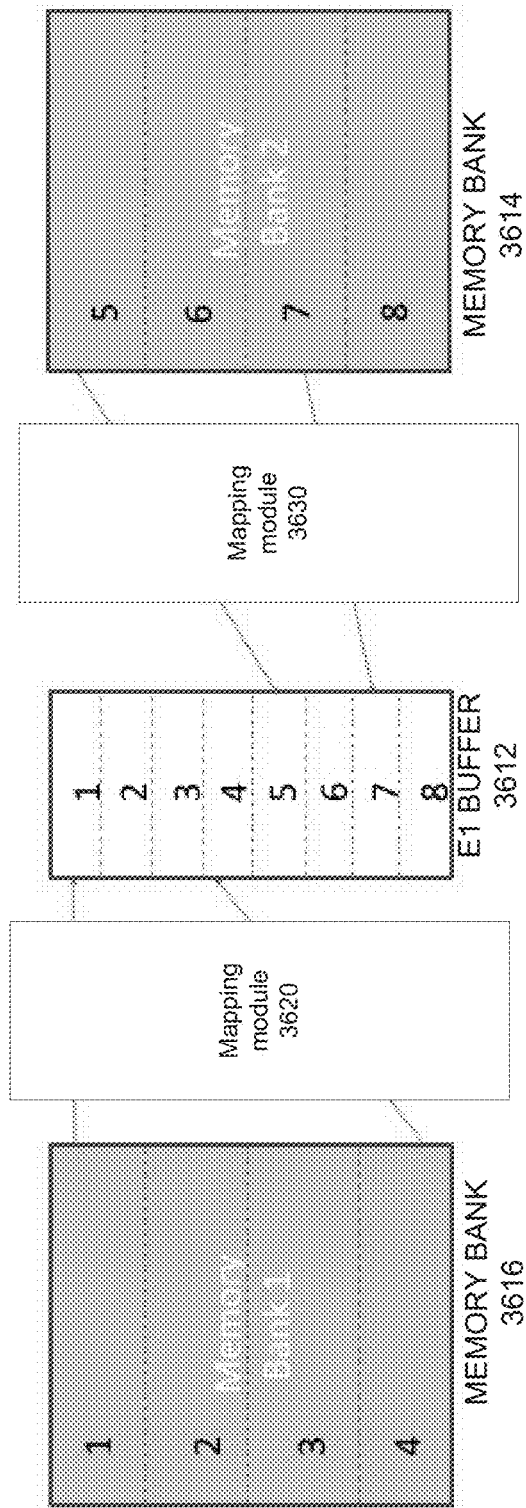
FIG. 36B illustrates the manner in which an error cache is divided into direct-mapped segments using a mapping module in accordance with an embodiment of the present invention.

FIG. 36B illustrates the manner in which an error cache is divided into direct-mapped segments using a mapping module in accordance with an embodiment of the present invention. As shown in FIG. 36B, each of the segments of error buffer 3612 is direct mapped to a corresponding section of memory banks 3616 and 3614. In other words, there is a direct mapping between address ranges of memory bank words (logical or physical) and error cache segments. For example, segment 1 of error buffer 3612 maps to the address range defined by memory region 1 in memory bank 3616. Data words and addresses from memory region 1 of memory bank 3616 will only be stored in segment 1 of the error buffer 3612. If, for example, a write on a word in memory region 1 of bank 3616 fails, the address of the word is used to determine that the word should be entered into segment 1 of error buffer 3612 for a potential re-write operation. Similarly, segments 5 and 7 of error buffer 3612 map to the address ranges of memory regions 5 and 7, respectively, of memory bank 3614.

In one embodiment, a memory mapping module (e.g. modules 3620 or 3630) may be used to perform the direct mapping between an address of the memory bank and the associated error buffer segment. For example, a memory mapping module may comprise mapping tables that translate the address of the memory bank (e.g., associated with an unsuccessful write) into a corresponding error segment. The mapping tables maintain a mapping from a memory address to its corresponding error buffer segment. The mapping module, in other words, allows the memory to determine the appropriate segment of the error buffer for inserting a pending verify or re-write operation. The mapping table may for example be stored within the pipeline circuitry, the error buffer itself or elsewhere on the memory chip.

In one embodiment, the mapping may comprise non-direct mapping. In other words, a mapping table stored in mapping modules 3620 and 3630 may be used to perform non-direct mapping. In another embodiment, the segment sizes of the error buffer 3612 may be non-uniform. For example, the segment sizes of the error buffer may be configured to grow as they fill up. In one embodiment, the non-uniform segment sizes may also be configured to borrow area from relatively empty segments.

There are several advantages to having a segmented error cache. First, to search for a particular pointer, e.g., a pointer associated with a verify or re-write operation, only the active or relevant segment of the error cache needs to be searched instead of the entire error cache. This saves both time and power consumption. With a fully associative cache, the entire cache would need to be searched for a particular address or data word. In the embodiment of FIG. 36B, if a re-write operation is associated with an address in memory region 7 of bank 3614, the re-write operation will only be found in segment 7 of error buffer 3612. Accordingly, the entire e1 buffer does not need to be searched. Only segment 7 needs to be searched. Cache power consumption is, thereby, reduced.

Further, the power associated with parasitic effects of bit-lines and source lines is reduced because only the bit-lines in the active segment of the error cache need to switch. In other words, the bit-lines do not need to traverse the entire depth of the cache and, accordingly, they consume much less power.

A non-direct mapped system requires a complex mapping module, which may require (n) m-bit comparisons, where n=number of address bits, and m=number of segments. However, a 2^n sized cache with direct mapping requires only (m) address decoders, each decoder using only log 2(m) address bits which is much simpler, from an area and power efficiency standpoint.

The segmented error cache with direct mapping requires fewer address bits to compare. For example, the error cache 3612 has 8 segments and accordingly will require only 3 address bits to perform a comparison because the last remaining bits will be pre-coded. So each time an entry needs to be retrieved from the error cache, 3 address bits will be required to perform the search. This further reduces the power and area consumed by the search.

The embodiments illustrated in FIGS. 36A and 36B, in certain instances, may be more susceptible to local high error bursts. For example, if a particular region of memory has a high error rate, the corresponding segment of the error cache may be contaminated with a disproportionately high number of words and addresses (related to words that need to be re-written or words that failed verify). This may risk overflow in the contaminated segment of the error cache. In the case of fully-associative mapping though, high error bursts in particular regions of memory is not a problem as long as the total number of failures in the memory chip conform to some expected threshold and the failures are within a standard deviation of an average mean failure rate. A higher number of errors in a particular segment will typically be balanced out by lower errors in other segments.

In one embodiment, in order to track the error cache occupancy similar to FIG. 22, a separate counter would be required for each segment of the e1 buffer. The counter tracks the number of valid entries that correspond to pending verify or re-write operations that need to be processed.

In one embodiment, if the number of write '1' and write '0' errors are being tracked separately, then two counters would be required for each segment, one for tracking write '1' errors and the other for tracking write '0' errors. Again, each counter tracks the number of valid entries that correspond to pending verify or re-write operations that need to be processed.

In another embodiment where memory address spaces are divided into multiple banks, multiple counters would be required, each for tracking number of entries corresponding to each bank. In most simplistic case where there are only two banks, two counters per segment would track the number of active entries corresponding to each bank.

Figure 37A:
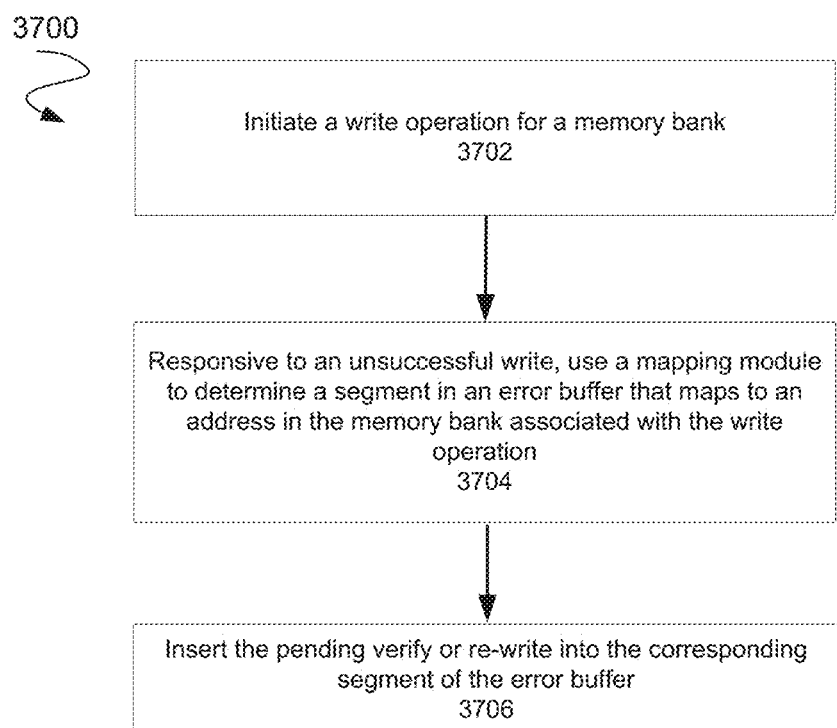
FIG. 37A depicts an exemplary embodiment for a process flow showing the manner in which a write operation is performed for a memory bank that comprises addresses that are mapped to corresponding segments in an error buffer in accordance with an embodiment of the present invention.

FIG. 37A depicts an exemplary embodiment 3700 for a process flow showing the manner in which a write operation is performed for a memory bank that comprises addresses that are mapped to corresponding segments in an error buffer in accordance with an embodiment of the present invention.

At step 3702, a write operation is initiated for a memory bank, e.g., memory bank 3614 or memory bank 3616.

At step 3704, responsive to an unsuccessful write or an unsuccessful verify operation (associated with the write), a mapping module (e.g., modules 3620 or 3630) can be used to determine a segment in an error buffer that maps to an address in the memory bank associated with the write operation.

At step 3706, the pending verify or re-write (associated with the unsuccessful write) is inserted into the corresponding segment of the error buffer.

Figure 37B:
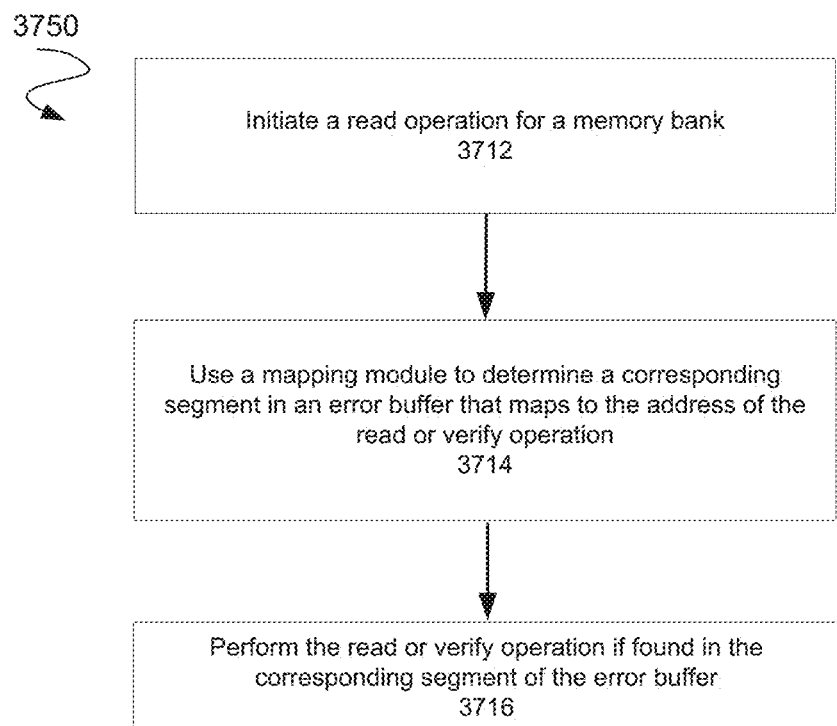
FIG. 37B depicts an exemplary embodiment for a process flow showing the manner in which a read operation is performed for a memory bank that comprises addresses that are mapped to corresponding segments in an error buffer in accordance with an embodiment of the present invention.

FIG. 37B depicts an exemplary embodiment 3750 for a process flow showing the manner in which a read operation is performed for a memory bank that comprises addresses that are mapped to corresponding segments in an error buffer in accordance with an embodiment of the present invention.

At step 3712, a read operation is initiated for a memory bank, e.g., memory bank 3614 or memory bank 3616.

At step 3714, a mapping module (e.g., modules 3620 or 3630) is used to determine a corresponding segment in an error buffer that maps to the address of the read operation. The error buffer can, therefore, be checked to determine if the read operation has an entry in the corresponding error buffer segment.

At step 3716, the read operation is performed if it is found in the corresponding segment of the error buffer. Performing the read operation using the segmented error cache results in considerable power savings for reasons explained above.

Error Cache System with Coarse and Fine Grain Segments for Power Optimization

Memory designs, in which the size of the error cache or dynamic redundancy register is large, can consume significant power during active mode operation.

As also explained earlier, there are three types of operations that can consume power during active mode operation. A CAM search of the error buffer for address matching can consume significant power. By way of example, address matching may be performed in an error buffer to determine if a row-address of any occupied entries in the error buffer matches with the row-address of an active address. The entry chosen as a result of the CAM operation will be staged in the verify stage of the pipeline in the next memory cycle. The larger the error buffer, the more power is consumed to perform a CAM (Content Addressable Memory) search for the address matching.

Second, another source of power consumption in memory designs with larger error cache sizes is pointer data structures used to prevent data collision, and to identify words to be verified or rewritten. Pointers in error caches are used, for example, among other things to keep track of empty locations in the error cache. When entries relating to pending re-write operations or verify operations are first added to the error buffer, pointers are used to keep track of locations that are empty and/or occupied. In this way, pointers may be used to prevent data collision.

Furthermore, pointers may also be used to search for background operations e.g. background verify operations that can be performed in the same cycle as active write operations. In some embodiments, multiple pointer structures may also be used. A separate pointer structure may be used for keeping track of empty slots in the error buffer, for keeping track of pending verify operations, and for keeping track of pending re-write operations.

For example, pointers that keep track of empty locations in the error buffer may be referred to as ENTRY_IN pointers, pointers that keep track of locations with data words to be re-written into the memory bank may be referred to as REWRITE pointers, and finally, pointers that keep track of locations with data words to be verified may be referred to as VERIFY pointers. ENTRY_IN pointers are used to find entries in the error cache that are available. Typically, the memory is configured with a predetermined procedure it uses to pick an entry, e.g., a simple top-down algorithm wherein entries towards the top of the memory are picked before entries towards the bottom of the memory. Also, it should be noted that pointer structures, e.g., REWRITE, VERIFY, etc. need to be re-evaluated every clock cycle because as cache fills up and empties the pointer data structures become obsolete.

As noted previously, the error buffer 3616 holds write errors (for potential re-write operations) and verifies that have not been completed. During an active read/write or an idle cycle, the engine, for example, searches for a verify or a rewrite associated with the inactive plane (in the background) in the error cache (an entry out pointer operation), so that the pending verify or rewrite operation can be performed in the background. These types of search pointer operations consume significant power during memory operation.

Finally, with a larger error cache, power may also be depleted in an SRAM during read/write operations due to bit-line parasitics.

As noted above, there are trade-offs between power consumption per pointer operation (e.g., ENTRY_IN, REWRITE, VERIFY pointers) (and memory address CAM search) and risk of cache overflow when considering segment size for a direct mapped cache such as the one discussed in connection with FIG. 37. The smaller error cache segments are more power efficient because the entire error cache does not need to be searched for address matching. Searching the entire cache would drastically increase the active and standby/idle power of the memory. However, the larger error buffer segments are more efficient at handling local random error bursts, thereby, avoiding segment overflow. Therefore, the risk of segment overflow grows as the power consumption decreases with smaller size segments and vice versa.

In one embodiment of the present invention a mapping scheme between the memory bank and the error buffer is used that achieves reduced power consumption of smaller segmentation size without increased risk of segment overflow. The mapping scheme comprises segmenting the error cache with a primary segmenting scheme and a secondary segmenting scheme, wherein the secondary scheme comprises sub-segmenting the primary segments.

In designing error buffer systems, the total number of entries in the error buffer needs to be determined by considering expected bit error rate, word size, and worst case memory access pattern. In the error buffer employing coarse grain segments (as illustrated in FIGS. 36A and 36B), the total number of entries is calculated as follows: $N_{total\_entries} = N_{segments} * N_{entries}$ (number of segments×number of entries per segment).

Often, the number of total entries optimally required for the error buffer is not a 2 to the n number (where n is an arbitrary positive integer number). Having a non-$2^n$ sized error buffer, is disadvantageous for several reasons. First, full address comparison is required when mapping between an address of the memory bank and the associated error buffer segment during error buffer operation. In contrast to a non-$2^n$ error buffer, a $2^n$ sized error buffer only requires an m-bit address comparison where $2^m$ is equal to the total number of segments in the error buffer. Second, an error buffer with a non-$2^n$ number for the number of entries or segments ($N_{entries}$ or $N_{segments}$) requires complex address encoding and decoding circuits compared to one with $2^n$ number of entries or segments ($N_{entries}$ or $N_{segments}$).

Separate from the discussion of why having non-$2^n$ numbers for the number of entries or segments ($N_{entries}$ or $N_{segments}$) results in a complex design, as stated previously, power consumption incurred by any pointer search is approximately proportional to the number of entries to be searched. If the span of entries to be searched is "finely" defined, the power penalty caused by pointer operation may be minimized. Simply increasing the number of segments ($N_{segments}$) in order to reduce the number of entries per segment ($N_{entries}$) does not reduce power requirements and implementation complexity, because additional logic to track the status of individual segments, e.g. occupancy also becomes more complex as the number of segments in the error buffer gets larger.

In one embodiment, in order to enable error buffers with a non-$2^n$ number total number of entries, fine-grain segments scheme are implemented. As mentioned above, the mapping scheme comprises segmenting the error cache with a primary segmenting scheme and a secondary segmenting scheme, wherein the secondary scheme comprises sub-segmenting the primary segments.

To implement fine-grained segments, two-level mapping between a memory address space and an error cache address is used. Conventional direct mapping is used as the first mapping. In this direct mapping, there are $2^m$ segments and only m-bit need to be compared to determine which segment is active during the error buffer operation. Once first-level segment selection (the coarse segmentation) is finished, there are certain number of sub-segments included in each selected segment (fine-grained segmentation). In one embodiment, the number of entries for each segment is arbitrarily chosen for the optimal total number of entries. For example, there could be 5 sub-segments (which is a non-$2^n$ number) inside each segment. Scheme for selecting the sub-segments could differ depending on implementation.

Figure 38:
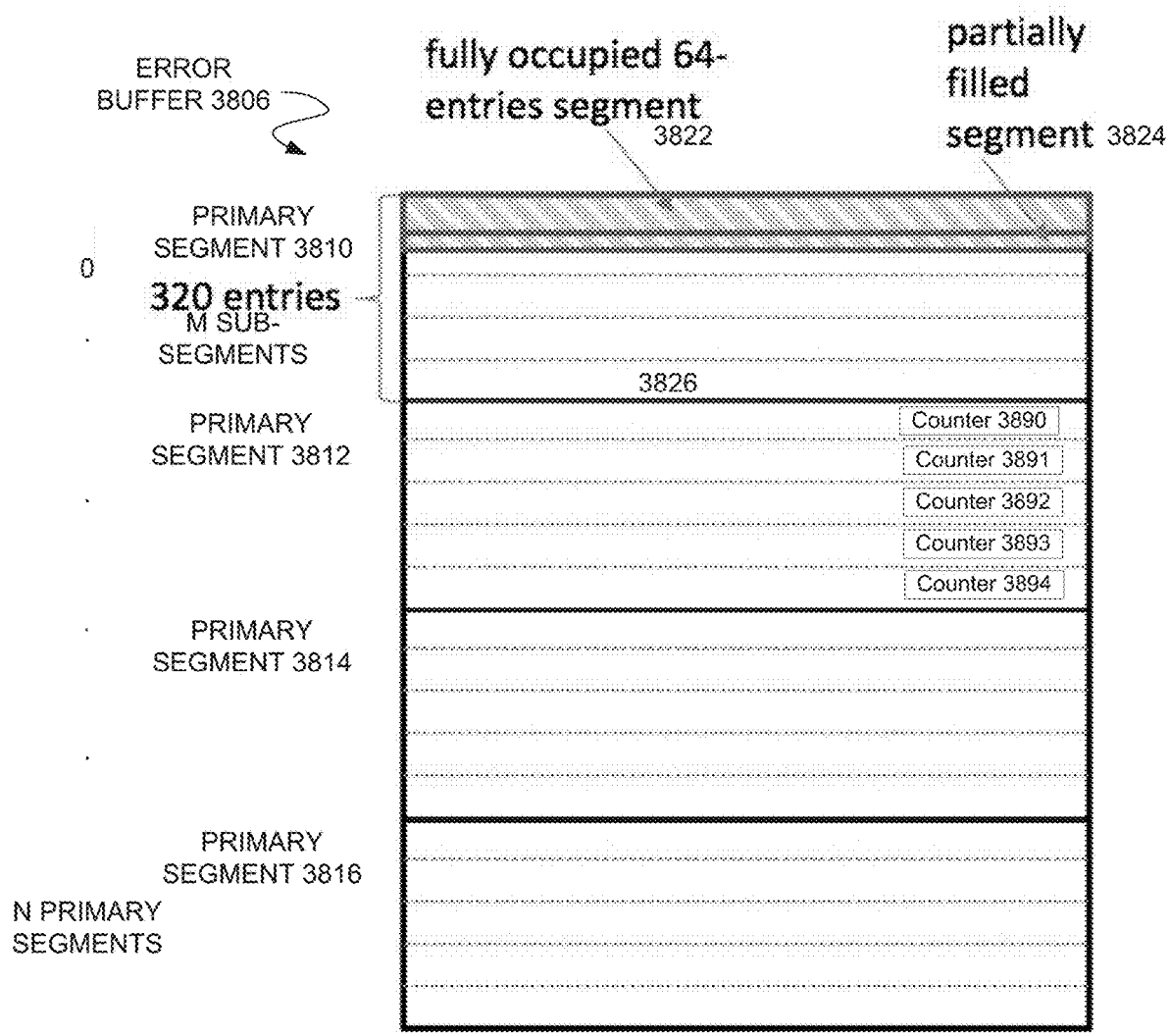
FIG. 38 illustrates a mapping scheme with coarse and fine segments that achieves reduced power of smaller segmentation size without increased risk of segment overflow in accordance with an embodiment of the present invention.

FIG. 38 illustrates a mapping scheme with coarse and fine segments that achieves the advantages of reduced power consumption of smaller segmentation size without increased risk of segment overflow in accordance with an embodiment of the present invention.

As shown in FIG. 38, error buffer 3806 comprises a primary mapping, wherein the primary segmentation level comprises an N number of segments. The primary segmentation comprises segmenting the error cache at a coarse level. It should be noted that in the exemplary illustration of FIG. 38, N=4. However, there can be any number of primary segments and N may be smaller or larger depending on the memory design. In one embodiment, N will typically be a power of 2. It should be noted that direct address mapping between a memory address space and an error cache address is most effectively/efficiently done when mapping is uniform and, typically, a power of 2. ($2^n$ where n=integer). It is desirable to have the mapping be a power of 2 because, otherwise, the primary cache segments may not be equal size, which results in complications. As shown in FIG. 38, error buffer 3806 comprises 4 primary segments, 3810, 3812, 3814 and 3816.

Error buffer 3806, in one embodiment, is further sub-divided into secondary segments, or segments at a finer level (as compared to the coarse level). As shown in FIG. 38, each segment of the error buffer is sub-divided into m sub-segments, where each primary segment (e.g., 3810, 3812, 3814 and 3816) comprises m sub-segments. Pointer operation for the error buffer is allowed at the more granular-sized segment level—in other words, pointer operation is permitted at the sub-segment level. As shown in FIG. 38, each primary segment, for example, may comprise 5 sub-segments (e.g., sub-segment 3822, 3824 etc.) Sub-segment 3822 may comprise 64 entries and, in the example shown in FIG. 38, sub-segment 3822 is fully occupied. Sub-segment 3824 also comprising 64 entries is partially occupied as shown in FIG. 38. The total number of entries in each primary segment is therefore (5×64=320) for the example shown in FIG. 38. The scheme shown in FIG. 38 can, therefore, enable non power of 2 segmentation as related to the number of entries in the primary segment. For example by dividing the cache 3806 into 4 primary segments where each primary segment has 5 sub-segments, each with 64 entries, the scheme enables each primary segment to comprise 320 entries (a non power of 2 number). Similarly, the number of sub-segments in a primary segment may also be a non power of 2 number (e.g., 5 sub-segments in each primary segment as shown in FIG. 38). In this way, the optimum number of entries or the optimum number of sub-segments within each primary segment does not need to be a power of 2. Having a primary segment size which does not divide neatly into the total cache size leaves an undesirable effect of leaving "remainder" segments which are smaller than others, and are themselves difficult to decode.

In one embodiment, a separate counter is maintained in each of the sub-segments of each primary segment. For example, as shown in FIG. 38, primary segment 3812 comprises a counter for each of the sub-segments (e.g. counters 3890, 3891, 3892, 3893 and 3894). The counters keep track of the number of valid entries in each of the sub-segments. In other words, the counter tracks the number of valid entries that correspond to pending verify or re-write operations that need to be processed.

It should be noted that different memory designs may comprise a differing number of entries per sub-segment and per primary segment. However, any memory design would need to consider the trade-offs when determining segment size. For example, a smaller segment size may be more efficient from a power standpoint but may have a very high risk of overflow. Also, a smaller segment size would result in more counters in the error buffer, which adds power and logic overhead.

The segmentation scheme illustrated in FIG. 38 conserves power advantageously in each of the three different categories discussed above.

For example, the power associated with parasitic effects of bit-lines and source lines is reduced because only the bit-lines in the active sub-segment of the primary segment of the error cache need to switch. In other words, the bit-lines do not need to traverse the entire depth of the primary segment and, accordingly, they consume much less power.

Also power is expended in priority matching operations associated with the pointer operation. It is possible that multiple CAM entries will be discovered when searching for possible rewrite or verify background operations. Priority matching is the process or reducing multiple discovered cache entries to a single selected entry using some types of selection criterion, e.g., position in cache, or others. In non-segmented caches this could require a full cache sort of the selected entries to supply the selection criteria and develop a single result. If this process is limited to a single segment or sub-segment, much faster result and lower power consumption will be the benefits.

Second with respect to CAM searching, power consumption is reduced to some degree because the sub-segments with zero counter values do not need to be searched for address matches. For example, address matching may be performed in an error buffer to determine if an address in the error buffer is obsolete. For such address matching, the sub-segments with zero counter values (corresponding to no entries) need not be searched because the zero counter value indicates that those sub-segments are empty. Accordingly, power consumption is reduced because a CAM search does not need to be performed for the entire error buffer. It should be noted that this type of power savings may not be significant in cases where there are not many sub-segments in the error cache with counter values that are zero.

Finally, with respect to pointer operations, as stated above, pointer structures prevent data collisions by keeping track of empty locations in the error cache. With the scheme of FIG. 38, the counter values determine the sub-segment in which a new entry will be placed. Accordingly, power consumption with respect to pointer search operations for determining empty locations is reduced. Further, as noted previously, pointer operations are also used to identify words to be verified or re-written. With the scheme of FIG. 38, again, the counter values are used to determine the sub-segment from which the entries corresponding to the pending verify and re-write operations are chosen. This also results in a power savings for search pointer operations because the entire primary segment does not need to be searched to select a pending verify or re-write operation.

Hueristics for Selecting Subsegments for Entry in and Entry Out Operations in an Error Cache System with Coarse and Fine Grain Segments In an error buffer with fine grain segments (such as the one illustrated in FIG. 38), a scheme for choosing sub-segments in which new entries will be inserted or from which existing entries will be emitted could be designed in a way that error buffer system is optimized over different metrics, e.g., equalizing utilization or greedy utilization over given user access pattern. In one embodiment, a least populated sub-segment within a chosen primary segment could be selected for inserting new entries. By contrast, a most populated sub-segment within a chosen primary segment could be selected when emitting existing entries. In such an embodiment, the utilization of sub-segments is equalized over the course of error buffer operations. In this approach, counters, which track a number of active entries in sub-segments, may be used to determine which sub-segments are the least or most populated.

In another embodiment, a most populated sub-segment within a chosen primary segment may be selected when new entry will be inserted. This will maximize utilization of the most populated segment. This embodiment may be useful because in results in more emptied sub-segments. Therefore, CAM search energy could be reduced by disabling the search in the emptied sub-segments.

In one embodiment, the mapping between the error cache and the main memory is done at the primary segmentation level similar to the scheme illustrated in FIG. 37. In other words, primary segment is chosen based on direct address mapping as discussed in relation to FIG. 37. However, pointer operation is conducted at the sub-segment level. And the sub-segment selection for the pointer operations are chosen based on a chosen heuristic, e.g., a counter-based heuristic. A counter based heuristic comprises maintaining a separate counter in each of the sub-segments of each primary segment. For example, as shown in FIG. 38, primary segment 3812 comprises a counter for each of the sub-segments (e.g. counters 3890, 3891, 3892, 3893 and 3894).

The counters keep track of the number of valid entries in each of the sub-segments. When a new entry needs to be entered into primary segment 3812, e.g., an ENTRY_IN operation, the counter values are checked and the entry is placed in a sub-segment (of primary segment 3812) with the lowest counter value. In other words, sub-segments may be chosen based on a "least used sub-segment" criterion. Furthermore, when determining a candidate in a primary segment for removal back to the pipeline (e.g., an entry out operation due to attempted verify or a re-write operation), the sub-segment with the highest counter value is chosen so as to remove entries from a sub-segment that is getting close to fully occupied. In other words, sub-segments may be chosen based on a "most used sub-segment" criterion.

The finer sub-segmentation conserves power because placing the entry into a sub-segment avoids power loss from bit-line switching. In other words, the power consumption is limited to bit-line switching for the sub-segment and not the entire primary segment (the entire depth of the bit-line for the coarse segment does not need to switch).

Second, with respect to pointer operations, as stated above, pointer structures prevent data collisions by keeping track of empty locations in the error cache. With the scheme of FIG. 38, the counter values determine the sub-segment in which a new entry will be placed. Accordingly, power consumption with respect to pointer search operations for determining empty locations is reduced. Further, as noted previously, pointer operations are also used to identify words to be verified or re-written. With the scheme of FIG. 38, again, the counter values are used to determine the sub-segment from which the entries corresponding to the pending verify and re-write operations are chosen. This also results in a power savings for search pointer operations because the entire primary segment does not need to be searched to select a pending verify or re-write operation.

Finally, with respect to CAM searching, power consumption is reduced because the sub-segments with zero counter values do not need to be searched for address matches. For example, address matching may be performed in an error buffer to determine if an address in the error buffer is obsolete. For such address matching, the sub-segments with zero counter values (corresponding to no entries) need not be searched. Accordingly, power consumption is reduced because a CAM search does not need to be performed for the entire error buffer.

It should further be noted, that for a CAM search (which is a search of the error buffer for a specific address for a typical read or a write operation), the entire primary segment would need to be searched for the address (except any sub-segments that are completely empty). Accordingly, the scheme of FIG. 38 does not significantly impact the power consumption for CAM searches. For example, if a read operation needs to be performed in the active plane, as shown in FIG. 6, the address is checked in the error buffers before the memory bank. To search for the read operation in the error buffer, a CAM search using the read address is performed. The CAM search needs to be searched in the entire primary segment corresponding to the memory address of the read. Similarly for a write operation, the address needs to be searched in the error buffer to ensure that a matching address is not already located in the error buffer (because, the address in the error buffer needs to be rendered obsolete to permit the fresh write to progress forward). The CAM search for this type of operation would also be performed in the entire primary segment associated with the address of the write. In one embodiment the CAM search of the primary segment can bypass those secondary sub-segments that are empty. Accordingly, some minimal power savings may result from not searching the sub-segments with zero counter values. The scheme of FIG. 38, as mentioned above, would not significantly impact the power consumption of this type of CAM search.

In one embodiment, there may be two counters per sub-segment to keep track of valid entries resulting from write '1' errors and write '0' errors separately.

The scheme of FIG. 38 is able to maintain the same statistics (as related to overflow) as the scheme of FIG. 37 with significantly improved power reduction.

For example, the power associated with parasitic effects of bit-lines and source lines is significantly reduced because only the bit-lines in the active sub-segment of the primary segment of the error cache need to switch. In other words, the bit-lines do not need to traverse the entire depth of the primary segment and, accordingly, they consume much less power.

With respect to pointer operations, as stated above, pointer structures prevent data collisions by keeping track of empty locations in the error cache. With the scheme of FIG. 38, the counter values determine the sub-segment in which a new entry will be placed. Accordingly, power consumption with respect to pointer search operations for determining empty locations is reduced. Further, as noted previously, pointer operations are also used to identify words to be verified or re-written. With the scheme of FIG. 38, again, the counter values are used to determine the sub-segment from which the entries corresponding to the pending verify and re-write operations are chosen. This also results in a power savings for search pointer operations because the entire primary segment does not need to be searched to select a pending verify or re-write operation.

Figure 39:
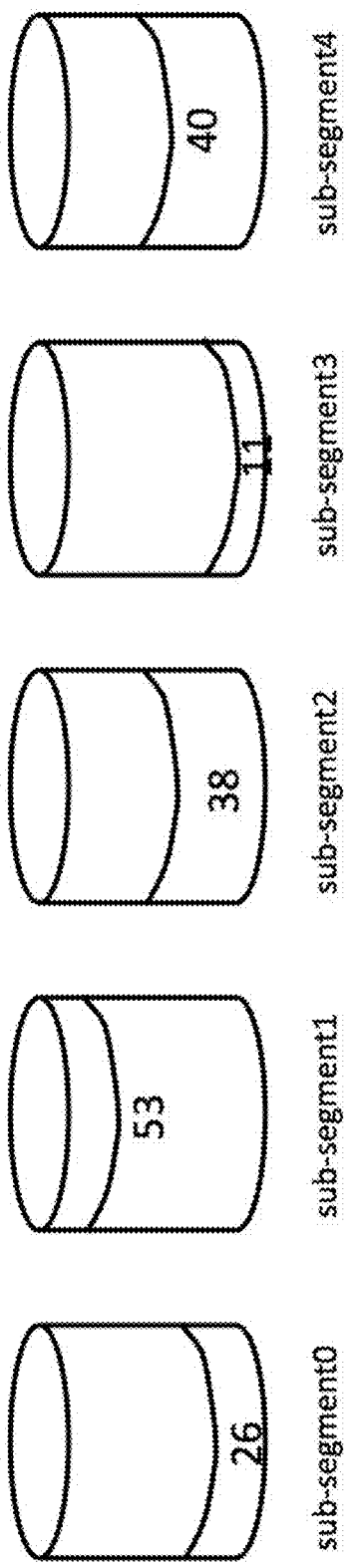
FIG. 39 illustrates the manner in which sub-segments may be chosen for entry-in and entry-out operations based on counter values in accordance with an embodiment of the present invention.

FIG. 39 illustrates the manner in which sub-segments may be chosen for entry-in and entry-out operations based on counter values in accordance with an embodiment of the present invention. As noted previously, the counters keep track of the number of entries in each of the sub-segments. When a new entry needs to be entered into primary segment 3902, e.g., an ENTRY_IN operation, the counter values associated with each of the sub-segments are checked and the entry is placed in a sub-segment with the lowest counter value in accordance with the "least used sub-segment" criterion (or heuristic). In the example of FIG. 39 then, sub-segment 3 would be picked which has the lowest counter value of 11. Furthermore, when determining a candidate in a primary segment for removal (e.g., an entry out operation due to attempted verify or a re-write), the sub-segment with the highest counter value is chosen in accordance with the "most used sub-segment" criterion. In the example of FIG. 39 then, sub-segment 1 would be picked which has the highest counter value of 53.

In a different embodiment, different heuristics may be used for choosing sub-segments for entry-in and entry-out operations (besides the "least used sub-segment" and "most used sub-segment" counter based heuristics discussed above). For example, a "priority by address space" heuristic may be used to select sub-segments for entry-in and entry-out operations. If certain sections or address spaces of memory are, for instance, more likely to fail than others and there is information available pertaining to the address spaces that are more prone to failure (either due to a known root cause or from observations made during testing), then the corresponding error cache-emptying policies are chosen to take into account the address spaces that are susceptible to failure. By way of example, sub-segments of the error buffer corresponding to such address spaces of memory may be prioritized for entry-out operations. Because those sub-segments are much likelier than others to fill up faster, prioritizing the sub-segments for entry-out operation prevents overflow. In one embodiment, a combination of a counter based and an address-space based heuristic may be used.

Figure 40:
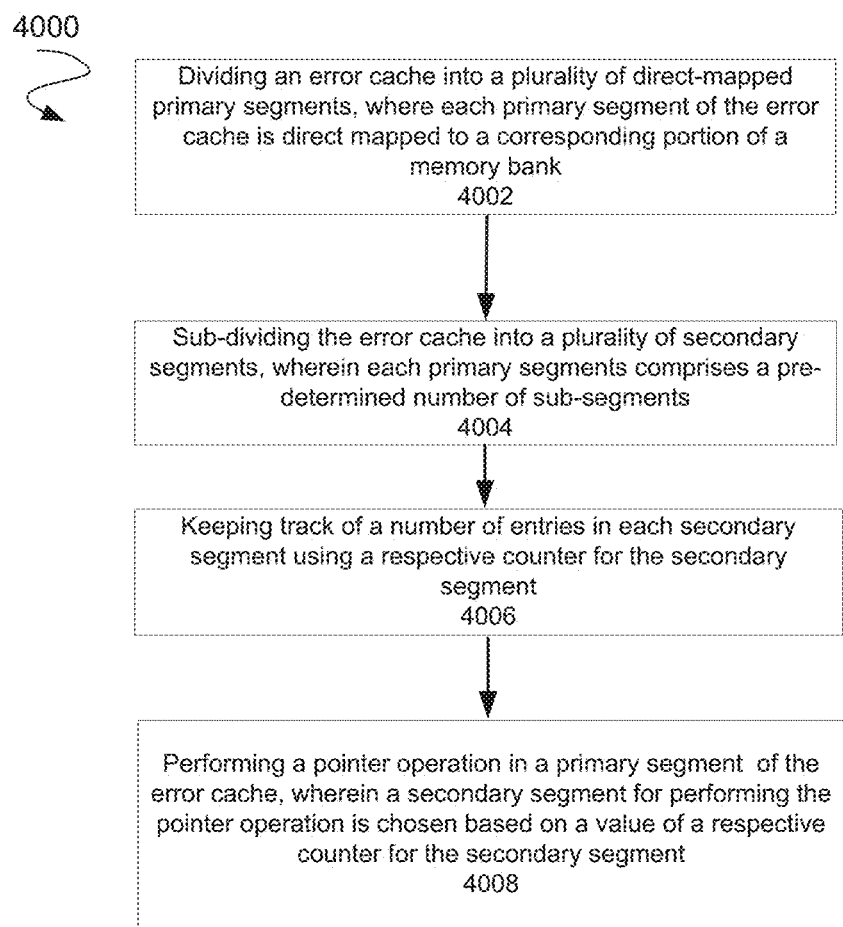
FIG. 40 depicts an exemplary embodiment for a process flow showing the manner in which power consumption can be optimized for an error cache in accordance with an embodiment of the present invention.

FIG. 40 depicts an exemplary embodiment for a process flow showing the manner in which power consumption can be optimized for an error cache in accordance with an embodiment of the present invention.

At step 4002, the error cache is divided into a plurality of primary segments, where each primary segment is direct mapped to a corresponding portion of a memory bank. As mentioned in connection with FIG. 36B, in one embodiment, the mapping may comprise non-direct mapping. In other words, a mapping table stored (e.g. stored in mapping modules 3620 and 3630) may be used to perform non-direct mapping.

At step 4004, each of the primary segments is sub-divided into a predetermined number of sub-segments. In other words, the error cache is sub-divided into a plurality of secondary segments with each primary segment comprising a predetermined number of secondary segments.

At step 4006, each of the secondary segments comprises a counter to keep track of the number of entries (e.g. corresponding to re-write or pending verify operations) in the respective secondary segment.

At step 4008, a pointer operation is performed in a primary segment of the error cache, wherein a secondary segment within the primary segment is chosen for performing the pointer operation based on a value of a respective counter for the secondary segment. The pointer operation may be one of several methods of accessing the error cache, including, an entry in operation or an entry out operation. For example, for an entry in operation, a secondary segment with the lowest count may be chosen. Similarly, for an entry out operation, a secondary segment with the highest count may be chosen. Details regarding choosing the appropriate sub-segment or secondary segment are discussed in relation to FIG. 39.

Determining an Inactive Memory Bank During an Idle Memory Cycle to Prevent Error Cache Overflow As discussed in connection with FIG. 17, a memory bank can be segmented in accordance with an embodiment of the present invention. As shown in FIG. 17, a memory bank can be split into segments, memory bank A 1702 and memory bank B 1703. Furthermore, there may be multiple memory banks in a given memory design.

Typically, during a particular memory cycle, e.g., a read or a write cycle, one of the banks will be active (the bank being written to or read from) and the other bank will be inactive. While no active operations in the pipeline may be performed on the inactive bank, there may still be certain background operations that can be performed in the inactive bank. As noted previously, the error buffer, e.g., error buffer 3602 holds write errors (for potential re-write operations) and verifies that have not been completed. During an active read/write or an idle cycle, the engine searches for a verify or a rewrite associated with the inactive bank (in the background) in the error cache, so that any pending verify or rewrite operation that needs to be completed can be performed in the background.

A memory cycle in which no active operations need to be performed (e.g., a read or a write) is called a no-op cycle. Even though no active operations are being performed during a no-op cycle, background operations related to pending verify and re-write operations continue to be performed. Accordingly, it is important to have establish criteria to define which of the two or more memory banks will be designated as the inactive state during a no-op cycle.

Figure 41A:
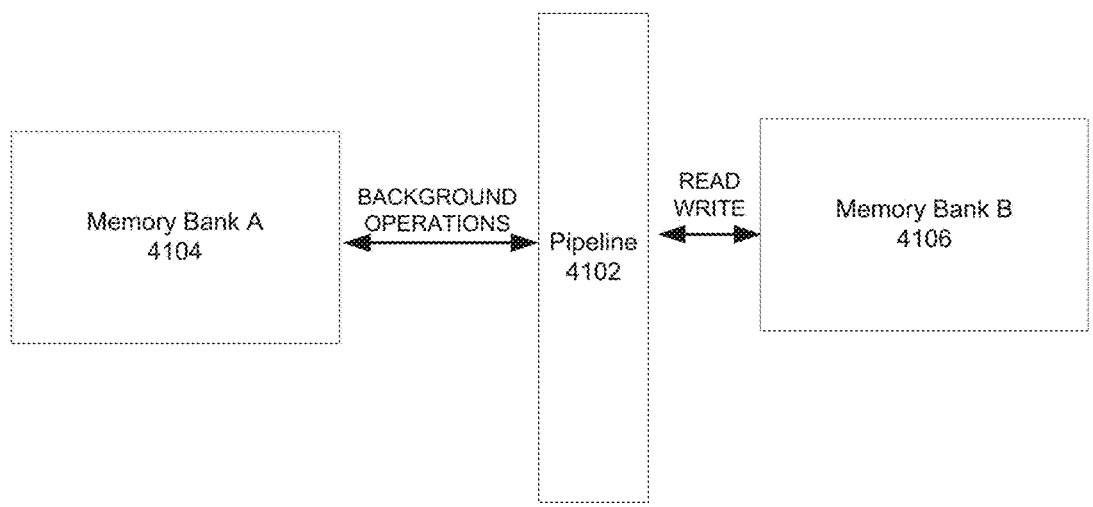
FIGS. 41A to 41C illustrate the different states in which two memory banks in a memory design can operate in accordance with an embodiment of the present invention.
Figure 41B:
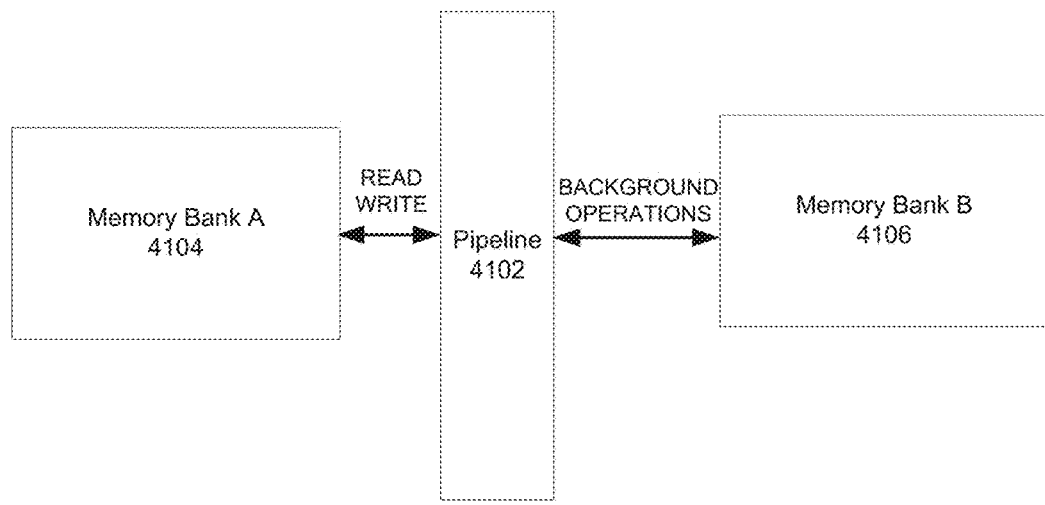
Figure 41C:
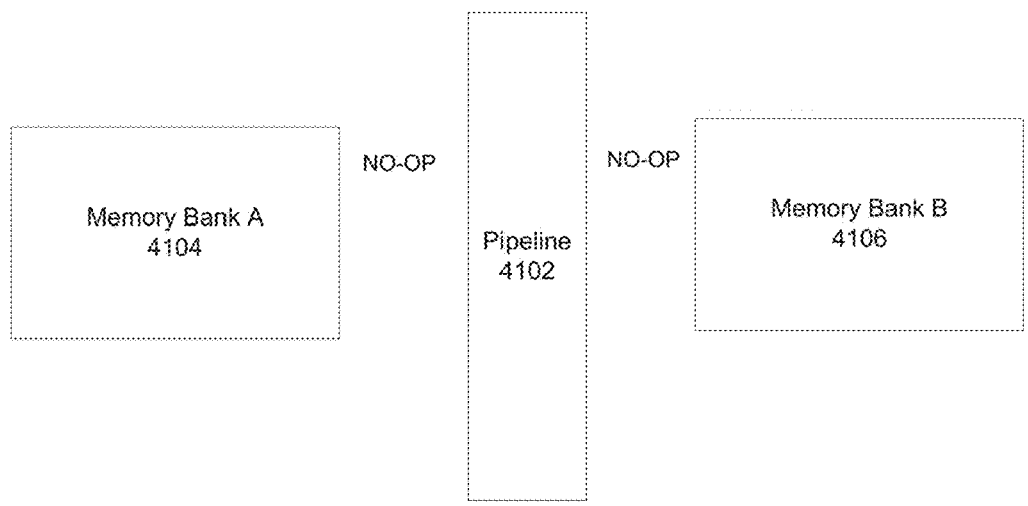

FIGS. 41A to 41C illustrate the different states in which two memory banks in a memory design can operate in accordance with an embodiment of the present invention. In FIG. 41A, memory bank A 4104 (associated with pipeline 4102) is the inactive bank in which background operations may be performed. Meanwhile, the second memory bank associated with pipeline 4102, memory bank B 4106, is the active memory bank in which active read and write operations are performed. In FIG. 41B, however, memory bank A 4104 is the active bank in which read/write operations are performed while memory bank B 4106 is inactive. In FIG. 41C, the memory is in a no-op cycle where both memory bank A and memory bank B are not performing any active operations. Even though no active operations are being performed in either memory bank A or B during the no-op cycle, background operations related to pending verify and re-write operations may continue to be performed for the inactive bank. Accordingly, as stated above, it is important to designate criteria to define which of the two memory banks in FIG. 41C will be the 'inactive' bank. In one embodiment, during a no-op cycle background operations may continue to be performed by both memory bank A and memory bank B, however, the inactive bank will process the background operations more efficiently.

Because background operations continue to be performed during a no-op cycle, and, further because the inactive bank will continue to process background operations, it is advantageous to select the memory bank with the greater number of corresponding entries in the error buffer as the inactive bank during a no-op cycle. If the memory bank with the greater number of entries in the error buffer is selected as the inactive bank during a no-op cycle, it will continue to process any entries corresponding to pending verifies and re-writes in the background during the no-op cycle.

In one embodiment, a counter is configured for each memory bank to keep track of the number of entries in the error buffer corresponding to the respective memory bank. For example, for the exemplary memory design of FIG. 17, a separate counter would be configured for each of memory bank A 1702 and memory bank B 1703. The counter corresponding to memory bank A would keep track of the number of entries in the error buffer associated with errors in memory bank A. Similarly, the counter corresponding to memory bank B would keep track of the number of entries in the error buffer associated with errors in memory bank B.

The values of the counters determine which of the memory banks will be determined to be the inactive bank during the no-op cycle. In one embodiment, the memory bank associated with the counter with the highest value is picked as the inactive bank during the no-op cycle. Because operations pertaining to the inactive plane are processed in the background during a no-op cycle, it is advantageous to pick the memory that has the highest number of associated errors. The no-op cycle can then be used as an opportunity to reduce the number of entries in the error buffer corresponding to the memory bank with the highest number of errors. In one embodiment, even in a design with multiple memory banks, the memory bank with the highest associated counter value is selected as the inactive bank during a no-op cycle.

Figure 42:
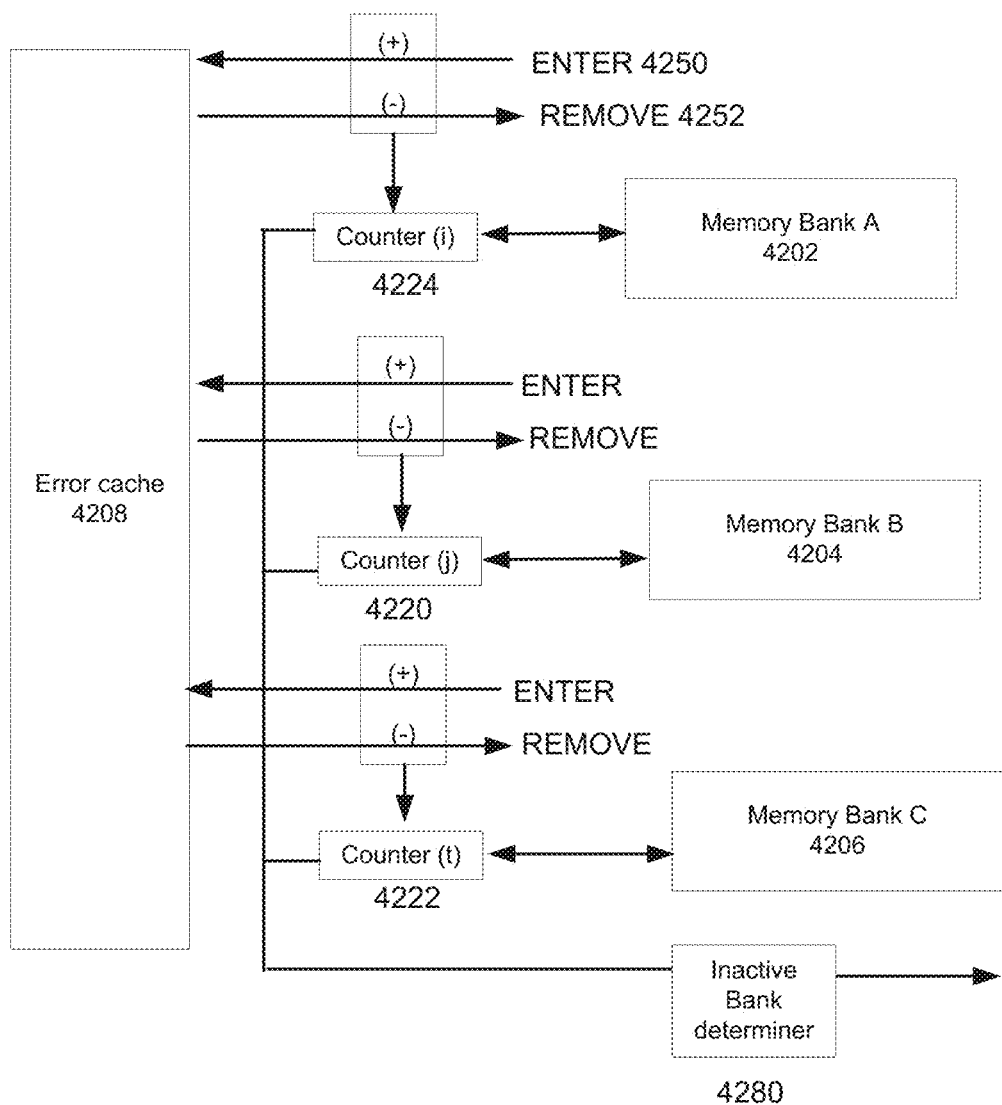
FIG. 42 illustrates the manner in which counters associated with each memory bank can be used to determine which memory bank to designate as the inactive bank during a no-op cycle in accordance with an embodiment of the present invention.

FIG. 42 illustrates the manner in which counters associated with each memory bank can be used to determine which memory bank to designate as the inactive bank during a no-op cycle in accordance with an embodiment of the present invention.

As shown in FIG. 42, when an entry associated with a particular memory bank is entered into the error cache 4208 the corresponding counter value associated with the memory bank is increased. Similarly, if an entry is removed the corresponding counter value associated with the memory bank is decreased. For example, when an entry 4250 (for a verify or re-write operation) that is associated with memory bank A 4202 is entered into error cache 4208, the counter value for counter 4224 is increased. On the other hand when an entry 4252 is removed from the error cache 4208, the counter value for counter 4224 is decreased.

Similarly, counter 4220 is used to track entries in the error cache 4208 associated with memory bank B 4204. Counter 4222 is used to track entries in the error cache 4208 associated with memory bank C 4206. Each of the counter values may be inputted into an inactive bank determiner 4280 to determine which has the highest counter value. The memory bank associated with the counter that has the highest value will be designated as the inactive memory bank during a no-op cycle.

In one embodiment, where the error cache is segmented at the coarse level, e.g., the error cache of FIG. 36B, the inactive bank is defined as the bank that has the most entries in the error cache as determined by the corresponding counter values. For example, if the counter associated with memory bank 3614 has a higher value, memory bank 3614 would be chosen as the inactive bank during the no-op cycle.

In a different embodiment, where the error cache supports both coarse and fine segmentation, the inactive bank is defined as the bank which corresponds to the segment with the highest occupancy. In one embodiment, each segment can comprise a separate counter to keep track of the number of entries within the respective segment. Because each segment comprises a separate counter, picking the bank which corresponds to the segment with the highest occupancy, allows the entries in the segment to be potentially drained during the no-op cycle, thereby, preventing overflow. For example, referring to FIG. 38, each of the primary segments 3810, 3812, 3814, and 3816 directly map to a segment of an associated memory bank. Primary segments 3810, 3812, 3814, and 3816 may, for example, each map to a different associated memory bank. Or, for example, primary segments 3810 and 3812 may map to a first memory bank while primary segments 3814 and 3816 may map to a second memory bank. In this embodiment, the memory bank that corresponds to the highest occupancy segment (for example, the memory bank that maps to the primary segment of the error buffer that has the highest counter-summed value) will be elected as the inactive bank. Stated differently, to determine the highest occupancy primary segment, the counter values of all the sub-segments in the primary segment are added up. For example, if the sum of counters 3890:3894 of primary segment 3812 has the highest counter-summed value of all the other segments of error buffer 3806, then the memory bank that corresponds to primary segment 3812 is elected as the inactive bank. Similarly, if the counter-summed value associated with sub-segments 3822:3826 of primary segment 3810 has the highest counter-summed value of all the other segments of error buffer 3806, then the memory bank that corresponds to primary segment 3810 is elected as the inactive bank.

FIG. 43 depicts an exemplary embodiment for a process flow showing the manner in which an inactive memory bank is chosen for a no-op cycle in a memory with two or more memory banks in accordance with an embodiment of the present invention.

At step 4301, a counter is maintained for each memory bank in a memory. Each counter maintains a count of a number of entries in an error buffer corresponding to the respective memory bank. For example, a memory bank with several errors will have a high corresponding number of entries in the memory bank.

At step 4302, it is determined if the memory is in a no-op cycle.

At step 4304, responsive to a no-op memory cycle determination, a determination is made as to which of the counters associated with the one or more memory banks has the highest value.

At step 4306, the memory bank with the highest corresponding counter value is chosen as the inactive bank during the no-op cycle.

At step 4308, the designated inactive bank is used for processing background operations such as verifies or re-writes. At step 4310, during a next memory cycle, the process starts over at step 4302 by determining if the next memory cycle is a no-op cycle.

At step 4316, responsive to a determination that the pipeline is not in a no-op cycle, the bank that does not have an active read/write operation being processed is chosen as the inactive bank. Again, at step 4310, the determination of whether the next memory cycle is a no-op cycle starts anew at step 4302.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

We claim:

1. A method of writing data into a memory device, the method comprising:
   utilizing a pipeline to process write operations of a first plurality of data words addressed to a memory bank;
   writing a second plurality of data words and associated memory addresses into an error buffer, wherein the second plurality of data words are a subset of the first plurality of data words, wherein the error buffer is associated with the memory bank and wherein further the second plurality of data words comprises data words that are awaiting write verification associated with the memory bank;
   searching for a data word that is awaiting write verification in the error buffer, wherein a verify operation associated with the data word is operable to be performed in a same cycle as a write operation, and wherein the verify operation associated with the data word occurs in a same row as the write operation;
   determining if an address of the data word is proximal to an address for the write operation; and
   responsive to a determination that the address of the data word is proximal to the address for the write operation, delaying a start of the verify operation, wherein a rising edge of the verify operation occurs a predetermined delay after a rising edge of the write operation.

2. The method of claim 1, further comprising:
   responsive to a determination that the address of the data word is not proximal to the address for the write operation, permitting the verify operation to occur simultaneously with the write operation.

3. The method of claim 1, wherein the verify operation is performed as a background operation, and wherein the verify operation occurs during a same cycle as the write operation.

4. The method of claim 1, wherein the verify operation completes prior to an end of the write operation.

5. The method of claim 1, further comprising:
   responsive to a determination that the verify operation is longer than the write operation, delaying an end of the write operation until after the verify operation has completed.

6. The method of claim 1, wherein the verify operation occurs in the same cycle as the write operation using a y-multiplexer circuit coupled to the memory bank, wherein the y-multiplexer circuit is operable to simultaneously multiplex across the memory bank based on two y portions of memory addresses, and wherein the y-multiplexer circuit is operable to simultaneously write a value and read a value associated with two separate memory cells of the memory bank.

7. The method of claim 1 wherein the memory bank comprises a plurality of magnetic random access memory (MRAM) cells.

8. The method of claim 1 wherein the memory bank comprises a plurality of spin-transfer torque magnetic random access memory (STT-MRAM) cells.

9. The method of claim 1, wherein a value of the predetermined delay is programmable.

10. The method of claim 1, wherein the address of the data word associated with the verify operation is determined to be proximal to the address for the write operation if the address for the verify operation is within one column address of the write operation.

11. The method of claim 1, wherein the address of the data word associated with the verify operation is determined to be proximal to the address for the write operation if the address of the data word associated with the verify operation is within two column addresses of the write operation.

12. The method of claim 1, wherein the address of the data word associated with the verify operation is determined to be proximal to the address for the write operation if the address for the verify operation is within three column addresses of the write operation.

13. A method of writing data into a memory device, the method comprising:
   utilizing a pipeline to process write operations of a first plurality of data words addressed to a memory bank;
   writing a second plurality of data words and associated memory addresses into an buffer, wherein the second plurality of data words are a subset of the first plurality of data words, wherein the buffer is associated with the memory bank and wherein further the second plurality of data words comprises data words associated with pending verify operations in connection with the memory bank;
   searching for a pending verify operation in the buffer, wherein the pending verify operation is operable to be performed in a background operation and operable to be performed in a same cycle as a write operation, and wherein a data word associated with the verify operation occurs in a same row as the write operation;

determining if an address of the data word is adjacent to an address for the write operation; and responsive to a determination that the address of the data word is adjacent to the address for the write operation, delaying a start of the verify operation, wherein a rising edge of the verify operation occurs a predetermined delay after a rising edge of the write operation, and wherein the verify operation and the write operation occur in a same clock cycle.

14. The method of claim 13, further comprising:
responsive to a determination that the address of the data word is not adjacent to the address for the write operation, permitting the verify operation to occur simultaneously with the write operation.

15. The method of claim 13, wherein the verify operation completes prior to an end of the write operation.

16. The method of claim 13, further comprising:
responsive to a determination that the verify operation is longer than the write operation, delaying a falling edge of the write operation until after the verify operation has completed.

17. The method of claim 13, wherein the verify operation occurs in the same cycle as the write operation using a y-multiplexer circuit coupled to the memory bank, wherein the y-multiplexer circuit is operable to simultaneously multiplex across the memory bank based on two y portions of memory addresses, and wherein the y-multiplexer circuit is operable to simultaneously write a value and read a value associated with two separate memory cells of the memory bank.

18. A memory device for storing data, the memory device comprising:
a memory bank comprising a plurality of addressable memory cells;

a pipeline configured to process write operations of a first plurality of data words addressed to the memory bank;

a cache memory operable for storing a second plurality of data words and associated memory addresses, wherein the cache memory is associated with the memory bank and wherein further the second plurality of data words comprises data words that are awaiting write verification associated with the memory bank; and a logic module operable to:
search for a data word that is awaiting write verification in the cache memory, wherein a verify operation associated with the data word is operable to be performed in a same cycle as a write operation, and wherein the verify operation associated with the data word occurs in a same row as the write operation;

determine if an address of the data word is proximal to an address for the write operation; and responsive to a determination that the address of the data word is proximal to the address for the write operation, delay a start of the verify operation, wherein a rising edge of the verify operation occurs a predetermined delay after a rising edge of the write operation.

19. The memory device of claim 18, wherein the logic module is further operable to:
responsive to a determination that the address of the data word is not proximal to the address for the write operation, performing the verify operation at a same time as the write operation.

20. The memory device of claim 18, wherein the verify operation completes prior to an end of the write operation.

* * * * *